United States Patent [19]
Tanaka et al.

[11] Patent Number: 5,909,399
[45] Date of Patent: Jun. 1, 1999

[54] NON-VOLATILE SEMICONDUCTOR MEMORY DEVICE AND MEMORY SYSTEM USING THE SAME

[75] Inventors: Tomoharu Tanaka; Masaki Momodomi, both of Yokohama; Hideo Kato, Kawasaki; Hiroto Nakai; Yoshiyuki Tanaka, both of Yokohama; Riichiro Shirota, Fujisawa; Seiichi Aritome; Yasuo Itoh, both of Kawasaki; Yoshihisa Iwata, Yokohama; Hiroshi Nakamura, Kawasaki; Hideko Odaira, Machida; Yutaka Okamoto, Kawasaki; Masamichi Asano, Tokyo; Kaoru Tokushige, Yokohama, all of Japan

[73] Assignee: Kabushiki Kaisha Toshiba, Kawasaki, Japan

[21] Appl. No.: 09/100,330

[22] Filed: Jun. 19, 1998

Related U.S. Application Data

[63] Continuation of application No. 08/826,820, Apr. 8, 1997, Pat. No. 5,793,696, which is a continuation of application No. 08/784,927, Jan. 16, 1997, Pat. No. 5,724,300, which is a continuation of application No. 08/576,564, Dec. 21, 1995, Pat. No. 5,615,165, which is a continuation of application No. 08/326,281, Oct. 20, 1994, Pat. No. 5,546,351, which is a continuation-in-part of application No. 07/992,653, Dec. 18, 1992, Pat. No. 5,361,227.

[30] Foreign Application Priority Data

| Dec. 19, 1991 | [JP] | Japan | 3-354871 |
| Dec. 25, 1991 | [JP] | Japan | 3-343200 |
| Mar. 10, 1992 | [JP] | Japan | 4-086082 |
| Mar. 31, 1992 | [JP] | Japan | 4-077946 |
| Mar. 31, 1992 | [JP] | Japan | 4-105831 |
| Jul. 2, 1992  | [JP] | Japan | 4-175693 |

[51] Int. Cl.$^6$ ............................................. G11C 13/00
[52] U.S. Cl. ........................ 365/185.33; 365/189.05; 365/230.08; 365/218
[58] Field of Search ................ 365/185.33, 218, 365/189.05, 230.08

[56] References Cited

U.S. PATENT DOCUMENTS

| 4,279,024 | 7/1981 | Schrenk | 365/203 |
| 4,597,062 | 6/1986 | Asano et al. | 365/201 |
| 4,755,970 | 7/1988 | Schrenk | 365/201 |
| 4,758,988 | 7/1988 | Kuo | 365/189 |
| 4,763,305 | 8/1988 | Kuo | 365/200 |
| 4,811,294 | 3/1989 | Kobayashi et al. | 365/189 |
| 4,819,212 | 4/1989 | Nakai et al. | 365/230 |
| 4,858,192 | 8/1989 | Tatsumi et al. | 365/200 |
| 4,879,689 | 11/1989 | Atsumi et al. | 365/201 |

(List continued on next page.)

FOREIGN PATENT DOCUMENTS

| 41 10 371 | 10/1991 | Germany. |
| 62-188100 | 8/1987  | Japan. |
| 3-259499  | 11/1991 | Japan. |
| 4-82090   | 3/1992  | Japan. |
| 4-82091   | 3/1992  | Japan. |
| 2029145   | 3/1980  | United Kingdom. |
| WO 90/12400 | 10/1990 | WIPO. |

OTHER PUBLICATIONS

M. Momodomi et al, *A 4–Mb NAND EEPROM with Tight Programmed $V_t$ Distribution*, IEEE Journal of Solid–State Circuits, vol. 26, No. 4, Apr. 1991, pp. 492–495 Patent Abstracts of Japan, vol. 14, No. 381, Aug. 16, 1990, p. 1093.

*Primary Examiner*—Terrell W. Fears
*Attorney, Agent, or Firm*—Foley & Lardner

[57] ABSTRACT

The time required for the program verify and erase verify operations can be shortened. The change of threshold values of memory cells can be suppressed even if the write and erase operations are executed repetitively. After the program and erase operations, whether the operations were properly executed can be judged simultaneously for all bit lines basing upon a change, after the pre-charge, of the potential at each bit line, without changing the column address. In the data rewrite oepration, the rewrite operation is not effected for a memory cell with the data once properly written, by changing the data in the data register.

22 Claims, 99 Drawing Sheets

U.S. PATENT DOCUMENTS

| | | | |
|---|---|---|---|
| 4,881,200 | 11/1989 | Urai | 365/189.04 |
| 4,881,202 | 11/1989 | Tsujimoto et al. | 365/200 |
| 4,937,787 | 6/1990 | Kobatake | 365/94 |
| 4,943,948 | 7/1990 | Morton et al. | 365/201 |
| 4,972,372 | 11/1990 | Ueno | 365/201 |
| 5,025,418 | 6/1991 | Asoh | 365/200 |
| 5,077,691 | 12/1991 | Haddad et al. | 365/218 |
| 5,086,413 | 2/1992 | Tsuboi et al. | 365/230.01 |
| 5,109,257 | 4/1992 | Kondo | 357/23.5 |
| 5,109,359 | 4/1992 | Sakakibara et al. | 365/189.07 |
| 5,124,945 | 6/1992 | Schreck | 365/185 |
| 5,126,973 | 6/1992 | Garcia et al. | 365/200 |
| 5,134,583 | 7/1992 | Matsuo et al. | 365/200 |
| 5,136,544 | 8/1992 | Rozman et al. | 365/201 |
| 5,142,496 | 8/1992 | Van Buskirk | 365/201 |
| 5,148,398 | 9/1992 | Kohno | 365/201 |
| 5,153,880 | 10/1992 | Owen et al. | 371/10.2 |
| 5,163,021 | 11/1992 | Mehorotra et al. | 365/185 |
| 5,172,338 | 12/1992 | Mehrotra | 365/185 |
| 5,172,339 | 12/1992 | Noguchi et al. | 365/201 |
| 5,233,610 | 8/1993 | Nakayama | 365/200 |
| 5,299,162 | 3/1994 | Kim et al. | 365/201 |
| 5,343,437 | 8/1994 | Johnson et al. | 365/230.3 |
| 5,355,340 | 10/1994 | Coker et al. | 365/200 |
| 5,361,277 | 11/1994 | Grover | 375/107 |
| 5,428,571 | 6/1995 | Atsumi et al. | 365/189.05 |
| 5,434,819 | 7/1995 | Matsuo et al. | 365/189.07 |
| 5,483,484 | 1/1996 | Endoh et al. | 365/185.18 |
| 5,513,333 | 4/1996 | Kynett et al. | 395/430 |
| 5,537,350 | 7/1996 | Larsen et al. | 365/185.33 |
| 5,566,105 | 10/1996 | Tanaka et al. | 365/185.22 |
| 5,574,684 | 11/1996 | Tomoeda | 365/185.04 |
| 5,574,688 | 11/1996 | McClure et al. | 365/200 |

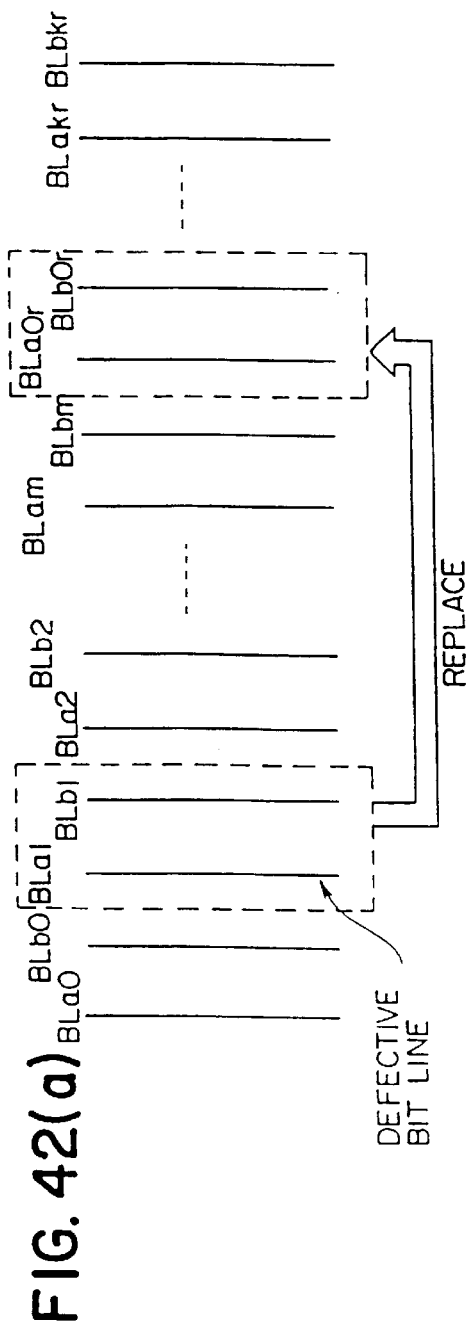
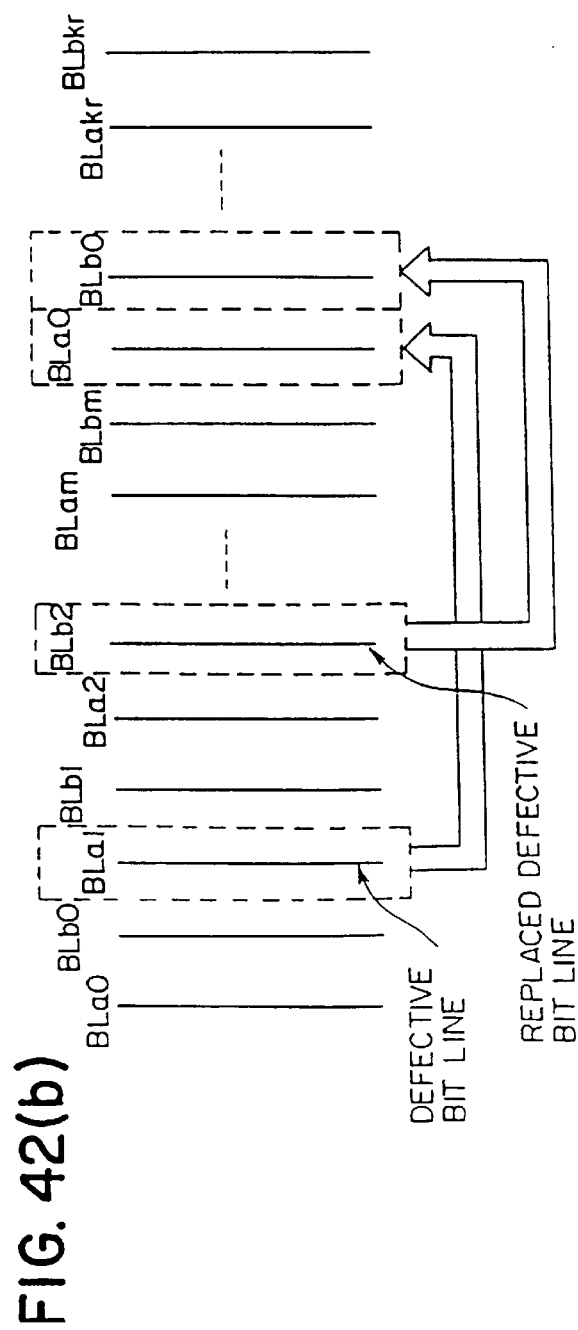

FIG. 66(a)
|    | BL1 | BL2 | BL3 |
|----|-----|-----|-----|
| WD | "1" | "0" | "1" |
| VD | "1" | "1" | "1" |
FIG. 66(b)
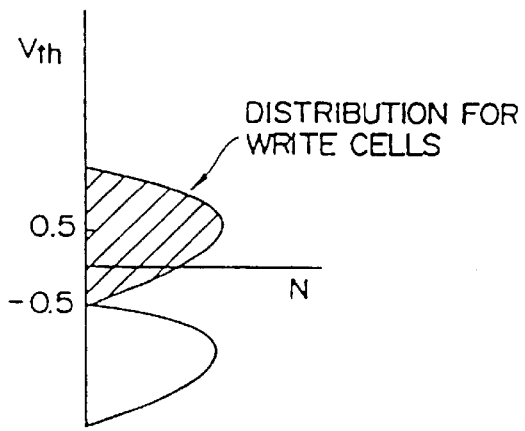
FIG. 66(c)
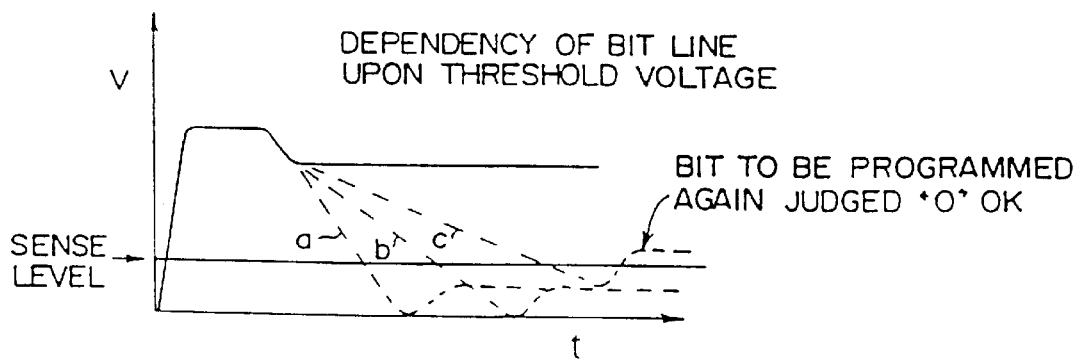

FIG. 69(a)
|    | BL1 | BL2 | BL3 |
|----|-----|-----|-----|
| WD | "1" | "0" | "1" |
| VD | "1" | "1" | "1" |
FIG. 69(b)
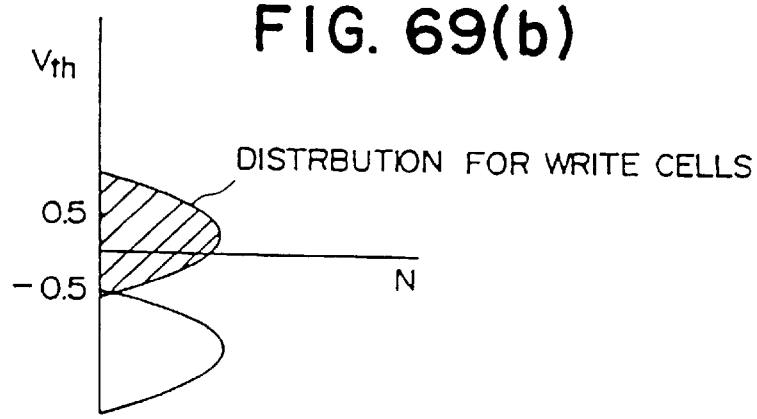
FIG. 69(c)
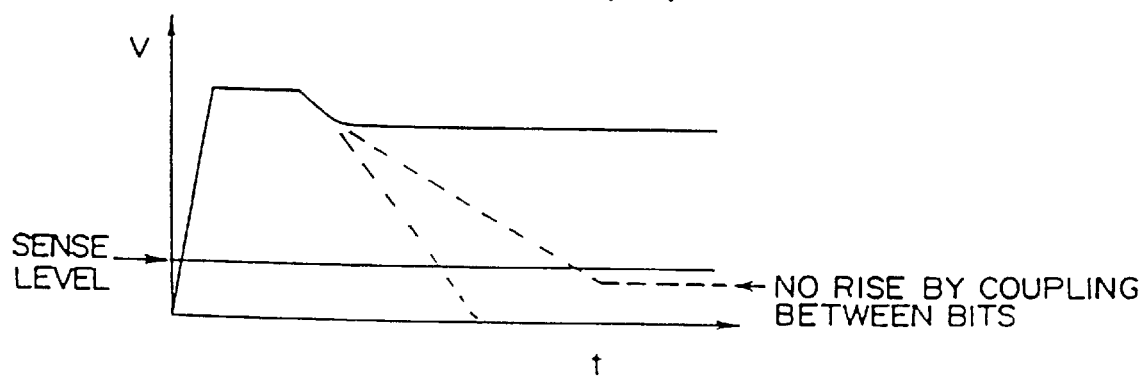

| WRITE DATA | 0 | 0 | 1 | 1 |
|---|---|---|---|---|
| VERIFY DATA | 0 | 1 | 0 | 1 |
| OUTPUT DATA AFTER COMPARISON | 0 | 1 | 1 | 0 |

NON-VOLATILE SEMICONDUCTOR MEMORY DEVICE AND MEMORY SYSTEM USING THE SAME

This application is a continuation of application Ser. No. 08/826,820 filed Apr. 8, 1997, now U.S. Pat. No. 5,793,646 which is a continuation of Ser. No. 08/784,927 filed Jan. 16, 1997, now U.S. Pat. No. 5,724,300 which is a continuation of 08/576,564 filed Dec. 21, 1995 now U.S. Pat. No. 5,615,165, which is a continuation of Ser. No. 08/326,281, filed Oct. 20, 1994 now U.S. Pat. No. 5,546,351 which is a continuation-in-part of Ser. No. 07/992,653 filed Dec. 18, 1992 now U.S. Pat. No. 5,361,227.

BACKGROUND OF THE INVENTION

1. Field of the Invention

The present invention relates to a non-volatile semiconductor memory device using a flash EEPROM, and a memory system using such a memory device.

2. Description of the Related Art

Magnetic disks have been used widely as storage means for computer systems. A magnetic disk has the following disadvantages. Namely, it is weak against an impact force because of its highly precise drive mechanism, less portable because of its weight, difficult to drive with a battery because of large power consumption, unable to access at high speed, and so on.

In order to overcome such disadvantages, semiconductor memory devices using an EEPROM have been developed recently. Generally, a semiconductor memory device has the following advantages over a magnetic disk. Namely, it is strong against an impact force because it has no highly precise drive mechanism, more portable because of its light weight, easy to drive with a battery because of small power consumption, able to access at high speed, and so on.

As an example of EEPROM, there is known a NAND cell type EEPROM capable of providing a high integration density. Such an EEPROM has the following structure. Namely, a plurality of memory cells are disposed, for example, in a column direction. The source and drain of adjacent memory cells are sequentially connected in series. With such a connection, a unit cell group (NAND cell) is constituted by a plurality of memory cells connected in series. Such a unit cell group is connected to each bit line.

A memory cell generally has a MOSFET structure with laminated charge accumulation layer and control gate. Memory cells are integrated as an array within a p-type well formed in a p-type or n-type substrate. The drain side of a NAND cell is connected via a select gate to a bit line. The source side of a NAND cell is connected via a select gate to a source line (reference potential wiring). The control gate of each memory cell is connected to a word line arranged in a row direction.

The write operation of a NAND type EEPROM is performed in the following manner. The threshold value or threshold voltage of all memory cells within a NAND cell is set to a negative value by the preceding erase operation. Data is sequentially written starting from the memory cell remotest from the bit line. A high voltage Vpp (about 20 V) is applied to the control gate of the selected memory cell. An intermediate potential VM (about 10 V) is applied to the control gates and select gates of the other memory cells on the bit line side. A potential of 0 V or intermediate potential is applied to the bit line, depending upon the level of write data. When a potential of 0 V is applied to the bit line, this potential is transmitted to the drain of the selected memory cell, so that electrons are injected from the drain to the floating gate. As a result, the threshold value of the selected memory cell is shifted to the positive side. This state is called, for example, a "0" state. If an intermediate potential is applied to the bit line, electron injection does not occur. As a result, the threshold value of the selected memory will not change. Namely, the threshold value takes a negative value. This state is called a "1" state.

In the erase operation, data in all memory cells within the NAND cell are erased at the same time. Namely, 0 V is applied to all control gates and select gates to make the bit lines and source lines in a floating state, and a high voltage 20 V is applied to the p-type well and n-type substrate. As a result, electrons in floating gates of all memory cells are removed therefrom to the p-type well, shifting the threshold values of memory cells toward the negative side.

The data read operation is performed in the following manner. Namely, 0 V is applied to the control gate of the selected memory cell, and a power supply voltage Vcc (=5 V) is applied to the control gates and select gates of non-selected memory cells. In this state, it is checked whether current flows through the selected memory cell. If current flows, it means that data "1" was stored, whereas if no current flows, it means that data "0" was stored.

As apparent from the description of the above operations, in a NAND cell type EEPROM, non-selected memory cells operate as transfer gates during the data read/write operation. For this reason, there is a limit of a threshold voltage of a memory cell written with data. For example, the proper range of the threshold value of a memory cell written with "0" should be from 0. 5 V to 3.5 V. This range is required to be narrower when considering a change of the threshold value with time after data write, variation of characteristic parameters of memory cells, and variation of power supply voltages.

However, it is difficult for a conventional data write method to make the range of the threshold value of a memory cell written with data 0 enter such an allowable range, because the conventional data write method writes data by using the same condition for all memory cells while using a fixed write potential and write time for all memory cells. More specifically, the characteristic of each memory cell changes with variation of manufacturing processes, sometimes resulting in a memory cell easy to be written and at other times resulting in a memory cell difficult to be written. Considering such a write characteristic difference, there has been proposed a data write method which controls the data write time for verifying the written data, in order to set the threshold value of each memory cell within a desired range.

With this method, however, data in a memory cell is required to be outputted from the memory device in order to check whether data has been written properly, posing a problem of a longer total write time.

For an erase verify operation, there is known a technique as disclosed in Japanese Patent Laid-Open Publication No. 3-259499, whereby outputs of a plurality of sense amplifiers are supplied to an AND gate, and the logical operation result is used in generating a collective erase verify signal. However, this circuit configuration can be used only for the NOR type erase verify operation, and it cannot be applied to the write verify operation. The reason for this is that the values of write data take "1" and "0" and the logical operation of the sense amplifier outputs cannot be used for a collective verify operation. For this reason, it becomes necessary for a data write operation to repetitively execute the write operation and verify read operation and sequentially output data of each memory cell, hindering the high speed data write operation.

SUMMARY OF THE INVENTION

The present invention pays attention to the above-described difficulty of high speed operation, and aims at providing an EEPROM and a memory system using an EEPROM capable of providing a high speed write operation and write verify operation and a high speed erase operation and erase verify operation, without increasing the area of necessary control circuits.

According to the memory device of the present invention, each of the plurality of comparator means compares the data stored in the data latch means with the data read from the memory cell, and judges whether data was written in the memory cell. The collective verify means outputs the write completion signal when all of the plurality of comparator means judge that data was written in corresponding memory cells.

According to the memory device of the present invention, externally inputted write data is stored in each of the plurality of data latch means as first and second logical levels. Each of the plurality of memory cells stores data as an erase state when the threshold value of each memory cell is within the first range and as a write state when the threshold value of each memory cell is within the second range. In a write operation, the threshold value is changed/change-suppressed when the first/second logical level is stored in each data latch means. In a verify operation after the write operation, the data stored in the data latch means is compared with the data read from the memory cell, by the rewrite data setting means. This rewrite data setting means sets again the second logical level to the data latch means when the threshold value of the memory cell enters the second range. The collective verify means outputs the write completion signal when the second logical level was set to all of the plurality of data latch means.

According to the memory device of the present invention, each of the plurality of data latch means stores externally inputted write data as first and second logical levels. The memory cell stores data as the first/second logical level when the threshold value of the memory cell is within the first/second range. In a write operation, the threshold value of the memory cell is changed from the first logical level toward the second logical level when the first logical level is stored in the data latch means, and a change of the threshold value is suppressed when the second logical level is stored in the data latch means. In an erase operation, the threshold value is changed in an opposite manner to the write operation. The data resetting means operates in the following manner. In a write verify operation after the write operation, the data stored in the latch means is compared with the data read from the memory cell. The second logical level is again set to the data latch means when the threshold value of the memory cell enters the second range. In an erase verify operation after the erase operation, the second/first logical level is again set to the data latch means when the threshold value of the memory cell is within the second/first range. The collective verify means outputs the write/erase completion signal when the second/first logical level was set to all of the plurality of data latch means.

According to the memory systems of the present invention, in the memory devices of the present invention described above, new write data is transferred to the data latch means after the collective verify means outputted the write completion signal.

FIG(S). 25(*a*) and (*b*) show other structures of the bit line control circuits of the third and fourth embodiment.

FIGS. 26(*a*) and (*b*) show other structures of the bit line control circuits of the third and fourth embodiments.

FIGS. 27(*a*) and (*b*) show other structures of the bit line control circuits of the third and fourth embodiments.

FIGS. 28(*a*) and (*b*) are timing charts illustrating the operation of collectively latching the same data to the data latch units of the bit line control circuit according to the third embodiment.

Figure 29:
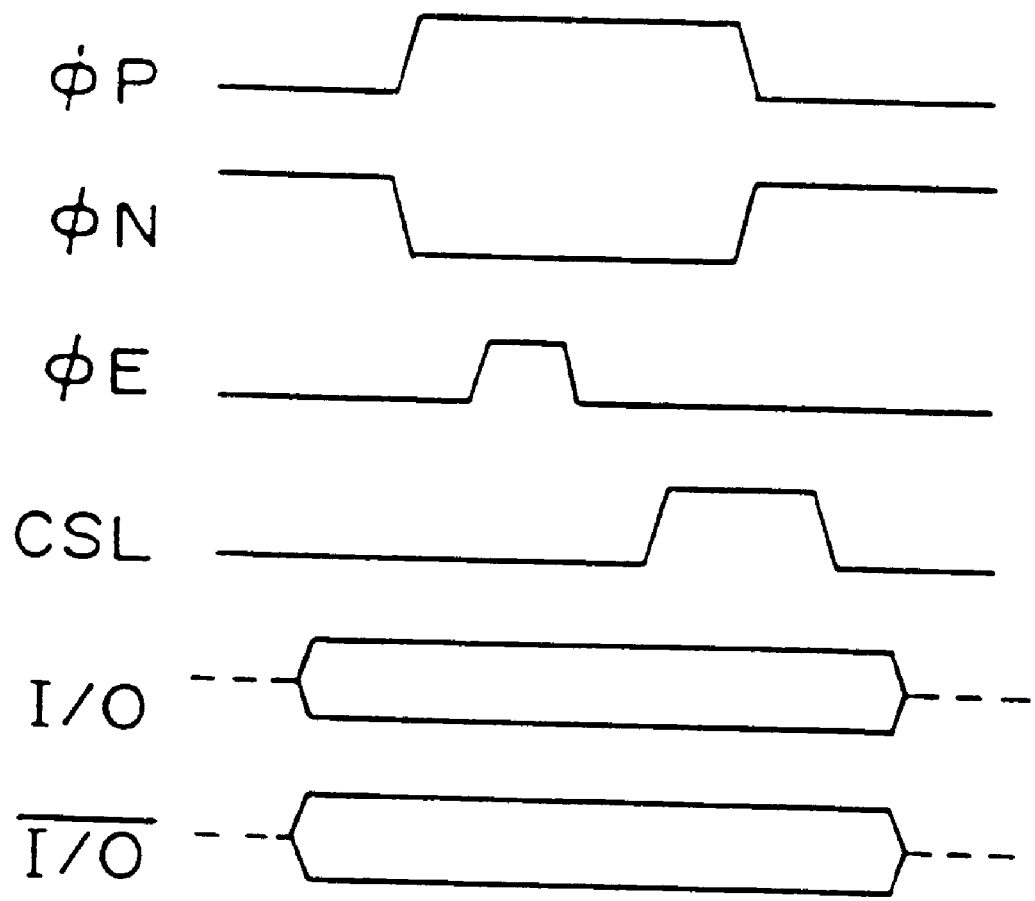

FIG. 29 is a timing chart illustrating the operation of collectively latching the same data to the data latch units of the bit line control circuit according to the third embodiment.

Figure 30:
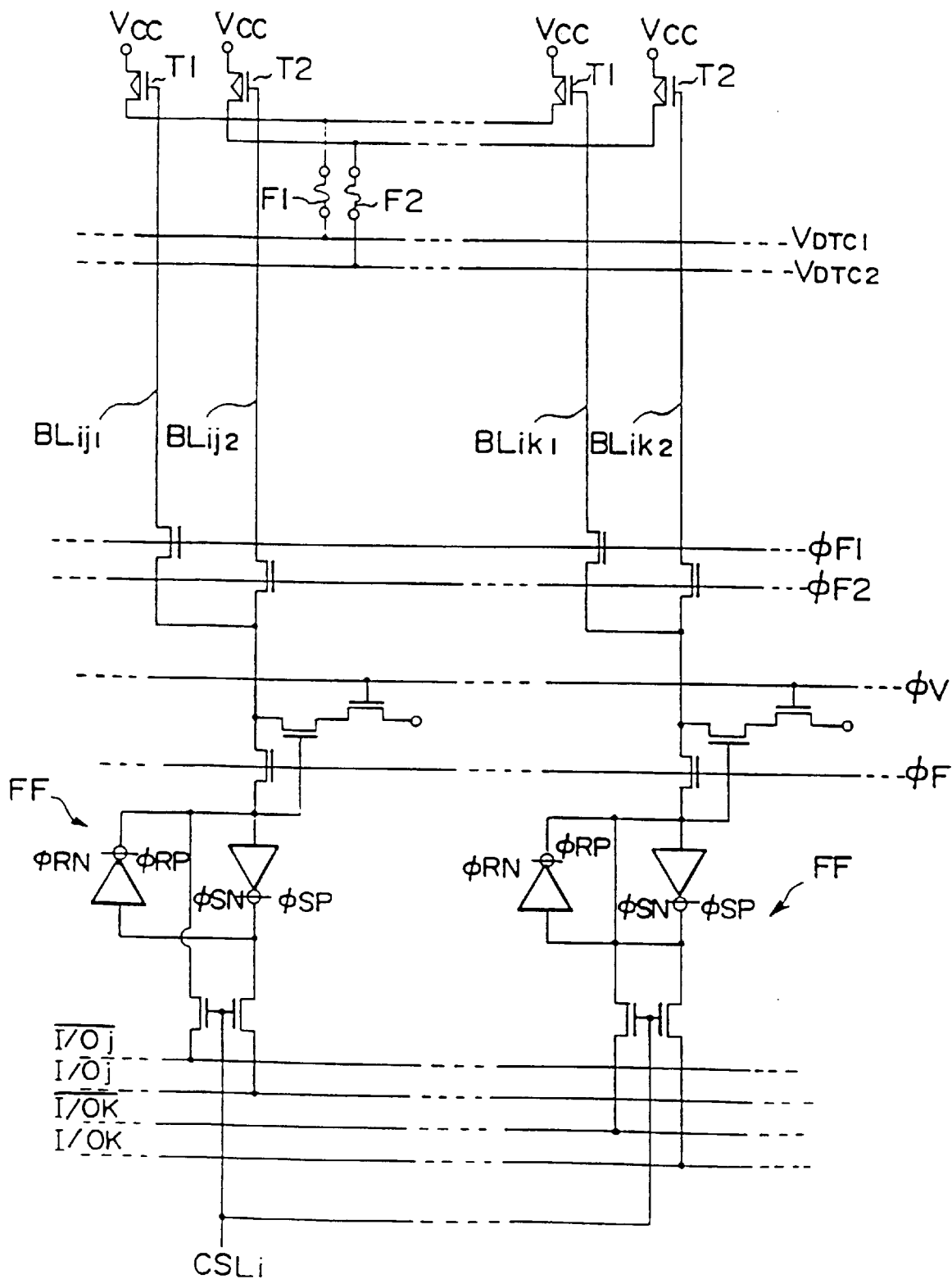

FIG. 30 is a circuit diagram showing a modification of the third embodiment, in which one CMOSFET is commonly used by adjacent two bit lines.

Figure 31A:
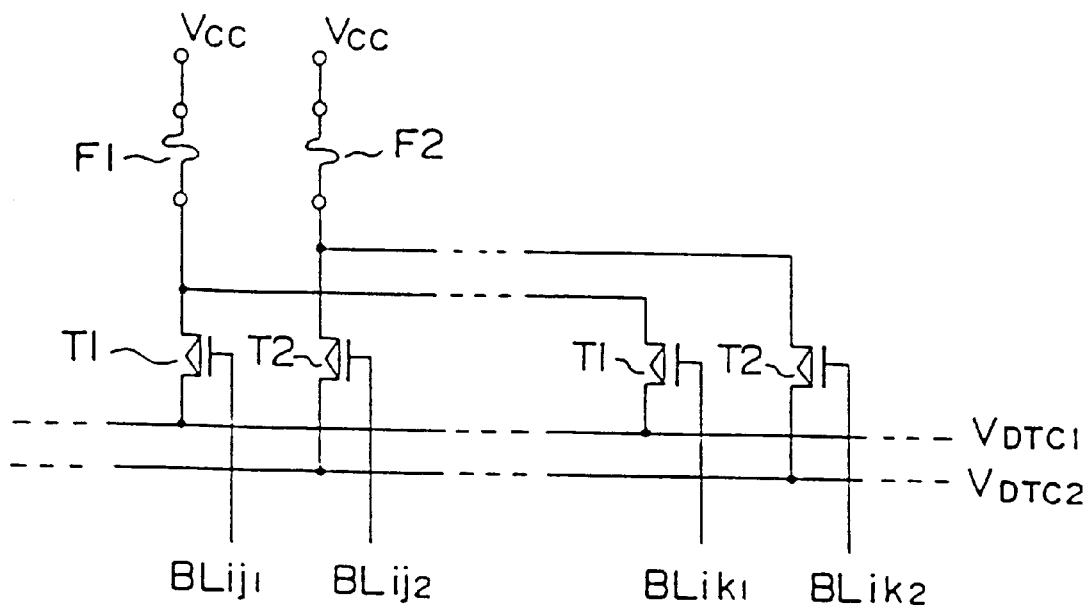
Figure 31B:
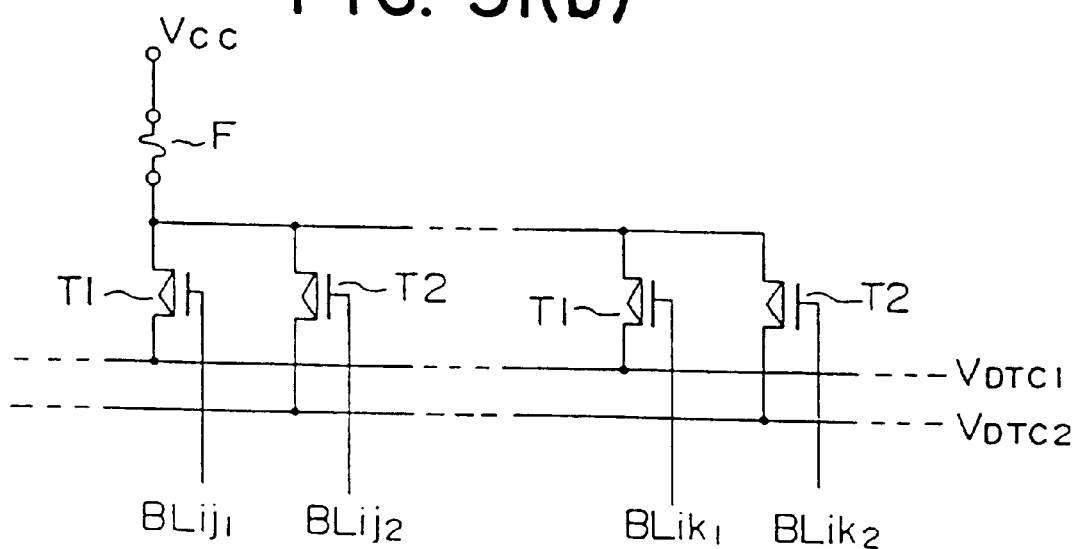

FIGS. 31(*a*) and (*b*) show the structures different from that shown in FIG. 30.

Figure 32:
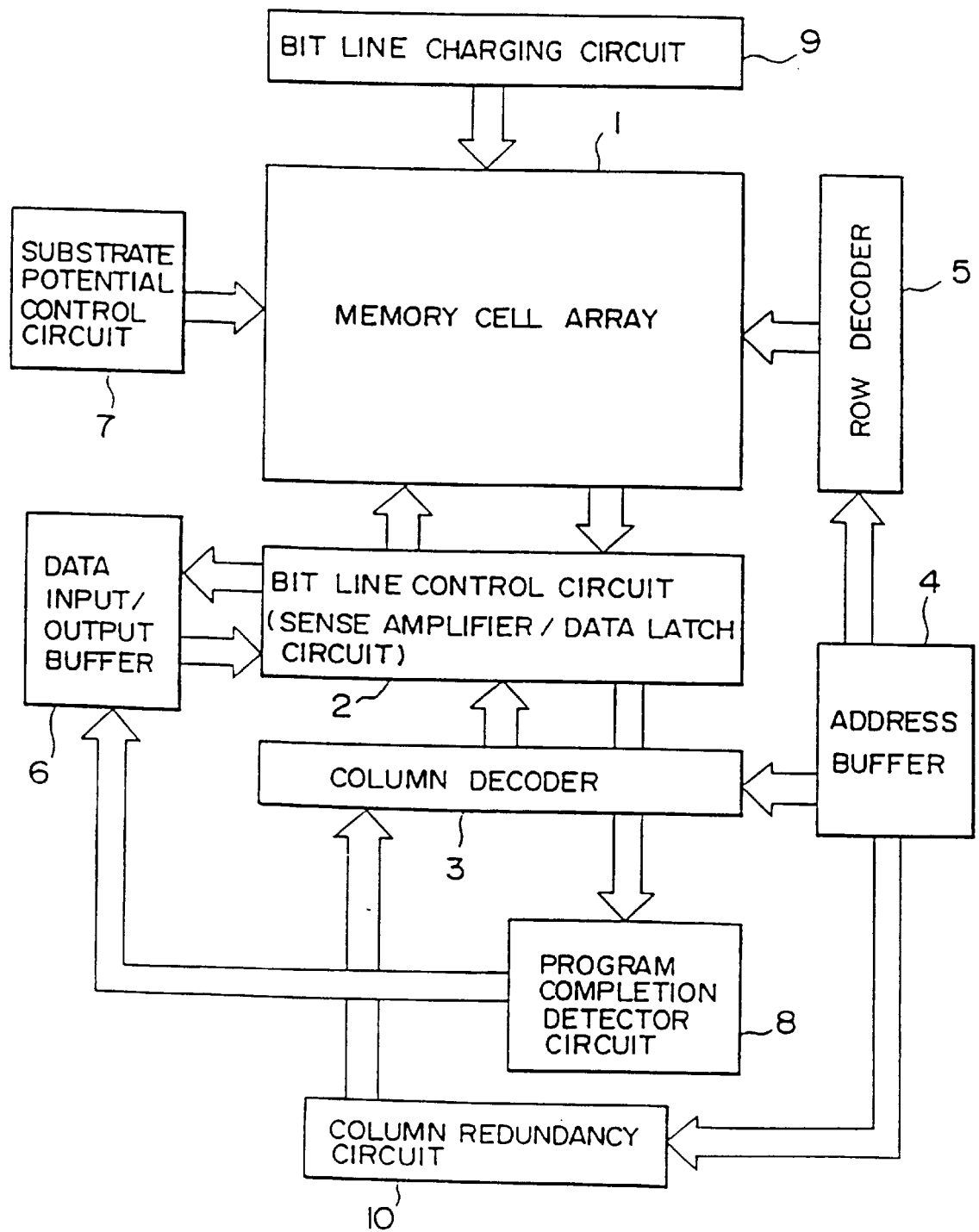

FIG. 32 is a block diagram showing the structure of a NAND cell type EEPROM according to a fifth embodiment of the present invention.

Figure 33:
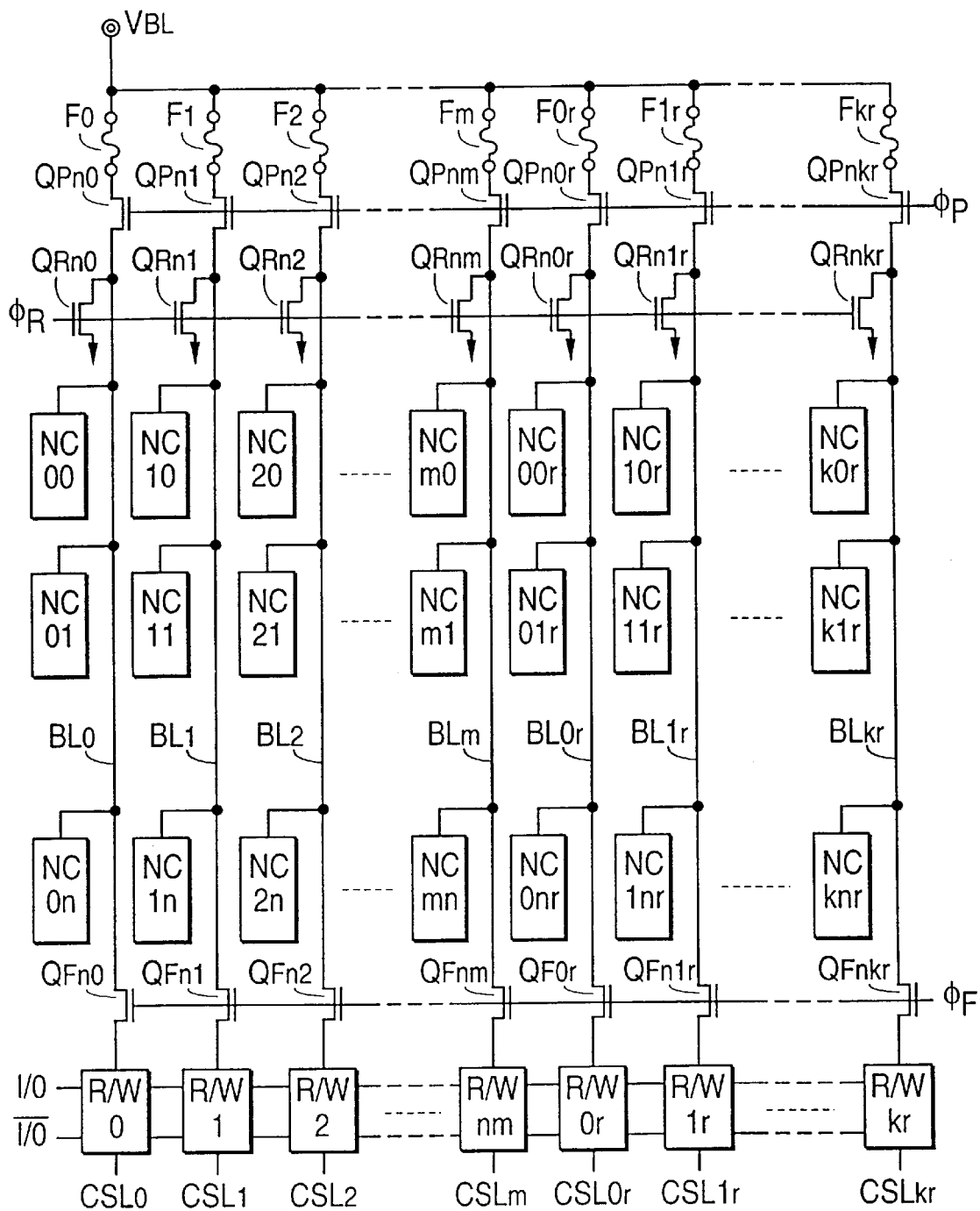

FIG. 33 is a circuit diagram showing a detailed structure of the memory cell array and its peripheral circuits of the fifth embodiment.

Figure 34:
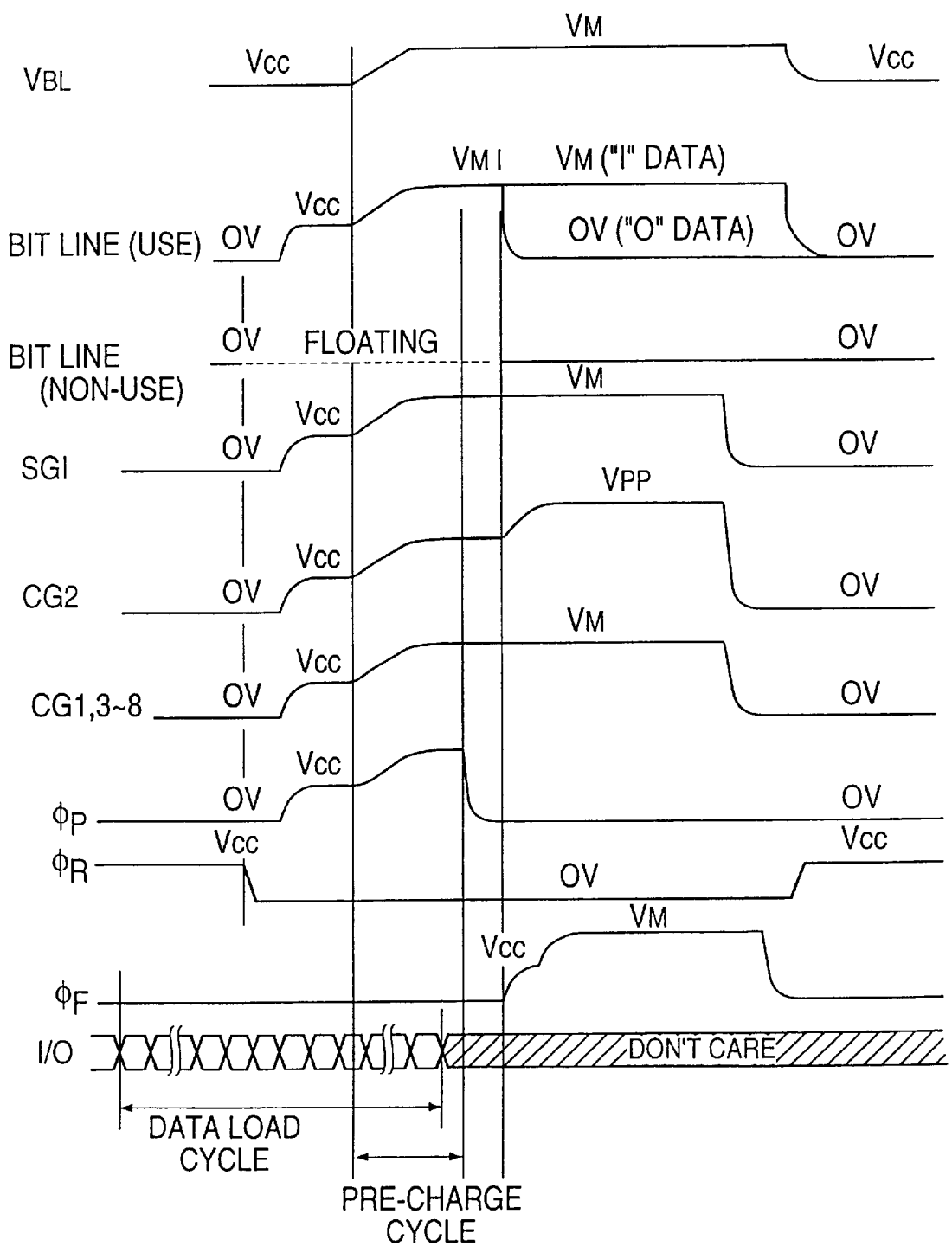

FIG. 34 is a timing chart illustrating the write operation of the fifth embodiment.

Figure 35:
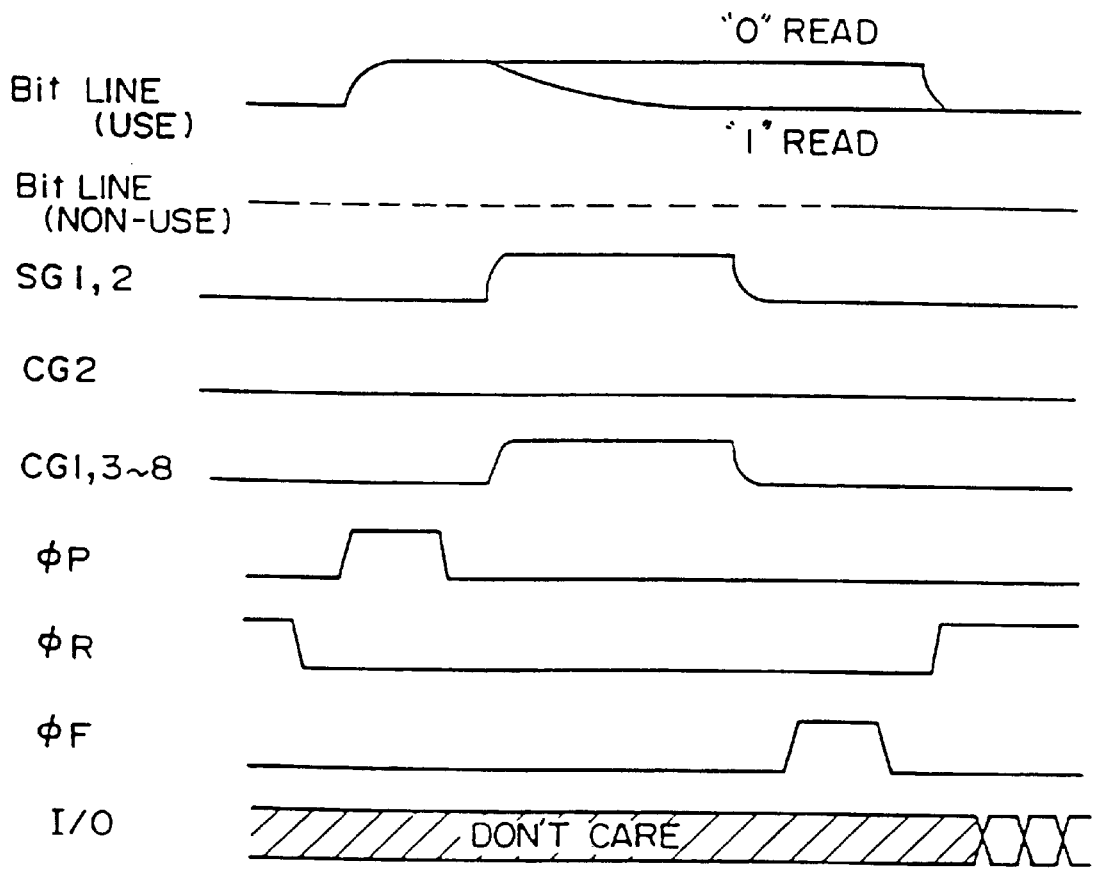

FIG. 35 is a timing chart illustrating the read operation of the fifth embodiment.

Figure 36:
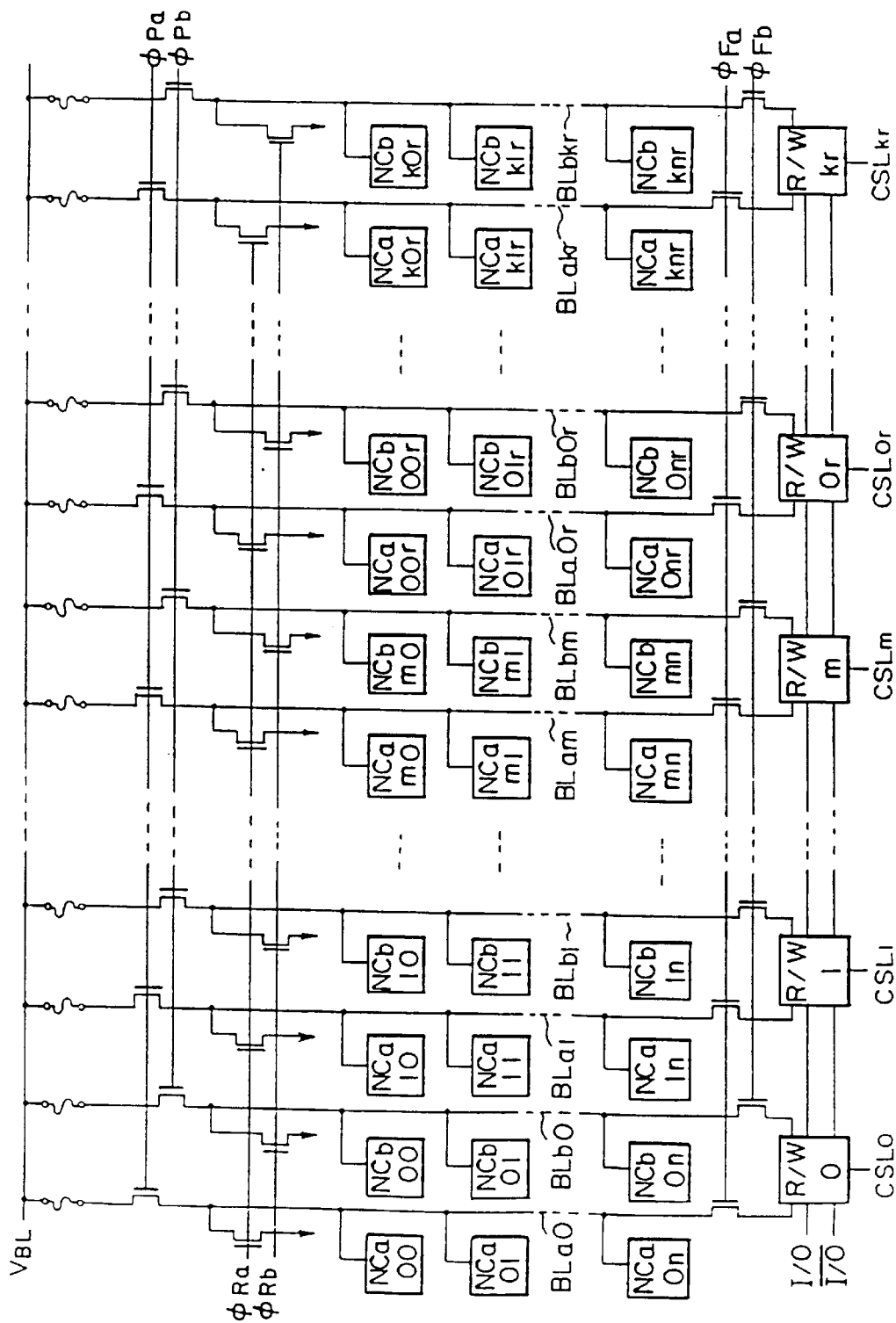

FIG. 36 is a circuit diagram showing a detailed structure of the memory cell array and its peripheral circuits according to a sixth embodiment of the present invention.

Figure 37:
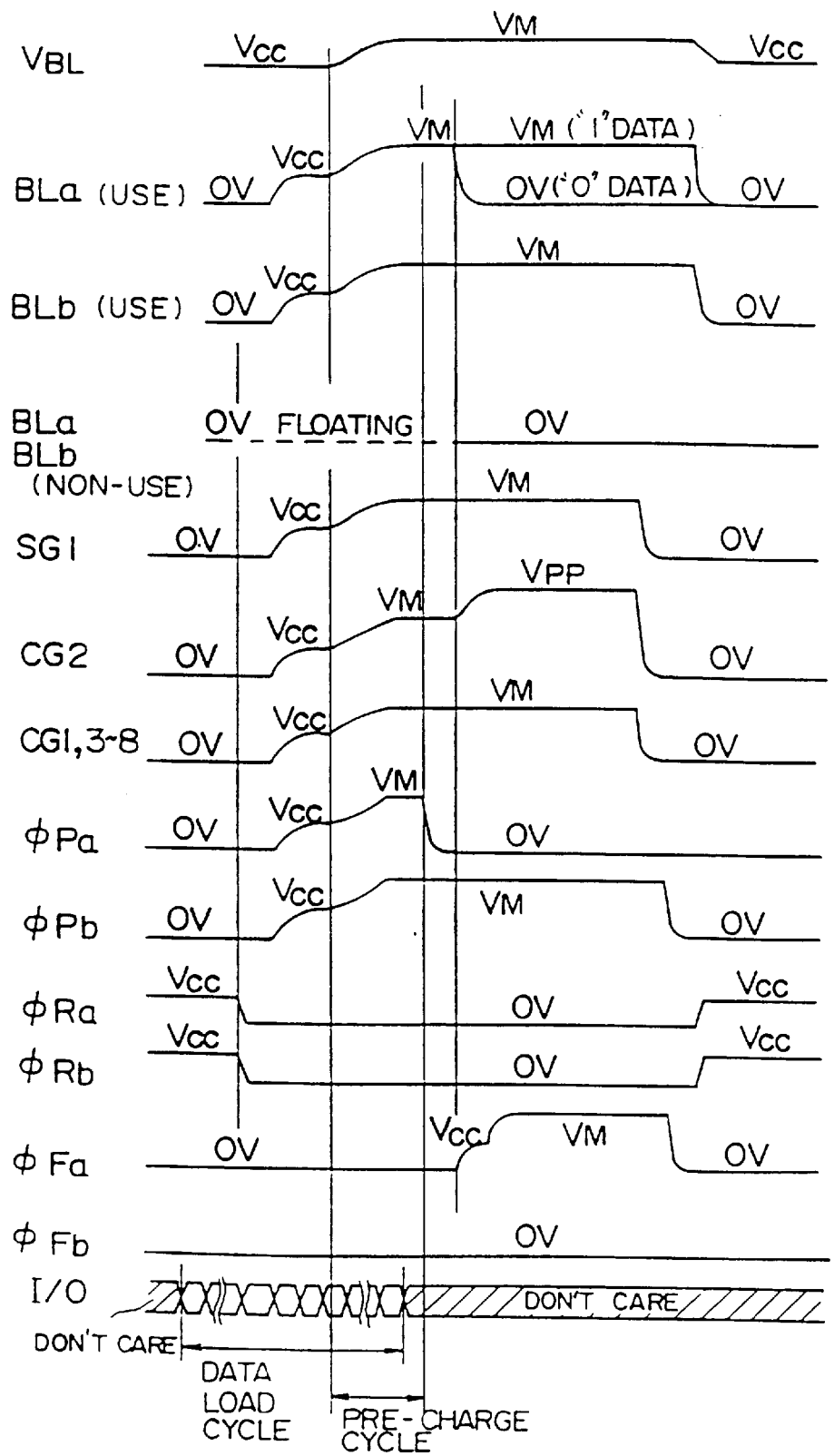

FIG. 37 is a timing chart illustrating the write operation of the sixth embodiment.

Figure 38:
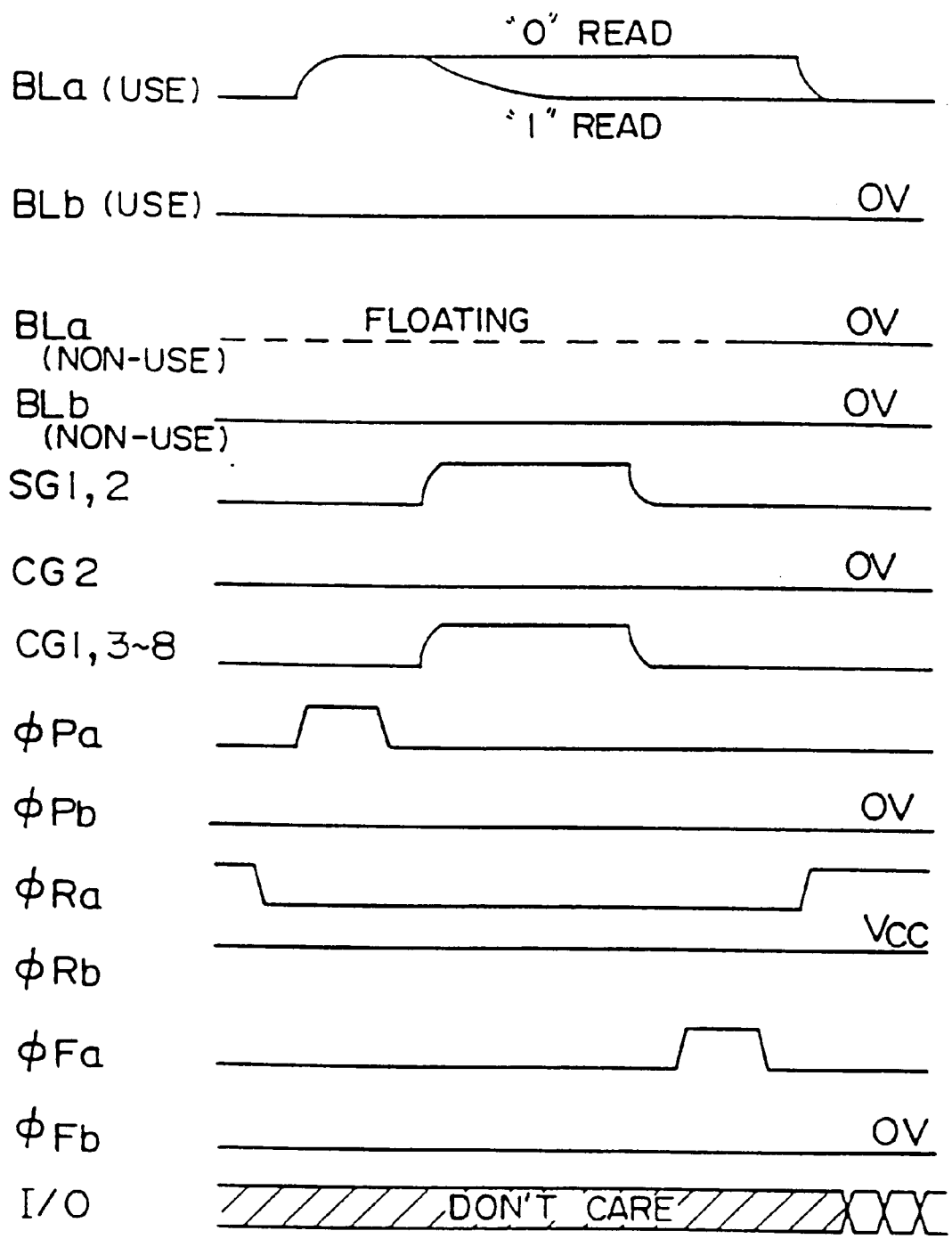

FIG. 38 is a timing chart illustrating the read operation of the sixth embodiment.

Figure 39:
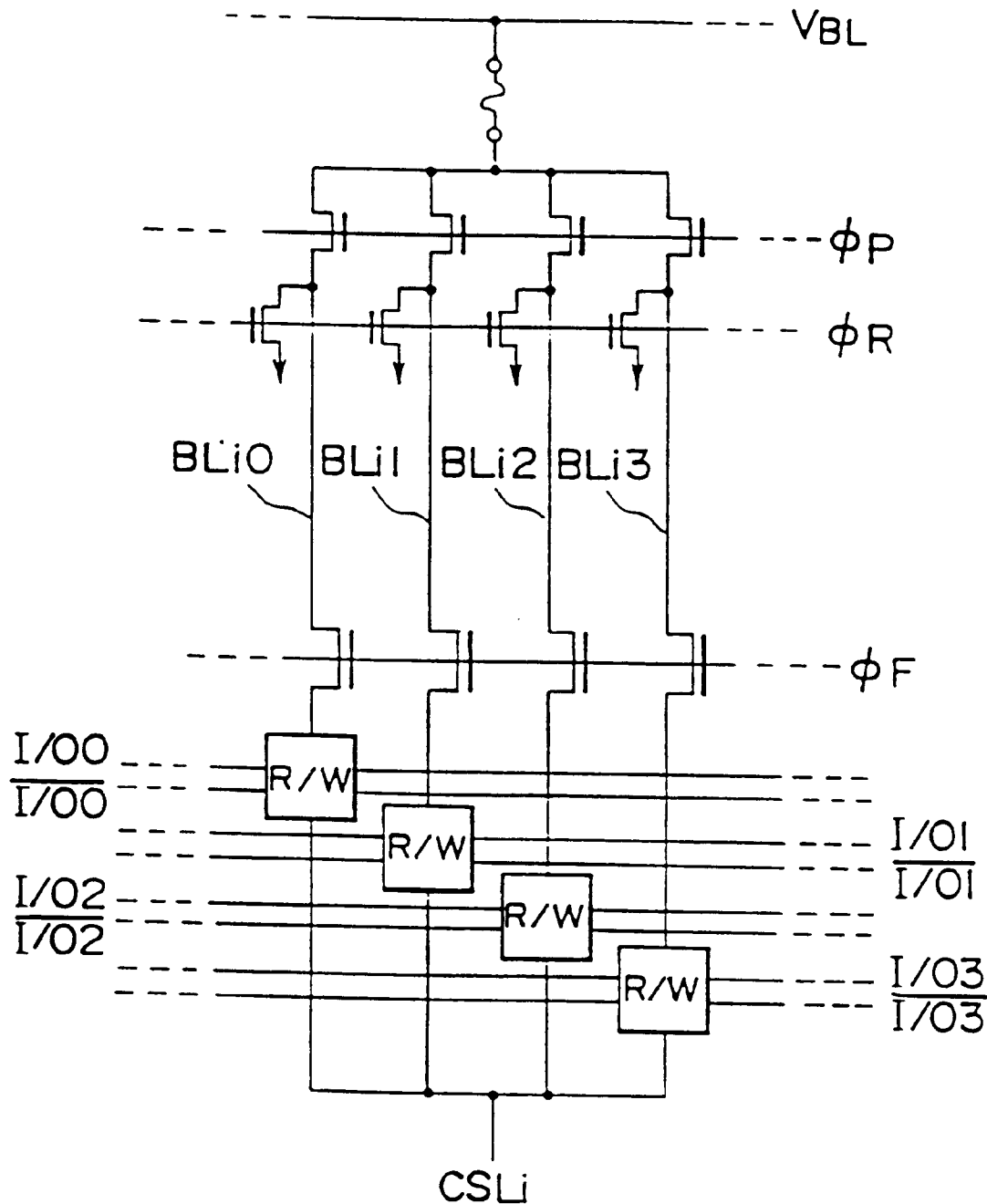

FIG. 39 is a circuit diagram showing a modification of the embodiment shown in FIG. 33.

Figure 40:
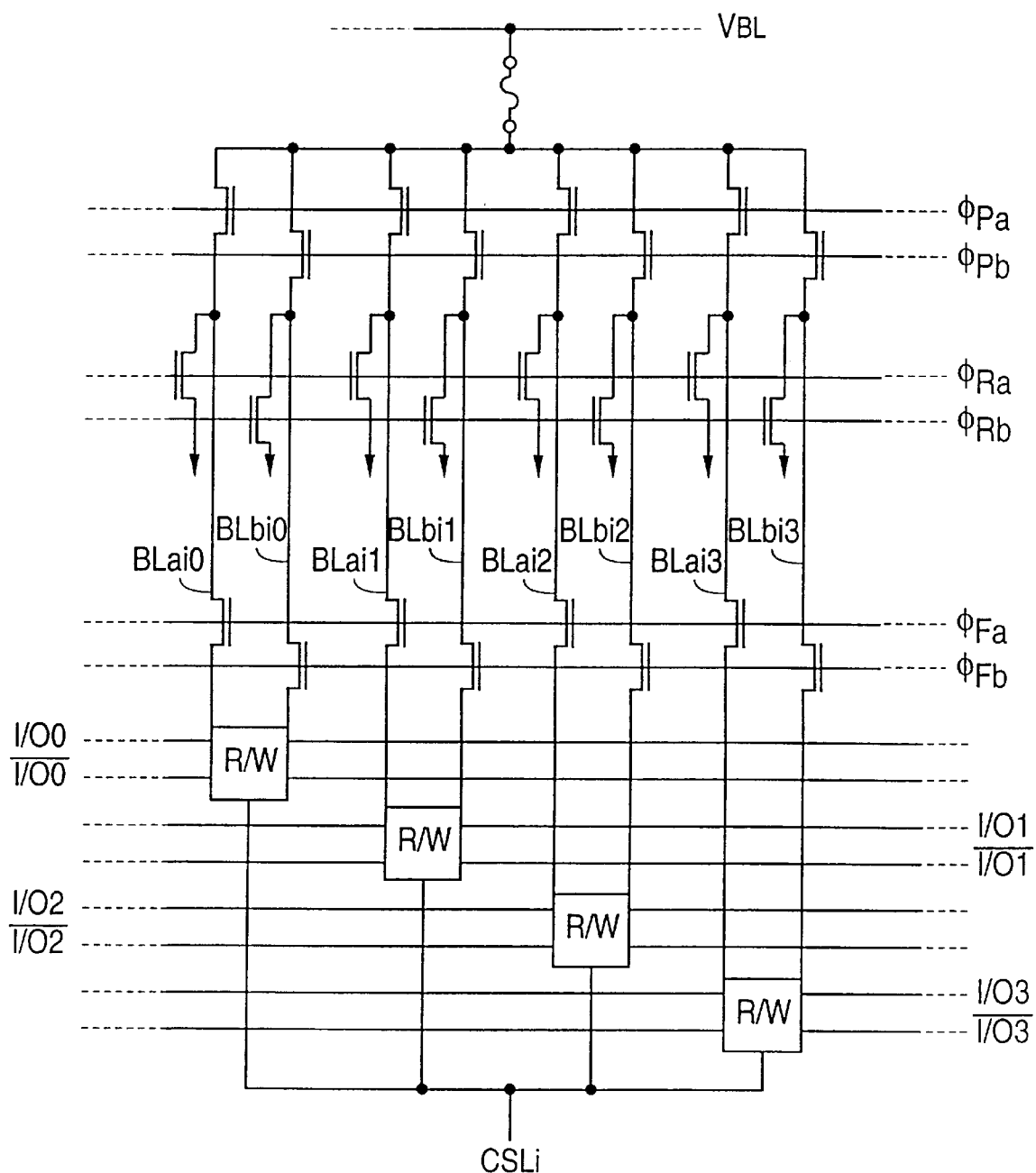

FIG. 40 is a circuit diagram showing a modification of the embodiment shown in FIG. 36.

Figure 41:
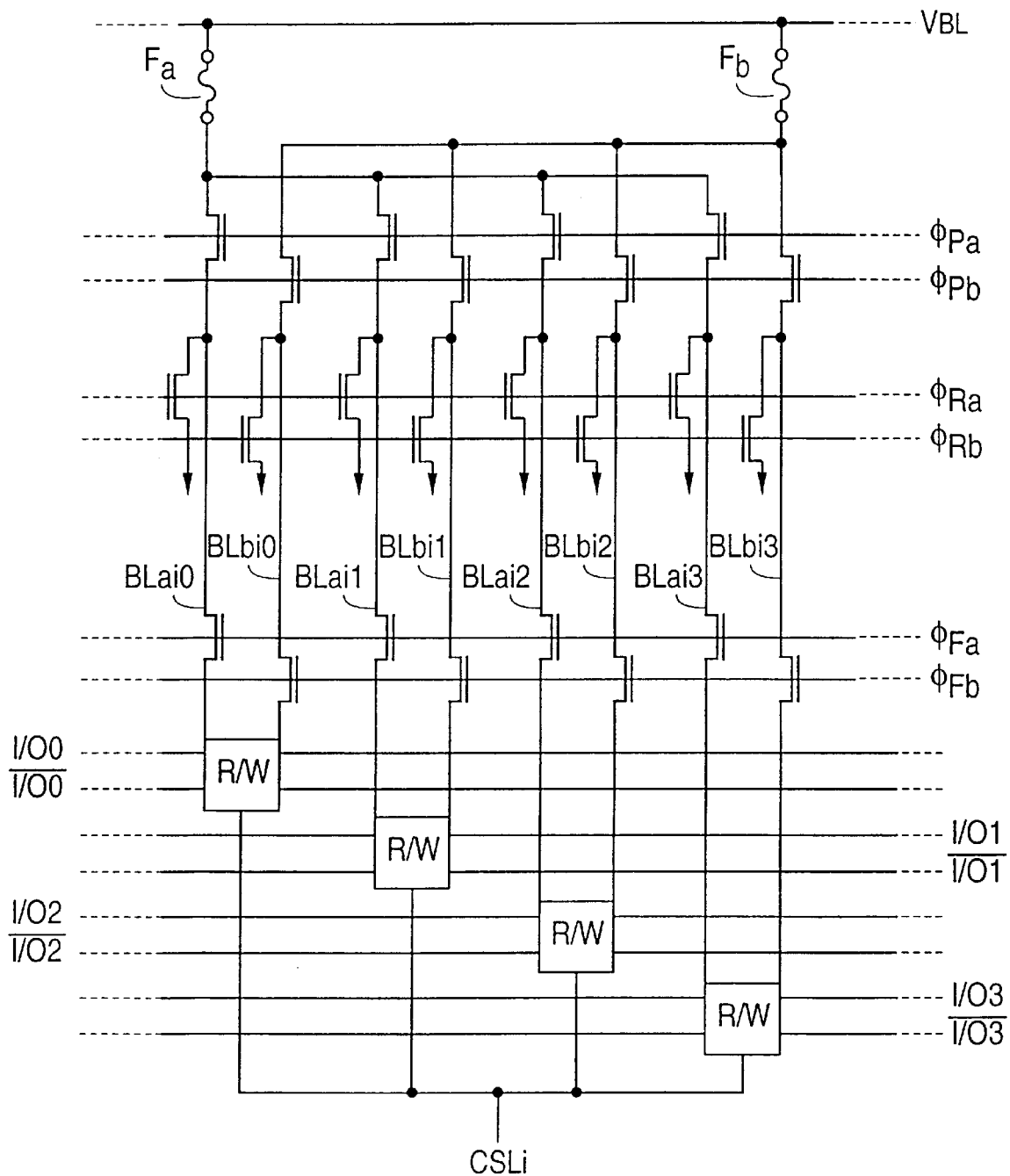

FIG. 41 is a circuit diagram showing another modification of the embodiment shown in FIG. 36.

FIGS. 42(*a*) and (*b*) are schematic diagrams illustrating the replacement of bit lines in the embodiment shown in FIG. 36.

Figure 43:
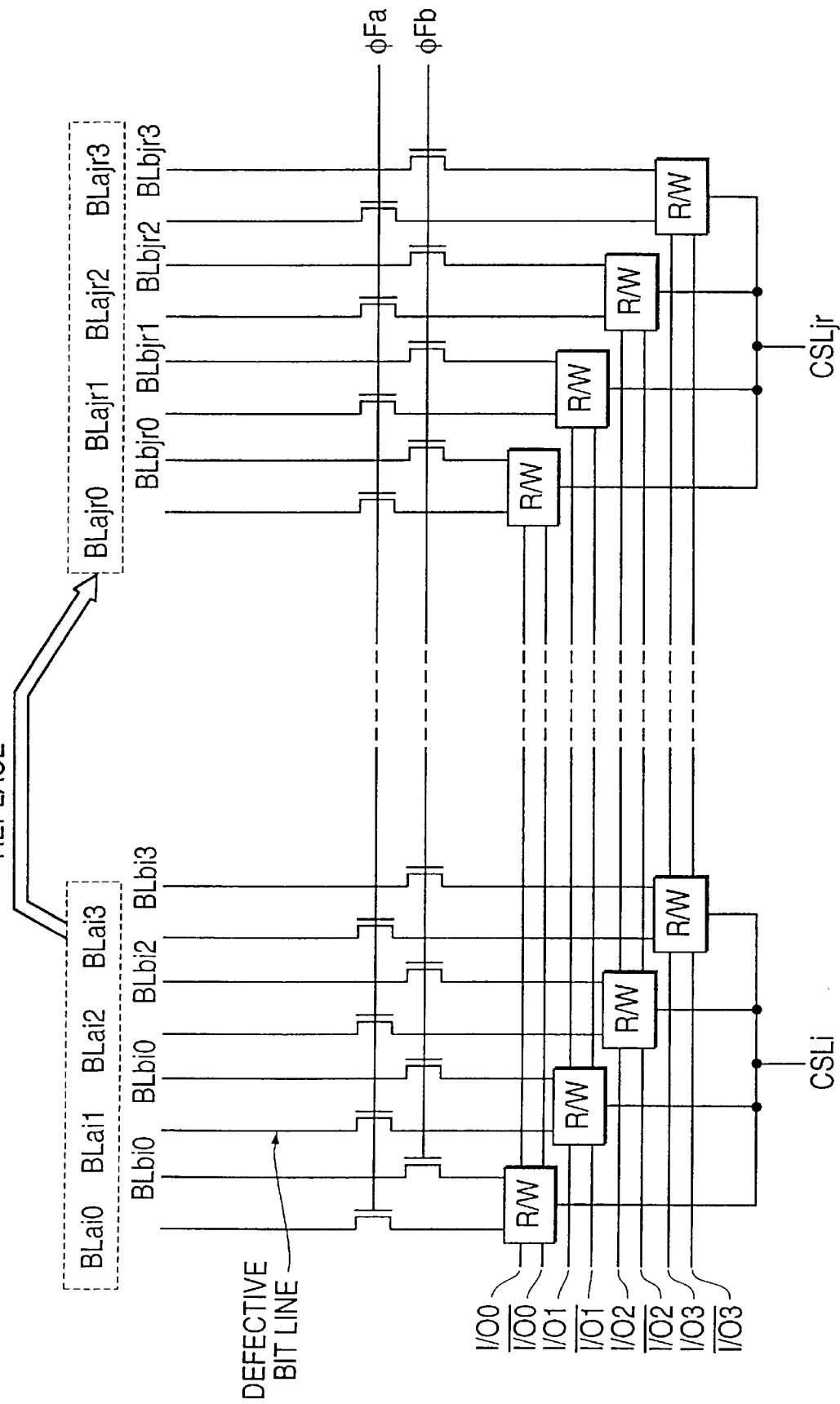

FIGS. 43 is a schematic diagram illustrating the replacement of bit lines in the embodiment shown in FIG. 36.

Figure 44:
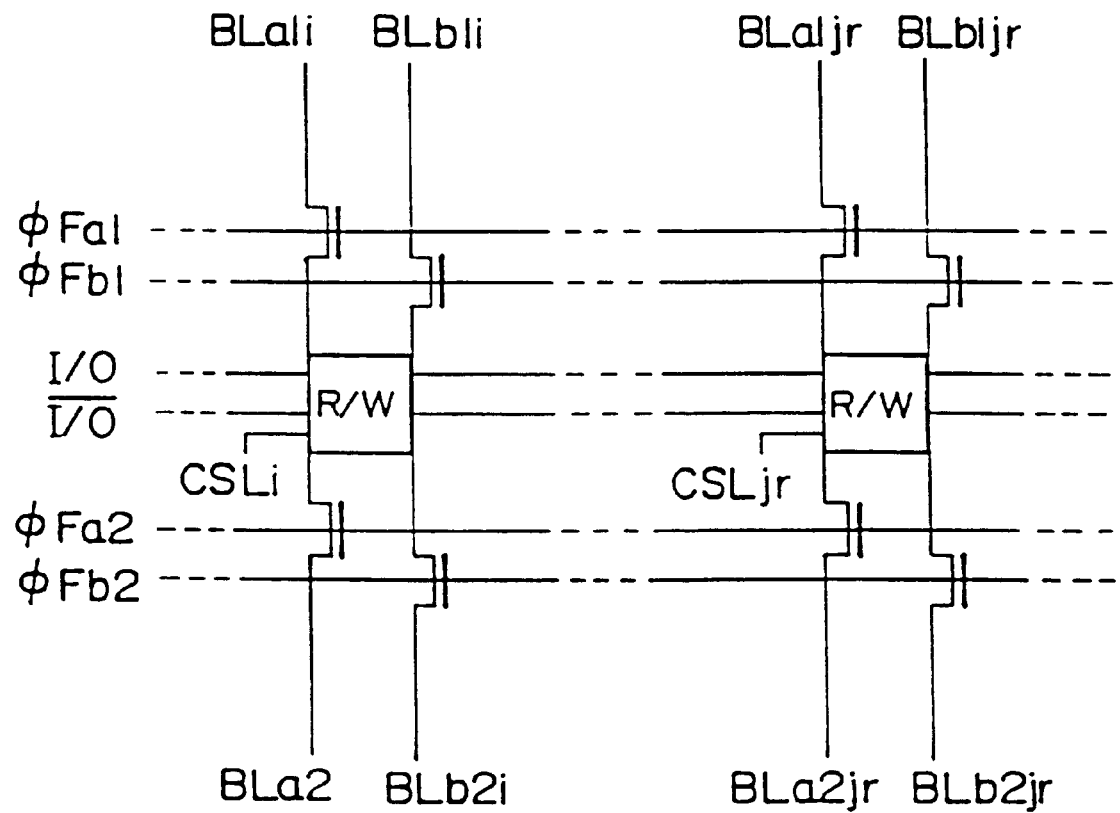

FIG. 44 is a circuit diagram showing an embodiment wherein a data latch/sense amplifier is shared by four bit lines.

FIGS. 45(*a*) and (*b*) are schematic diagrams illustrating the replacement of bit lines in the embodiment shown in FIG. 44.

Figure 46A:
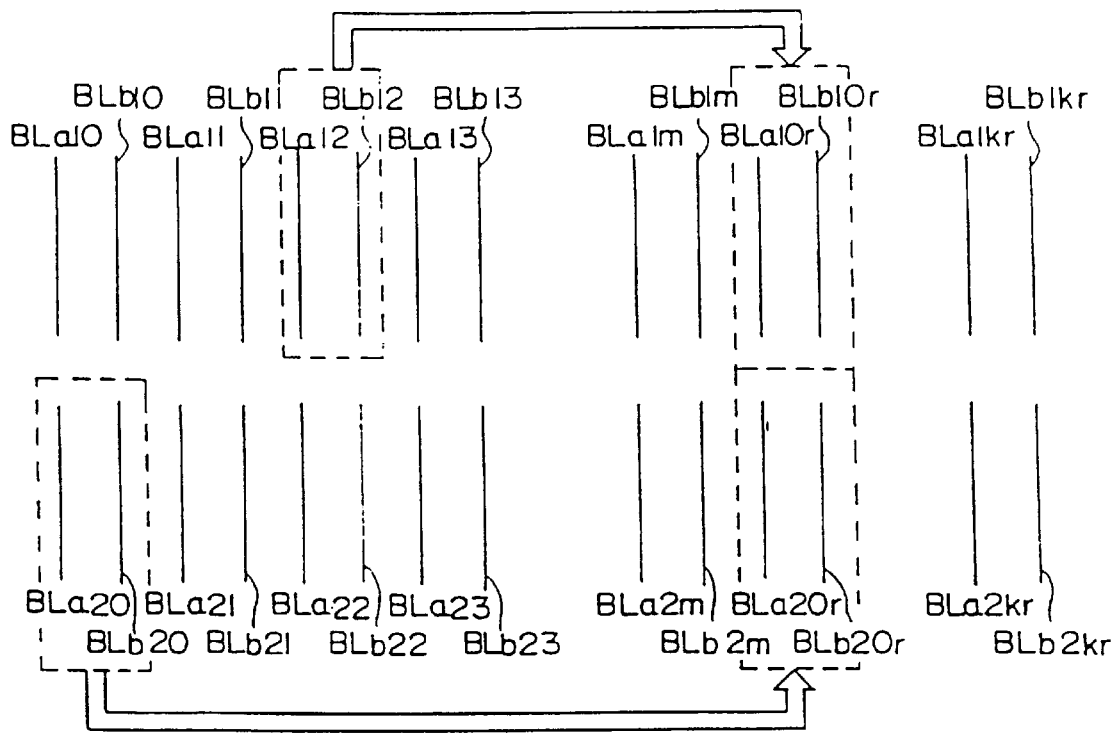

FIGS. 46(*a*) and (*b*) are schematic diagrams illustrating the replacement of bit lines in the embodiment shown in FIG. 44.

Figure 47:
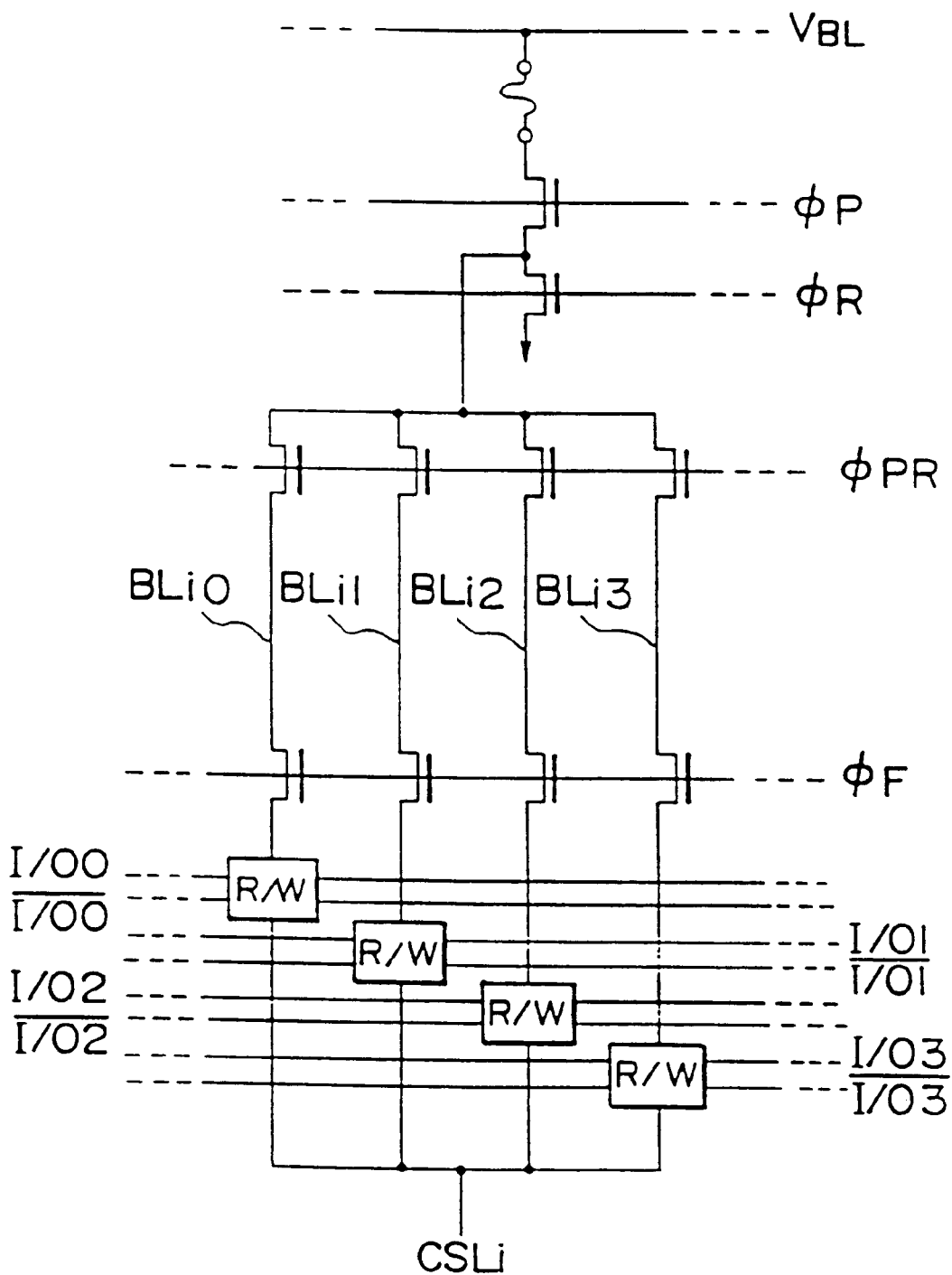

FIG. 47 is a circuit diagram showing a modification of the embodiment shown in FIG. 39.

Figure 48:
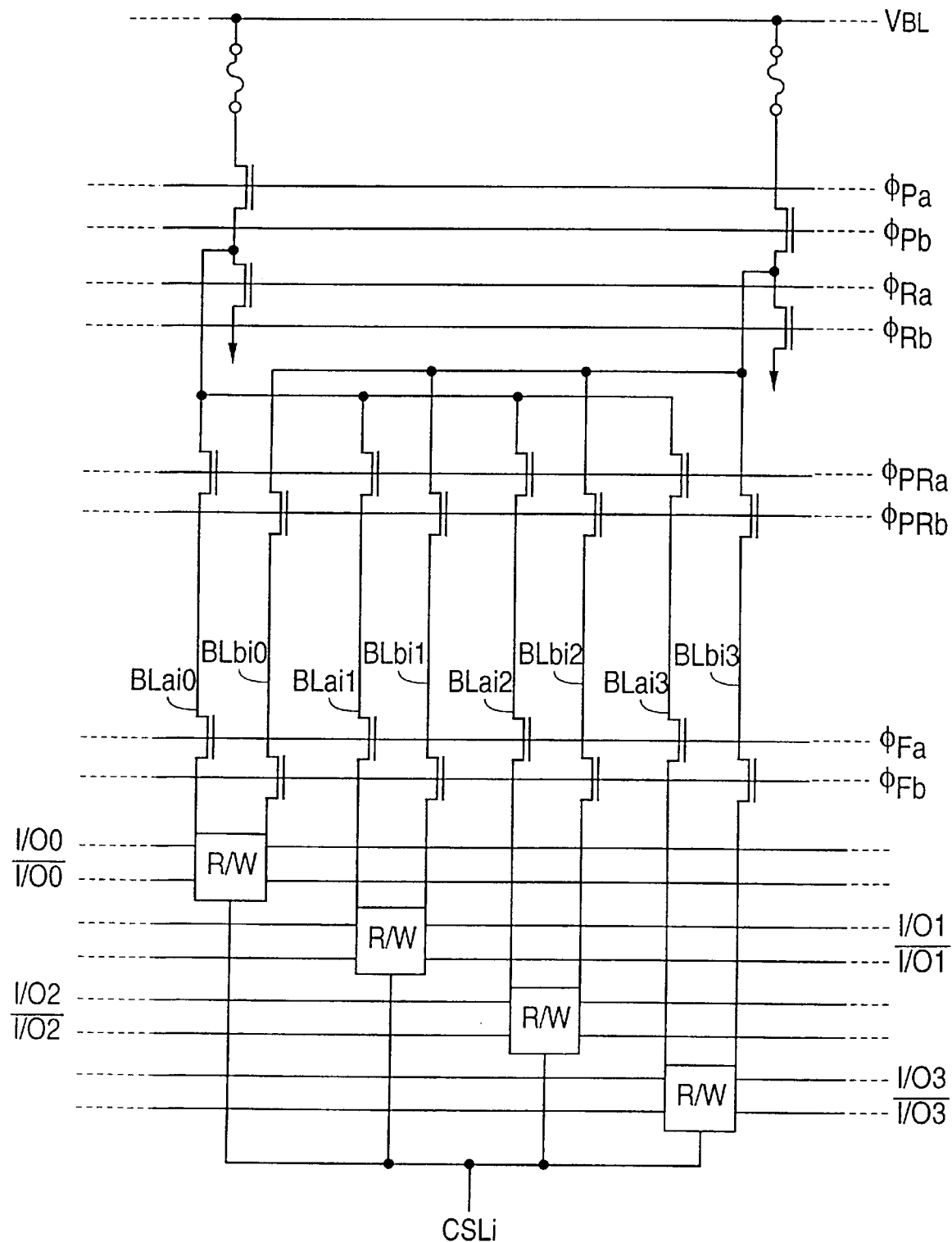

FIG. 48 is a circuit diagram showing a modification of the embodiment shown in FIG. 40.

Figure 49:
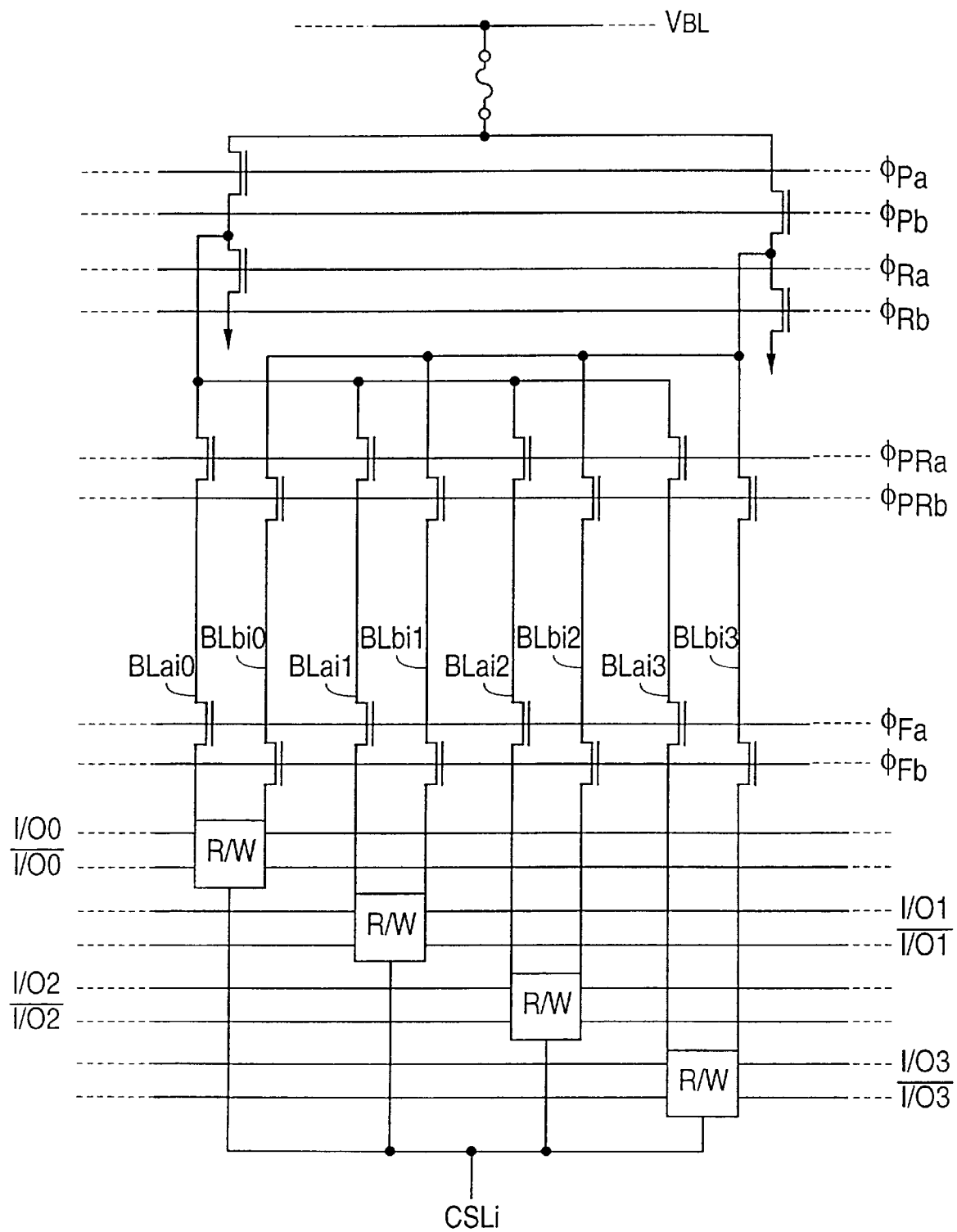

FIG. 49 is a circuit diagram showing a modification of the embodiment shown in FIG. 41.

Figure 50:
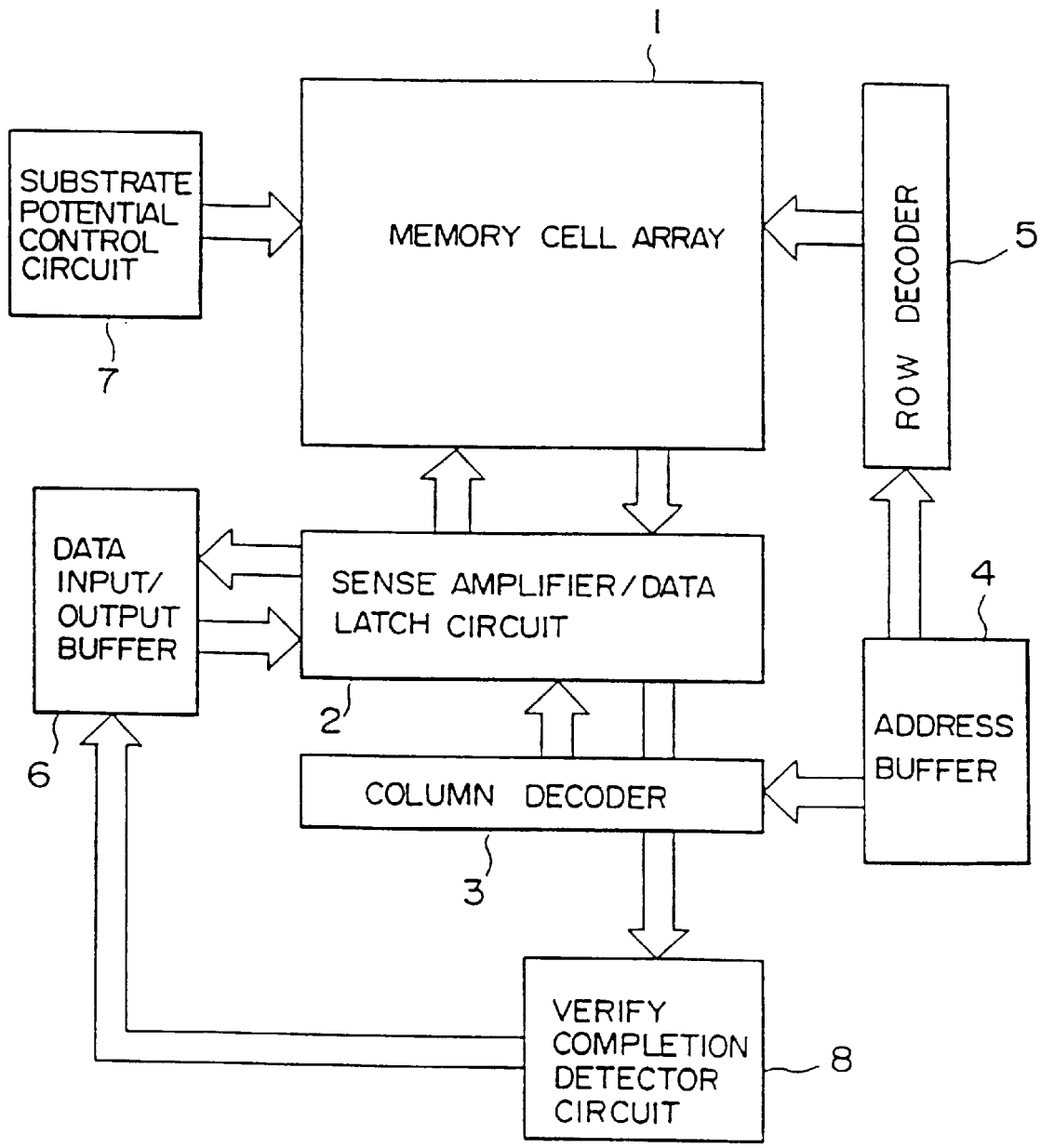

FIG. 50 is a block diagram showing a seventh embodiment of a non-volatile semiconductor memory device according to the present invention.

Figure 51:
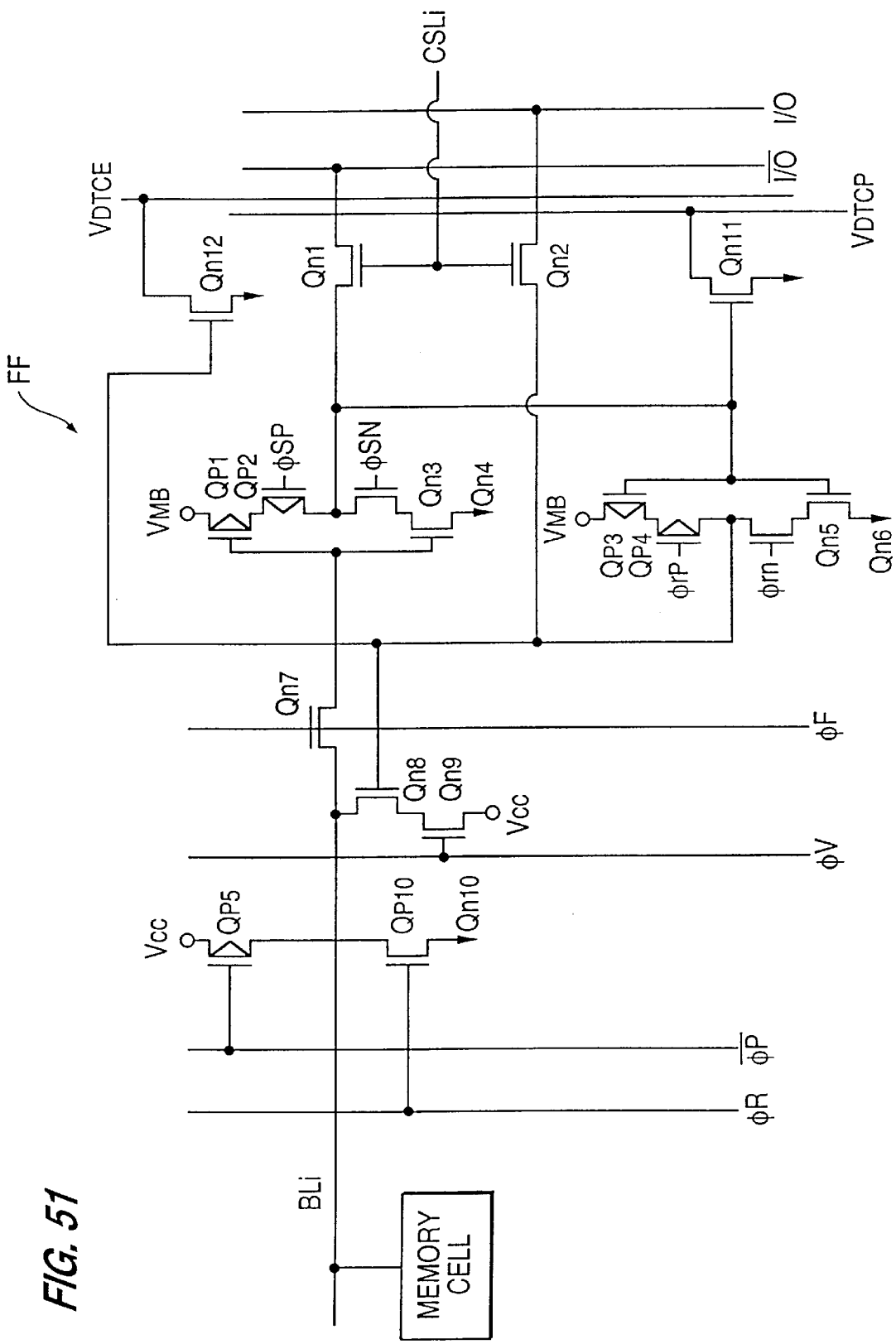

FIG. 51 is a circuit diagram of the sense amplifier/latch circuit of the seventh embodiment.

Figure 52:
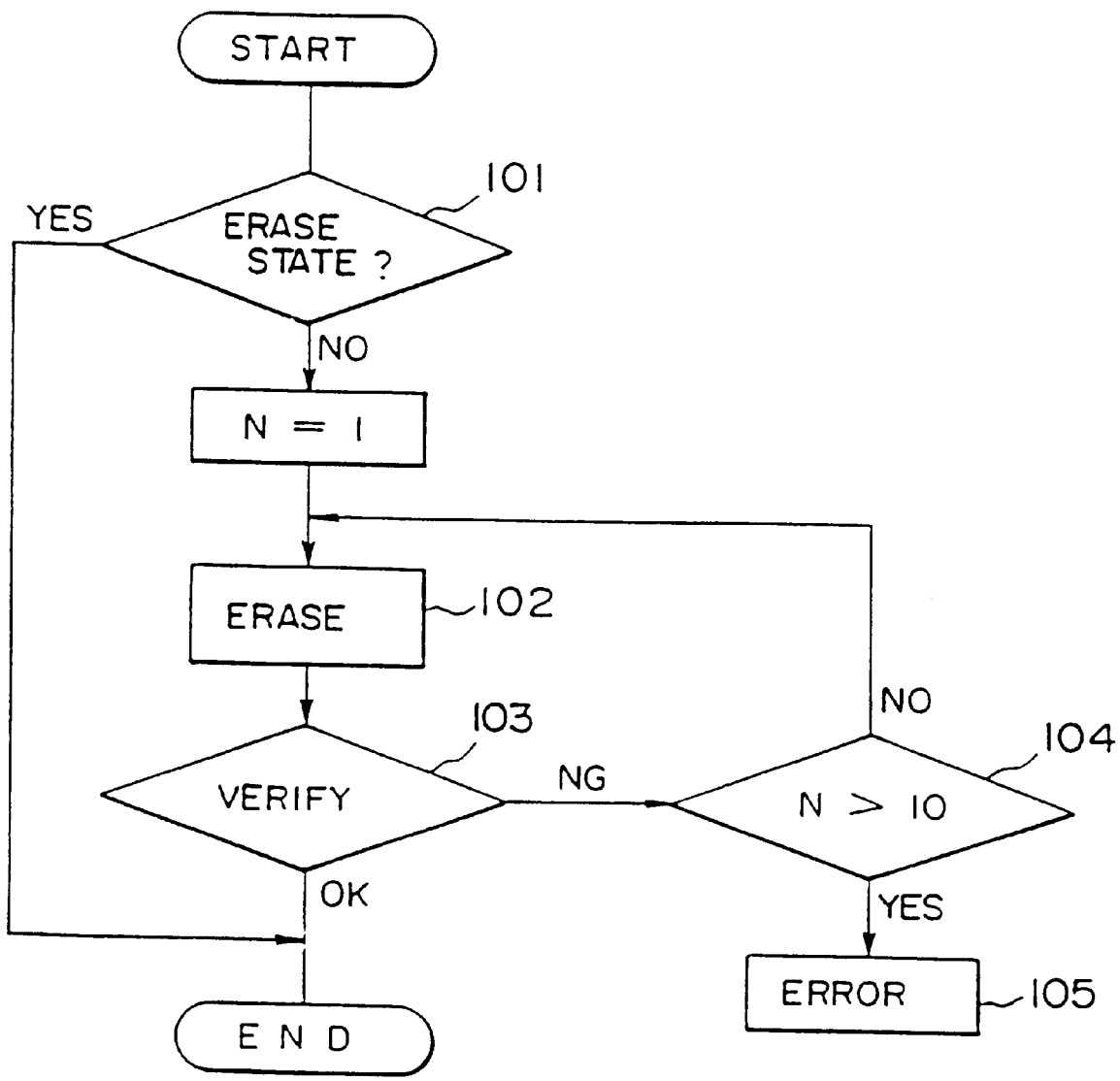

FIG. 52 is a flow chart illustrating the erase operation of the seventh embodiment.

Figure 53:
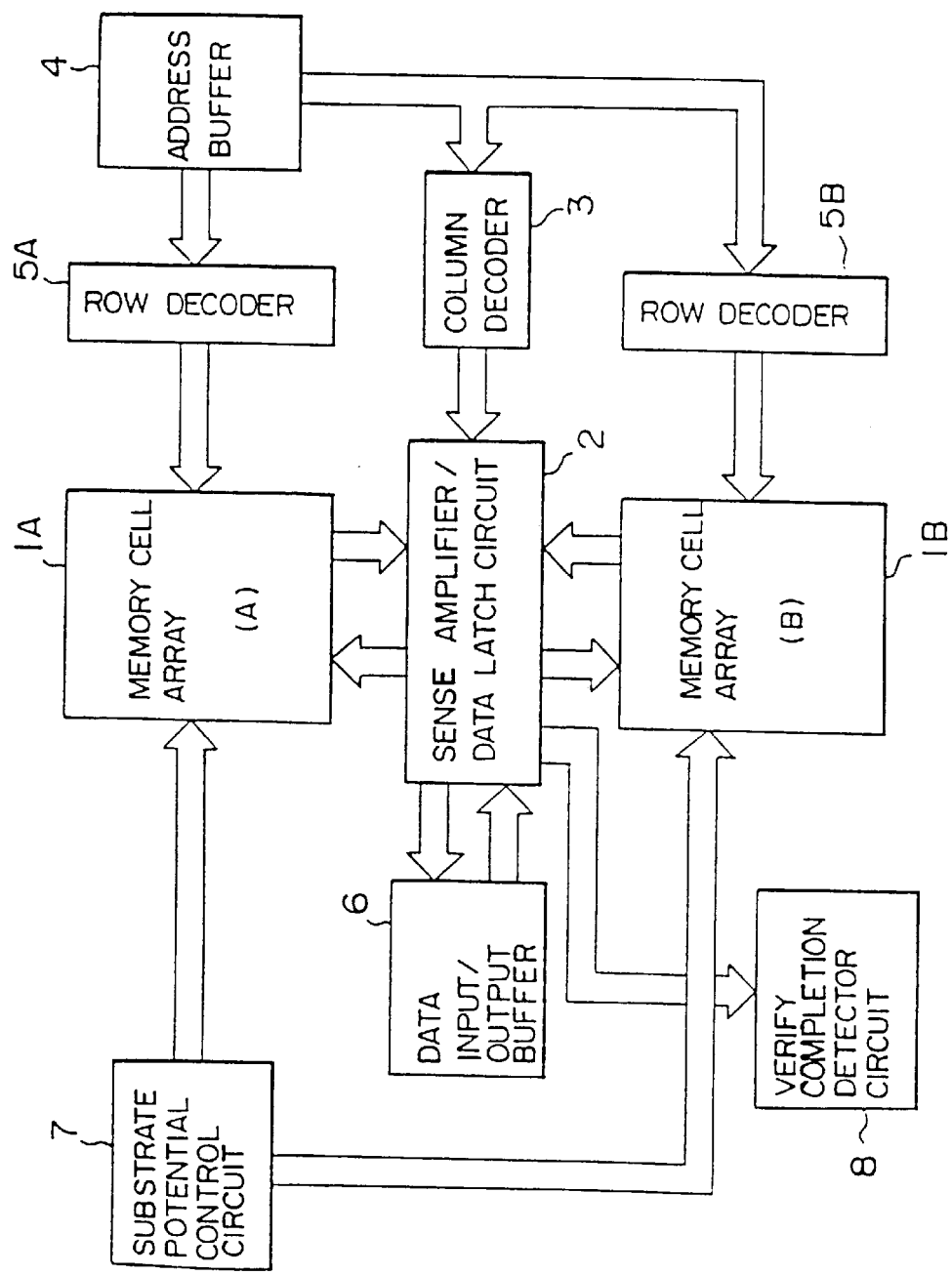

FIG. 53 is a block diagram showing an eighth embodiment of the present invention.

Figure 54:
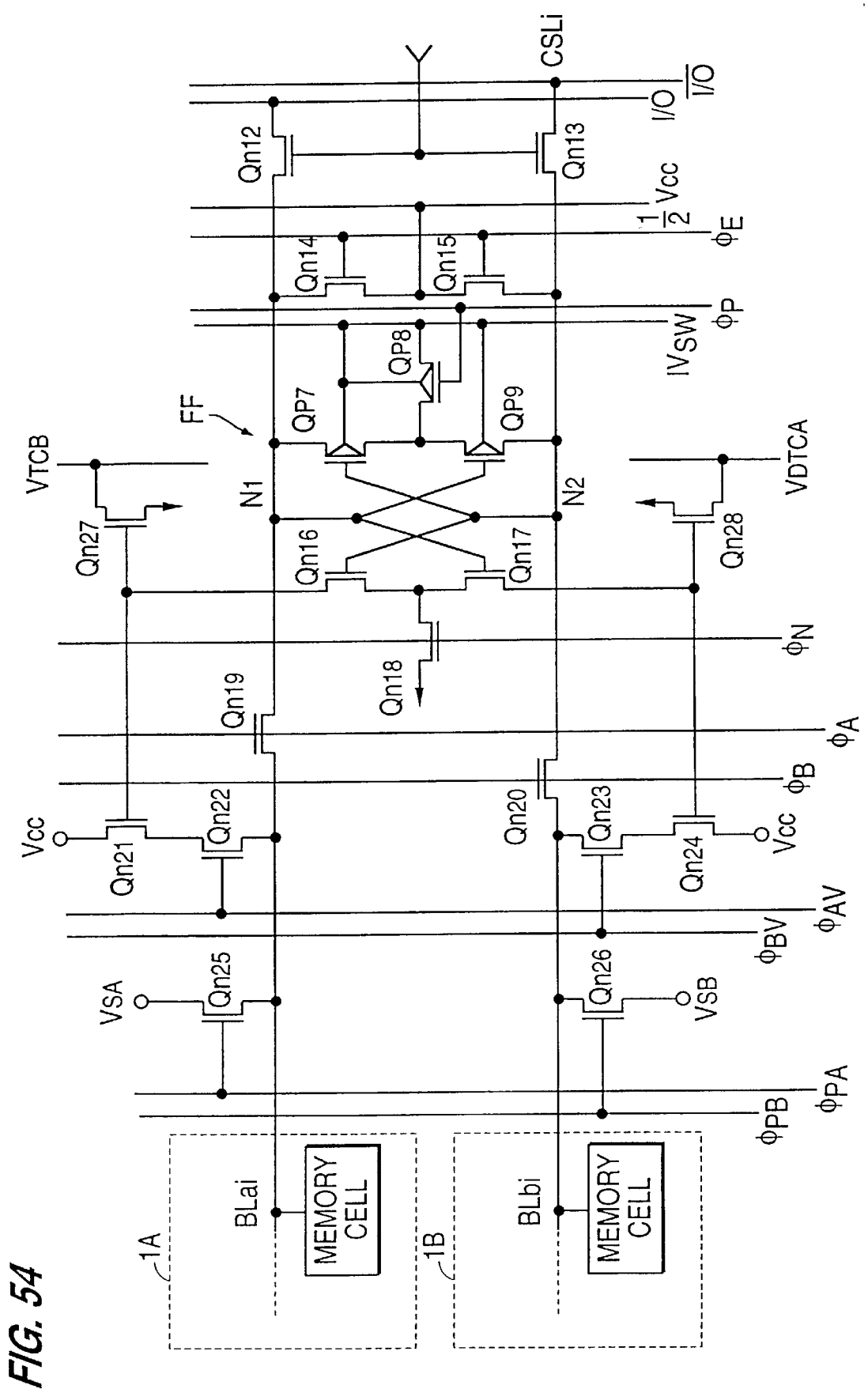

FIG. 54 is a circuit diagram of the sense amplifier/latch circuit of the eighth embodiment.

Figure 55:
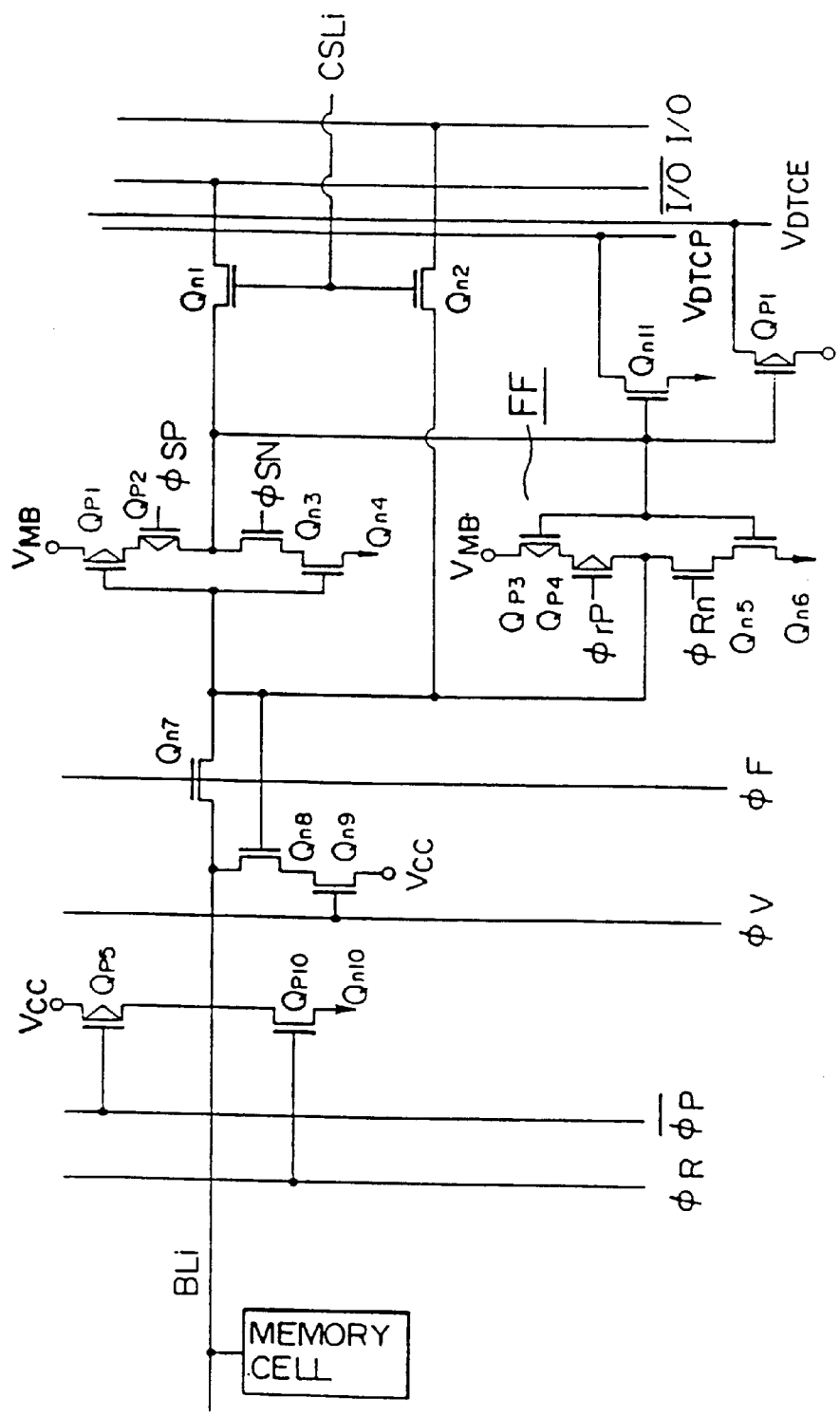

FIG. 55 is a circuit diagram of a sense amplifier/latch circuit according to a ninth embodiment 5 of the present invention.

Figure 56:
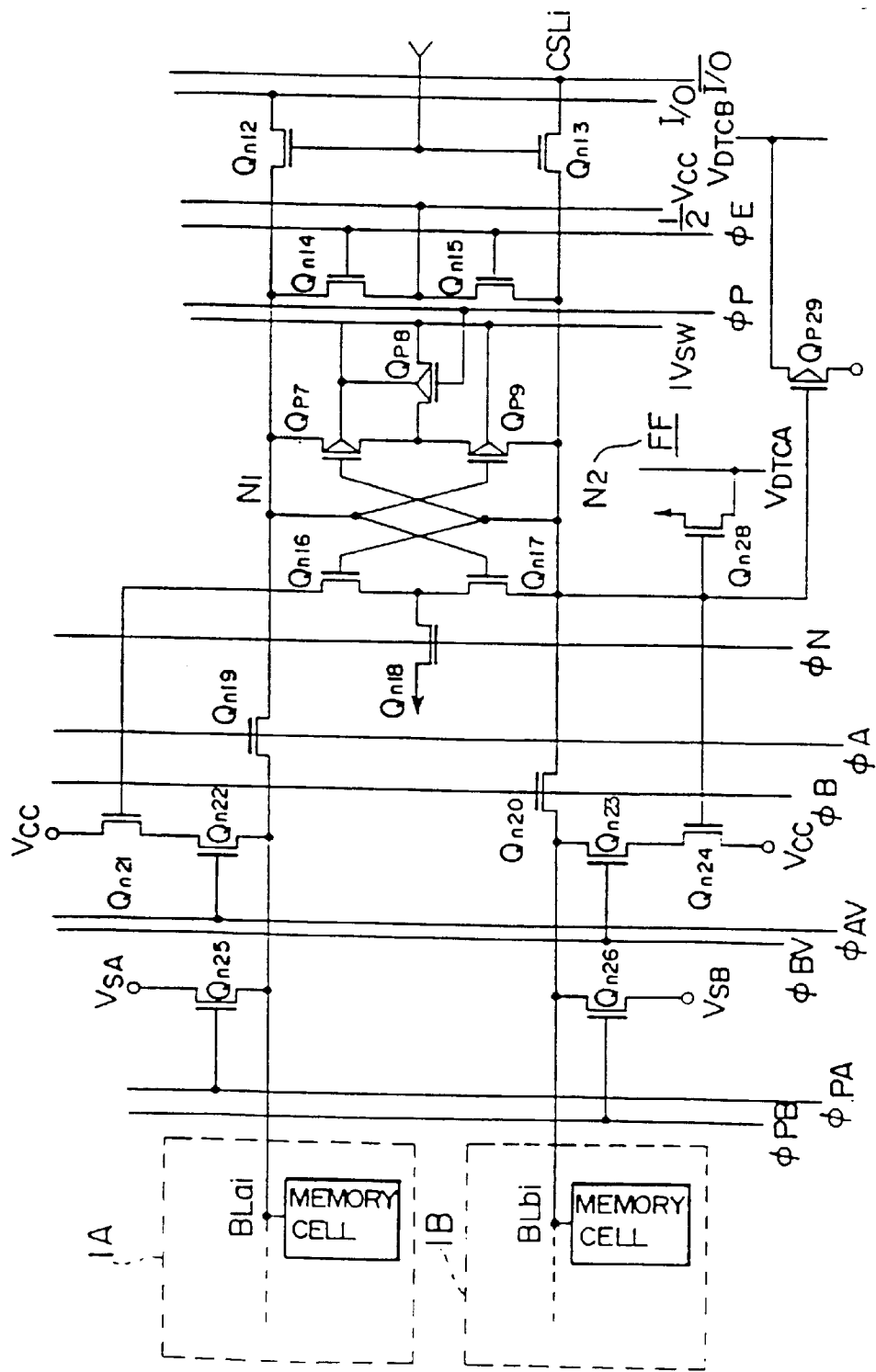

FIG. 56 is a circuit diagram of a sense amplifier/latch circuit according to a tenth embodiment of the present invention.

Figure 57A:
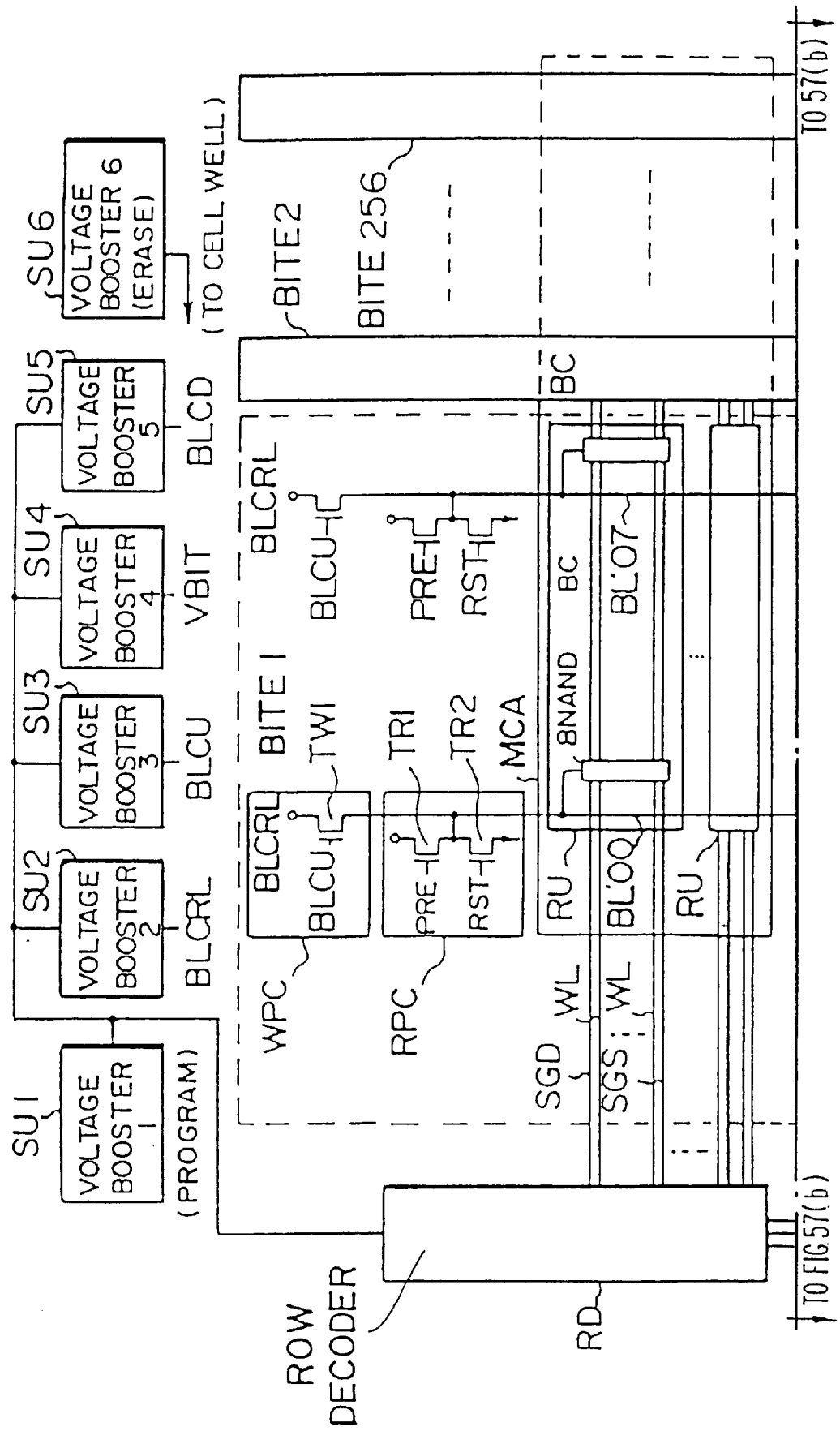
Figure 57B:
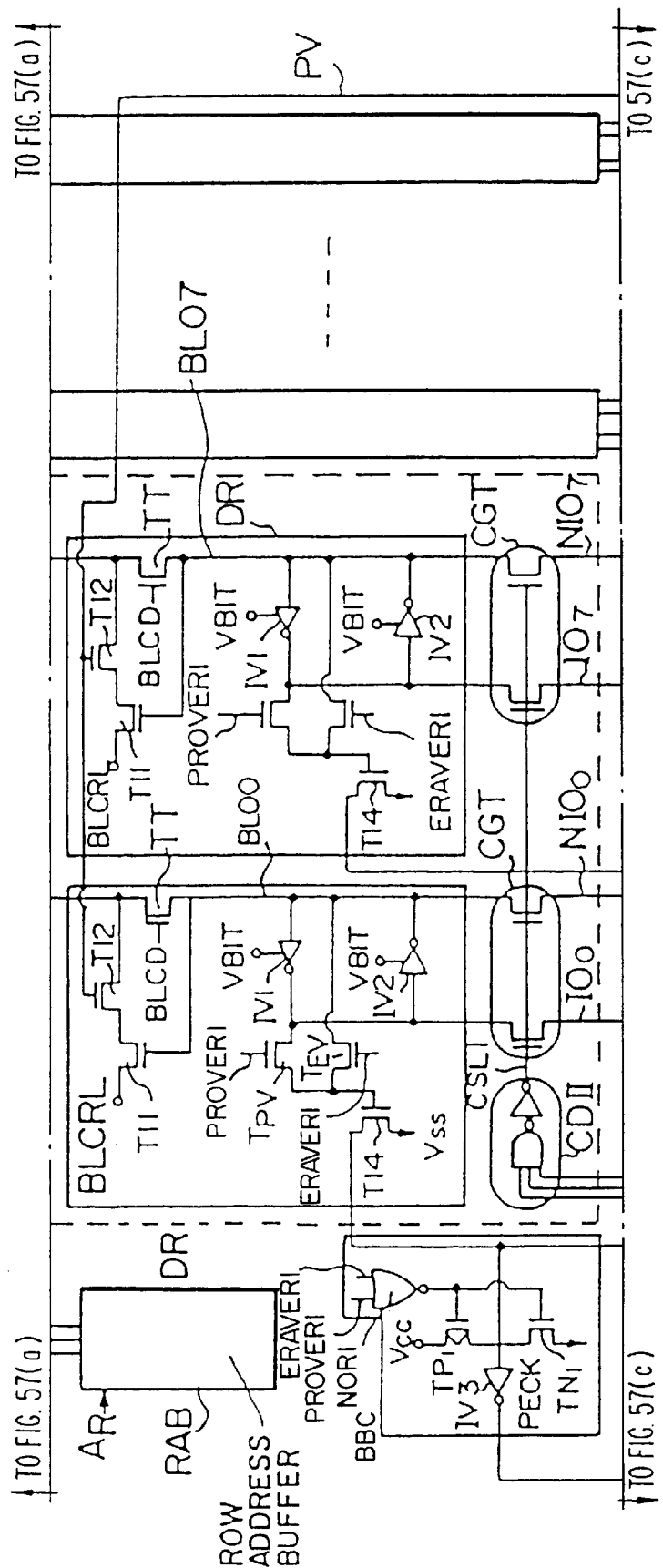
Figure 57C:
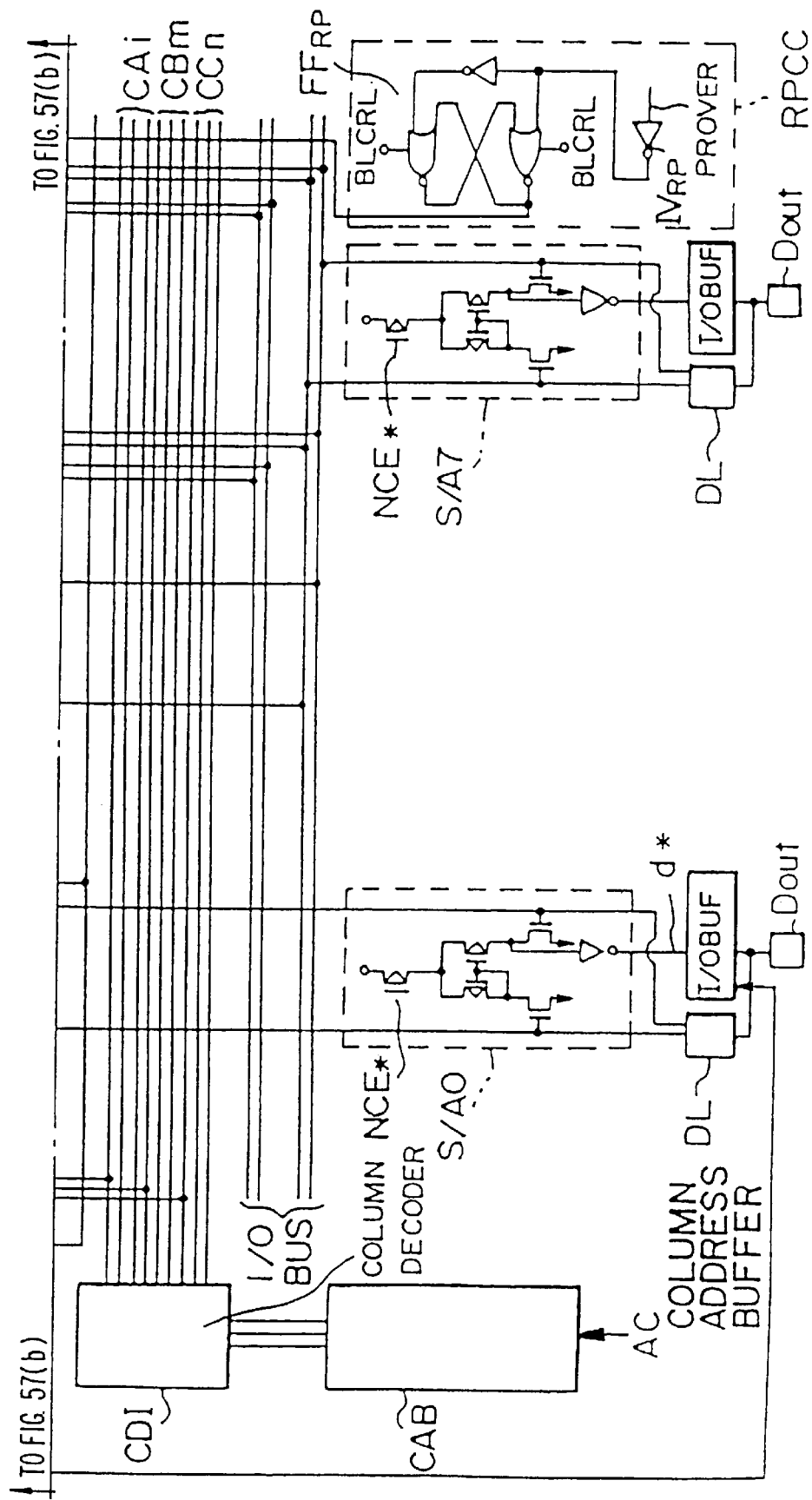

FIG. 57 shows the overall structure of a memory 10 system according to an eleventh embodiment of the present invention.

Figure 58:
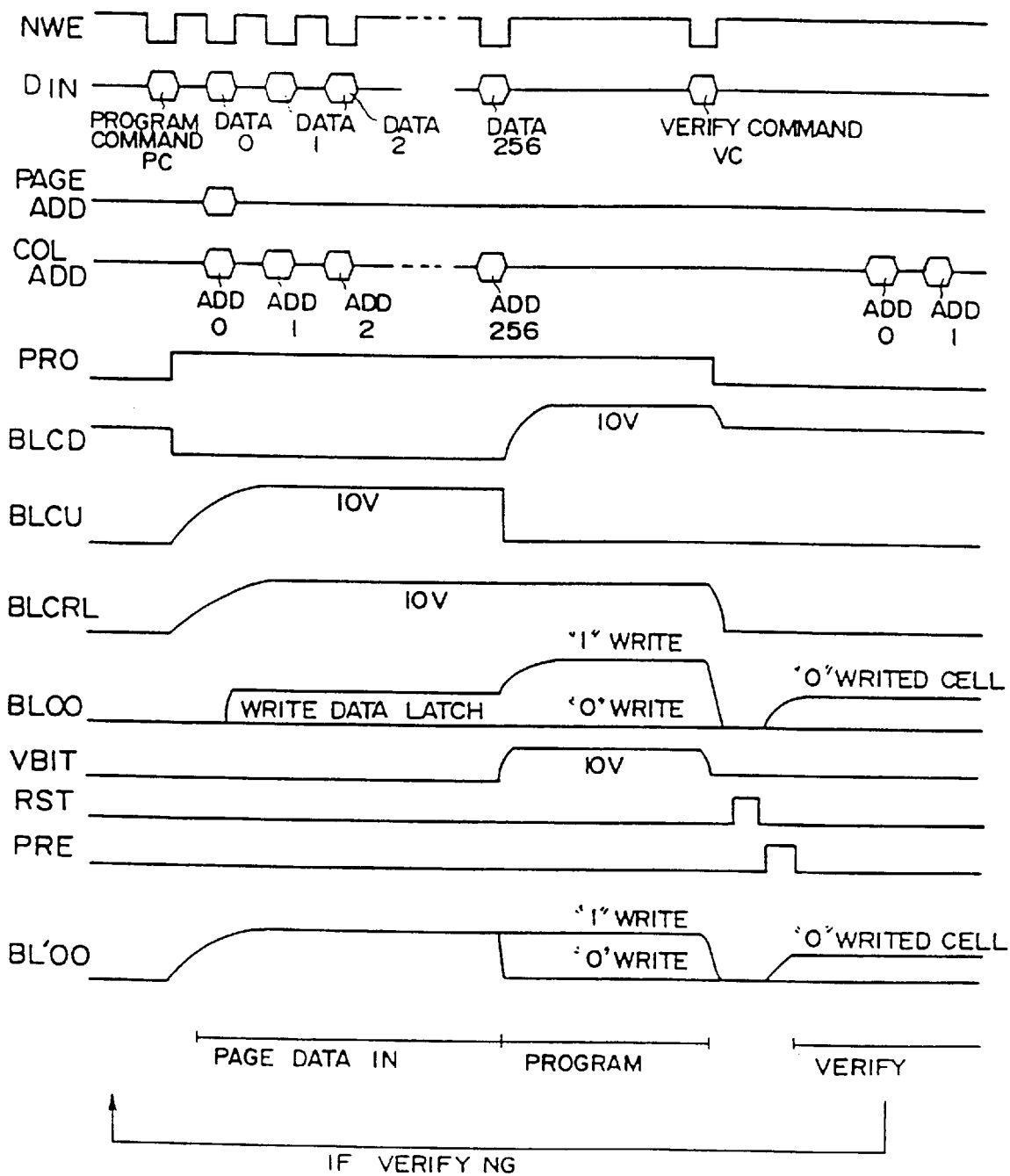

FIG. 58 is a timing chart illustrating the operation of the embodiment shown in FIG. 57.

Figure 59:
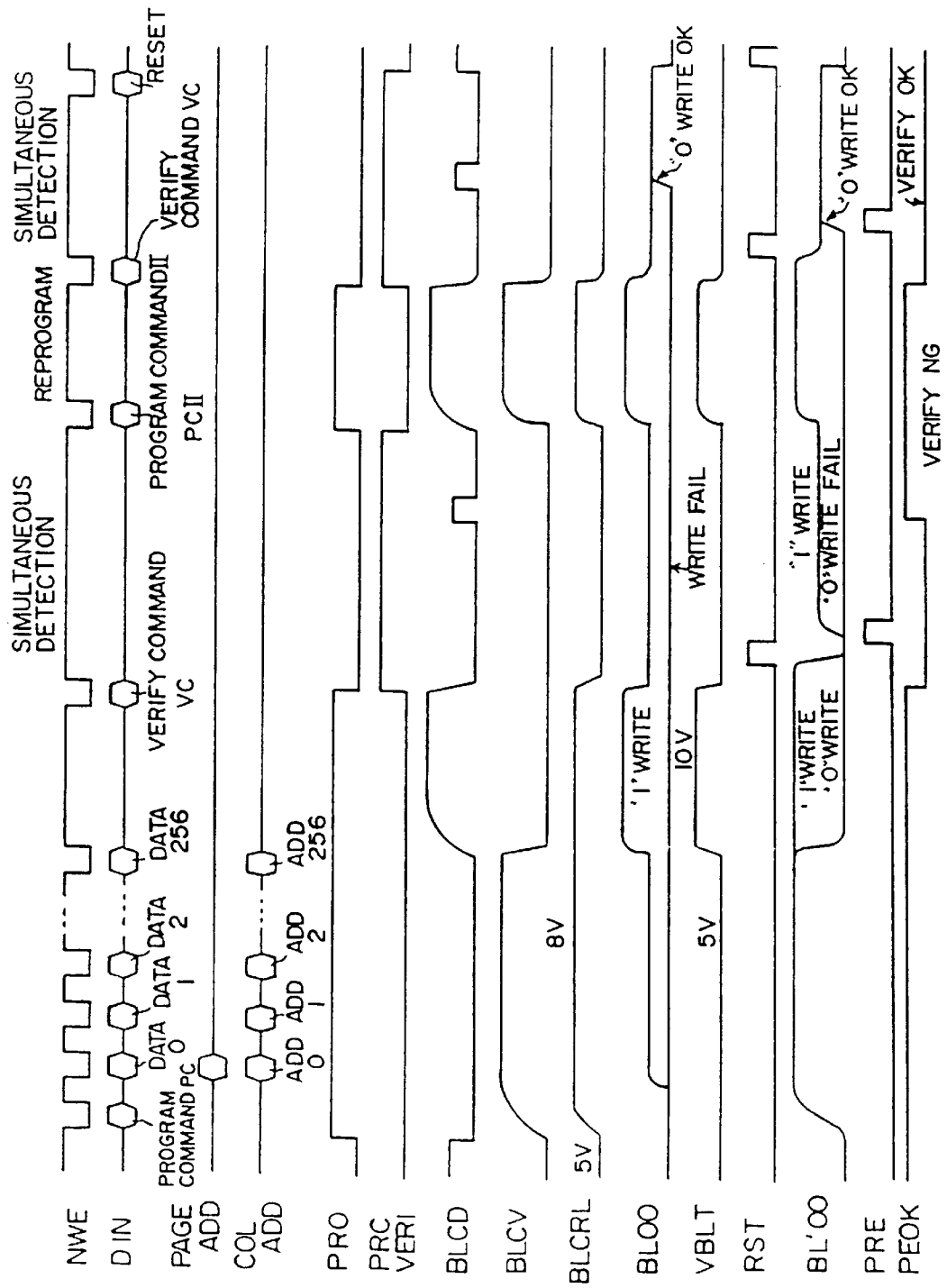

FIG. 59 is a timing chart illustrating the read 15 margin in the embodiment shown in FIG. 57.

Figure 60:
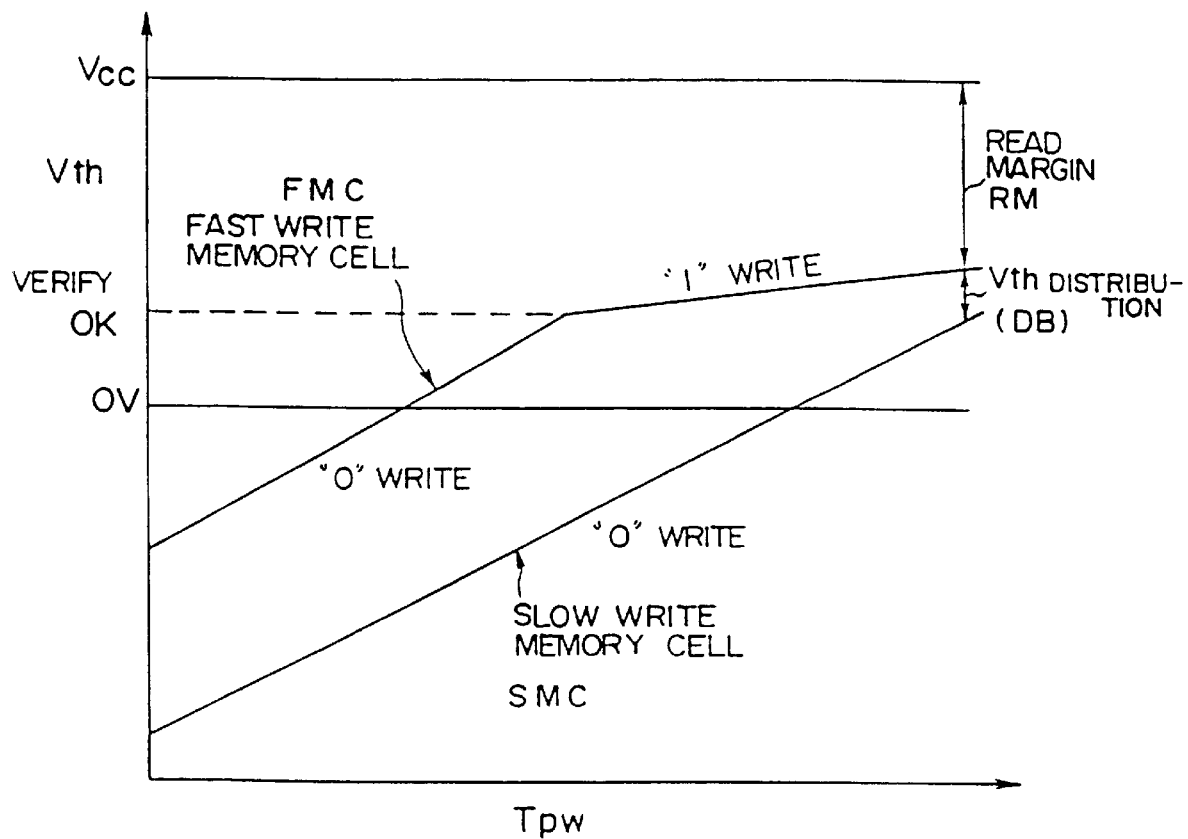

FIG. 60 is a graph showing the distribution of threshold values during the write operation of the embodiment shown in FIG. 57.

Figure 61:
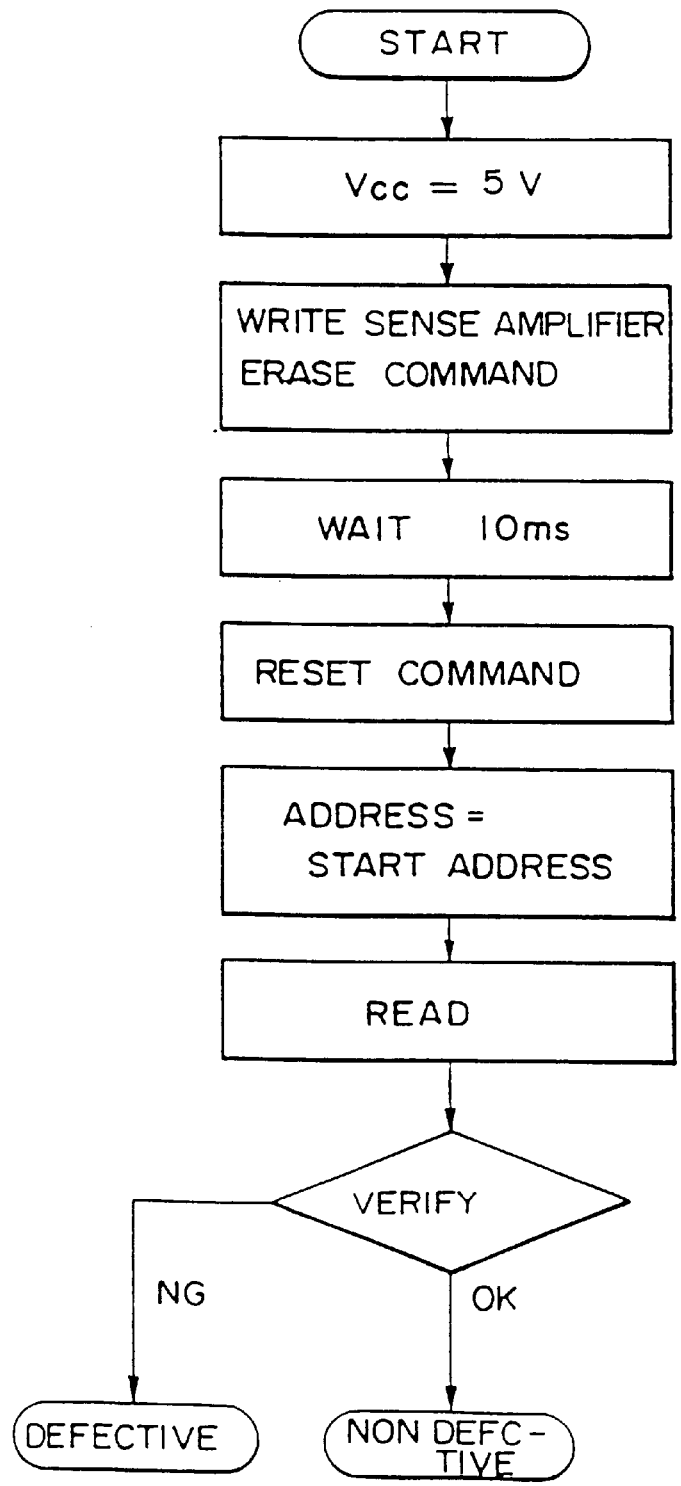

FIG. 61 is a flow chart illustrating the operation of the erase mode.

Figure 62:
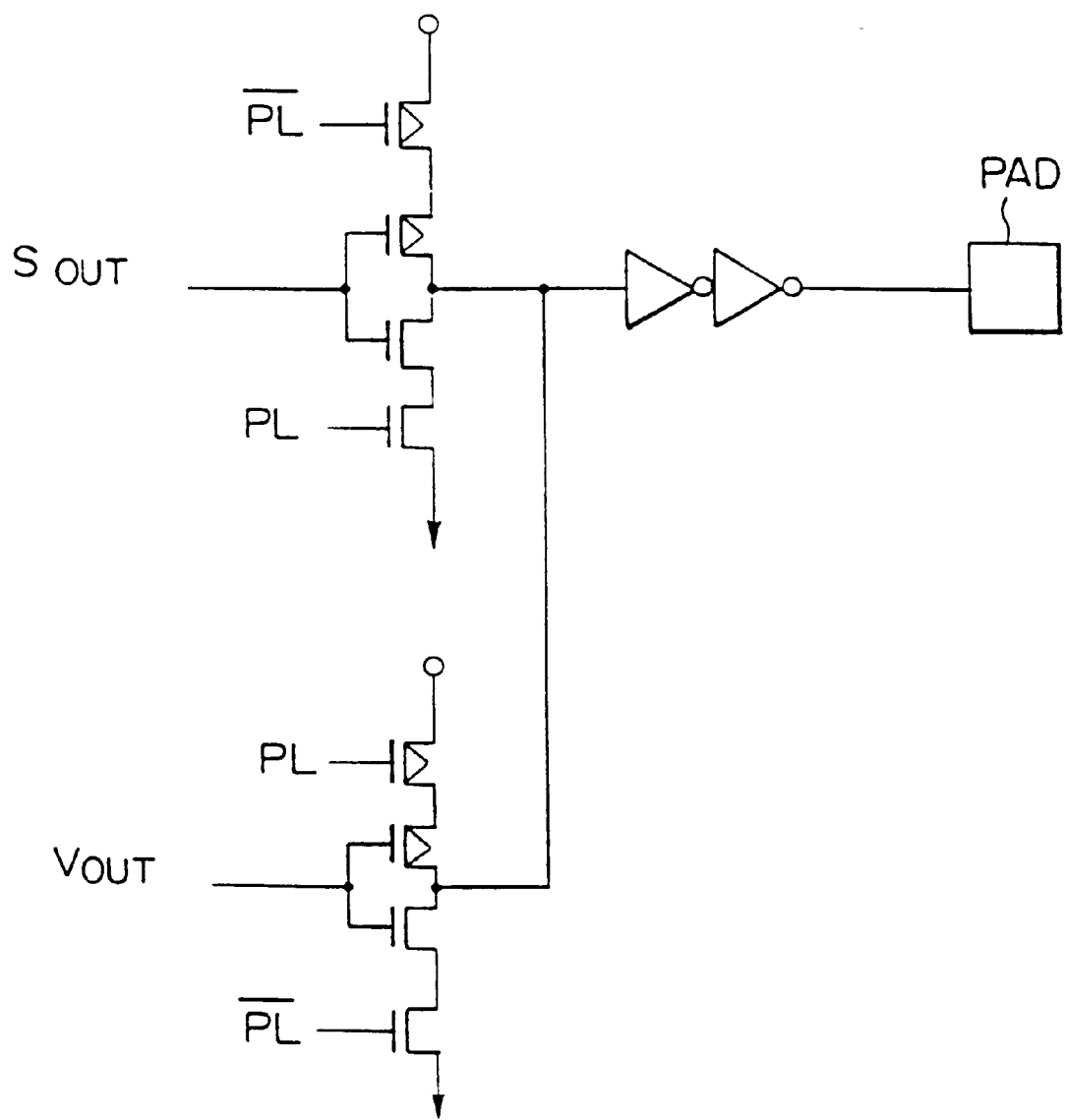

FIG. 62 shows the detailed circuit diagram of the output circuit shown in FIG. 57.

Figure 63:
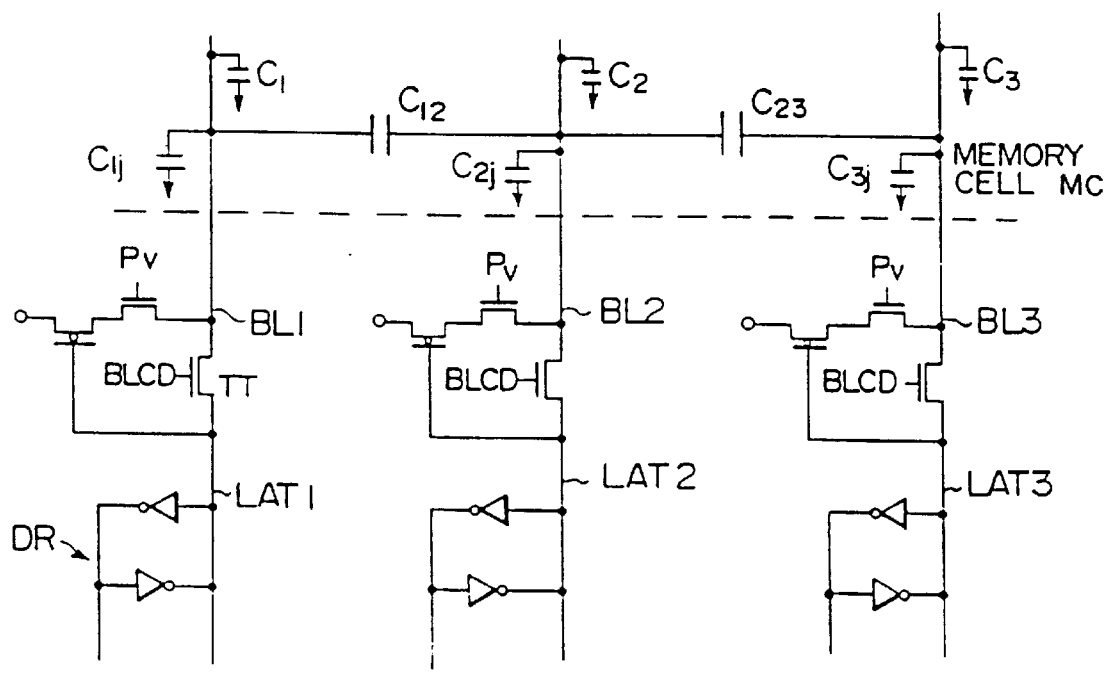

FIG. 63 is a circuit diagram showing part of a conventional memory.

Figure 64:
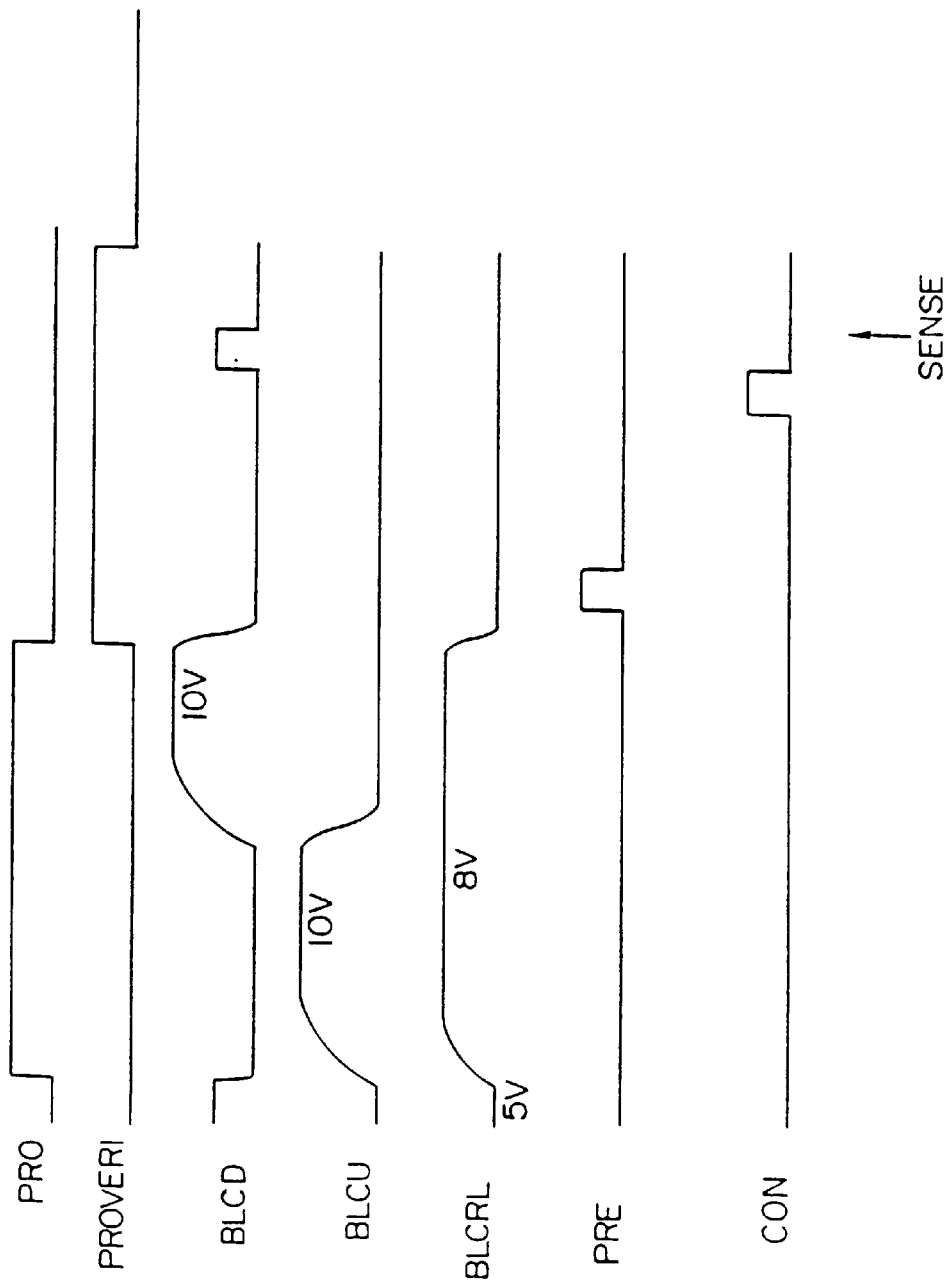
Figure 65A:
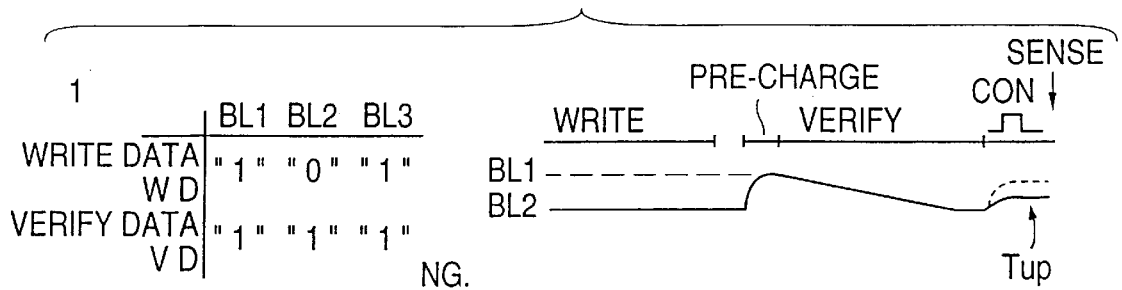
Figure 65B:
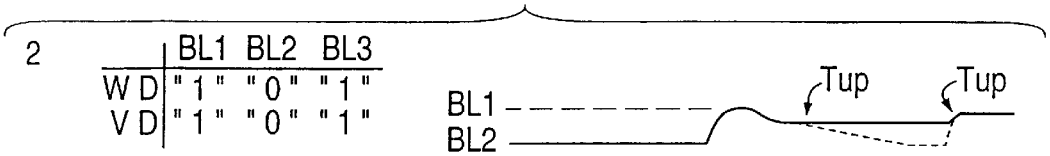
Figure 65C:
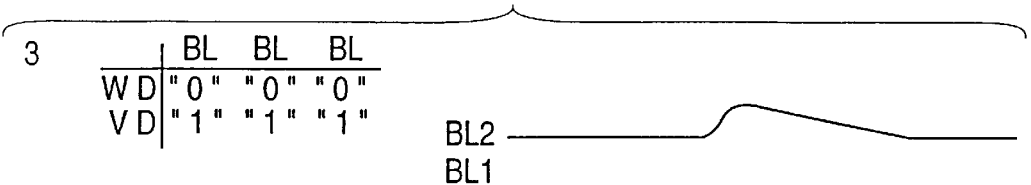
Figure 65D:
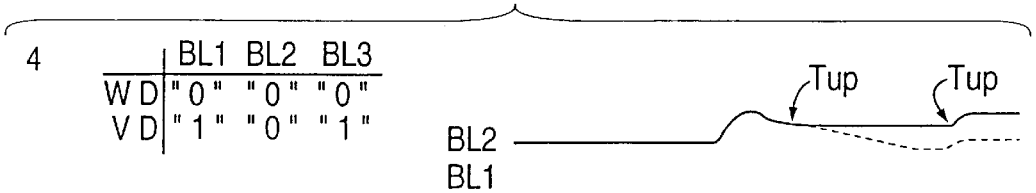
Figure 65E:
Figure 65F:
Figure 65G:
Figure 65H:
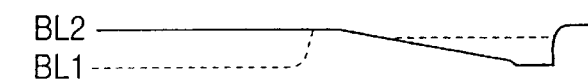

FIG. 64 is a timing chart illustrating the program verify operation.

FIG. 65 is a diagram showing combinations of write data WD and verify data VD.

FIG. 66 illustrates the distribution of potential levels after the verify operation and the dependency of a bit line on the threshold value.

Figure 67:
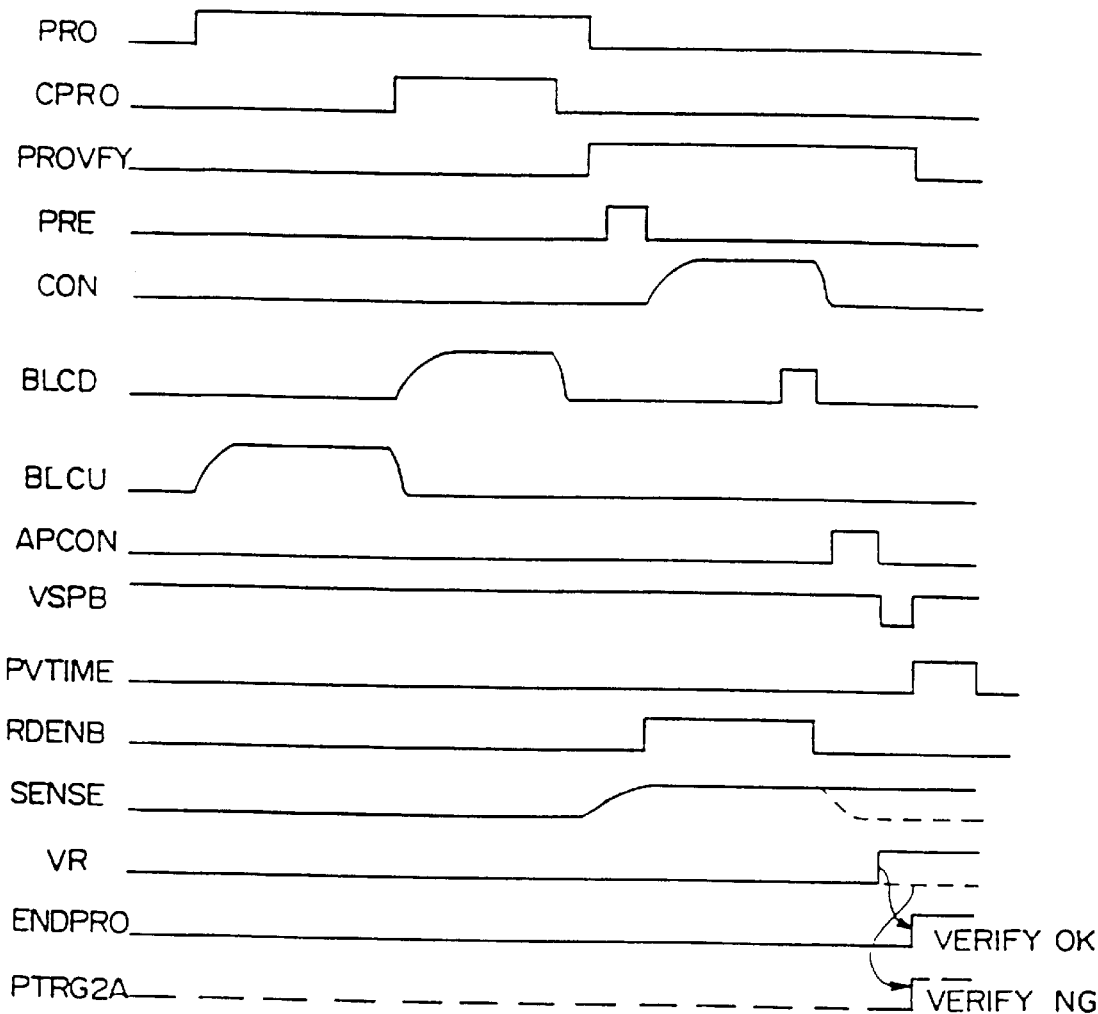
Figure 68A:
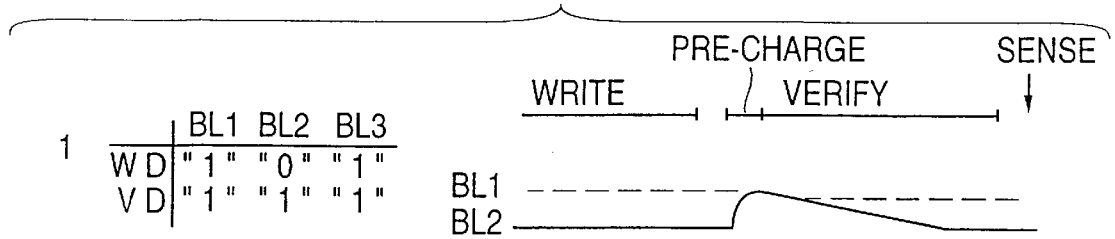
Figure 68B:
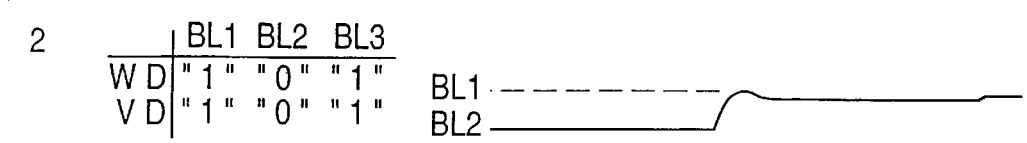
Figure 68C:
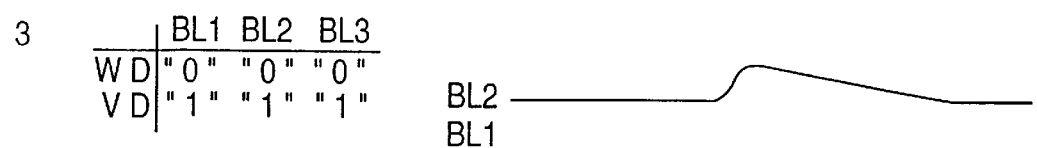
Figure 68D:
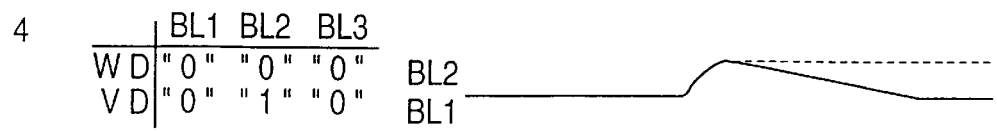
Figure 68E:
Figure 68F:
Figure 68G:
Figure 68H:
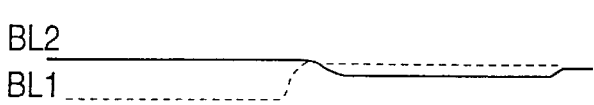

FIG. 67 is a timing chart of the program verify operation.

FIG. 68 is a diagram showing combinations of write data WD and verify data VD.

FIG. 69 illustrates the distribution of potential levels after the verify operation and the dependency of a bit line on the threshold value.

Figure 70A:
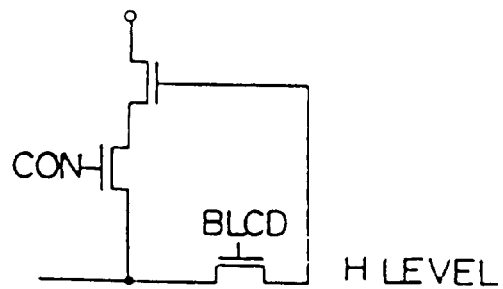
Figure 70B:
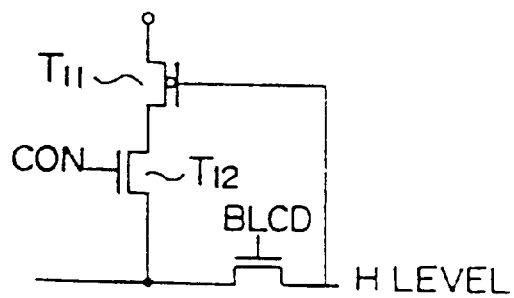
Figure 70C:
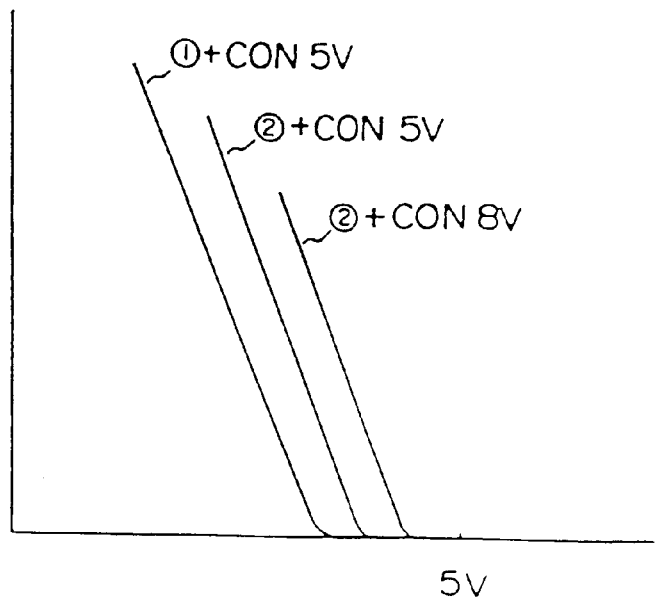

FIGS. 70(*a*), (*b*) and (*c*) show other examples of rewriting transistors.

Figure 71:
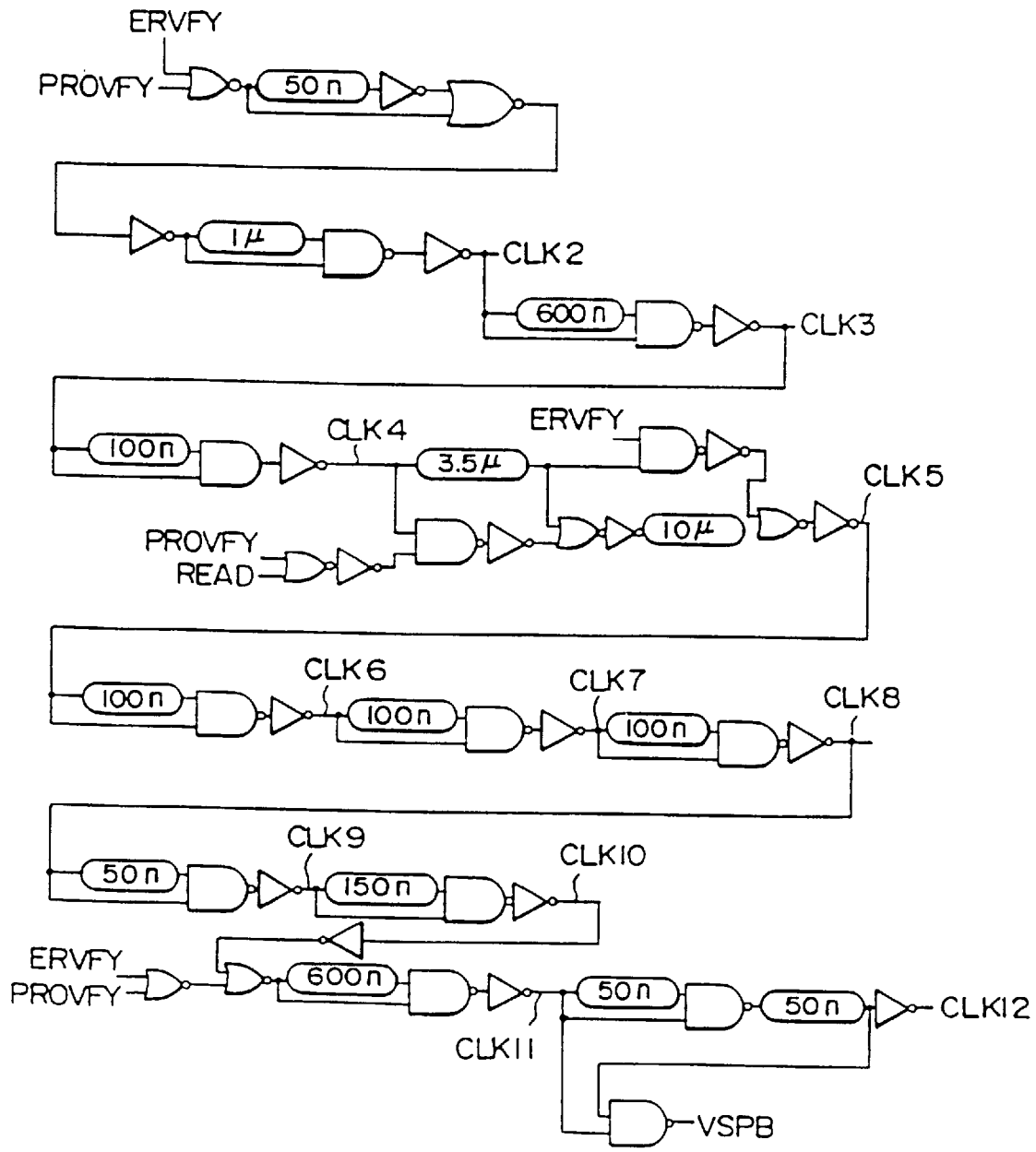

FIG. 71 shows a general circuit embodying the present invention.

Figure 72:
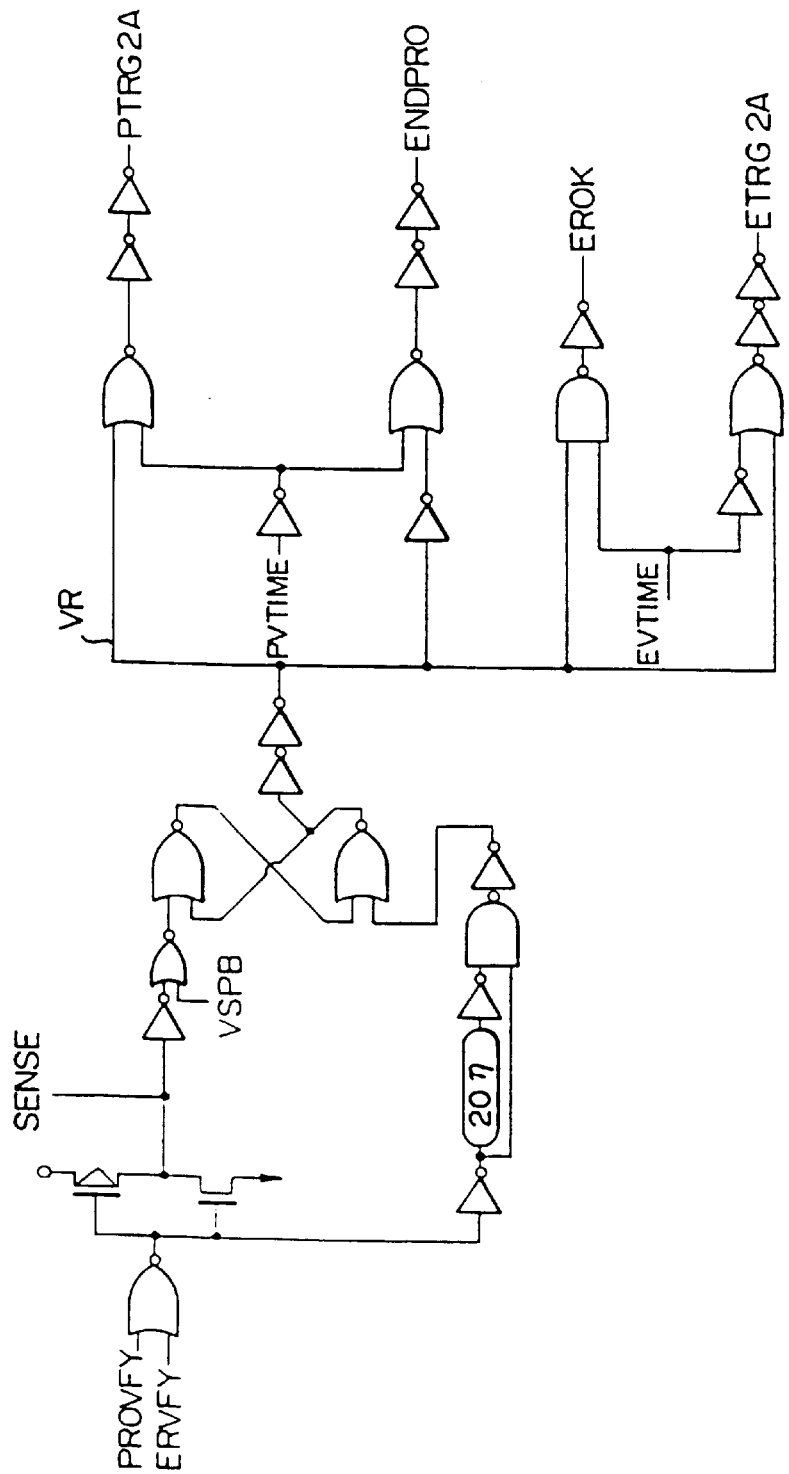

FIG. 72 shows a general circuit embodying the present invention.

Figure 73:
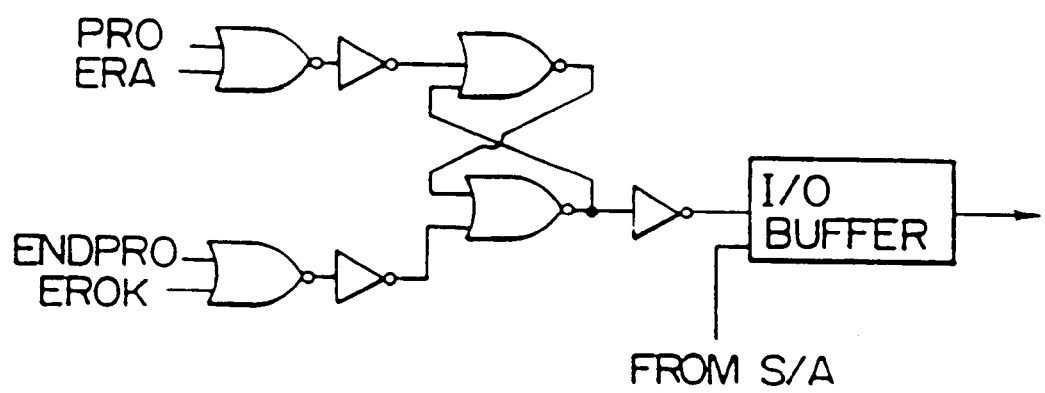

FIG. 73 shows a general circuit embodying the present invention.

Figure 74A:
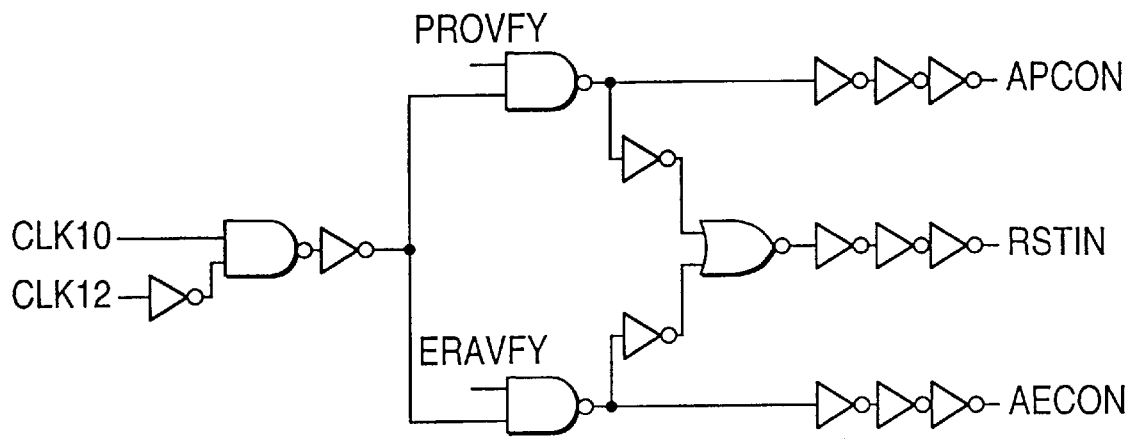
Figure 74B:
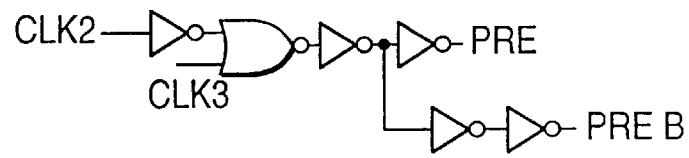
Figure 74C:
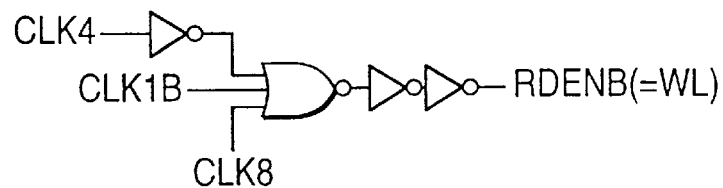

FIG. 74 shows general circuits embodying the present invention.

Figure 75:
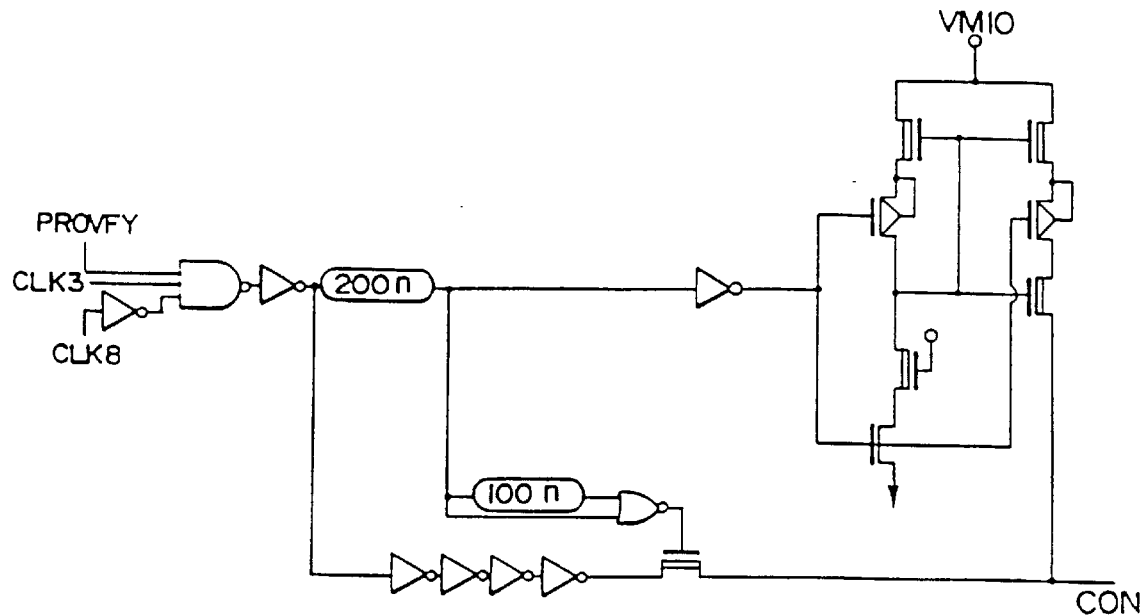

FIG. 75 shows a general circuit embodying the present invention.

Figure 76:
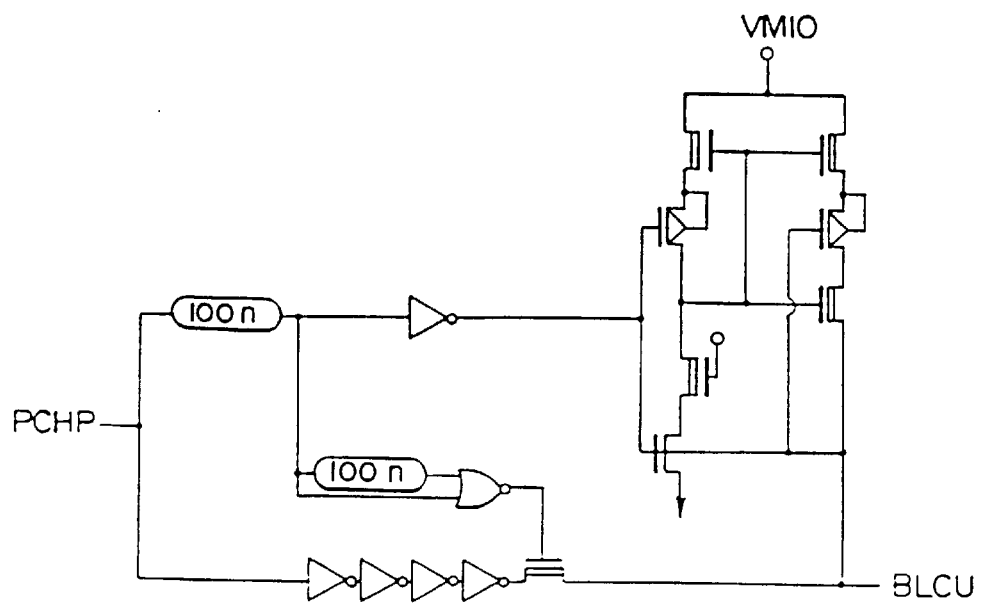

FIG. 76 shows a general circuit embodying the present invention.

Figure 77:
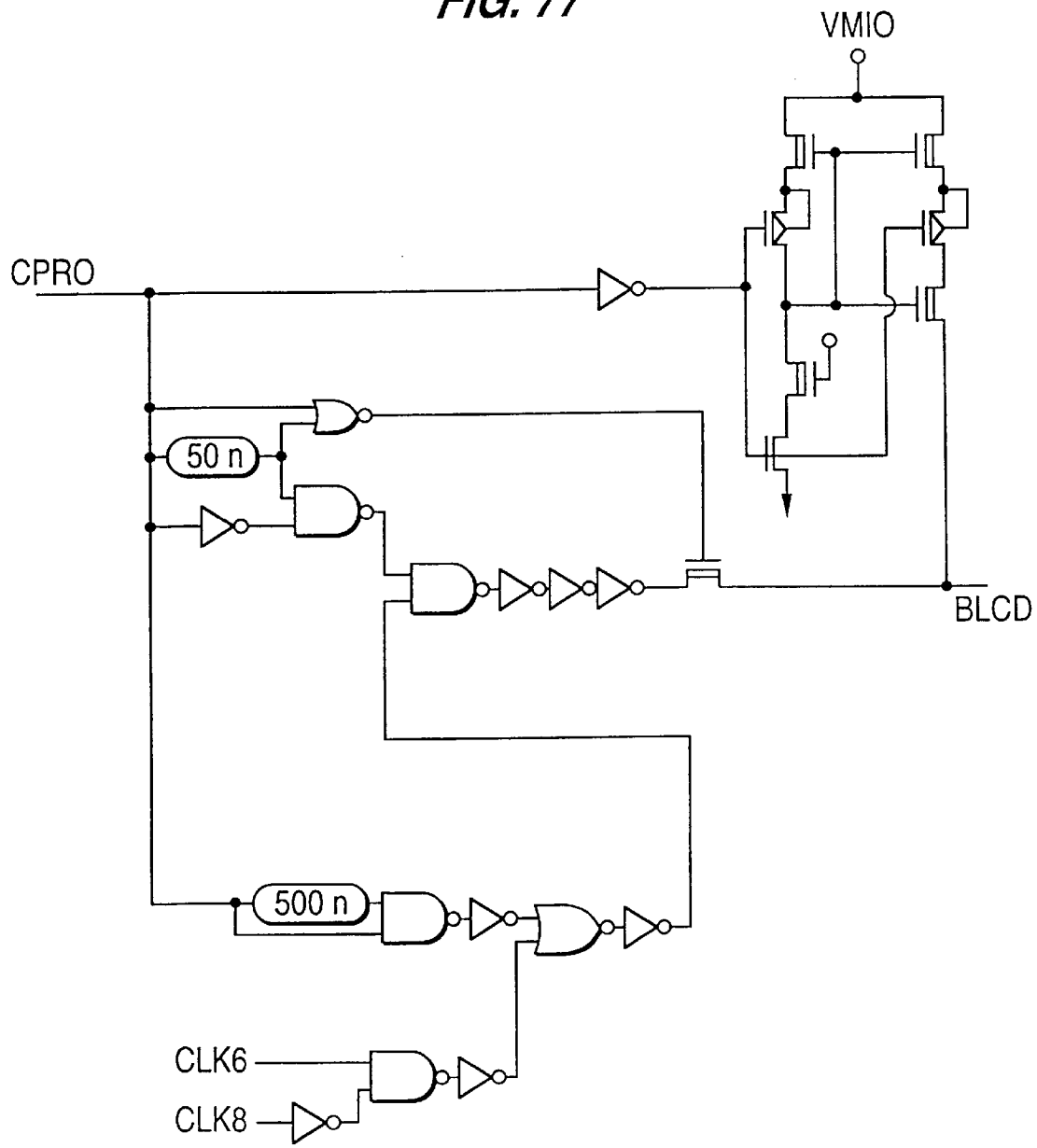

FIG. 77 shows a general circuit embodying the present invention.

Figure 78A:
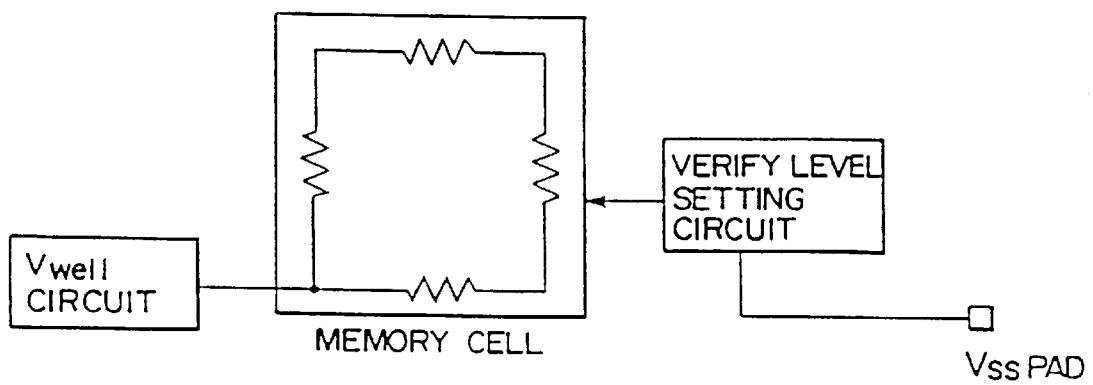
Figure 78B:
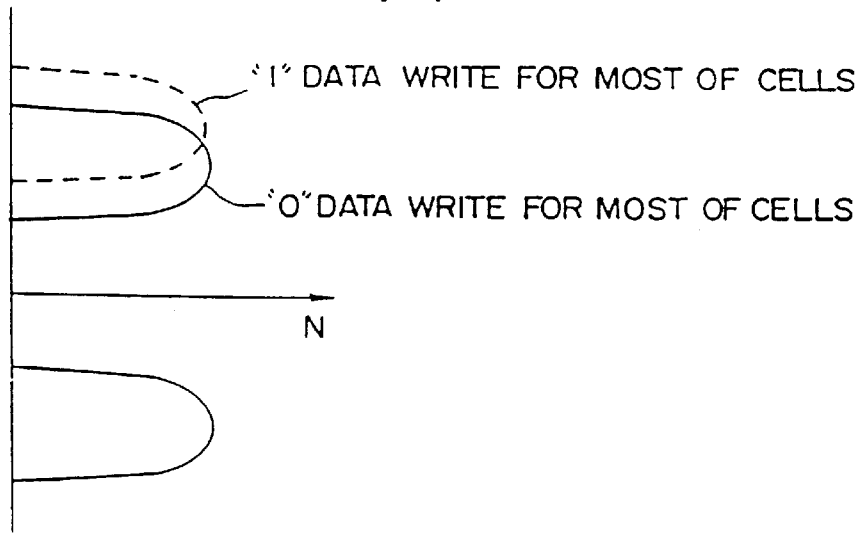

FIG. 78 shows a chip circuit diagram and a threshold value distribution graph according to an embodiment of the present invention.

Figure 79:
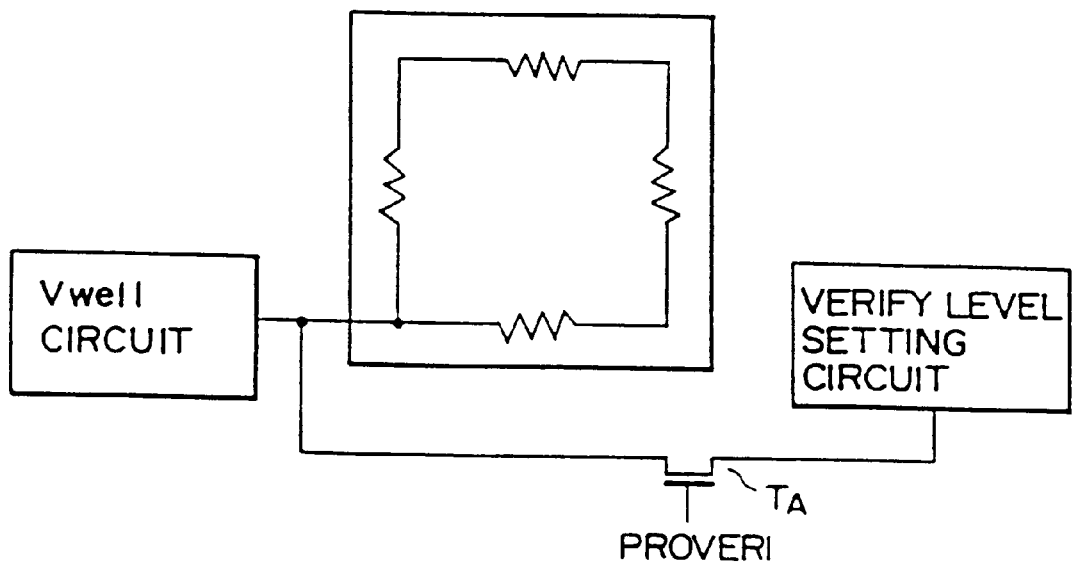

FIG. 79 is a circuit diagram of a chip according to another embodiment of the present invention.

Figure 80:
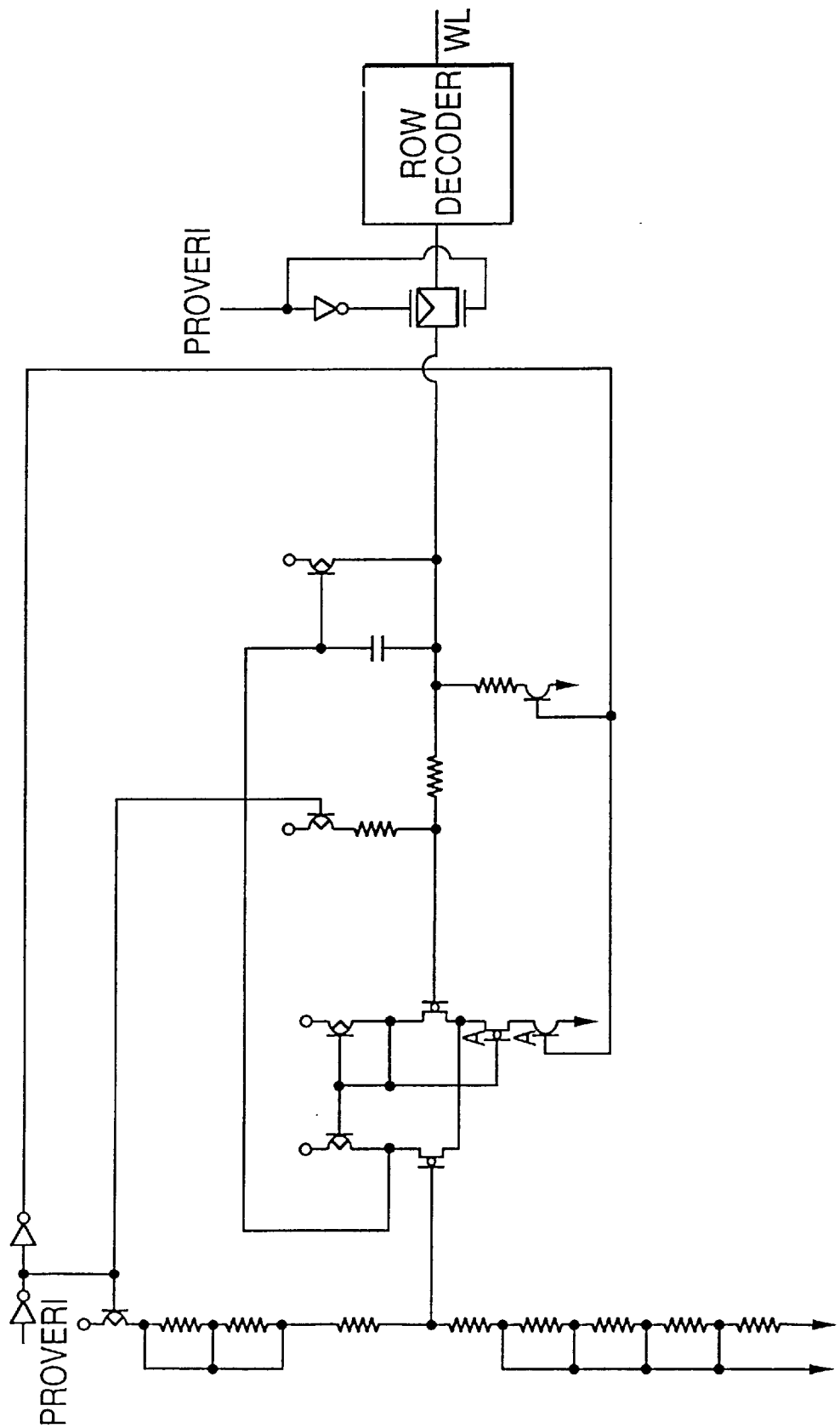

FIG. 80 is a circuit diagram of the verify level setting circuit.

Figure 81:
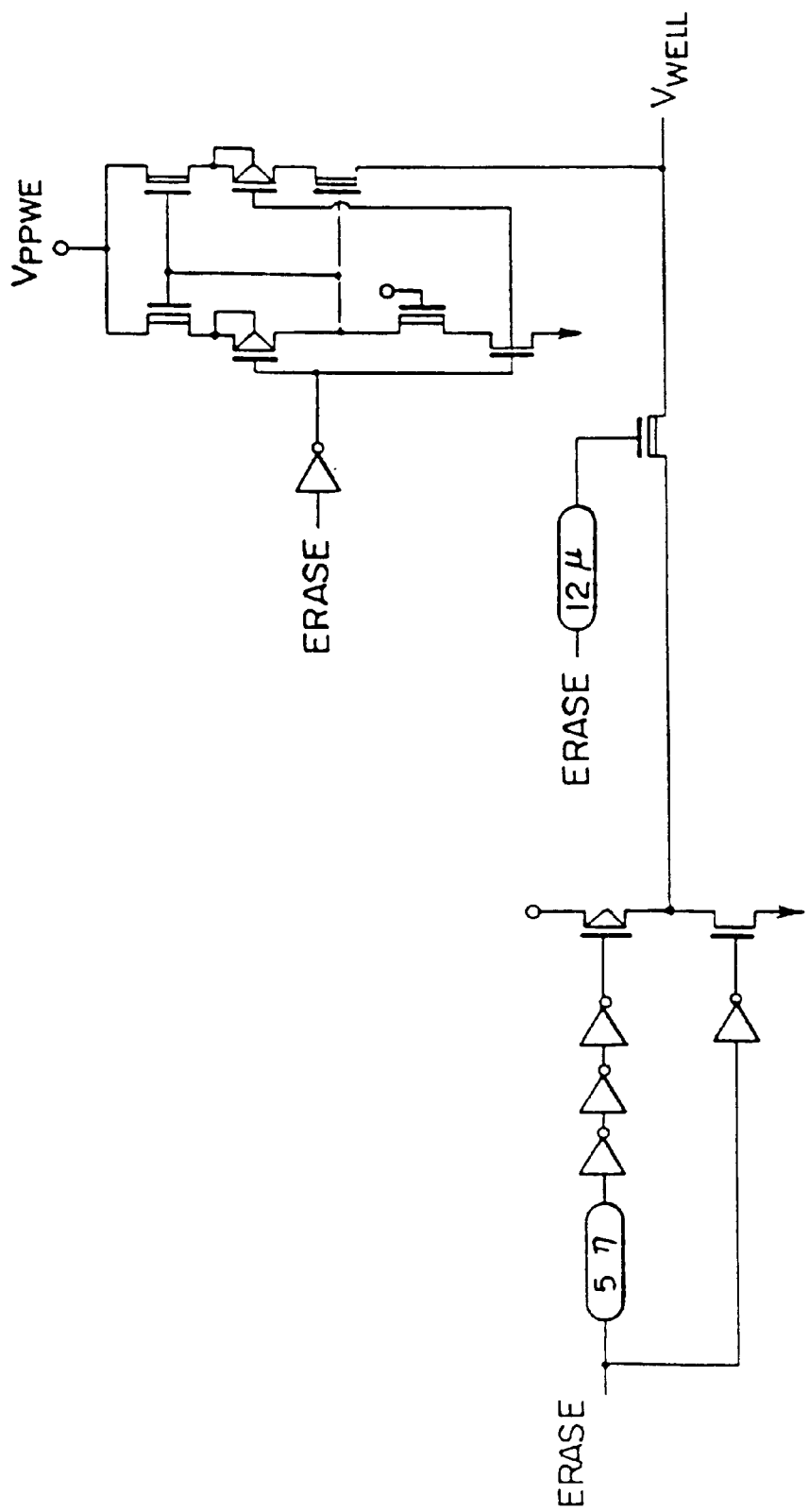

FIG. 81 shows the details of the V well circuit.

Figures 82, 83:
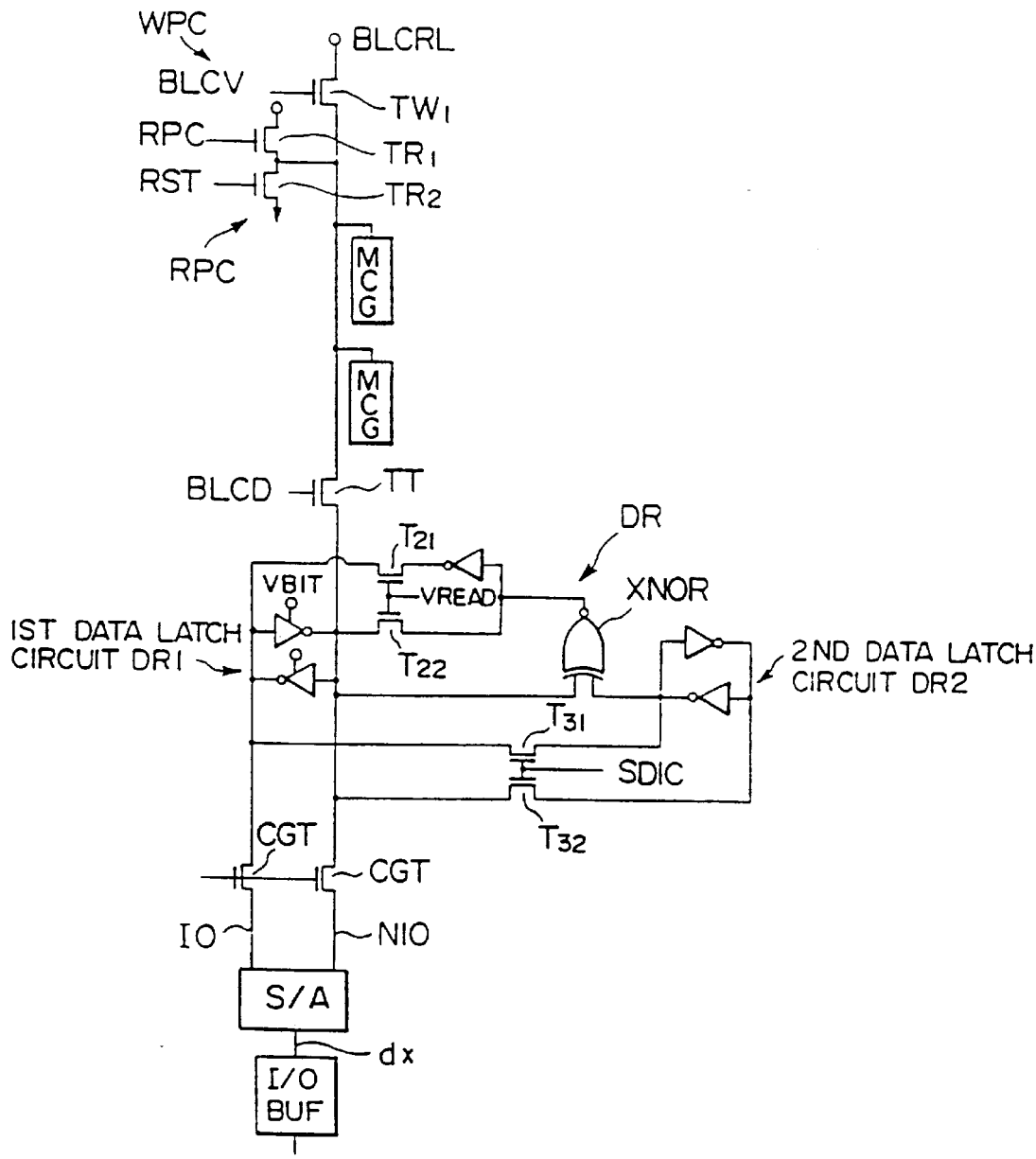

FIG. 82 shows a modification of the eleventh embodiment shown in FIG. 55.

FIG. 83 is a table explaining the operation of the embodiment shown in FIG. 82.

Figure 84:
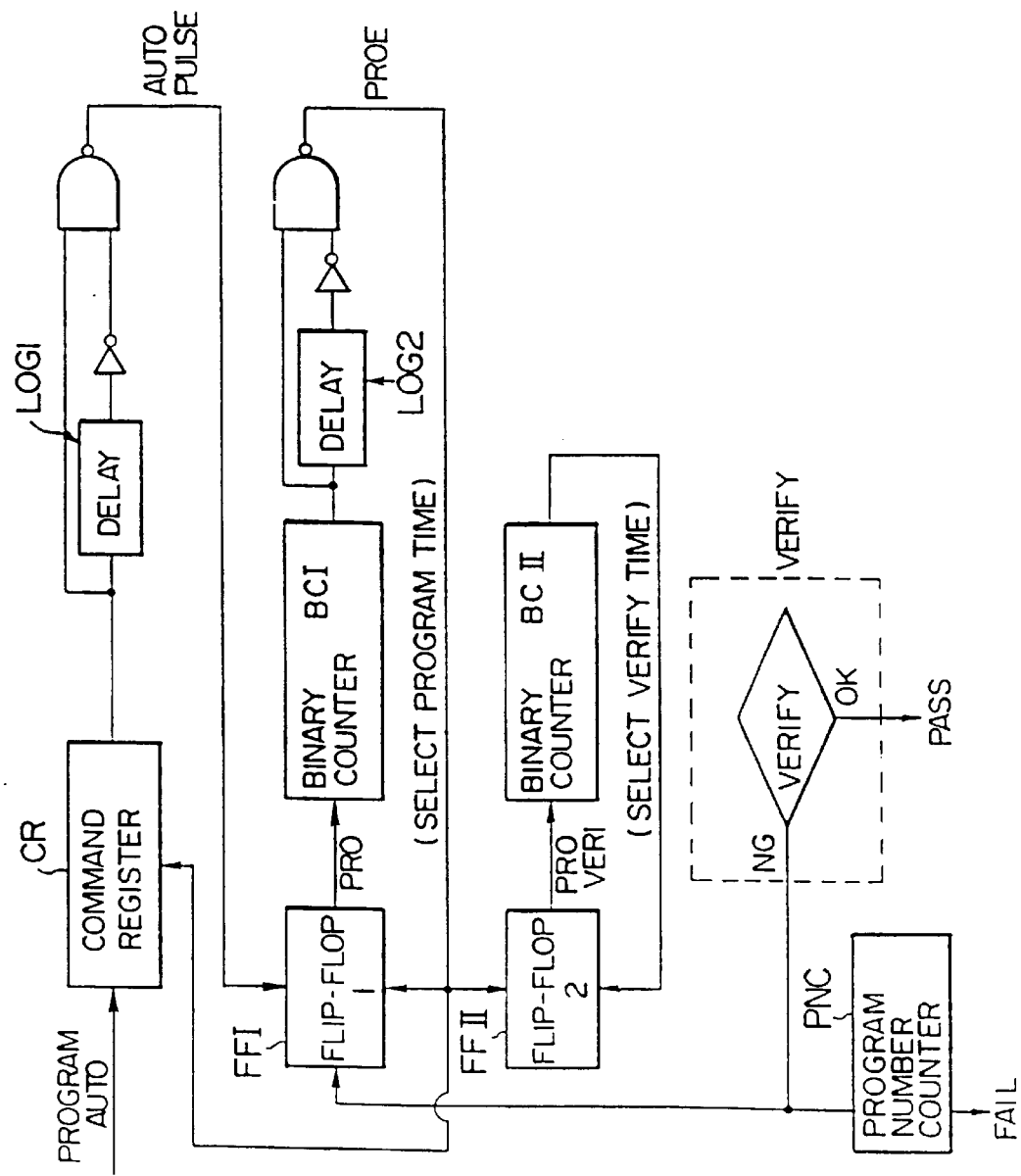

FIG. 84 is a diagram conceptually showing the automatic program.

Figure 85:
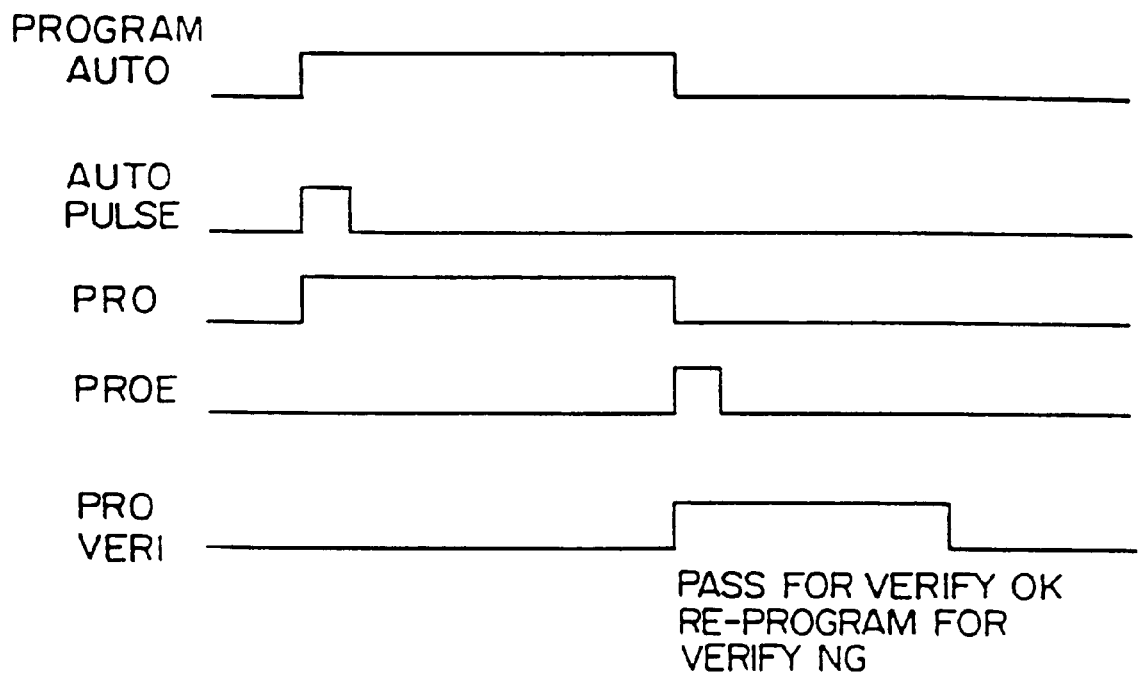

FIG. 85 is a flow chart showing the operation of the automatic program shown in FIG. 84.

Figure 86:
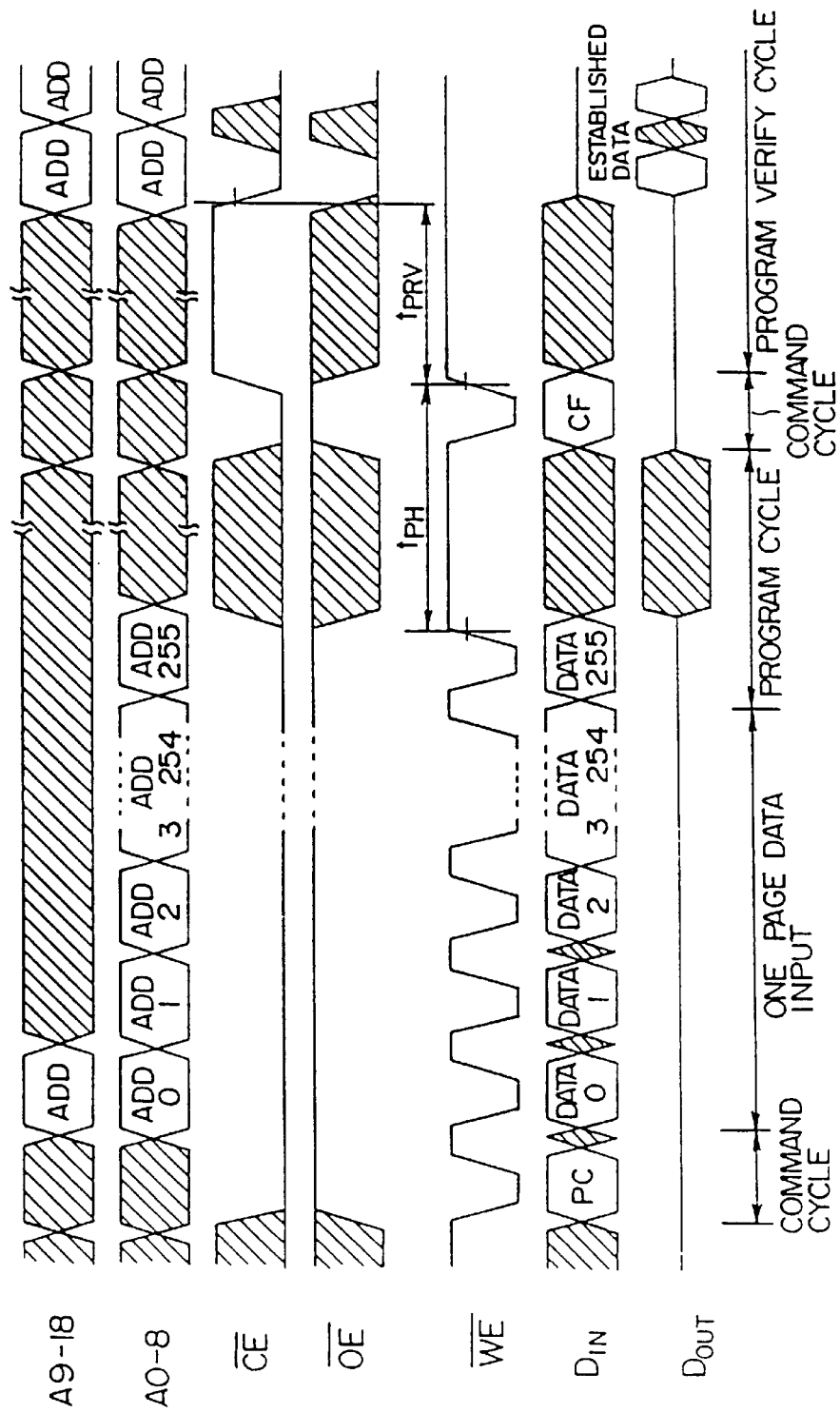

FIG. 86 is a timing chart illustrating the verify operation after the program operation.

Figure 87:
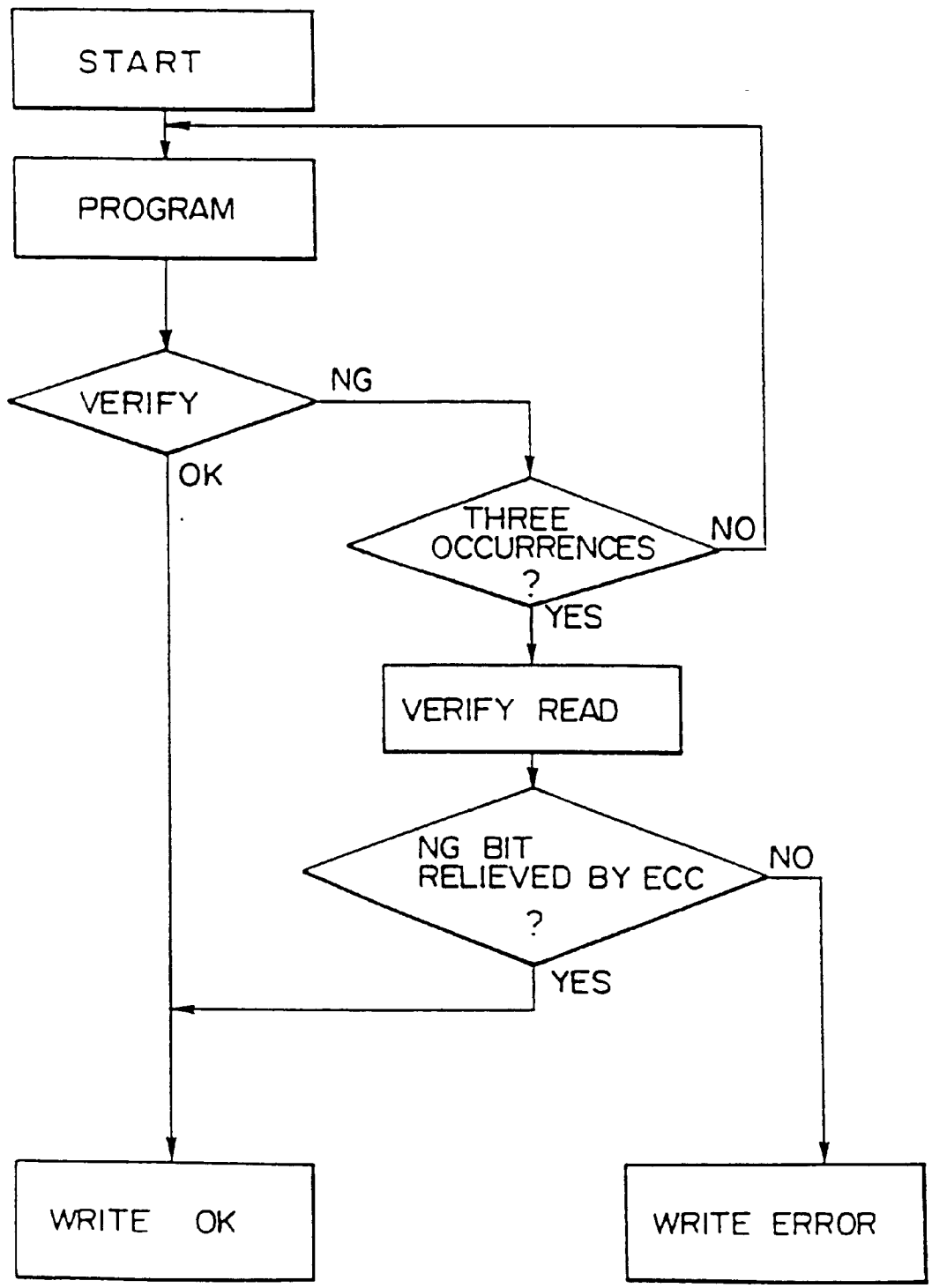

FIG. 87 is a flow chart illustrating the operation of an embodiment having an ECC circuit.

Figure 88:
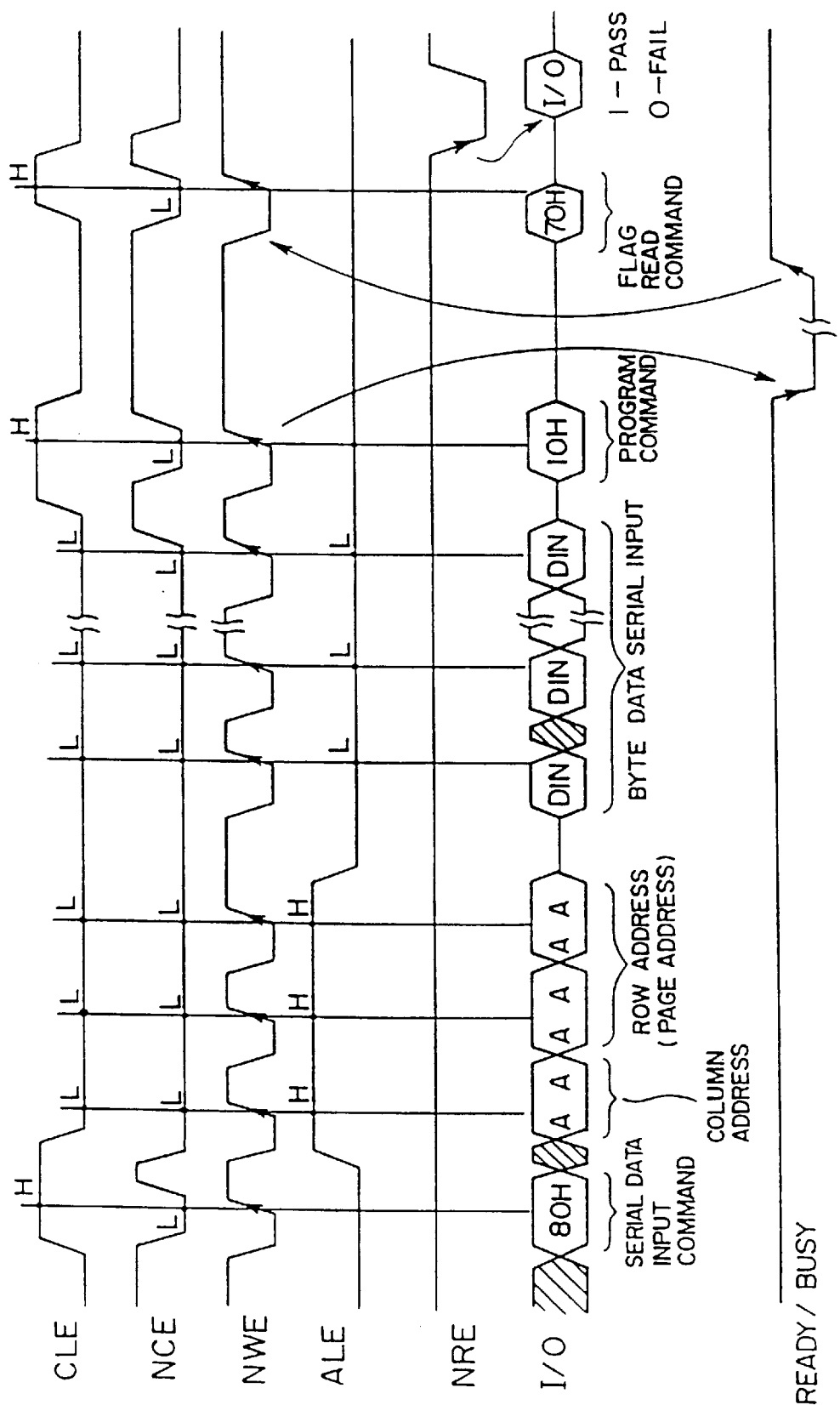

FIG. 88 is a timing chart No. 1 illustrating the operation in the external control mode.

Figure 89:
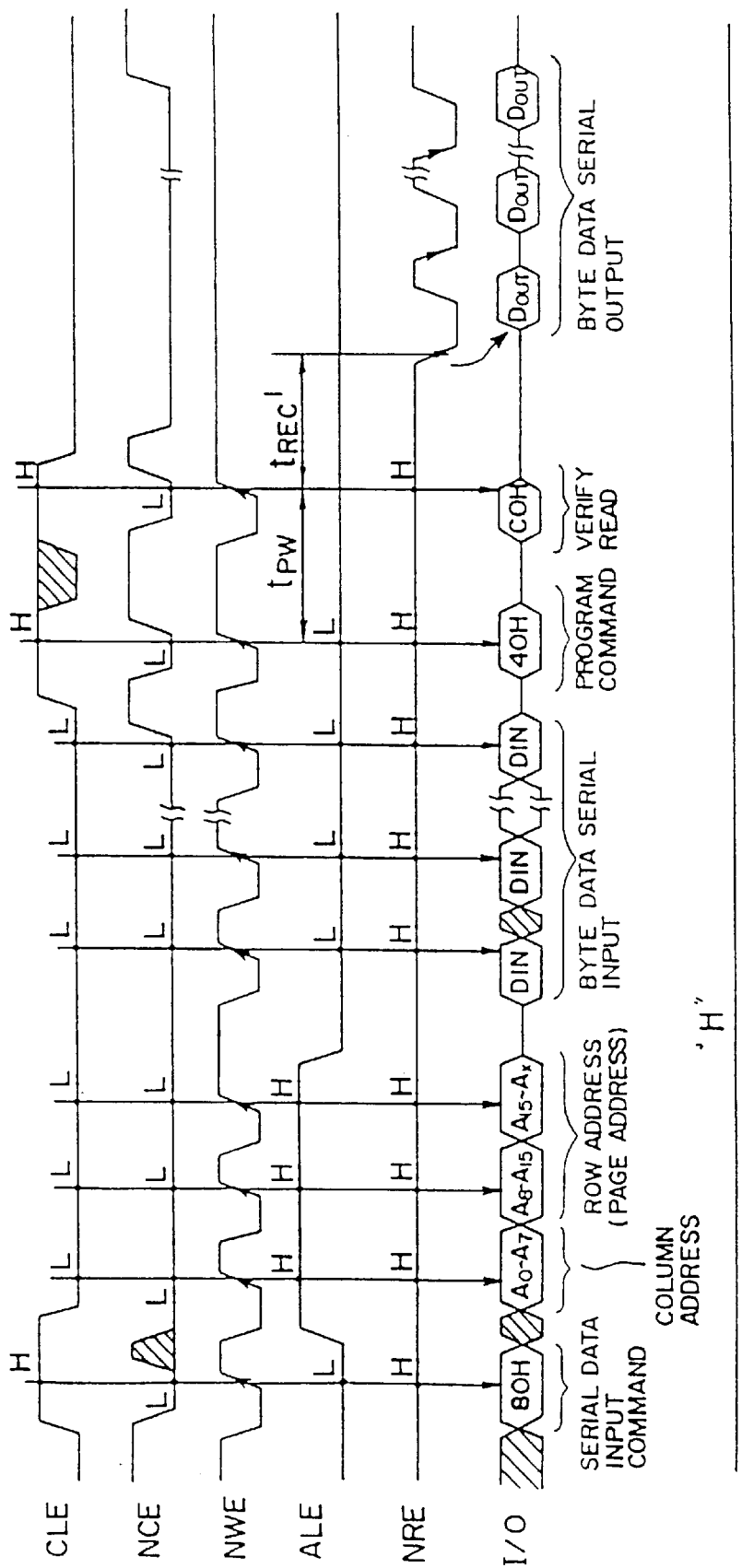

FIG. 89 is a timing chart No. 2 illustrating the operation in the external control mode.

Figure 90:
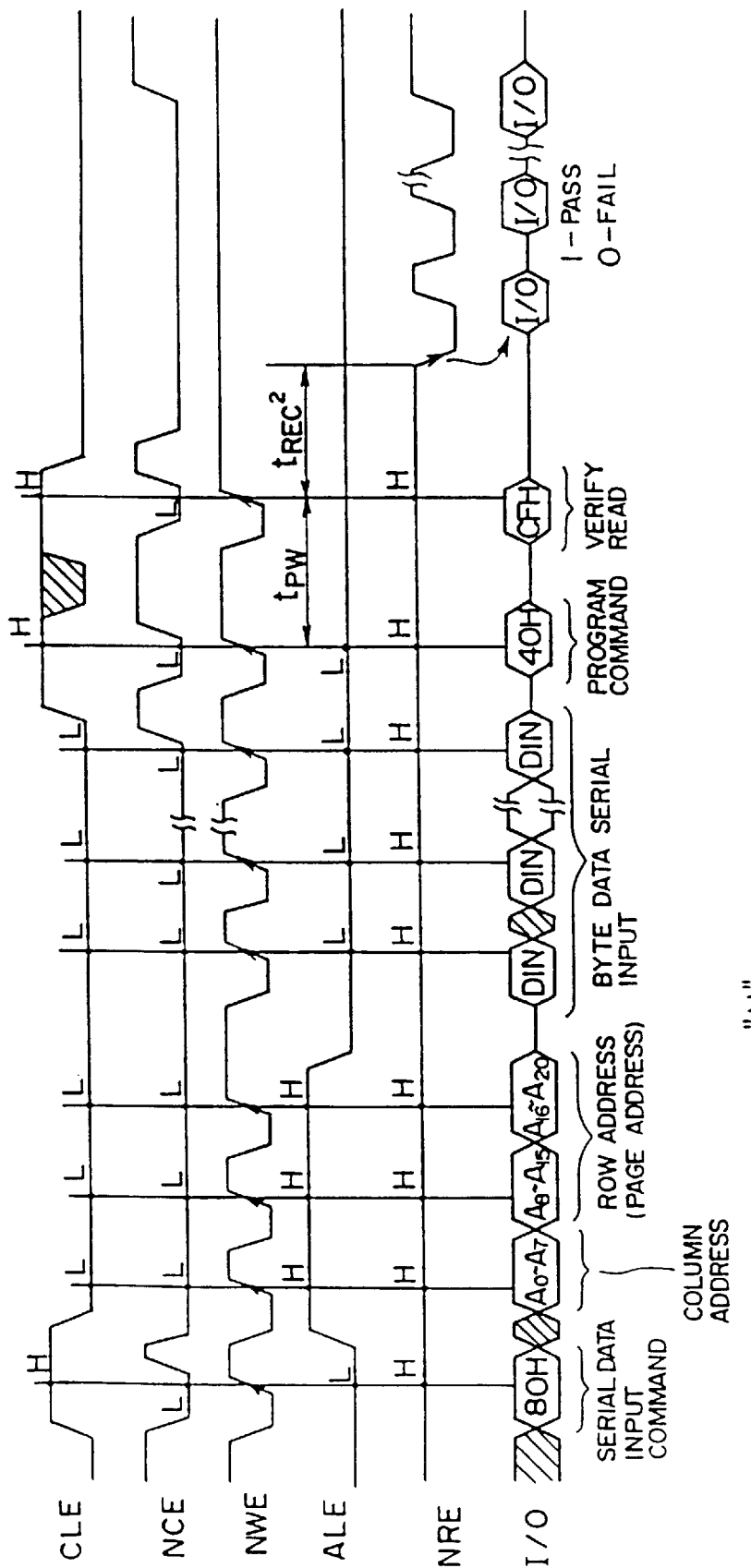

FIG. 90 is a timing chart No. 3 illustrating the operation in the external control mode.

Figure 91:
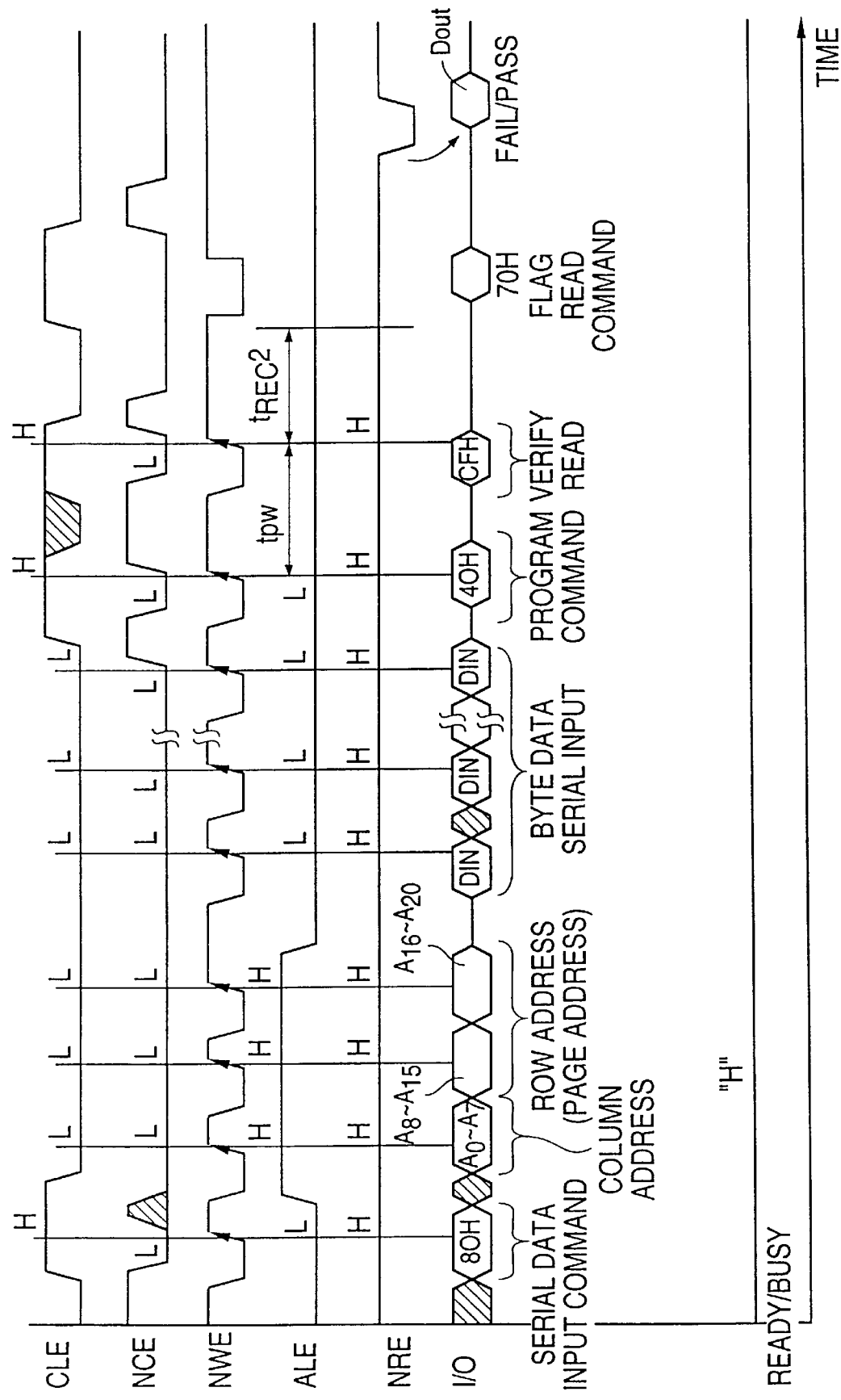

FIG. 91 is a timing chart No. 4 illustrating the operation in the external control mode.

Figure 92:
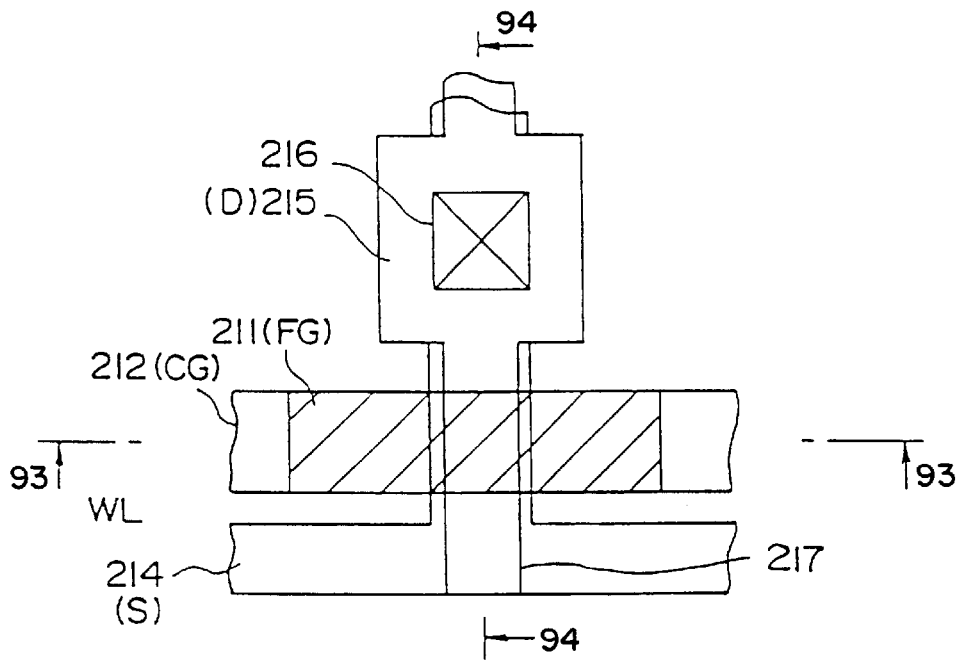

FIG. 92 is a plan view of a pattern of an EEPROM.

Figure 93:
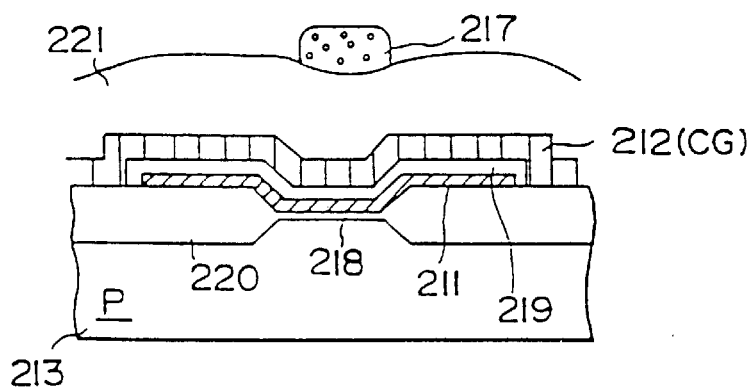

FIG. 93 is a cross sectional view taken along line B-B' of FIG. 92.

Figure 94:
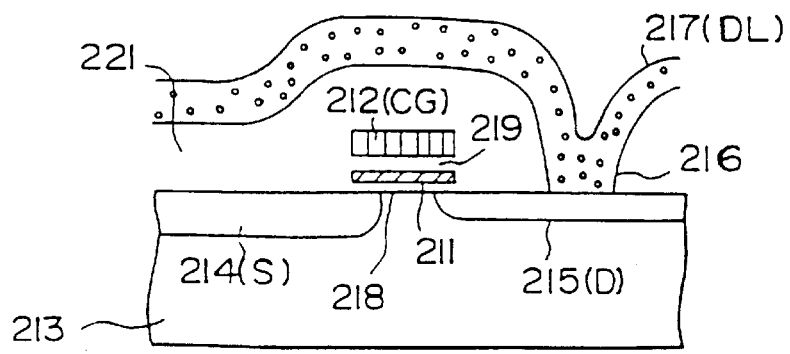

FIG. 94 is a cross sectional view taken along line C-C' of FIG. 92.

Figure 95:
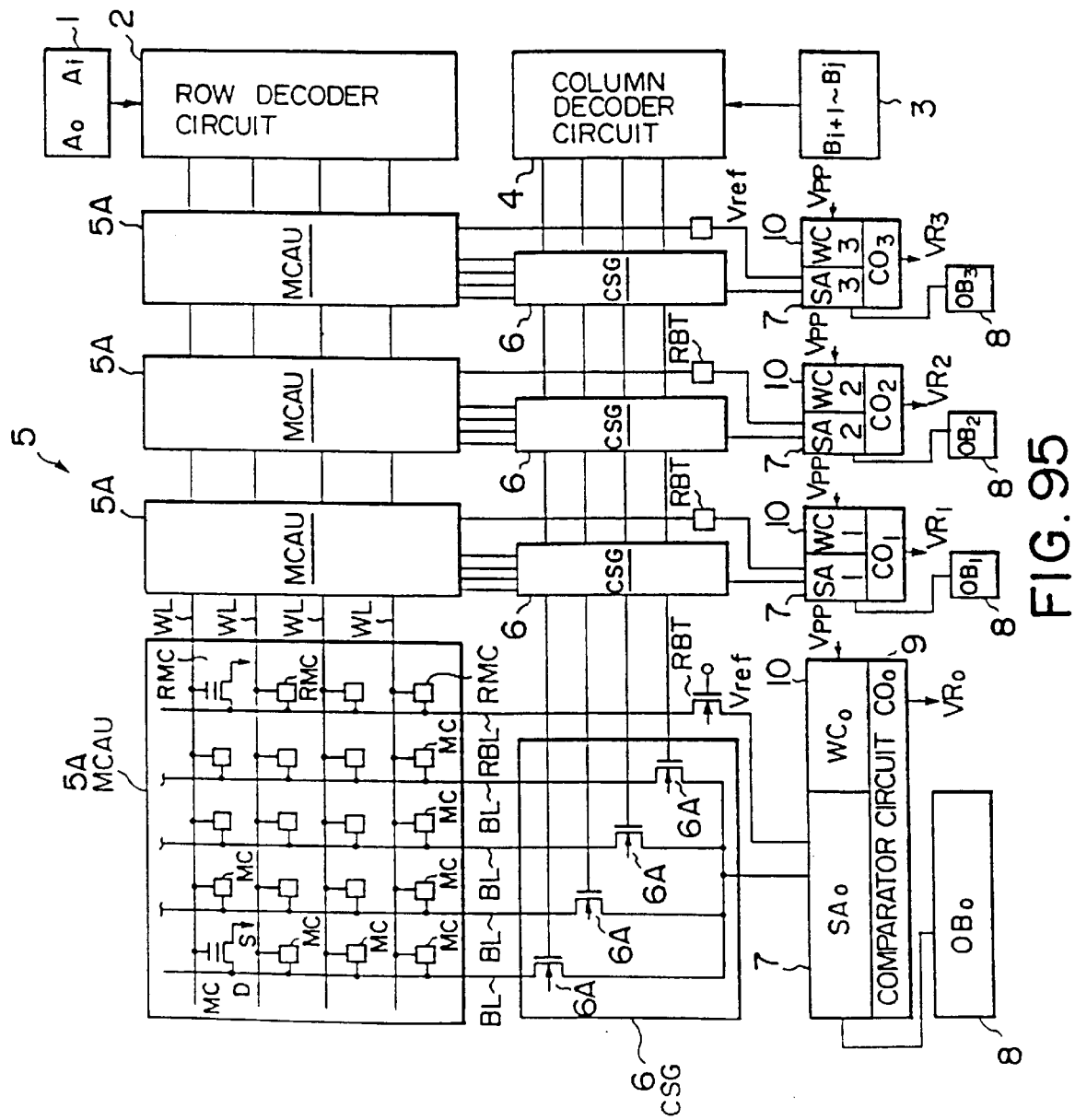

FIG. 95 is a block diagram of a 4-bit flash EEPROM.

Figure 96:
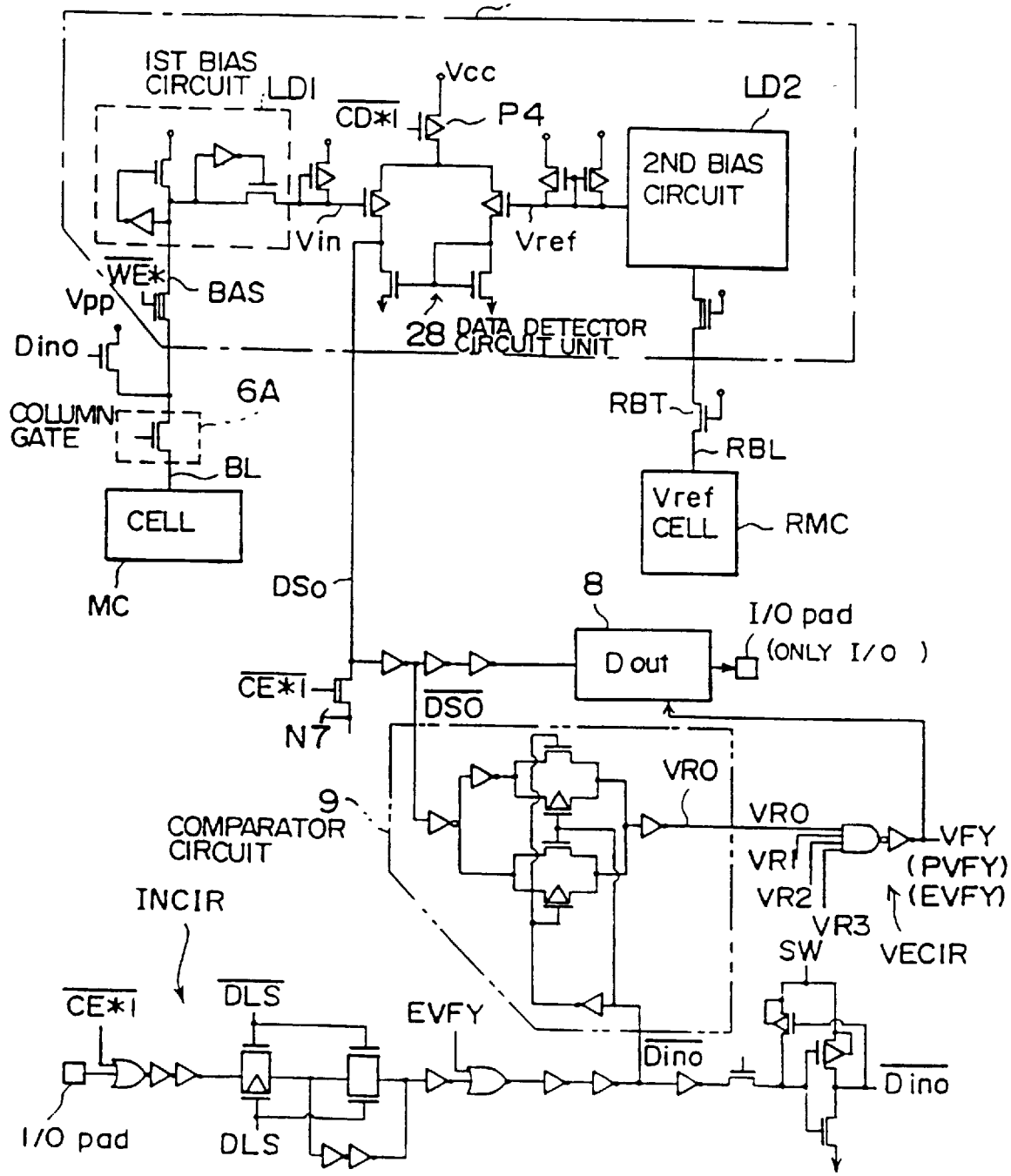

FIG. 96 shows the details of part of EEPROM shown in FIG. 95.

Figure 97A:
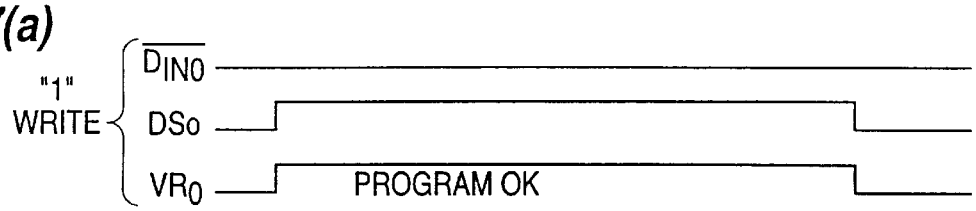
Figure 97B:
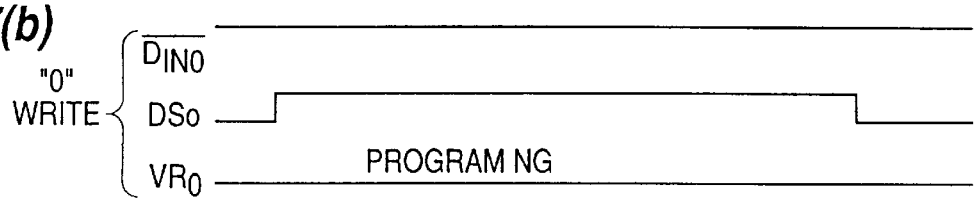
Figure 97C:
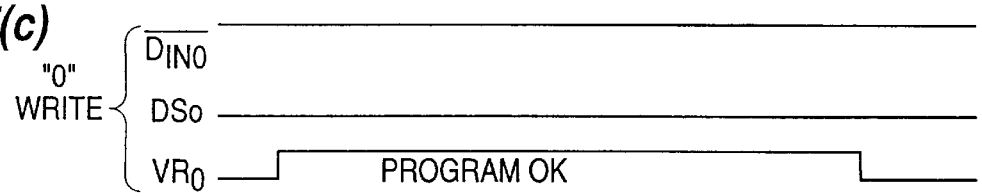

FIG. 97 is a timing chart illustrating the program verify operation.

Figure 98:
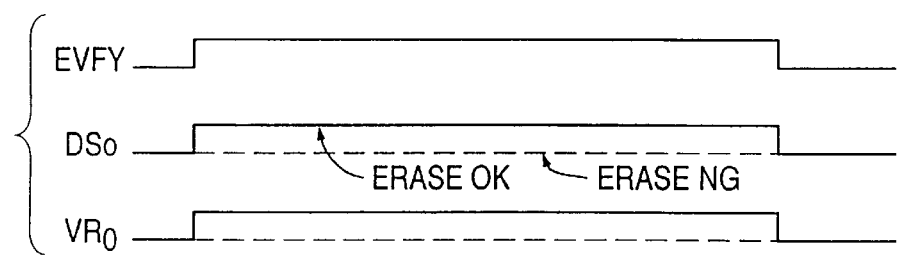

FIG. 98 is a timing chart illustrating the erase verify operation.

Figure 99:
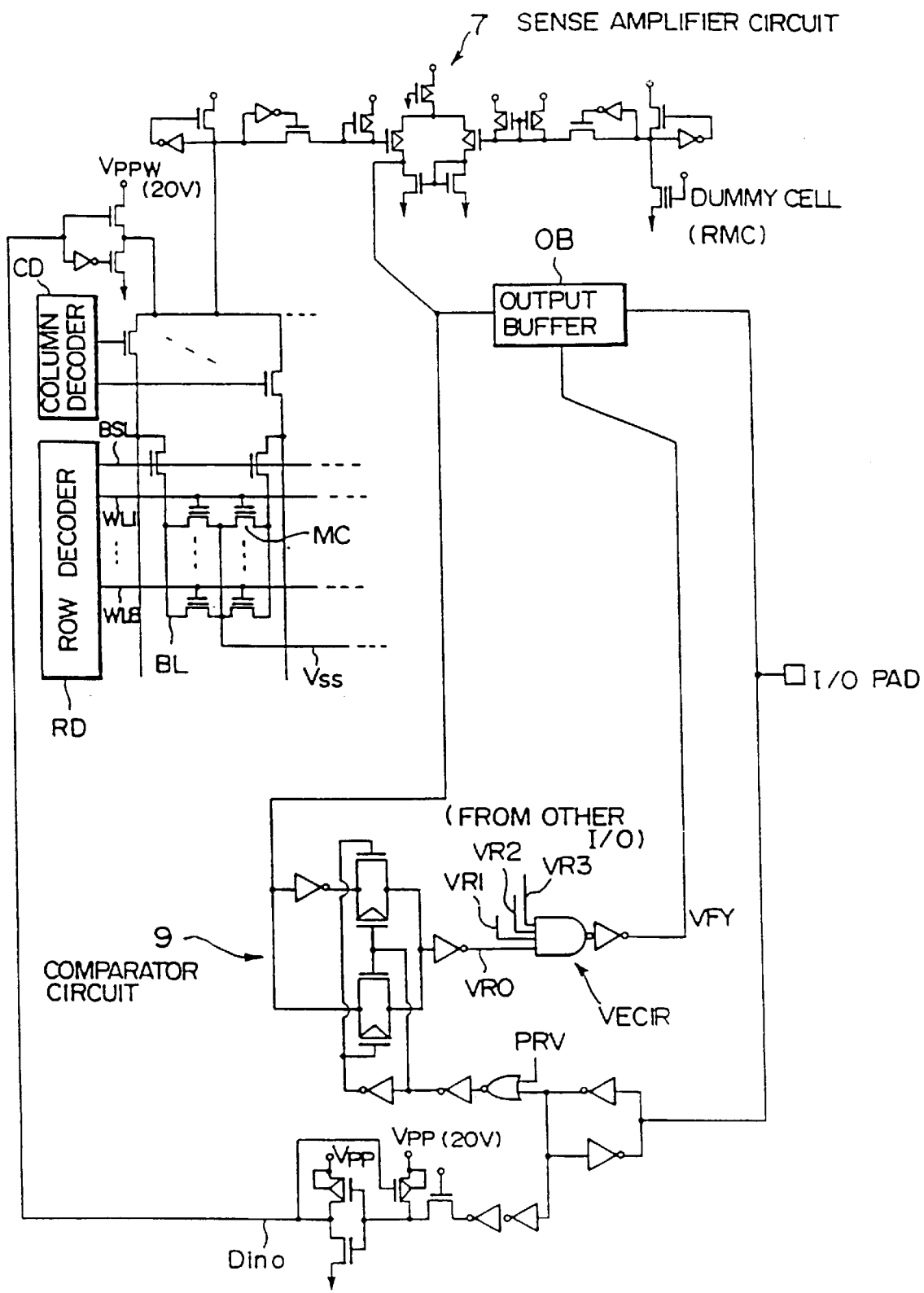

FIG. 99 is a circuit diagram of another embodiment.

Figure 100:
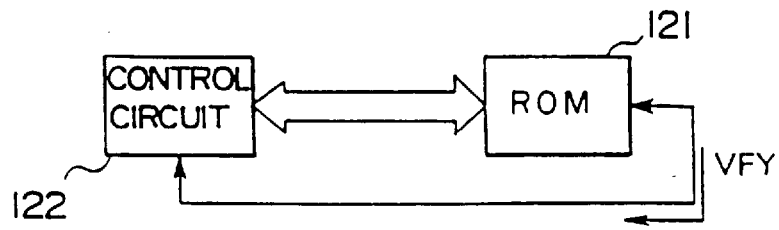

FIG. 100 shows a memory system according to an embodiment of the present invention.

Figure 101:
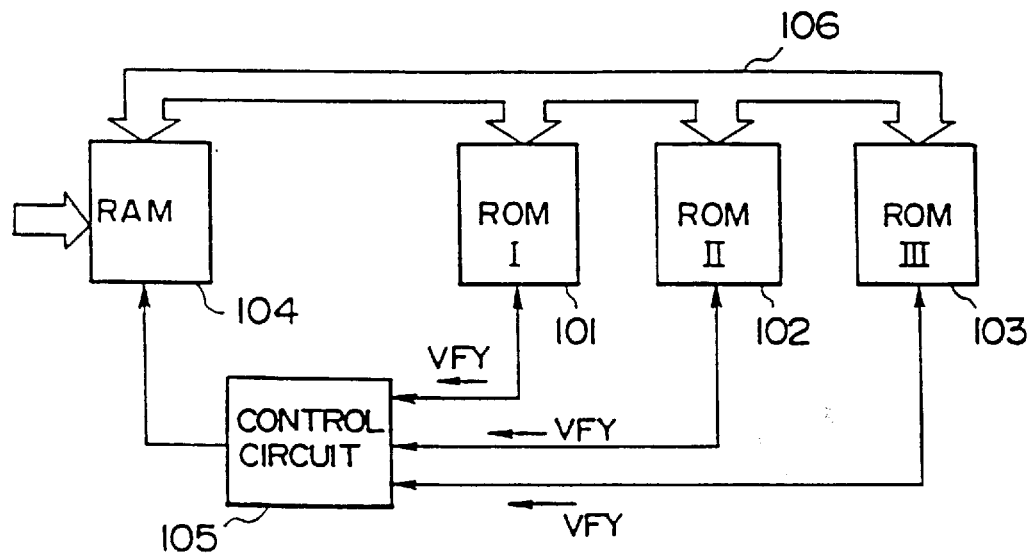

FIG. 101 shows a memory system of another embodiment.

Figure 102:
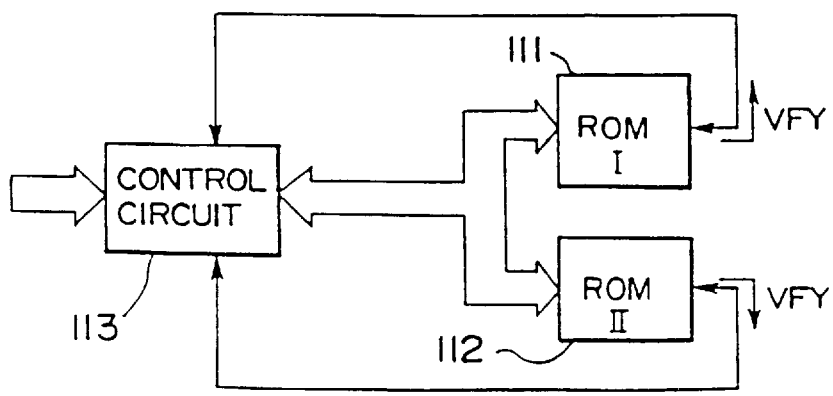

FIG. 102 shows a memory system of a still further embodiment.

DETAILED DESCRIPTION OF THE PREFERRED EMBODIMENTS

Embodiments of the present invention will be described in detail with reference to the accompanying drawings.

Figure 1:
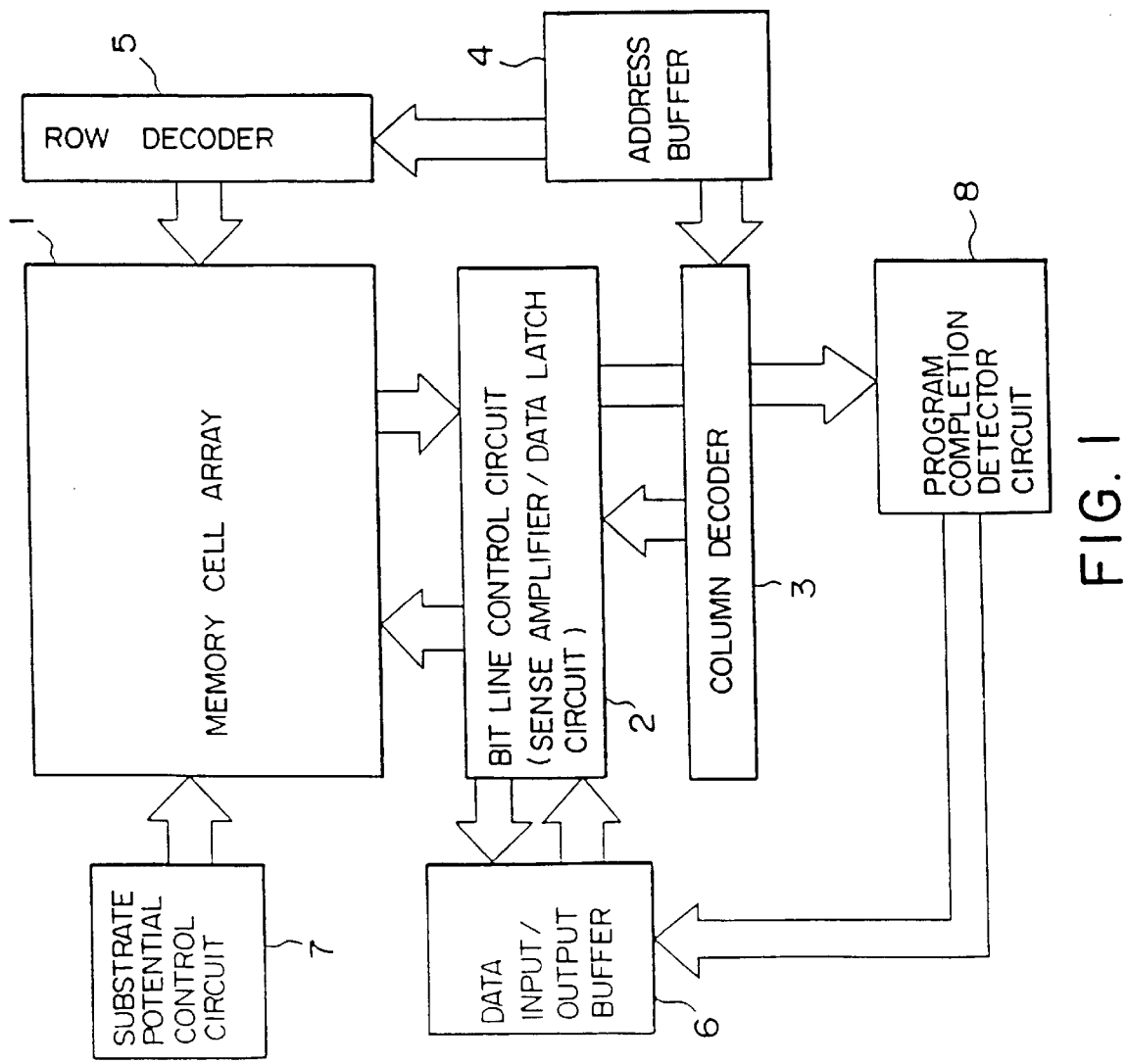
FIG. 1 is a block diagram showing the structure of a NAND cell type EEPROM according to a first embodiment of the present invention.

FIG. 1 is a block diagram showing a NAND type EEPROM according to the first embodiment of the present invention. A bit line control circuit 2 is provided for the execution of data write, data read, data rewrite, and verify read, to and from a memory cell array 1. The bit line control circuit 2 is connected to a data input/output buffer 6. An address signal from an address buffer is supplied via a column decoder 3 to the bit line control circuit 2. A row decoder 5 is provided for the control of control gates and select gates of the memory cell array 1. A substrate potential control circuit 7 is provided for the control of the potential of a p-type region (p-type substrate or p-type well). A program completion detector circuit 8 detects data latched in the bit line control circuit 2, and outputs a write completion signal which is externally delivered from the data input/output buffer 6.

The bit line control circuit 2 has CMOS flip-flops (FF) which perform a latch operation for the data to be written, a sense operation for detecting the potentials at bit lines, a sense operation for a verify read operation after the write operation, and a latch operation for data to be rewritten.

Figures 2A, 2B:
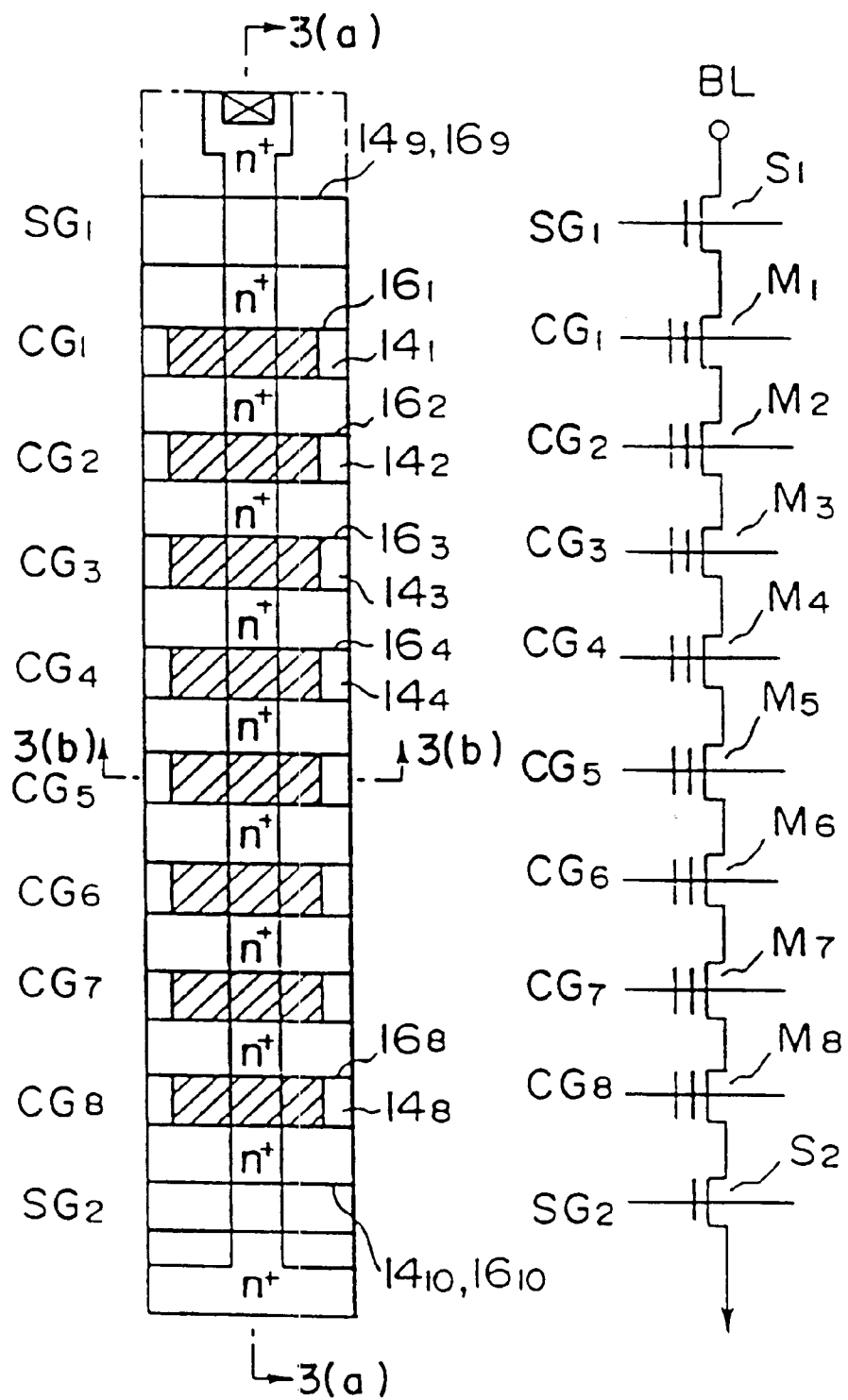
FIGS. 2(a) and 2(b) are, respectively, plan views of the NAND cell structure and an equivalent circuit diagram of the first embodiment.
Figure 3A:
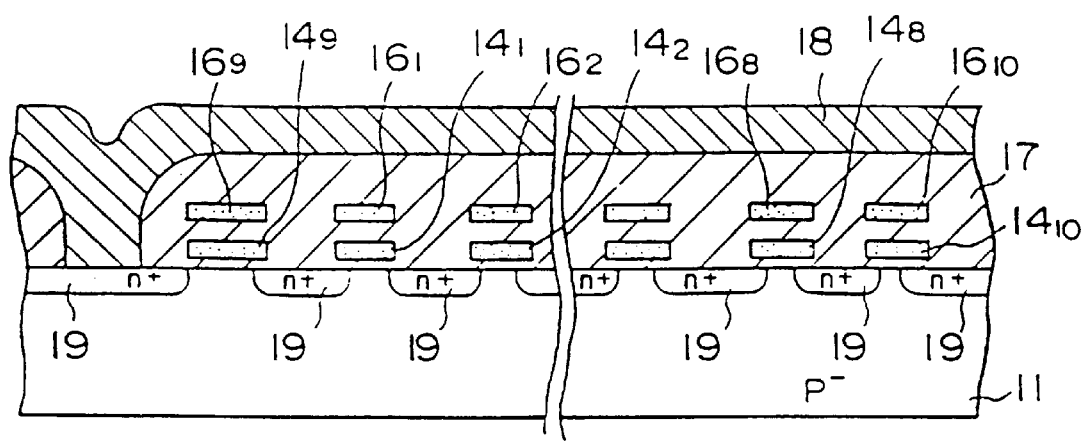
FIGS. 3(a) and 3(b) are, respectively, cross sectional views taken along lines AA and B—B of FIG. 2(a).
Figure 3B:
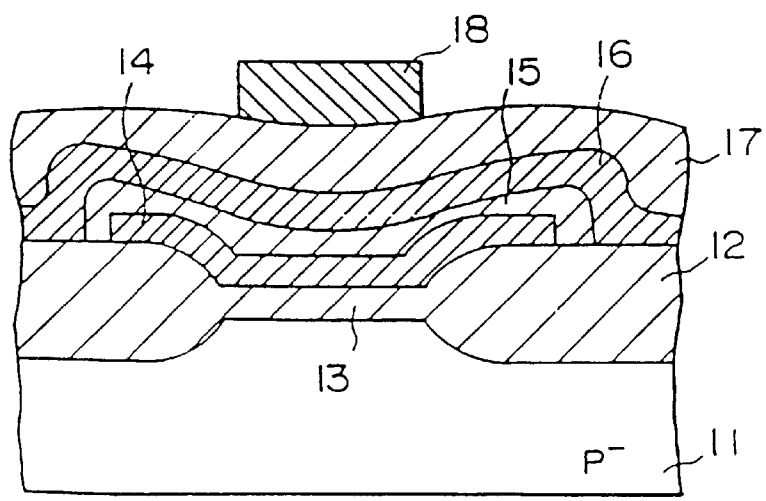

FIGS. 2(a) and 2(b) are plan views of a NAND of a memory cell array, and an equivalent circuit diagram. FIGS. 3(a) and 3(b) are cross sectional views taken along lines A-A' and B-B' of FIG. 2(a). A memory cell array is formed within a p-type region 11 surrounded by an element isolation oxide film 12, the memory cell array having a In this embodiment, one NAND cell is constituted by eight memory cells M1 to M8 connected in series. Each memory cell has a floating gate 14 ($14_1$, $14_2$ ..., $14_8$) above a substrate 11 with a gate insulating film 13 being interposed therebetween. Above the floating gate 14, a control gate 16 ($16_1$, $16_2$ ..., $16_8$) is formed with an interlayer insulating film 15 interposed therebetween. Each n-type diffusion layer 19 is shared by two adjacent memory cells, one as a source and the other as a drain. In this way, memory cells are connected in series.

On the drain and source sides of the NAND cell, there are formed select gates $14_9$, $16_9$ and $14_{10}$, $16_{10}$ which are formed by the same process as of the floating gates and select gates of the memory cell. After forming elements in the above manner, the substrate is covered at its top with a CVD oxide film 17. A bit line 18 is wired on the oxide film 17. The bit line 18 is connected to a drain side diffusion region 19 at one end of the NAND cell. The control gates 16 of a plurality of NAND cells arranged in the row direction are connected in common at the same row, by a corresponding one of control gate lines CG1, CG2, ..., CG8 arranged in the row direction. These control gate lines are word lines. The select gates $14_9$, $16_9$ and $14_{10}$ or $16_{10}$ are also connected by select gate lines SG1, SG2 disposed in the row direction. The gate insulating film 13 between the select gates 1410 and 1610 may be made thicker than that of the memory cell gate insulating film. The thicker gate insulating film improves the reliability of each memory cell.

Figure 4:
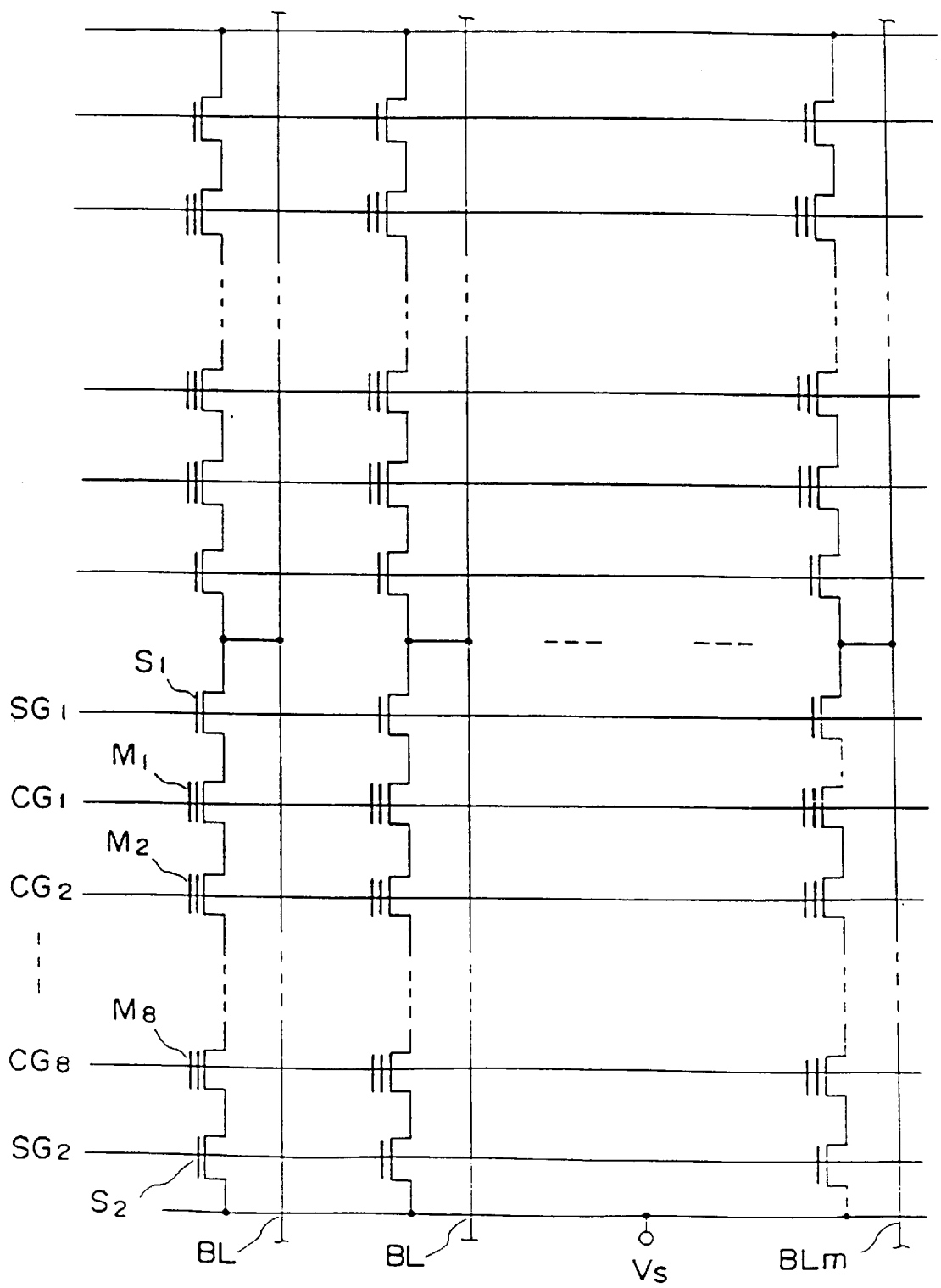
FIG. 4 is an equivalent circuit diagram of the memory cell array of the first embodiment.

FIG. 4 is an equivalent circuit diagram of a memory cell array having a plurality of above-described NAND cells disposed in a matrix shape.

Figure 5:
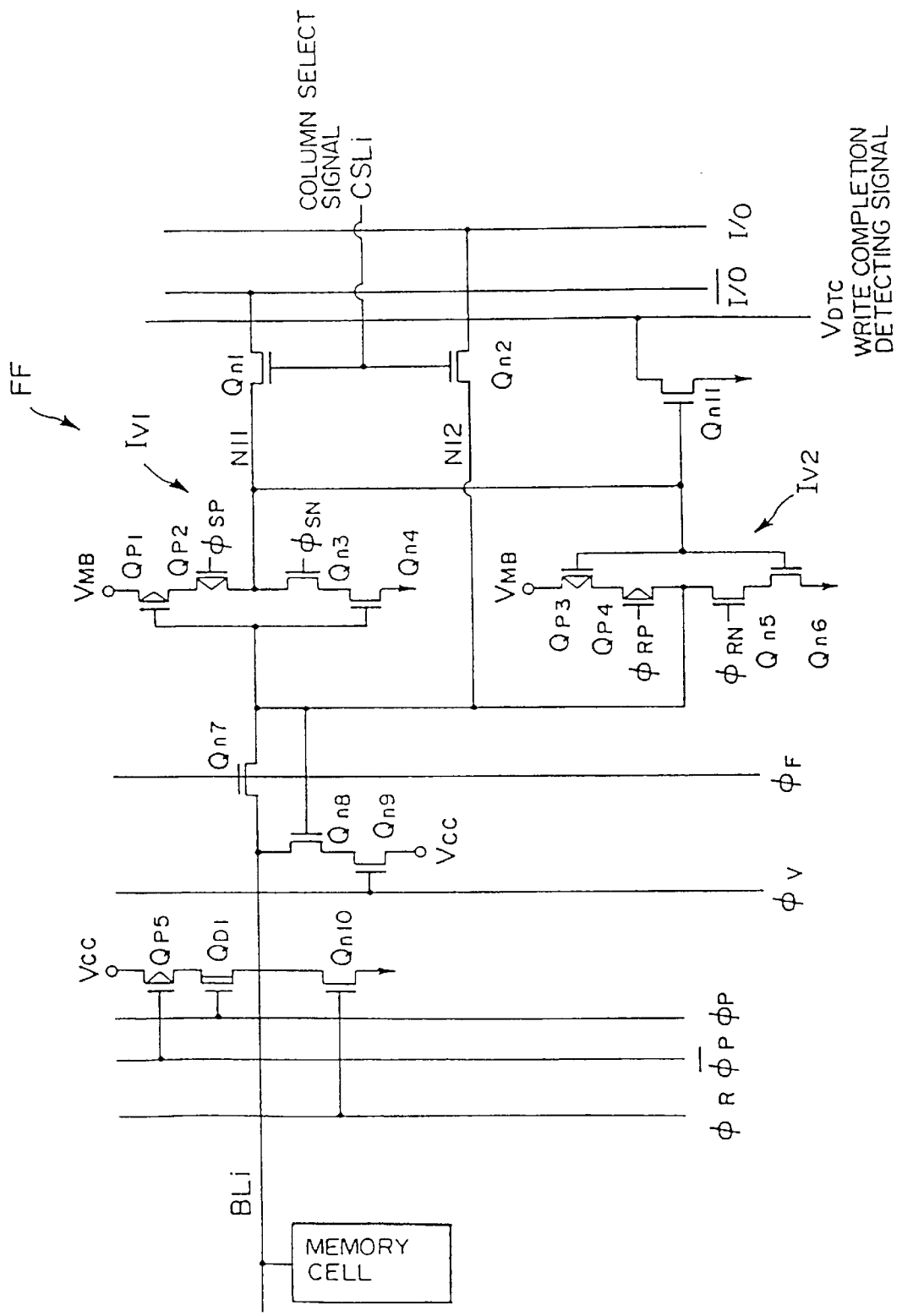
FIG. 5 is a circuit diagram showing the structure of the bit line control circuit of the first embodiment.

FIG. 5 shows an example of the structure of the bit line control circuit 2 shown in FIG. 1. A CMOS flip-flop FF as a data latch/sense amplifier has first and second signal synchronizing type CMOS inverters IV1 and IV2. The first signal synchronizing type CMOS inverter IV1 includes E type p-channel MOS transistors Qp1 and Qp2, and E type n-channel MOS transistors Qn3 and Qn4. The second signal synchronizing type CMOS inverter IV2 includes E type p-channel MOS transistors Qp3 and Qp4r and E type n-channel MOS transistors Qn5 and Qn6.

The output node of the CMOS flip-flop FF is connected to a bit line BL1 via an E type n-channel MOS transistor Qn7 controlled by a signal φF.

Connected between the bit line BLi and Vcc is a serial circuit of an Entype n-channel MOS transistor Qn8 controlled by the output node of the flip-flop FF and an E type n-channel MOS transistor Qn9. These transistors operate to charge the bit line BLi to (Vcc - Vth) during the verify read operation, in accordance with the data in the CMOS flip-flop.

A serial circuit of an E type p-channel MOS transistor Qp5 and D-type n-channel MOS transistor QD1 is a circuit for precharging the bit line BLi to Vcc. The transistor QD1 is provided for preventing the transistor Qp5 from being applied with a high voltage during the erase or write operation. An E type n-channel MOS transistor Qn10 is a reset transistor for resetting the bit line BLi to 0 V.

Two nodes $N_{11}$ and $N_{12}$ of the CMOS flip-flop FF are connected to input/output lines /IO and IO via two transfer gates (E type n-channel MOS transistors Qn1 and Qn2) controlled by a column select signal CSLI.

The node $N_{11}$ of the CMOS flip-flop FF is also connected to the gate of an E type n-channel MOS transistor Qn11. An output of the transistor Qn11 is used as a write completion detected signal VDTC.

Figure 6:
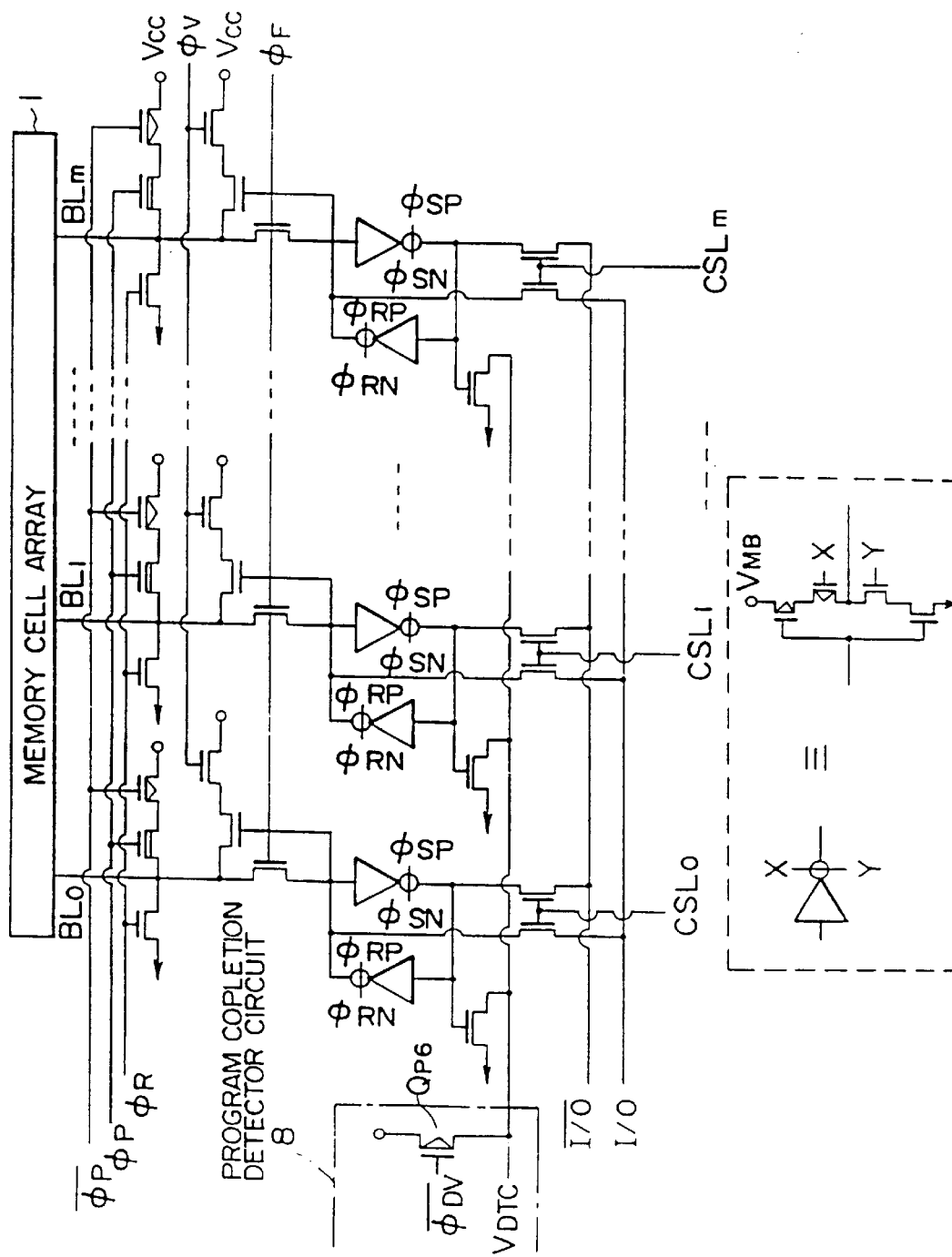
FIG. 6 is a diagram showing the interconnection between the bit line control circuit and other circuits of the first embodiment.

FIG. 6 shows the connection between the bit line control circuit 2, memory cell array 1, and program completion detector circuit 8.

An E type p-channel MOS transistor Qp6 of the program completion detector circuit 8 outputs the write completion detected signal VDTC. In FIG. 6, FF is shown by a symbol illustrated in an area surrounded by a broken line in FIG. 6.

The write operation and write check operation of the embodiment will be described next. In the following description, one NAND cell is assumed as a serial circuit constituted by eight memory cells as described previously.

Prior to the write operation, data in memory cells is erased by applying about 20 V (Vpp) to the p-type region (p-type substrate or p-type well) and 0 V to the control gates CG1 to CG8. With this erase operation, the threshold value of each memory cell is set to 0 V or lower.

Figure 7:
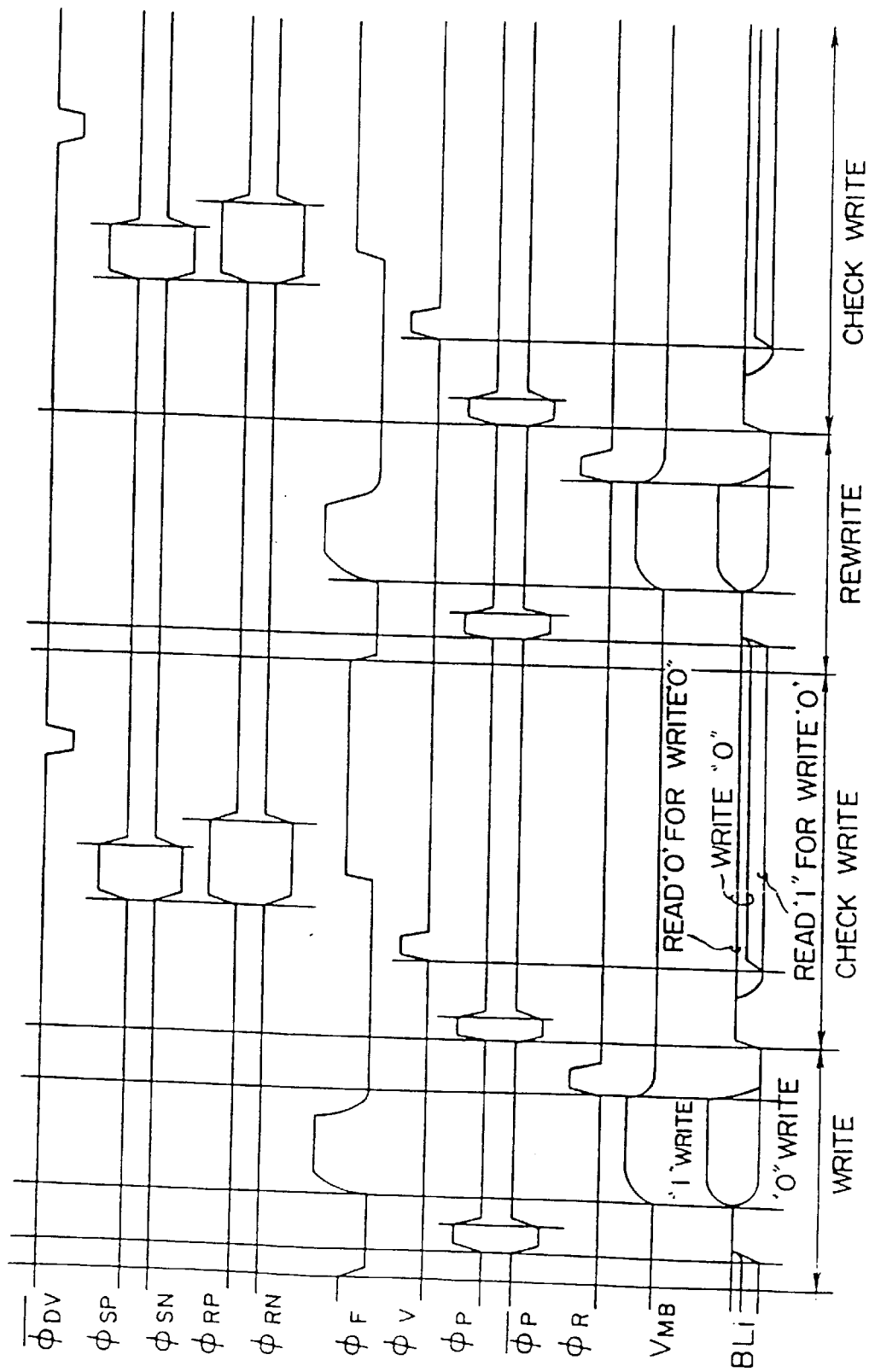
FIG. 7 is a timing chart illustrating a data read/write check operation.

FIG. 7 is a timing chart illustrating the write operation and write check operation. In FIG. 5, data to be written is supplied from the I/O lines /Io and Io, and latched by the CMOS flip-flop FF. Thereafter, the pre-charge signal φP becomes "H", and /φP becomes "L", so that the bit line BLi is precharged to Vcc. The voltage VMS and OF change from Vcc to an intermediate potential VM (up to 10 V). In response to the latched data, the bit lines BLi takes 0 V for the "0" write, and VM for the "1" write. At this time, referring to FIG. 4, the select gate SG1 takes VM, and SG2 takes 0 V. Assuming that the control gate CG2 was selected, CG1 takes VM, CG2 takes a high voltage Vpp (up to 20 V), and CG3 to CG8 take VM.

When the select gates SG1 and SG2, and control gates CG1 to CG8 are reset to 0 V, the signal OP becomes "L" and a reset signal φR becomes "H", resetting the bit line BLi to 0 V. Thereafter, the write check operation is carried out.

In the write check operation, the precharge signal φP becomes "H", and /φP becomes "L", pre-charging the bit line BLi to Vcc. Thereafter, the row decoder 5 drives the select gates and control gates. After the data in the memory cell is read out to the bit line, the select gates SG1 and SG2 and control gates CG1 to CG8 are reset. Thereafter, a verify signal φV becomes "H" so that (Vcc-Vth) is outputted only to the bit line BLi of the memory cell written with "1".

Then, φSP and φRP become "H", φSN and φRN become "L", and φP becomes "H". When the signal φSP becomes "L" and the signal φSN becomes "H", the bit line potential is sensed. Thereafter, when the signal ORP becomes "L" and signal φRN becomes "H", rewrite data is latched. The relationship between write data, memory cell data, and rewrite data at this time is given by Table 1.

TABLE 1

| Write data      | 0 | 0 | 1 | 1 |
| Memory cell data | 0 | 1 | 0 | 1 |
| Rewrite data    | 1 | 0 | 1 | 1 |

Thereafter, a write completion detecting signal /φ(DV becomes "L". If all rewrite data are "1", the write completion detected signal VDTC becomes "H". If there is data "0" and even if it is only one "0", VDTC becomes "Lli". The write operation and write check operation are repeated until VDTC becomes "H". The detection result is outputted from a data input/output pin or READY/BUSY pin.

In this embodiment, the potentials of the bit line BLi, select gates SG1 and SG2, control gates CG1 to CG8 during the erase, write, read, write check operations are given by Table 2 which assumes that CG2 is selected.

TABLE 2

|  | Erase | Write "0" | Write "1" | Read | Write Check |
|---|---|---|---|---|---|
| Bit line BLi | Floating | 0 V | 10 V | 5 V | 5 V |
| Select gate SG1 | 0 V | 10 V | 10 V | 5 V | 5 V |
| Control gate CG1 | 0 V | 10 V | 10 V | 5 V | 5 V |
| Control gate CG2 | 0 V | 20 V | 20 V | 0 V | 0.5 V |
| Control gate CG3 | 0 V | 10 V | 10 V | 5 V | 5 V |
| Control gate CG4 | 0 V | 10 V | 10 V | 5 V | 5 V |
| Control gate CG5 | 0 V | 10 V | 10 V | 5 V | 5 V |
| Control gate CG6 | 0 V | 10 V | 10 V | 5 V | 5 V |
| Control gate CG7 | 0 V | 10 V | 10 V | 5 V | 5 V |
| Control gate CG8 | 0 V | 10 V | 10 V | 5 V | 5 V |
| Select gate SG2 | 0 V | 0 V | 0 V | 5 V | 5 V |
| Source line | Floating | 0 V | 0 V | 0 V | 0 V |
| Substrate | 20 V | 0 V | 0 V | 0 V | 0 V |

Figure 8:
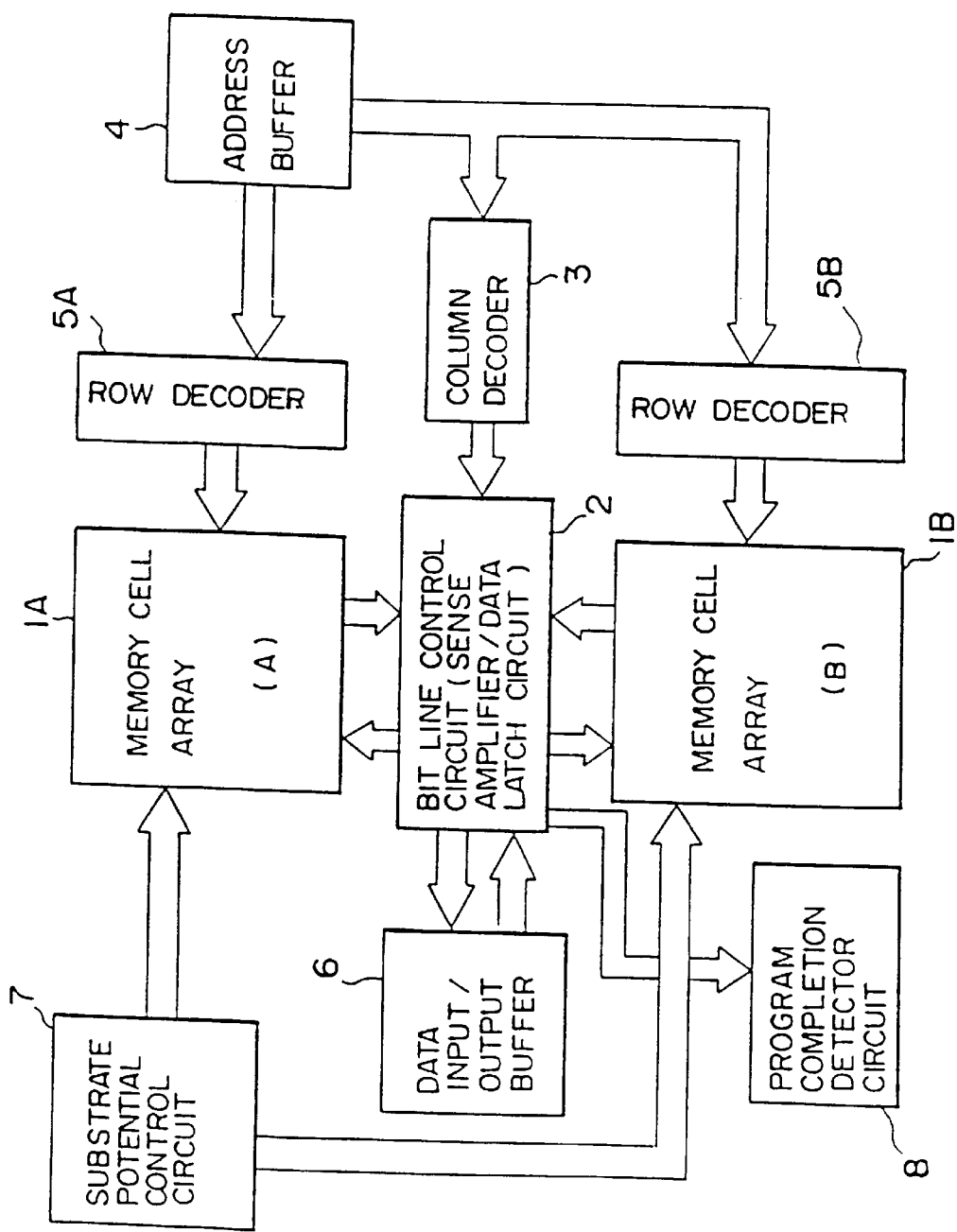
FIG. 8 is a block diagram showing the structure of a NAND cell type EEPROM according to a second embodiment of the present invention.

FIG. 8 is a block diagram showing a NAND type EEPROM according to the second embodiment of the present invention. The fundamental structure is the same as that shown in FIG. 1. The different point of the second embodiment from the first embodiment is that the cell array is divided into two blocks 1A and 1B which share the bit line control circuit 2 in common.

Figure 9:
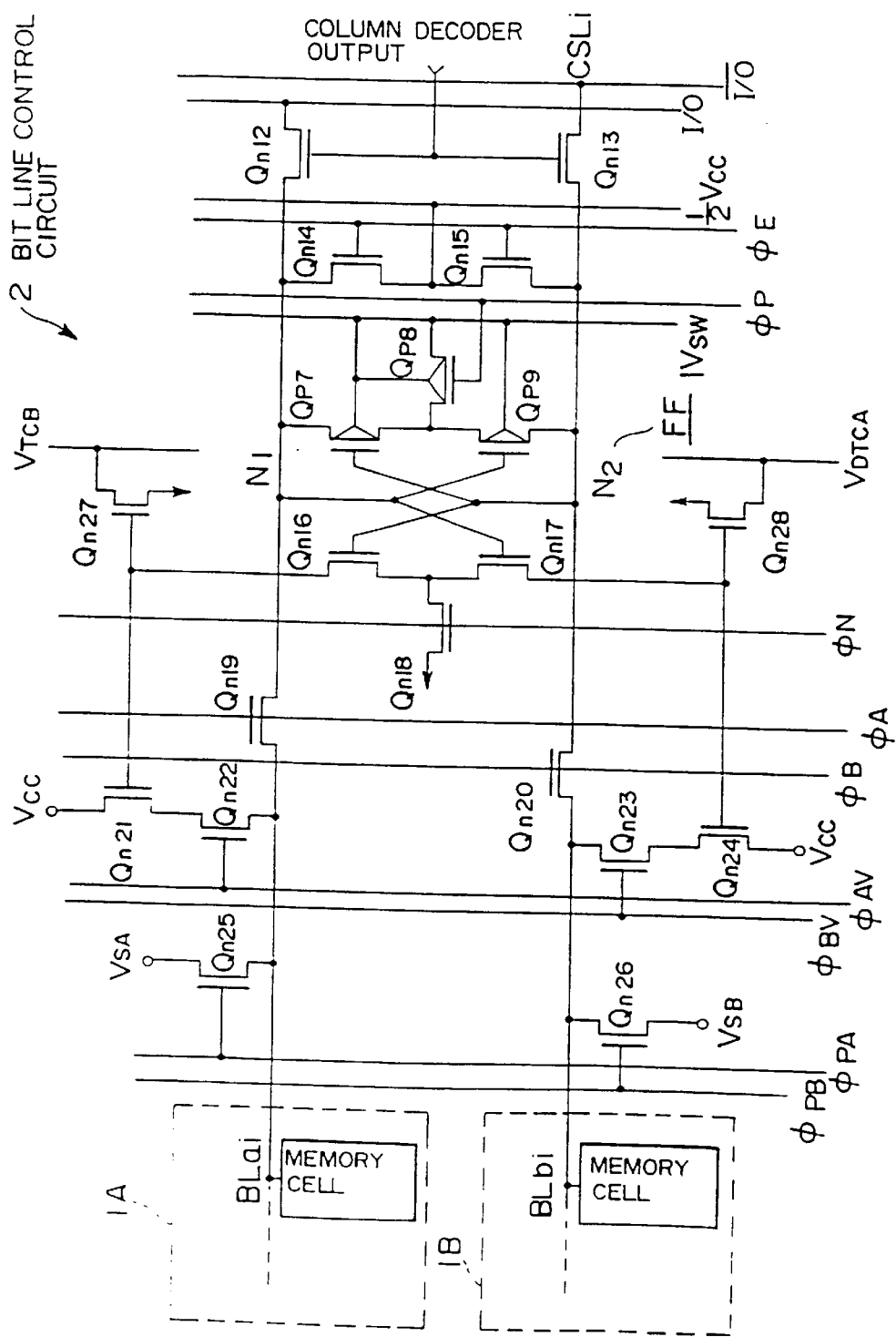
FIG. 9 is a circuit diagram showing the structure of the bit line control circuit of the second embodiment.
Figure 10:
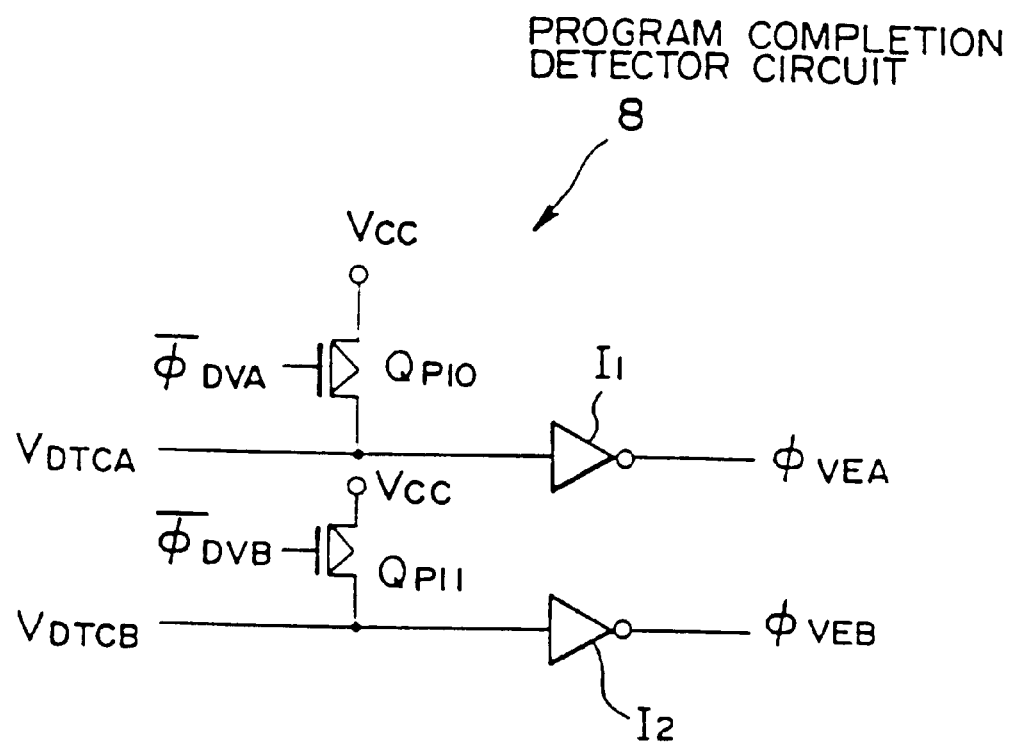
FIG. 10 is a circuit diagram of the program completion detector circuit of the second embodiment.

FIGS. 9 and 10 show the bit line control circuit 2 and program completion detector circuit 8. Referring to FIG. 9, FF is constituted by E type n-channel MOS transistors Qn16 and Qn17 and E type p-channel MOS transistors Qp7 and Qp9. E type n-channel MOS transistors Qn14 and Qn15 are equalizer transistors of FF. E type n-channel MOS transistors Qn27 and Qn28 are data detector transistors.

An E type n-channel MOS transistor Qn18 and E type p-channel MOS transistor Qp8 are FF activating transistors. E type n-channel MOS transistors Qn19 and Qn20 connect two nodes N1 and N2 of FF to bit lines BLai (i=0, 1, . . . ) and BLbi (i=0, 1, . . . ) of the cell array blocks 1A and 1B. E type n-channel MOS transistors Qn21 to Qn24 charge the bit lines to Vcc - Vth in accordance with the data on the bit lines. Qn25 and Qn26 are transistors for pre-charging and resetting the bit lines. Referring to FIG. 10, E type p-channel MOS transistors Qp10 and Qp11 are transistors for detecting a program completion. /φDVA and /φDVB are program completion detecting signals, and φVEA and φVEB are program completion detected signals.

Figure 11:
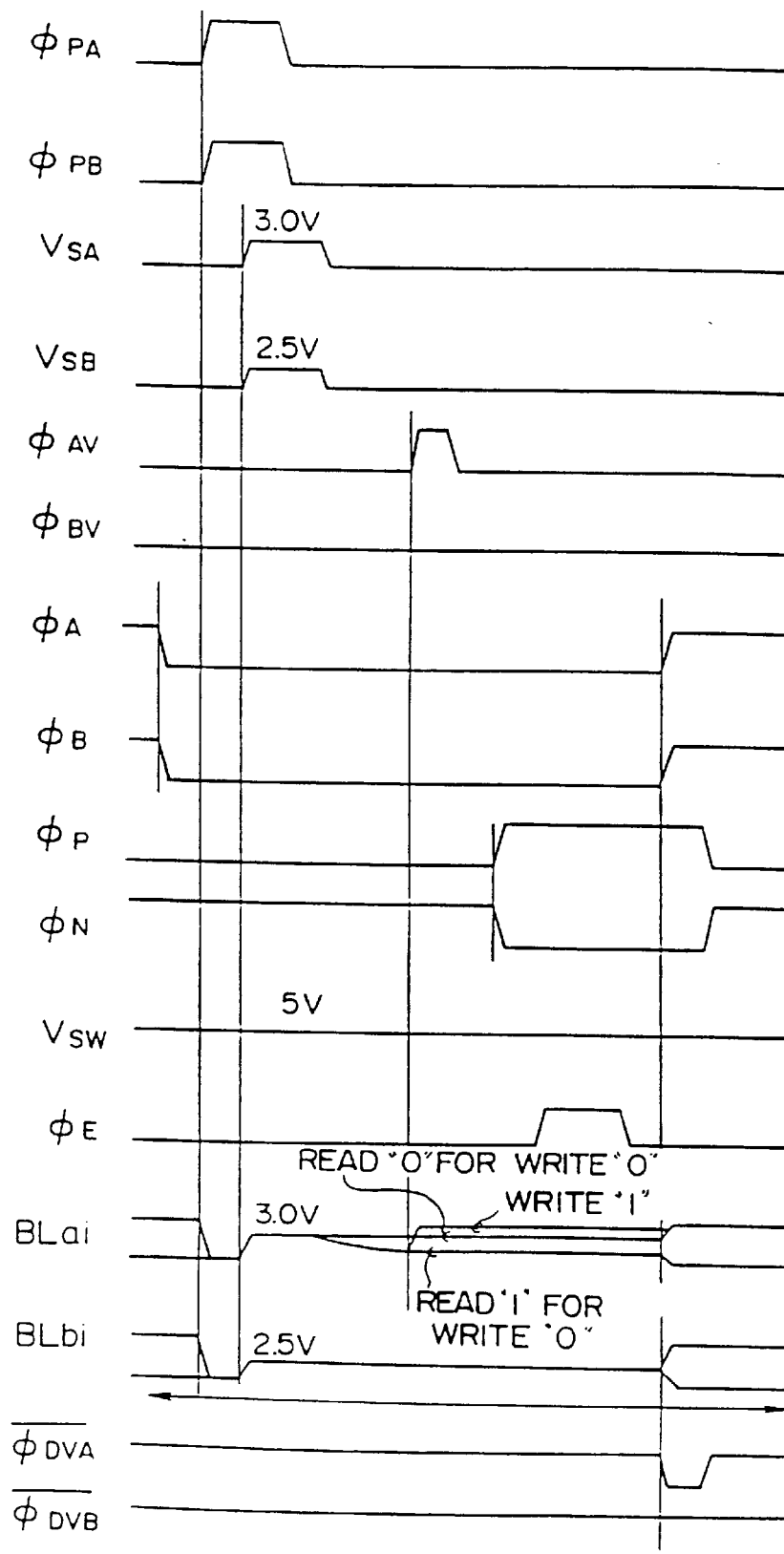
FIG. 11 is a timing chart illustrating the write check operation of the second embodiment.

Next, the write check operation of EEPROM constructed as above will be described with reference to FIG. 11. In the following description, it is assumed that the bit line BLai of the memory cell array 1 is selected.

Similar to the embodiment described previously, the selected control gate is applied with 0.5 V for example instead of 0 V, and the verify signal φAV is outputted. First, the bit line BLai is pre-charged to 3 V, and the bit line BLbi is pre-charged to 2 V. Thereafter, the pre-charge signals φPA and φPB become "L" level, and so the bit lines BLai and BLbi enter a floating state. The control gate and select gate are selected by the row decoder 5, SG1, CG1, CG3 to CG8 take Vcc, and CG2 takes 0.5 V for example. In the ordinary read operation, if the threshold value of a memory cell is 0 V or higher, "0" is read. However, in the verify read operation, "0" is read only when the threshold value is 0.5 V or higher.

Thereafter, assuming that "1" is to be written, the bit line BLai is charged to (Vcc - Vth) by the verify signal φAV. The pre-charge voltage level of the verify signal is sufficient if it is equal to or higher than the pre-charge voltage of the selected bit line. When the equalize signal φE is outputted, the CMOS flip-flop is reset. Thereafter, φA and φB become "H" so that the nodes N1 and N2 are connected to the bit lines BLai and BLbi. φP becomes "L" level and φN becomes "H" level to read data on the bit line BLai. The read data is latched and used as the next rewrite data. This rewrite data is obtained through conversion of the data read from the memory cell storing the previous write data, during the verify operation. This data conversion is the same as shown in Table 1 of the first embodiment.

Thereafter, /φDVA becomes "L". Similar to the first embodiment, if the write operation was correctly performed, VDTCA becomes "H" and the program completion detected signal φVEA becomes "L" to terminate the write operation. The detection result is outputted from a data input/output pin or READY/BUSY pin.

In this embodiment like the first embodiment, the threshold value of a memory cell with "0" written can be prevented from rising unnecessarily high in the verify read/rewrite operation.

In this embodiment, the potentials of the control gates CG1 to CG8 and select gates SG1 and SG2 during the erase, write, verify read, and read operations are given by Table 3 which assumes that CG2 and bit line BLai are selected.

TABLE 3

|  | Erase | Write "0" | Write "1" | Read | Write Check |
|---|---|---|---|---|---|
| Bit line BLai | Floating | 0 V | 10 V | 3 V | 3 V |
| Bit line BLbi | " | 0 V | 0 V | 2 V | 2 V |
| Select gate SG1 | 0 V | 10 V | 10 V | 5 V | 5 V |
| Control gate CG1 | 0 V | 10 V | 10 V | 5 V | 5 V |
| Control gate CG2 | 0 V | 20 V | 20 V | 5 V | 0.5 V |
| Control gate CG3 | 0 V | 10 V | 10 V | 5 V | 5 V |
| Control gate CG4 | 0 V | 10 V | 10 V | 5 V | 5 V |
| Control gate CG5 | 0 V | 10 V | 10 V | 5 V | 5 V |
| Control gate CG6 | 0 V | 10 V | 10 V | 5 V | 5 V |
| Control gate CG7 | 0 V | 10 V | 10 V | 5 V | 5 V |
| Control gate CG8 | 0 V | 10 V | 10 V | 5 V | 5 V |
| Select gate SG2 | 0 V | 0 V | 0 V | 5 V | 5 V |
| Source line | Floating | 0 V | 0 V | 0 V | 0 V |
| Substrate | 20 V | 0 V | 0 V | 0 V | 0 V |

Figure 12A:
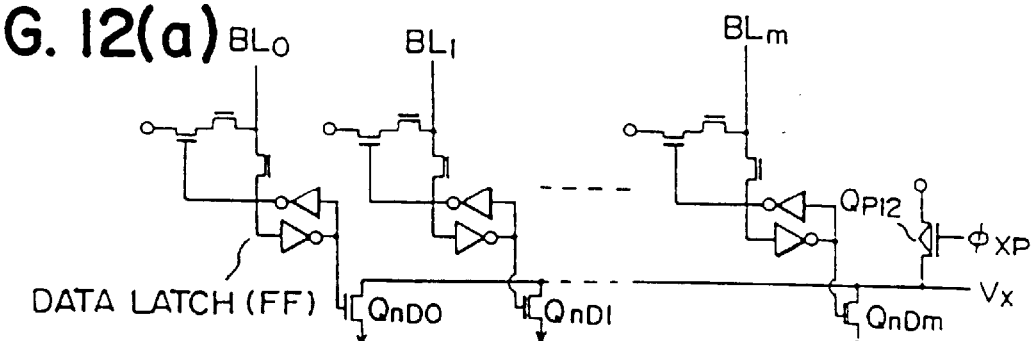
FIGS. 12(a), (b), (c) and (d) are circuit diagrams showing other embodiments of the data latch unit and program completion check circuit.

FIGS. 12(a) to 12(d) are schematic circuit diagrams showing the data latch unit of the bit line control circuit 2 and the program completion detector circuit 8 relative to bit lines, respectively of the present invention. FIG. 12(a) shows the circuits used in the first embodiment. E type n-channel MOS transistors QnD0 to QnDm correspond to the transistor Qn11 shown in FIG. 5. An E type p-channel MOS transistor Qp12 corresponds to the transistor Qp6 of the program completion detector circuit 8 shown in FIG. 6.

Figure 12B:
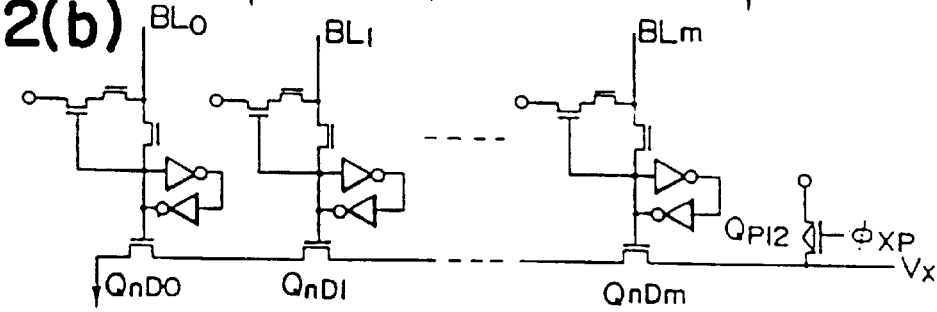

FIG. 12(b) shows serially connected data detector E type n-channel MOS transistors. If the gates of all data detector transistors QnD0 to QnDm become "H", the program is completed, and Vx becomes "L".

Figure 12C:
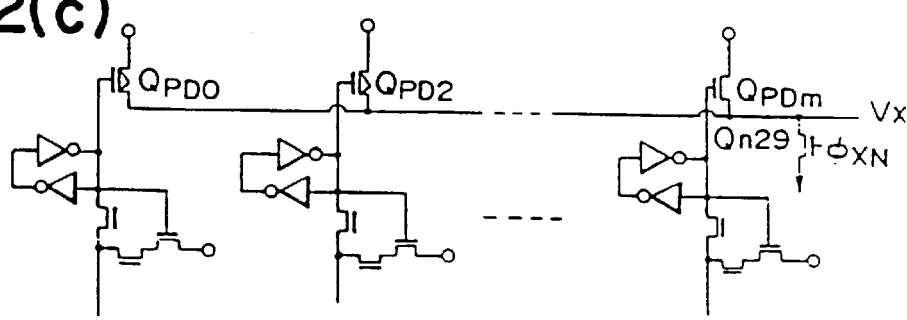
Figure 12D:
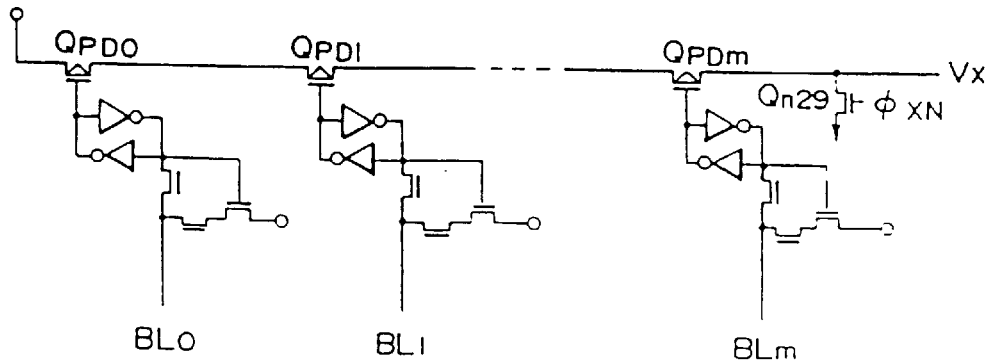
Figure 13A:
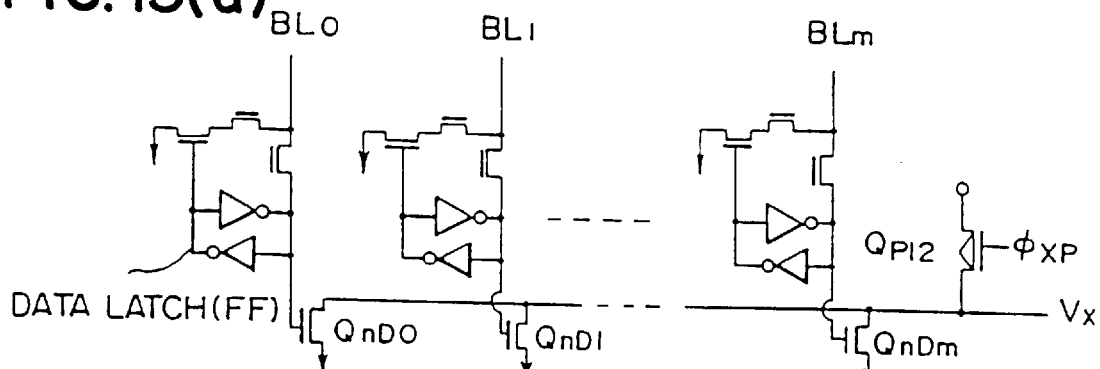
FIGS. 13(a), (b), (c) and (d) are circuit diagrams showing other embodiments of the data latch unit and program completion check circuit.
Figure 13B:
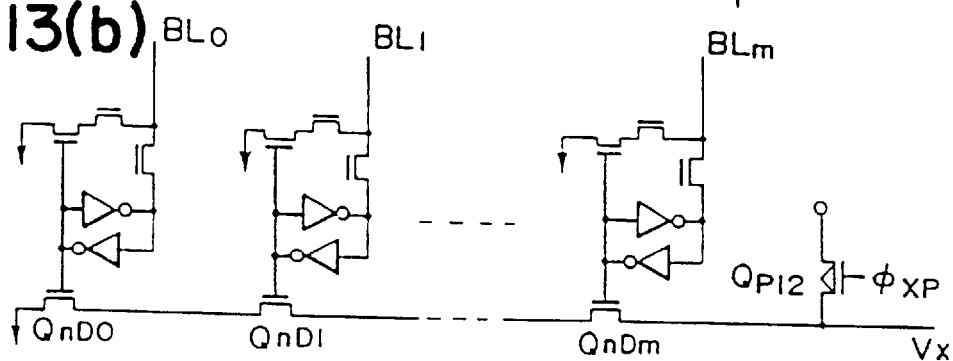
Figure 13C:
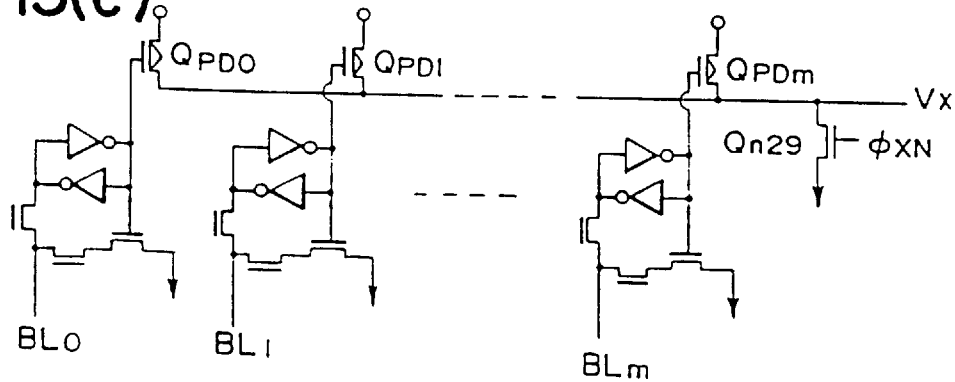
Figure 13D:
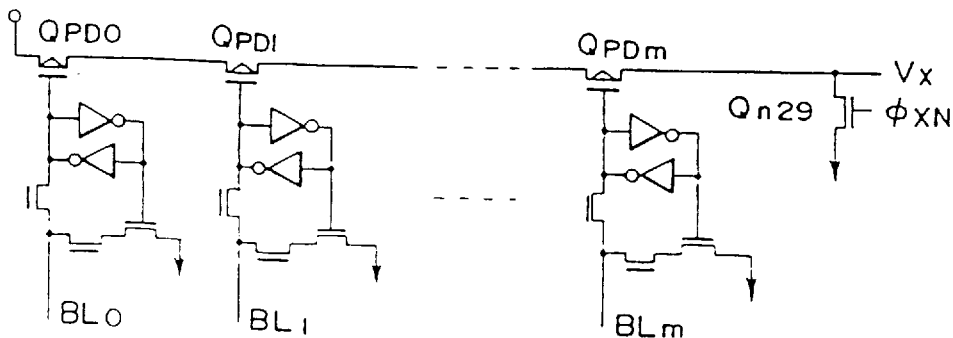

In FIGS. 12(c) and 12(d), as data detector transistors, E type p-channel MOS transistors QpD0 to QpDm are used, and as the program completion detector circuit 8, an E type n-channel MOS transistor Qn29 is used. With such a circuit arrangement, it is possible to detect a completion of the write operation.

As in the case of FIG. 12(a), use of the parallel circuit of the detector transistors QnD0 to QnDm allows a proper detection even if the number of bit lines is 1000. As in the case of FIG. 12(b), with the serial circuit of the detector transistors, the source and drain of adjacent Transistors can be used in common, reducing a pattern area.

FIGS. 13(a) to 13(d) show modifications of the circuits shown in FIGS. 12(a) to 12(d), applied to one transistor type (NOR type) flash EEPROM. In a NOR type flash EEPROM, data is inverted after the end of the write operation. Therefore, as shown in FIGS. 13(a) to 13(d), terminals of FF are connected to data detector transistors in the manner opposite to the cases of FIGS. 12(a) to 12(d).

Next, an embodiment of a NOR type flash EEPROM will be described.

In FIG. 5 of Japanese Patent Laid-Open Publication No. 3-250495, there is disclosed a memory which uses a NOR type memory cell structure while achieving a high integration density of generally the same level of a NAND type. It is possible to considerably shorten a write verify time by applying to this memory the collective verify circuit or instantaneous detecting circuit of the present embodiments described previously.

Such an embodiment will be described with reference to FIGS. 14 and 15.

Figure 14:
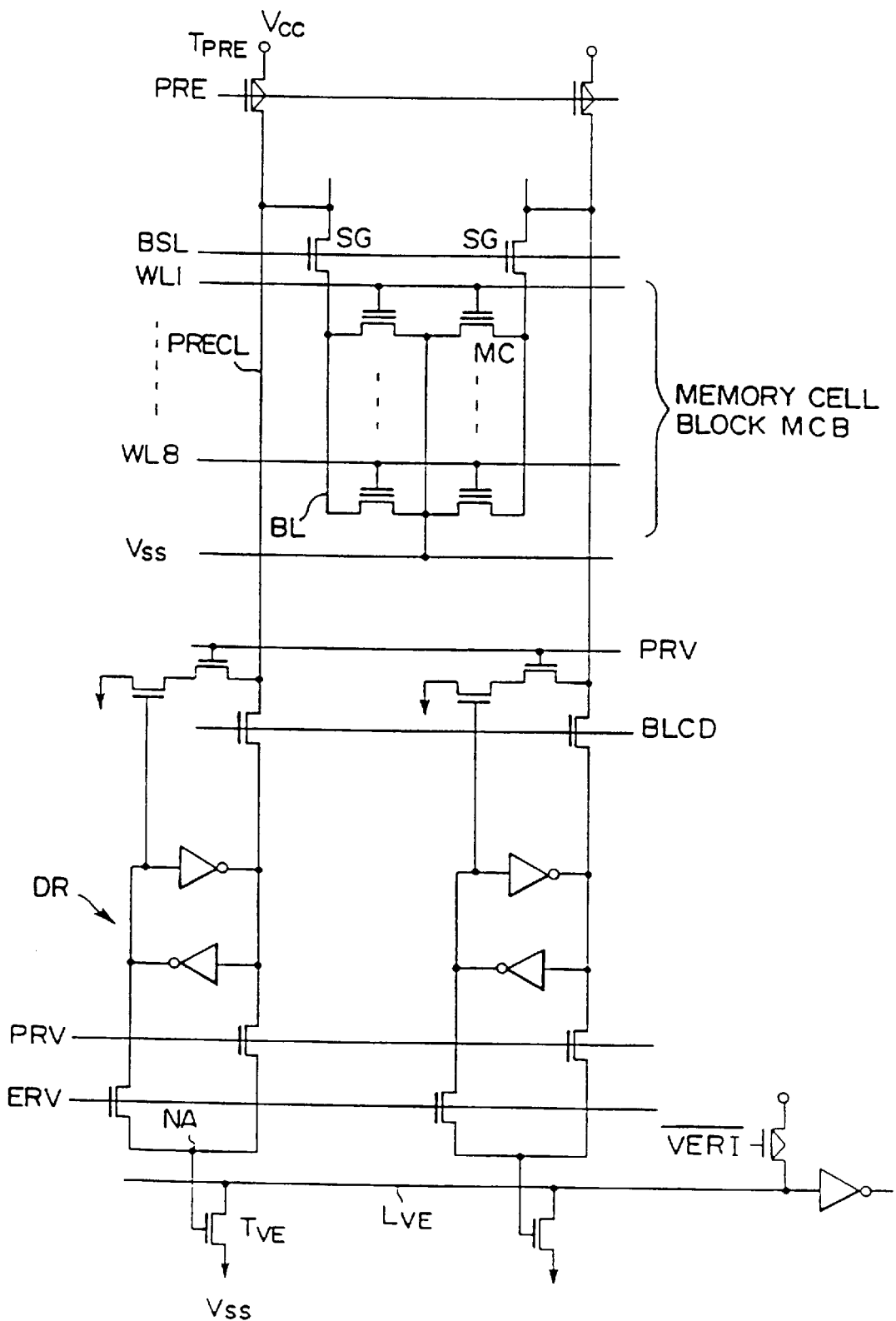
FIG. 14 is a circuit diagram showing an embodiment of a NOR type flash EEPROM.

The circuit arrangement of this embodiment is shown in FIG. 14. The different points of this embodiment from an NAND type EEPROM are as follows. Namely, data to be written in a memory cell MC of a memory cell block MCB is latched by a data latch DR. A signal is outputted from the opposite node of the data latch DR to a detector transistor.

Figure 15:
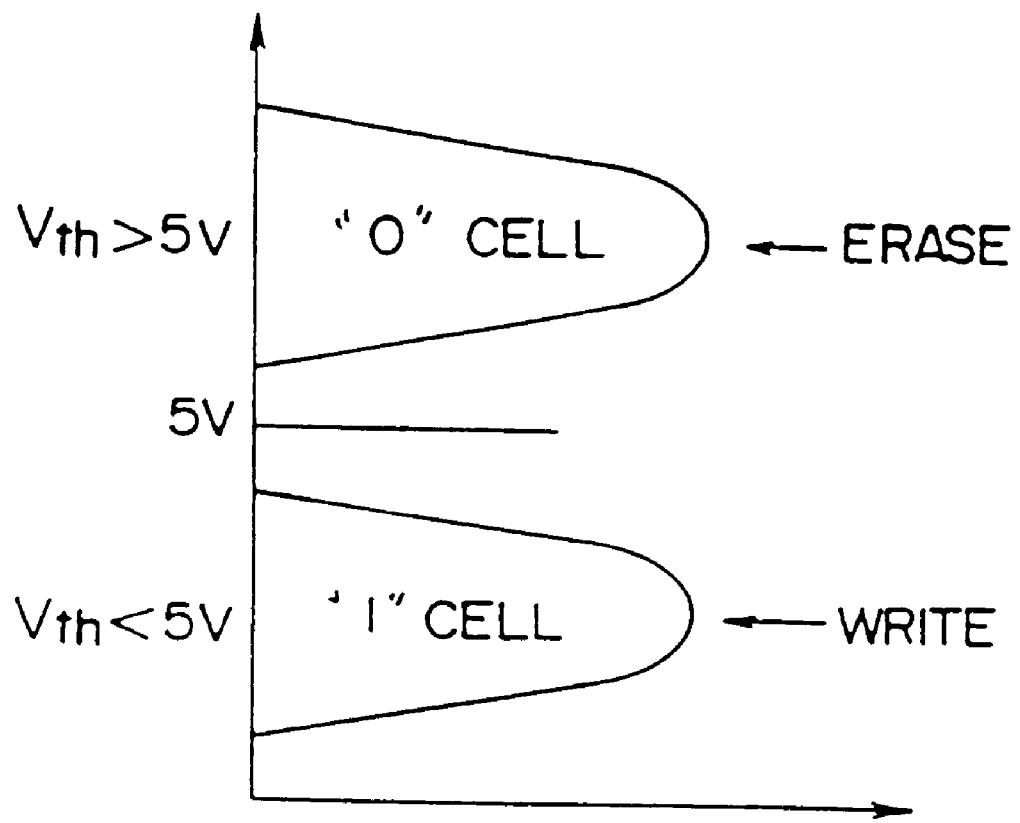
FIG. 15 is a graph showing the distribution of threshold values.

FIG. 15 shows the distribution of threshold values Vth of cells with data written and cells with data erased.

The applying voltages to circuit portions during the erase, write, and read operations are given by Table 4.

TABLE 4

|  | BSL | BL | WL | $V_{SS}$ |
|---|---|---|---|---|
| Erase | 0 V | Floating | 20 V | 0 V |
| Write |  |  |  |  |
| "0" write ($V_{th}$ > 5) | 22 V | 0 V | 0 V | Floating |
| "1" write ($V_{th}$ > 5) | 22 V | 20 V | 0 V | Floating |
| Non-selected cell | 22 V | 0 V/20 V | 10 V | Floating |
| Read | 5 V | 0 V/5 V | 5 V | 0 V |

Next, the erase operation will be described.

A block to which data is written is selected by its row decoder. A bit line corresponding to a memory cell to be selected is made of a floating state, and the word line is applied with 20 V. As a result, electrons are injected to the floating gate of the selected memory cell. This injection is carried out by an F-N current. Therefore, the amount of current is very small. For this reason, memory cells of 1000 bits can be erased at the same time.

The verify operation after the erase operation is performed by a collective verify operation or instantaneous detecting operation. Namely, a voltage of 5 V for example is applied to a word line. At this time, the memory cell erased turns off/on depending upon whether its threshold value is sufficiently shifted to the positive side. If off, it means an erase OK state.

More specifically, the verify operation is carried out in the following manner. When a signal PRE becomes "L" level and a transistor $T_{PRE}$ turns on, a pre-charge line PRECL is pre-charged to Vcc via the transistor $T_{PRE}$. At this time, a select line BSL is set to 5 V and a select gate SG is turned on. As a result, a bit line BL is also pre-charged. A word line WL to be selected is set to 5 V. At this time, a memory cell sufficiently erased/not-erased turns off/on. When the memory cell turns off/on, the pre-charge potential at the bit line BL and hence pre-charge line PRECL is held/discharged. The potential at the pre-charge line PRECL is detected by a sense amplifier and latched to the data latch DR. Thereafter, a signal ERV is set to "H" to read the contents of the data latch DR to a node NA. The potential at the node NA becomes "L" if all of a plurality of memory cells of a column corresponding to the node NA are in an erase OK state, and becomes "H" if even one of memory cells is in an erase NG state. The potential at the node NA is applied to the gate of a verify transistor TVE. This transistor $T_{VE}$ turns off/on depending upon "L/H" of the node NA. When the transistor $T_{VE}$ turns off/on, the potential of a collective verify sense line $L_{VE}$ becomes/does-not-become $V_{SS}$. The above operations are performed for each column. Therefore, the level of the collective verify sense line $L_{VE}$ becomes "H" when all cells of all columns take a verify OK state, and becomes "L" if even one cells of any column takes a verify NG state.

Next, the write (program) operation will be described.

The word line of a block to be programmed is set to 0 V. Word lines of the other blocks are set to 10 V to relax the electric field stress between the drain and gate of each memory cell. In the block to be programmed, the bit line connected to a memory cell from which floating gate electrons are pulled out, is selectively set to 20 V to perform a program operation.

In the program verify operation, the verification is carried out based upon the "H/L" potential level of the pre-charge line PRECL and the program data "0/1" during the verify read. For the collective verify operation, the signal PRV is set to "H". If a program NG state occurs, data is rewritten. In this rewrite operation, the pre-charge line PRECL connected to a memory cell in a "0" write OK state is discharged to "L" level. Because of the "L" level of the bit line, electrons are not pulled out of the floating gate during the rewrite operation. On the contrary, the threshold value of a memory cell in a "1" write OK state is sufficiently low, so that the pre-charge potential is discharged via the memory cell under the "1" write OK state to "L" level during the rewrite program operation. As a result, also during the rewrite program operation, the threshold value of the memory cell in the "1" write OK state will not change. On the other hand, the threshold value is not lowered by the discharge of the pre-charge potential for the case of a program NG state of "1" write NG state. Therefore, "H" level is again latched and programmed.

This embodiment described above has the following advantages. Since the cell structure is the same as a NAND type cell, it can be made by reducing the size of a chip. Furthermore, since a cell itself is of a NOR type, the operating current $I_{cell}$ is large allowing a high speed random access. A page read/write is also possible.

Figures 16A, 16B:
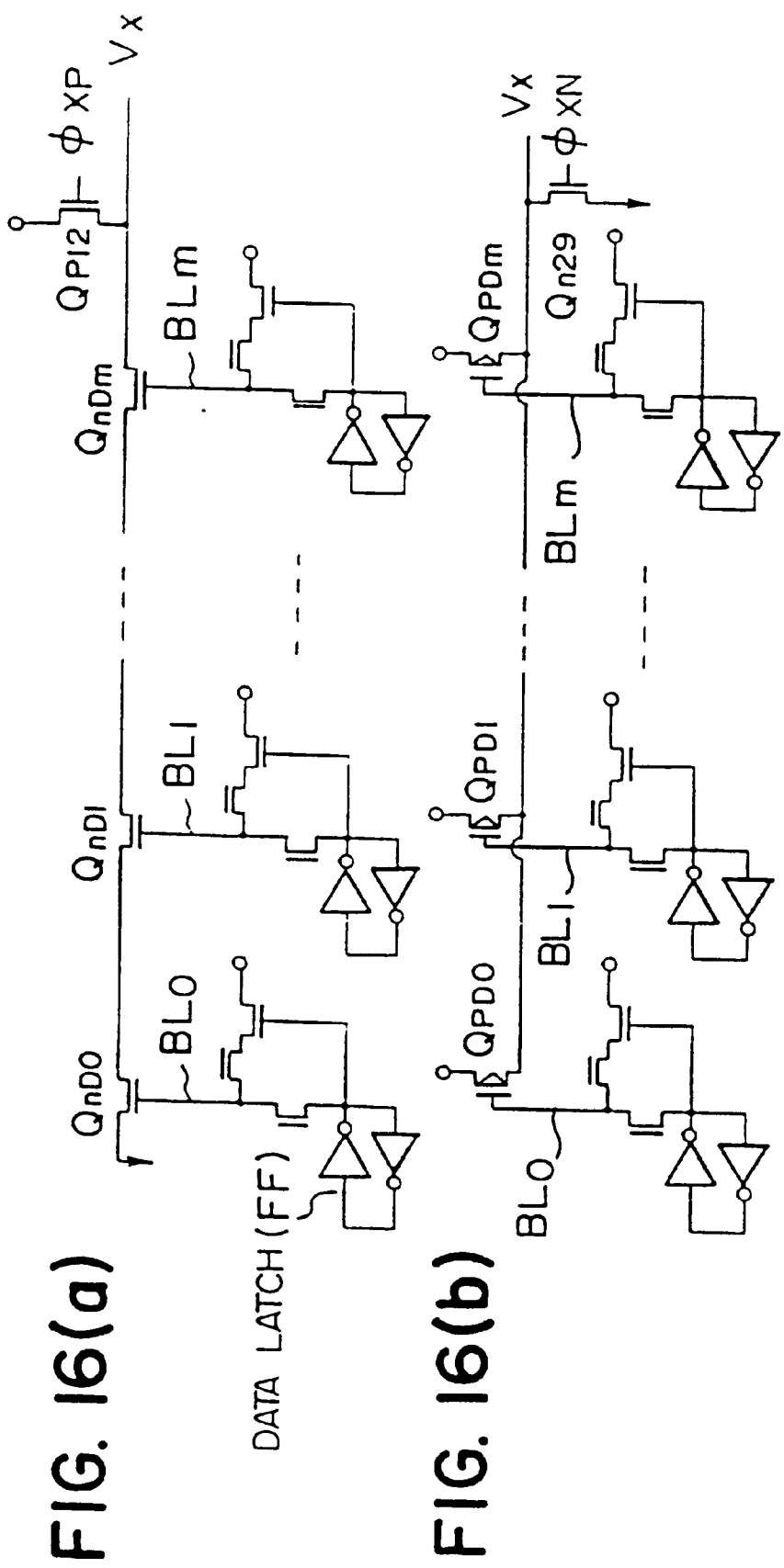
FIGS. 16(a) and (b) are circuit diagrams showing other embodiments of the data latch unit and program completion detector circuit.
Figure 17A:
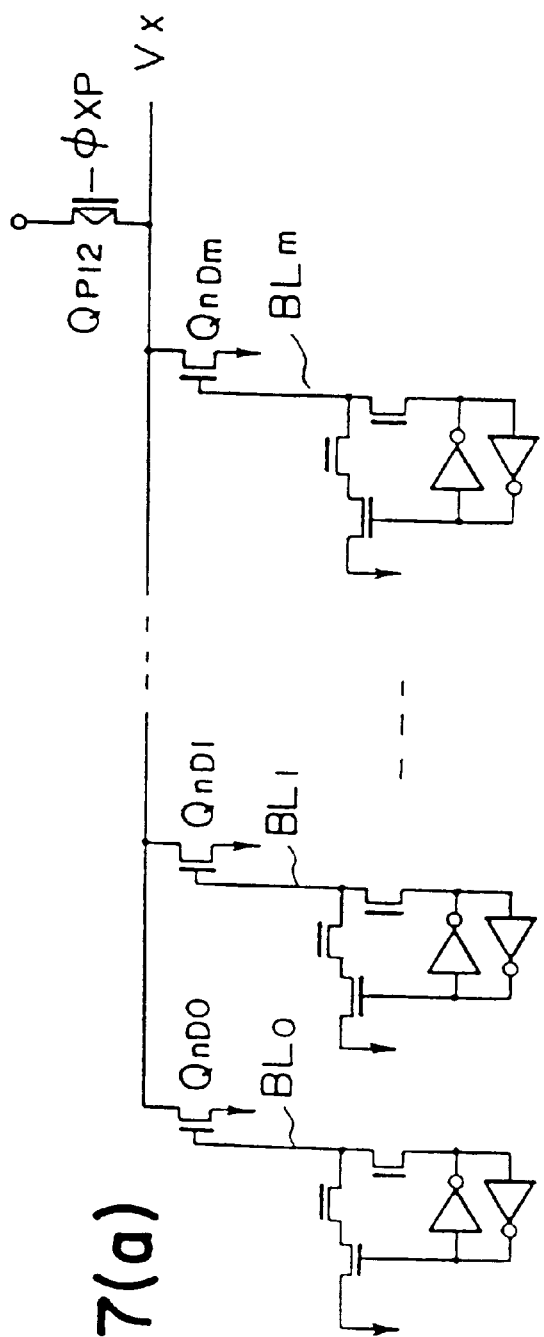
FIGS. 17(a) and (b) are circuit diagrams showing other embodiments of the data latch unit and program completion detector circuit.
Figure 17B:
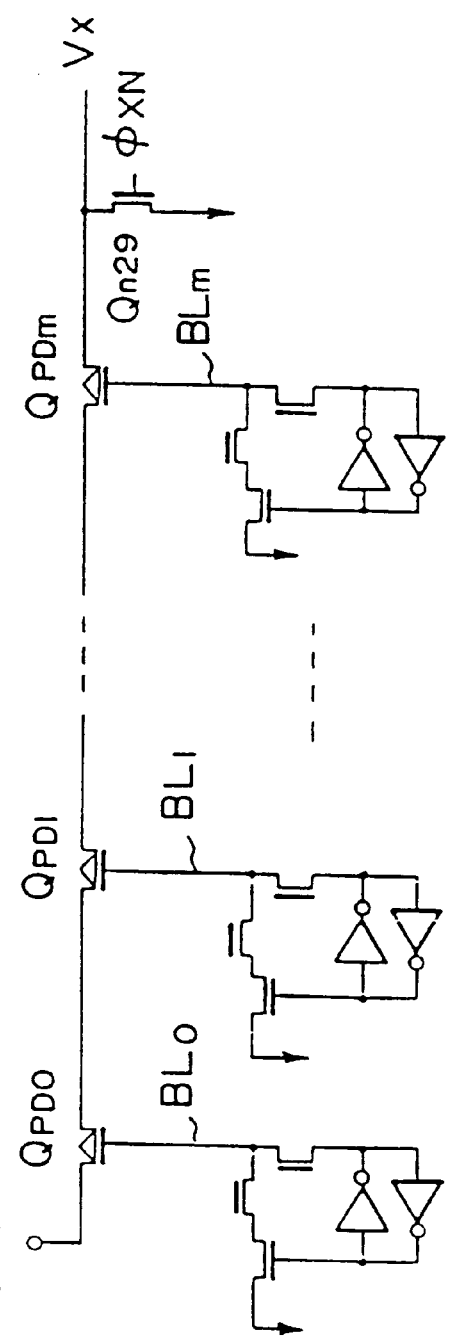

The same functions of the embodiments shown in FIGS. 12(b) and 12(c) can also be obtained by directly connecting the gate of the data detector transistor to the bit line BLi. Such examples are shown in FIGS. 16(a) and 16(b). Similarly, the same functions of the embodiments shown in FIGS. 13(a) and 13(d) can also be obtained by directly connecting the gate of the data detector transistor to the bit line BLi. Such examples are shown in FIGS. 17(a) and 17(b).

In the embodiments shown in FIGS. 12(a) to 12(d) 13(a) to 13(d), 16(a) and 16(b), and 17(a) and 17(b), a single bit line system is used. Instead, an open or folded bit line system may also be used. In such a case, the structure of the data detector transistor, CMOS flip-flop FF, and select bit line are arranged in the same manner as the embodiments.

FIGS. 12(a) to 12(d), 13(a) to 13(d), 16(a) and 16(b), and 17(a) and 17(b) schematically show the structure of the data detector transistor, CMOS flip-flop FF, and select bit line. Various bit line systems can be used in the same manner.

Another embodiment of the present invention will be described. In the embodiments described above, one end of the CMOS flip-flop (data latch/sense amplifier circuit) provided at one end of the bit line is connected to the gate of the detector transistor. Irrespective of the address signals, all of the contents of the data latches are checked to determine whether they are all "1" write data and to determine whether the write conditions are sufficient or not.

Because of such operations, data in the latch circuits at the defective column address or non-used redundancy column address provided for relief purpose, is detected. Even if the write conditions are sufficient, they may be detected as insufficient, resulting in a problem of no completion of the data write operation. Namely, the data write check operation after the data write provides a malfunction because of the defective column address or non-used column address.

In this embodiment, therefore, there is provided means for relieving a malfunction of the detector circuit for detecting the rewrite data. It is accordingly possible to detect the write conditions at column addresses actually used, without being influenced by the write conditions at the defective column address or non-used column address.

The fundamental structure is the same as the first embodiment shown in FIGS. 1 to 7. In addition to the elements used in the first embodiment, in this embodiment, a fuse or non-volatile memory are connected to the write completion detector MOS transistor, as will be later described.

Figure 18A:
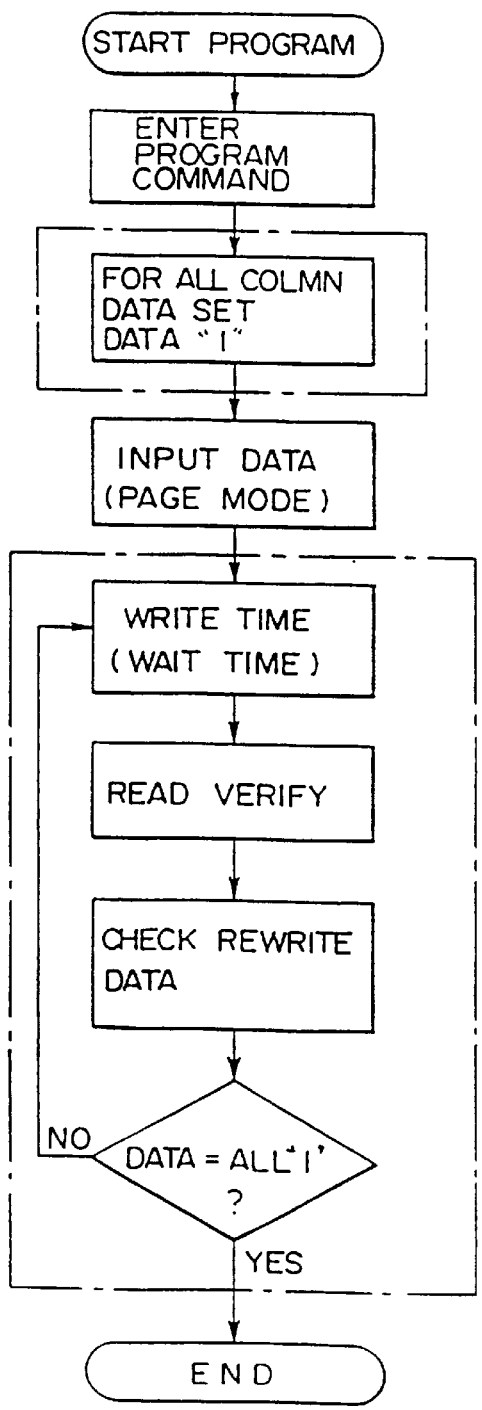
FIGS. 18(a) and (b) are flow charts illustrating algorithms for data read/write check according to a third embodiment.

FIG. 18(a) shows an algorithm for checking the read/write operation. When a program command is entered, "1" program data is automatically latched to the data latch circuits at all column addresses including redundant column addresses. All column addresses mean all column addresses at the divided cell arrays and data latch circuits selected, if they are provided in division.

The write operation is quite the same as the first embodiment, and the write check operation is generally the same as the first embodiment. However, in Table 1, the memory cells at the defective column address and non-used column address are reset to "1" before data input. As a result, the rewrite data is always "1" irrespective of the write data and memory cell data.

With the read/write check operation following the algorithm shown in FIG. 18(a), even if there is a memory cell at the defective column address which cannot be written with "0", the write completion detecting operation will not be influenced by this memory cell and will not show a malfunction. More specifically, it is possible to avoid in advance the problem of no completion of the write operation to be caused by an erroneous judgement of insufficient write conditions resulting from an influence of memory cells at defective or non-used column addresses, irrespective of actually sufficient write conditions.

Figure 18B:
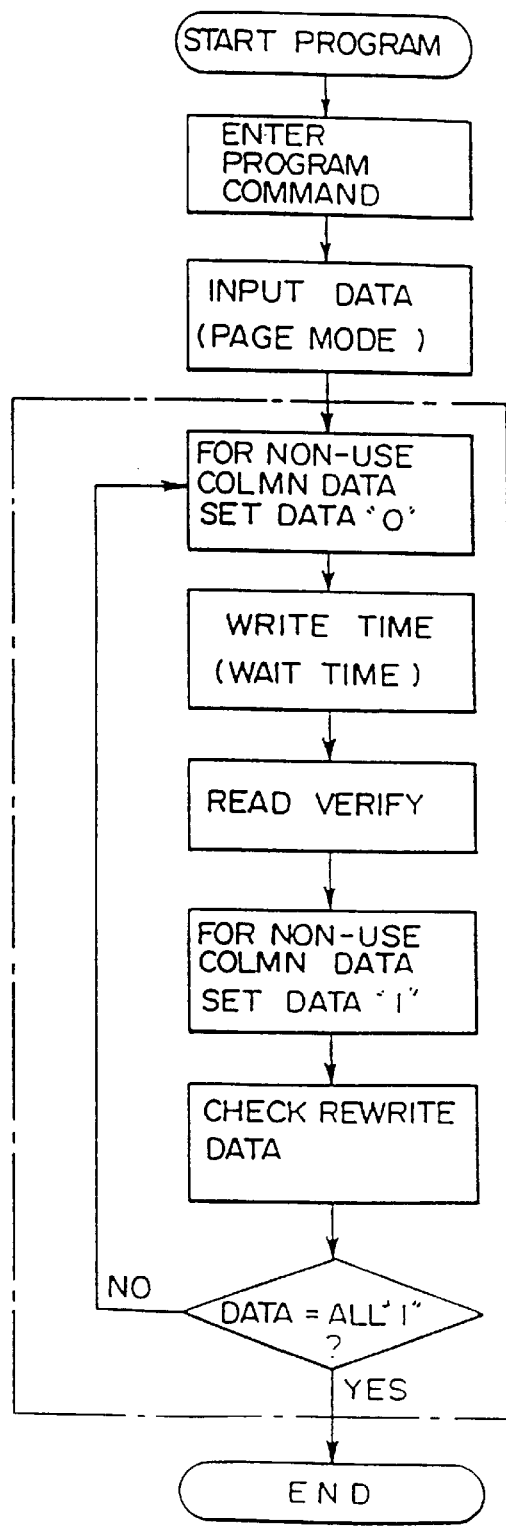

FIG. 18(b) shows another algorithm. For example, a bit line at a certain defective column address is assumed to be short circuited to ground. In such a case, if "1" program data is set as illustrated in FIG. 18(a), the intermediate potential VM is applied to this bit line. Therefore, the intermediate potential VM is short circuited to ground, so that the potential VM generated by the voltage booster circuit cannot be raised to a predetermined potential.

In view of this, according to the algorithm shown in FIG. 18(b), "0" program data is automatically set only for a non-used column address (inclusive of a defective address), after externally inputting data. "1" program data is also automatically set for a non-used column address, after the verify read operation. With such an arrangement, it is possible to realize a highly reliable NAND cell type EEPROM which is not influenced by a possible leakage of the bit line. In both the algorithms shown in FIGS. 18(a) and 18(b), the steps encircled by a one-dot chain line are automatically executed within EEPROM.

Figure 19A:
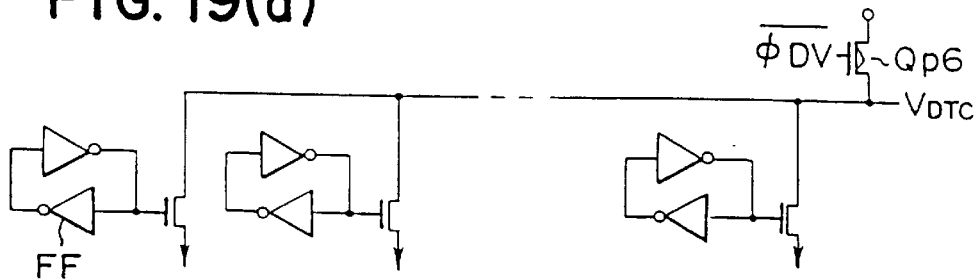
FIGS. 19(a), (b) and (c) are schematic circuit diagrams of data latch/sense amplifiers and write completion detecting transistors.
Figure 19B:
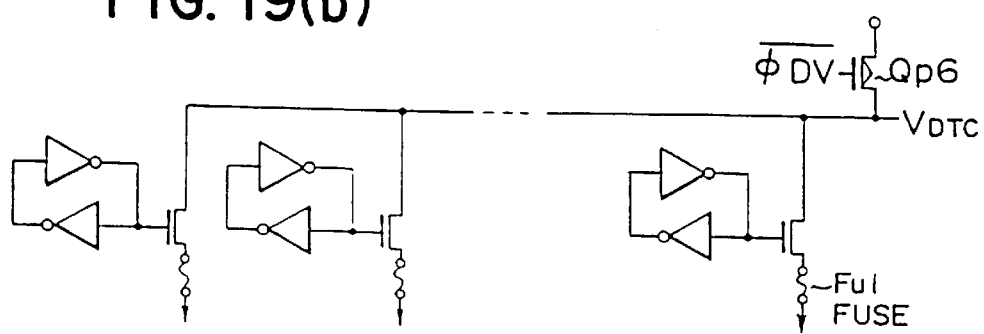
Figure 19C:
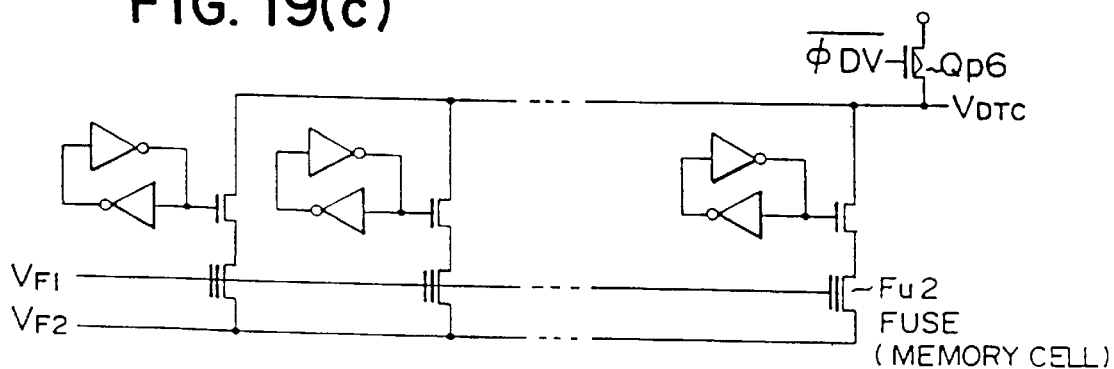

FIG. 19(a) schematically shows data latch/sense amplifier circuits of CMOS flip-flops and write completion detector transistors, respectively shown in FIG. 6. FIGS. 19(b) and 19(c) show examples of fuses Fu1 and Fu2 connected to the write completion detector MOS transistors for relieving a malfunction of the write completion detector circuit. In the example of FIG. 19(b), a fuse Fu1 made of polysilicon or aluminum line is provided between the source of the write completion MOS transistor and ground. After testing EEPROM, of the fuses Fu1, the fuses corresponding to the defective column address and non-used column address are blown by a laser beam or the like. The write completion detecting operation is not therefore carried out for the column address with a blown fuse Fu1.

In the example shown in FIG. 19(c), as a fuse Fu2, a non-volatile memory cell is used. In order to use a nonvolatile memory cell as a fuse, fuse data is erased (initialized) by applying an ultraviolet ray. Namely, for example, Vth of the memory cell Fu2 is made negative or set to the range of 0<Vth<Vcc. In order to program the fuse data, VF1 is set to about VM larger than Vcc, VF2 is set to 0 V, and VDTC is set to Vcc. "0" program data is latched to the latch at the column address for which the path between the source of the write completion detector MOS transistor and ground is to be disconnected. "1" program data is latched to the latch at the column address for which the path is not to be disconnected. Current flows through the memory cell (fuse Fu2) at the column address with "0" data latched, and so its Vth rises because of hot electron injections. Current does not flow through the memory cell (fuse Fu2) at the column address with "1" data latched, and so its Vth will not rise. VF2 may be set to Vss, and VDTC may be set to 0 V.

In an ordinary operation, the potentials at circuit portions are set as follows. If Vth of the memory cell is negative at the fuse data erase, Vth is changed to positive, and VF1 is set to the ground potential, to make the memory cell (fuse Fu2) of a blown state. If Vth of the memory cell is within the range of 0<Vth<Vcc<Vth is changed to the range of Vth>Vcc, VF1 is set to Vcc, and VF2 is grounded to obtain the blown state of the memory cell.

For the data erase of the fuse memory Fu2, Vth of the fuse may be set within the range of Vth<0 V or 0 V<Vth<Vcc by using a tunnel current, by setting VF1 to the ground potential and setting VF2 to about VM higher than Vcc.

Figure 20A:
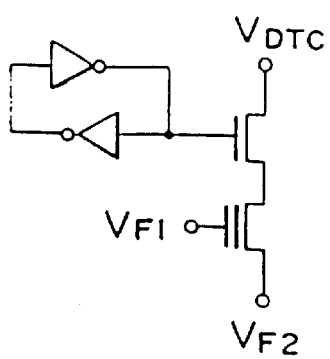
FIGS. 20(a) (b) and (c) are schematic diagrams showing the structures of the write completion detecting transistor and fuseblow non-volatile memory shown in FIGS. 19(a) to 19(c).
Figure 20B:
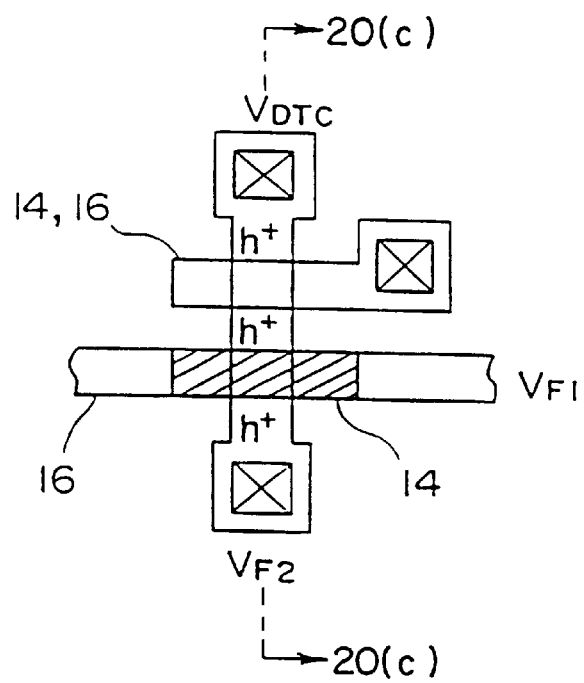
Figure 20C:
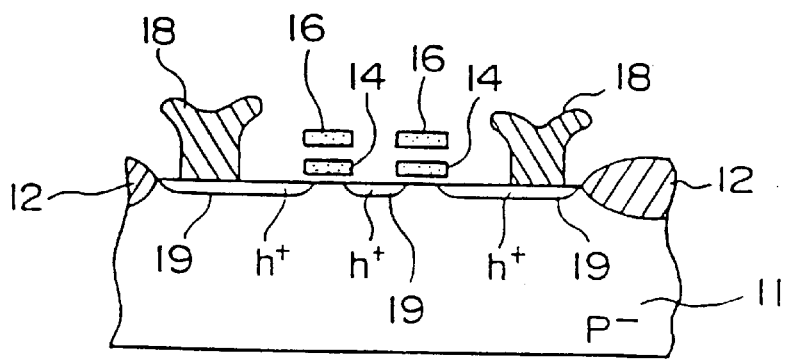

FIG. 20(a) shows a circuit portion of FIG. 19(c) corresponding to one column. FIG. 20(b) is a plan view of the write completion detector MOS transistor and fuse non-volatile memory shown in FIG. 20(a). FIG. 20C is a cross sectional view taken along line X-X' of FIG. 20B. The write completion detector MOS transistor and fuse non-volatile memory are formed at the same time when NAND type memory cells are formed. Similar to the select gate of a NAND cell, the gate electrode of the write completion detector MOS transistor is of a two-layer structure, the two gate layers being connected together on an element isolation insulating film 12.

First elements such as the write completion detector MOS transistors and fuse non-volatile memory cells are formed in the similar manner to forming second elements such as the select transistors and memory cells of NAND cells. For example, the concentration of the n-type diffusion layer of the first element may be made higher more or less so as to make it easy to program through hot electron injection. For example, the concentration of the n-type diffusion layer of the first element is arranged to be the concentration of the n-type diffusion layer of a peripheral transistor having a higher concentration than the second element. The second element may be formed at the same time when forming the n-type diffusion layer of a peripheral transistor.

Figure 21A:
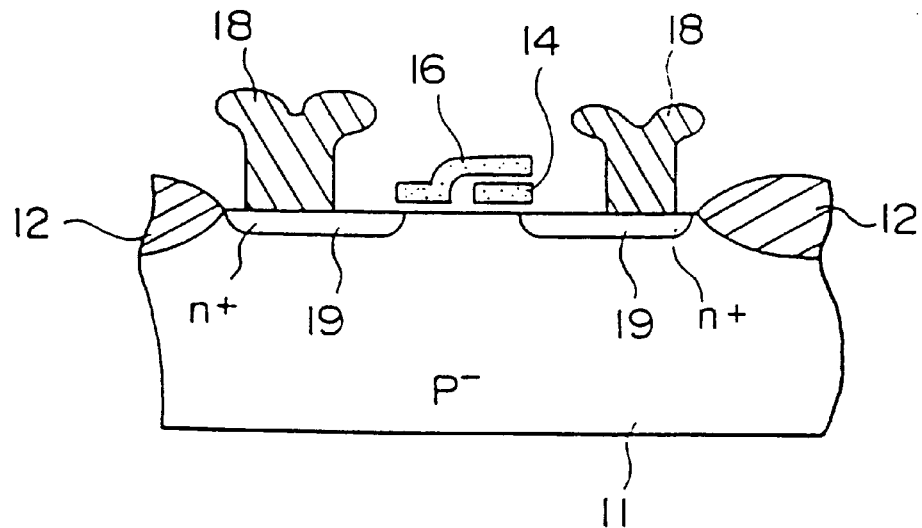
FIGS. 21(a), (b) and (c) are schematic diagrams showing the structures different from those shown in FIGS. 20(a), (b) and (c).
Figure 21B:
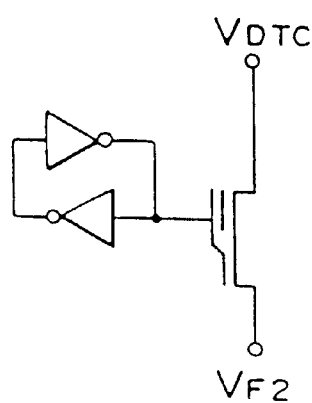
Figure 21C:
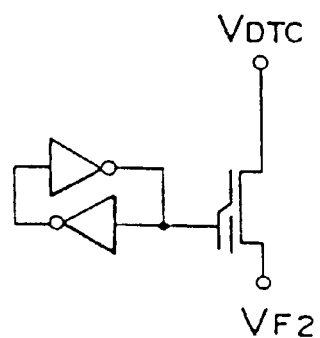

FIGS. 21(a) to 21(c) show another example of the write completion detector MOS transistor and fuse nonvolatile memory cell. FIG. 21(a) is a cross sectional view showing the structure of the elements, and FIGS. 21(b) and 21(c) are equivalent circuit diagrams. Programming of the fuse non-volatile memory cells are performed in the similar manner to the example shown in FIGS. 20(a) to 20(c). The programming with VF2 grounded is illustrated in FIG. 21(b). The programming with VDTC grounded is illustrated in FIG. 21(c). This element structure is formed in the similar manner to the example shown in FIGS. 20(a) to 20(c).

In programming the non-volatile memory cells shown in FIGS. 20(a) to 20(c) and 21(a) to 21(c), a high efficiency is obtained if the power supply potential Vcc is set higher than that in the ordinary operation. A high efficiency is also obtained by setting the power supply VMB of the CMOS flip-flop to VM higher than Vcc.

Figure 22:
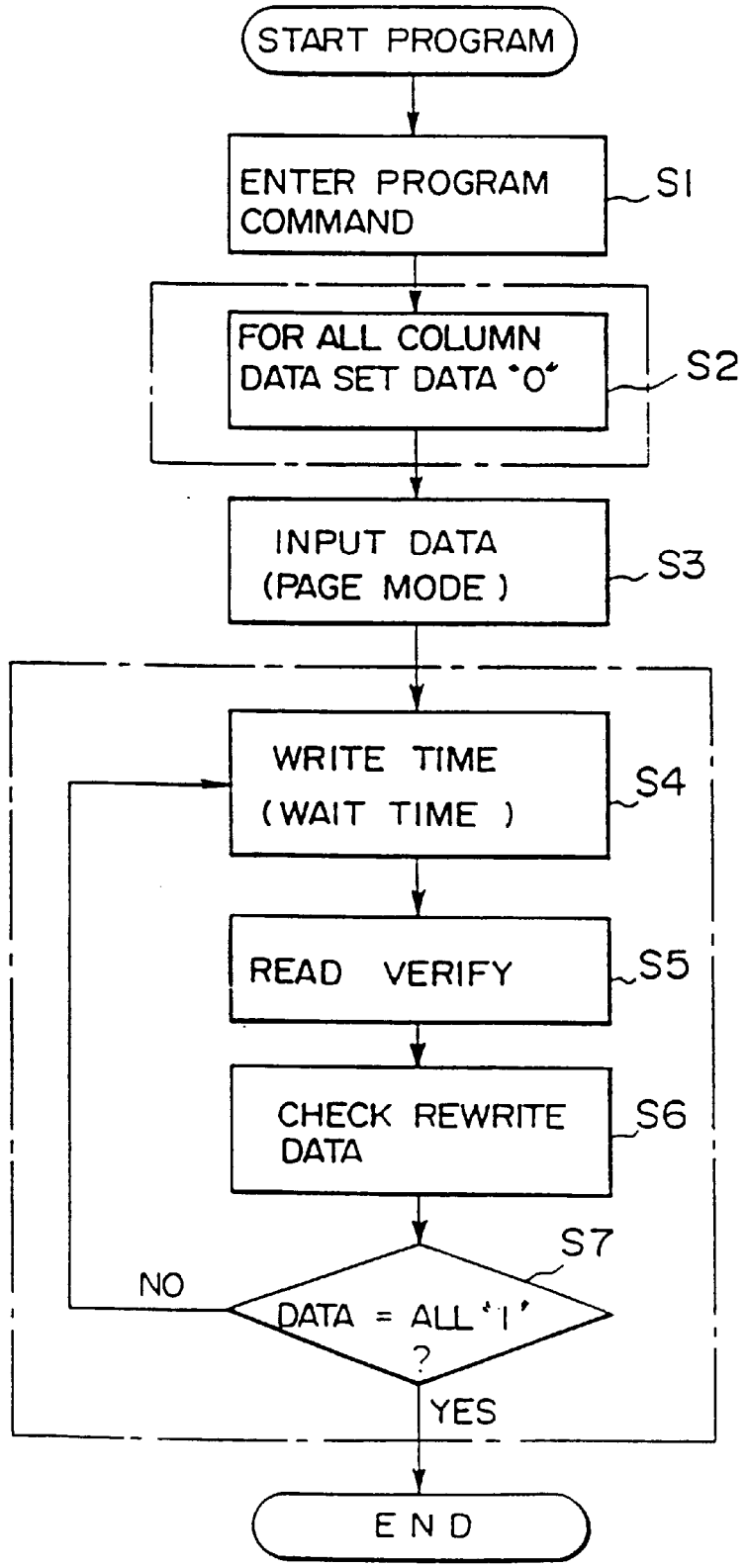
FIG. 22 is a flow chart illustrating the program algorithm using the circuit shown in FIGS. 19(a) to 19(c).

FIG. 22 shows a program algorithm for a NAND cell type EEPROM having fuses shown in FIGS. 19(b) and 19(c).

When a program command is entered (S1), "0" program data is automatically set for all column addresses including non-used column addresses (inclusive of defective column addresses) (S2). Thereafter, program data is inputted in the page mode (S3) to automatically perform write, write check, write completion detecting operations (S4 to S7). The reason why "0" program data is set for non-used column addresses, is to prevent the intermediate potential VM from being applied to the non-used bit line during programming. Another reason is that VM outputted from the voltage booster circuit will not be raised to a predetermined potential if the non-used bit line is short circuited to the ground potential for example.

Figure 23:
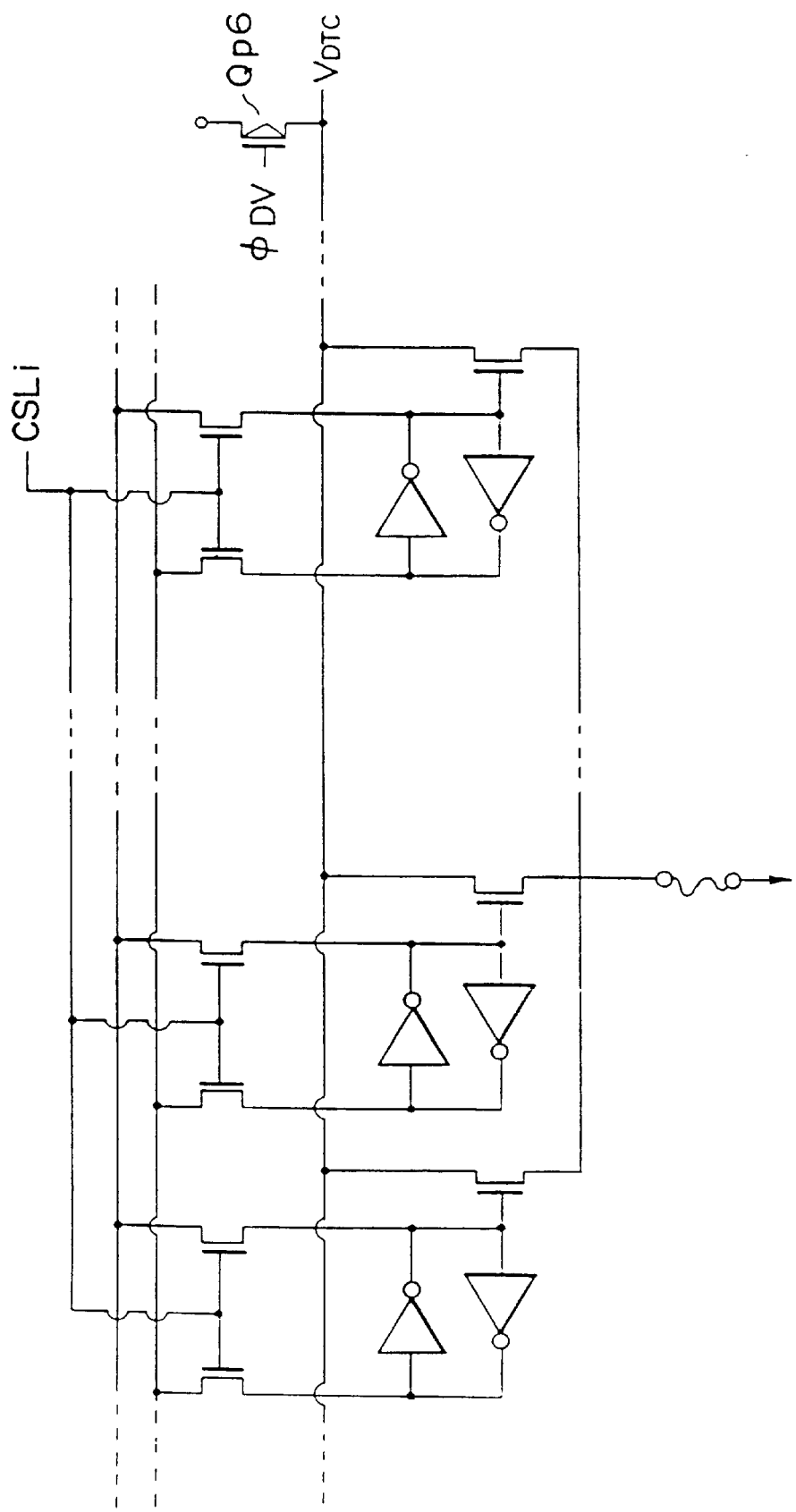
FIG. 23 is a circuit diagram showing the structure different from that shown in FIGS. 19(a) to 19(c).

FIG. 23 shows another example for the case of FIG. 19(b). The write completion detector MOS transistor is connected to the bit lines sharing the same column address select signal in common. Fuses for these transistors may be a single fuse used in common, reducing the layout area. This fuse may be replaced by a nonvolatile memory.

Next, another embodiment will be described in which the above-described relieving means is applied to the second embodiment.

The fundamental operation is the same as the second embodiment. Also in this embodiment, a malfunction of the write completion detector circuit to be caused by the influence of a non-used column address can be made as less as possible, by programming using the algorithms shown in FIGS. 18(a) and 18(b).

Figure 24A:
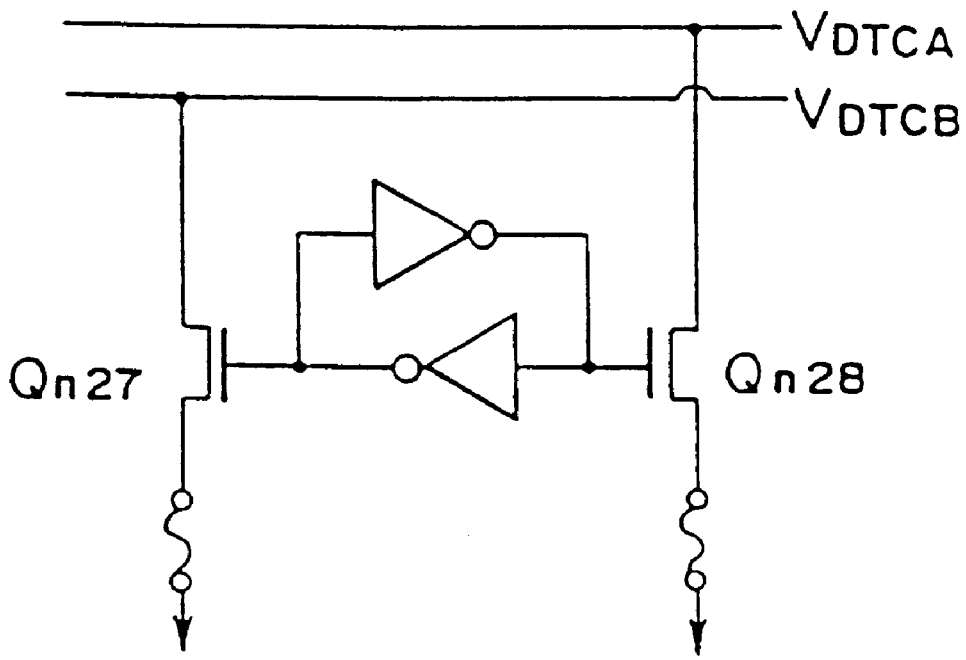
FIGS. 24(a) and (b) are circuit diagrams showing the structure of a bit line control circuit according to a fourth embodiment of the present invention.
Figure 24B:
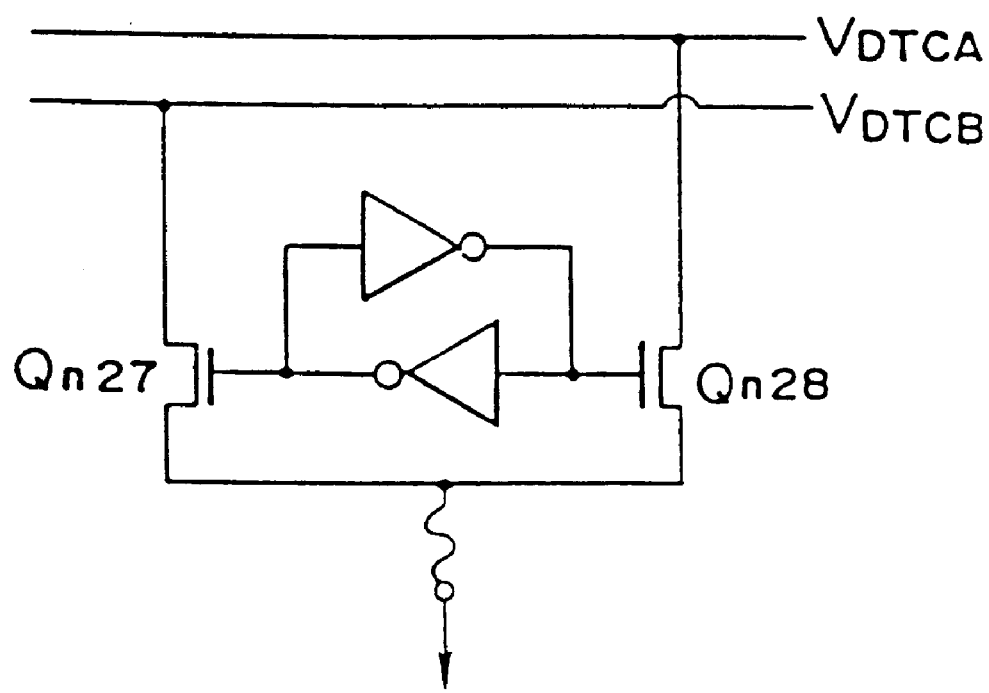

As shown in FIGS. 24(a) and 24(b), programming using the algorithm shown in FIG. 22 may also be executed using fuses. In the case of FIG. 24(a), two write completion detector MOS transistors are connected to one data latch/sense amplifier circuit. Each of two transistors is connected to a fuse. In blowing fuses in the programming operation, two fuses are blown at the same time. Therefore, a single fuse may be used as shown in FIG. 24(b). In FIGS. 24(a) and 24(b), a non-volatile memory may be used in place of fuses.

Figure 25A:
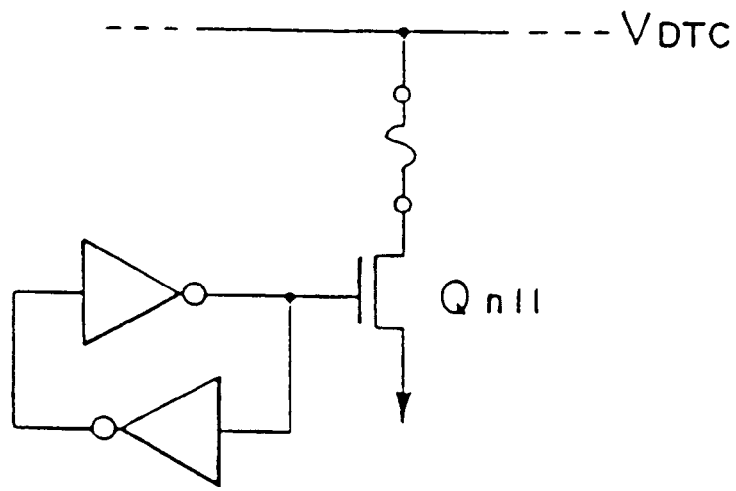
Figure 25B:
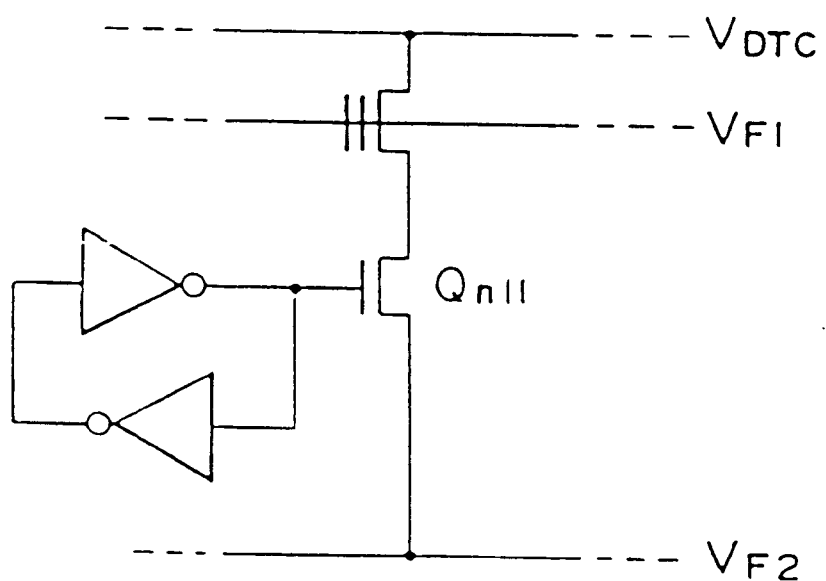
Figure 26A:
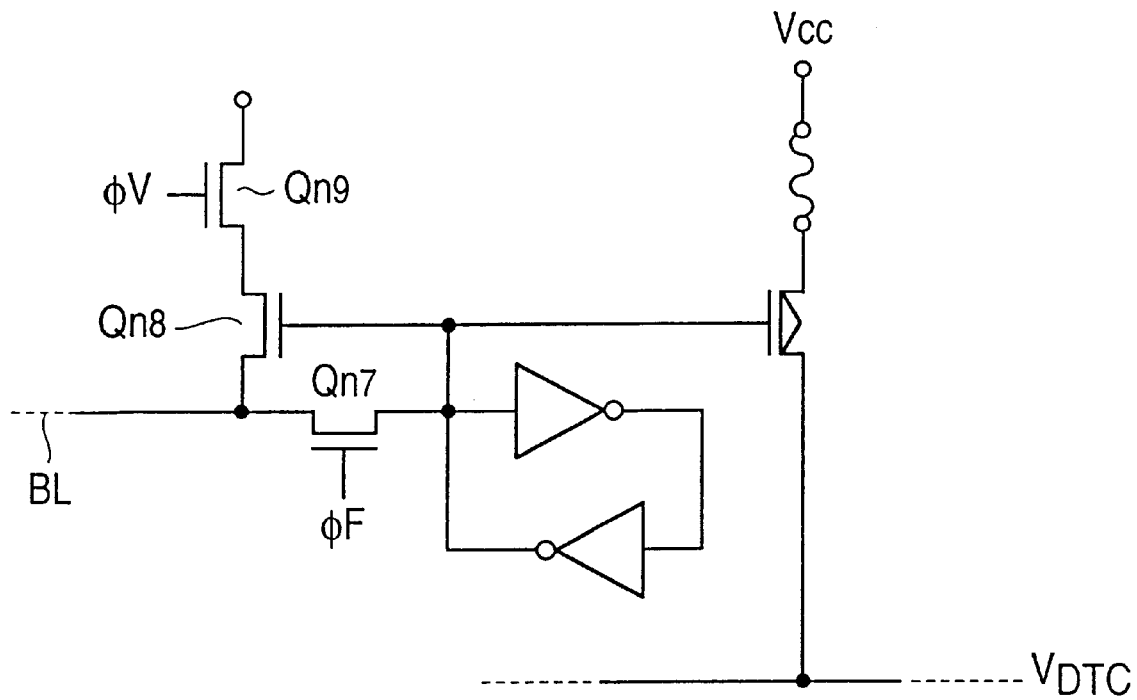
Figure 26B:
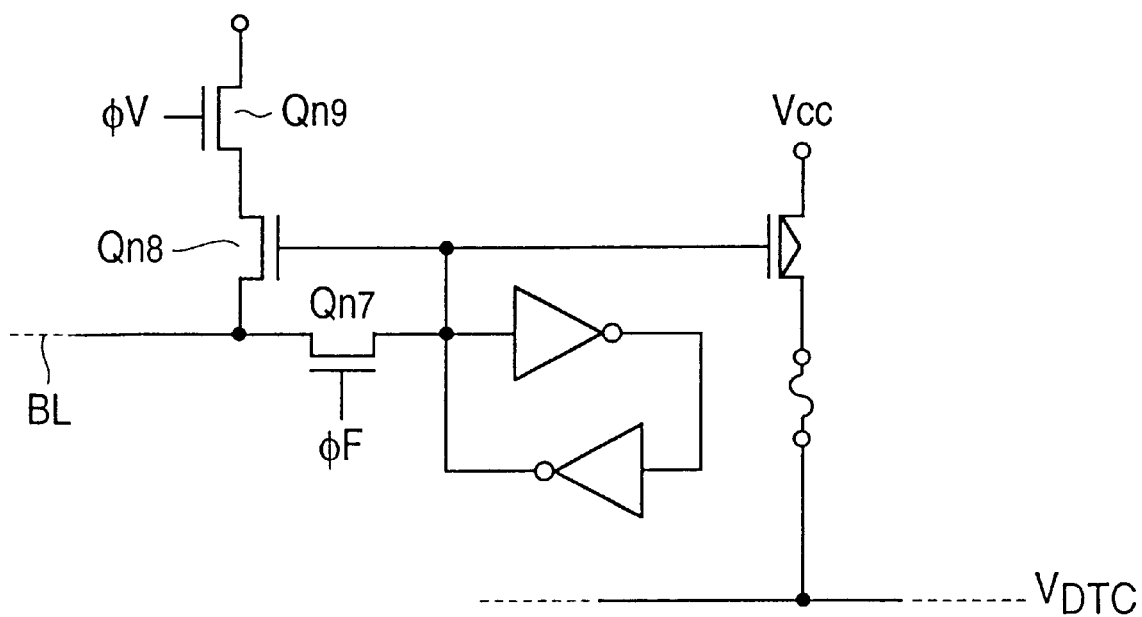
Figure 27A:
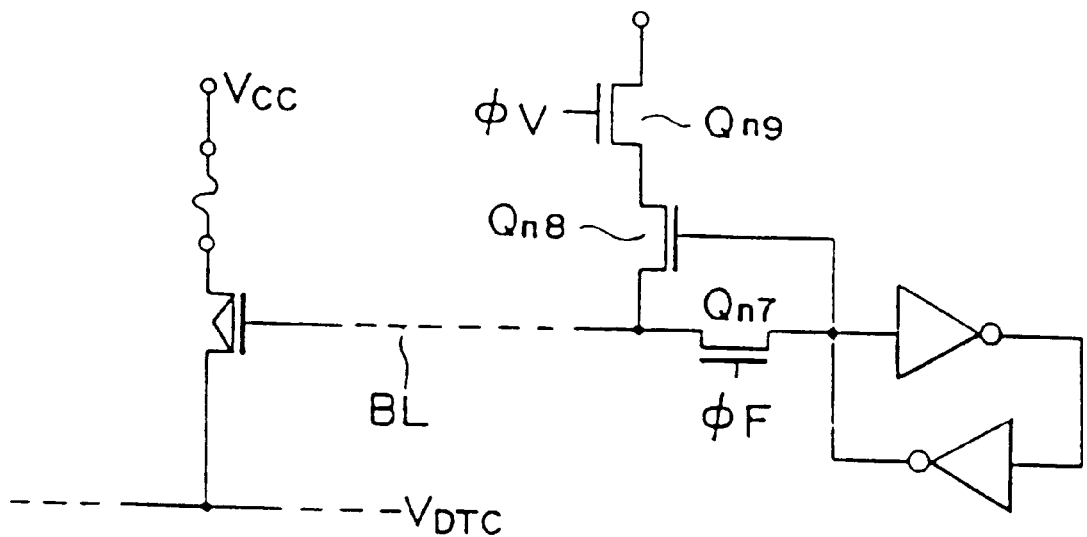
Figure 27B:
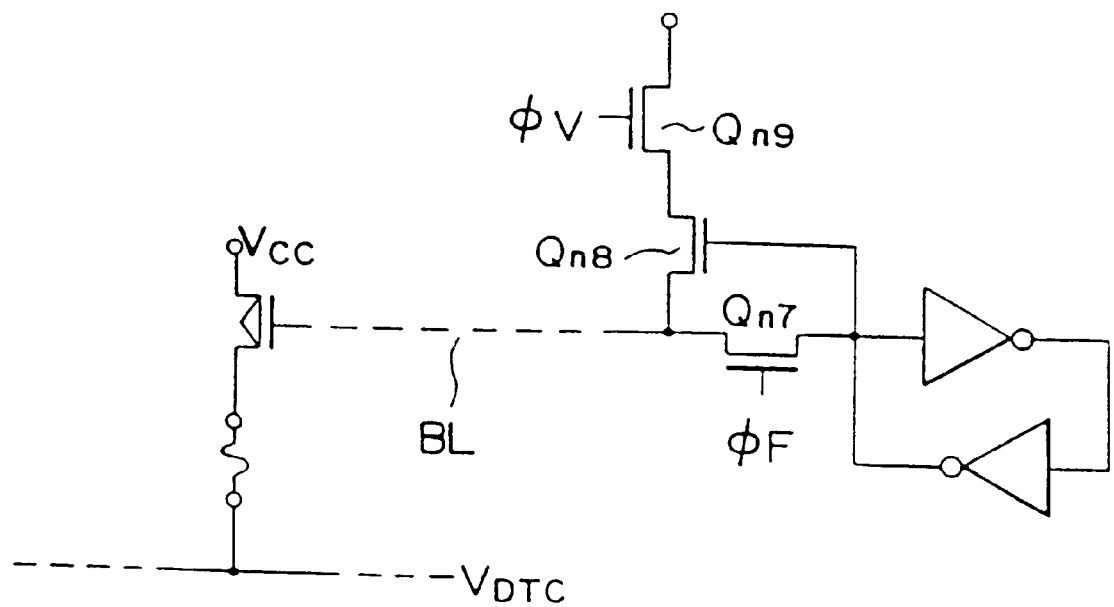

The circuits shown in FIGS. 19(b) and 19(c) may be changed to the circuits shown in FIGS. 25(a) and 25(b), with the same functions being retained. As shown in FIGS. 26(a) and 26(b), an E type p-channel MOS transistor may be used as the detector MOS transistor. FIGS. 27(a) and 27(b) show examples wherein a detector MOS transistor is directly connected to the bit line. Also in this example, a non-volatile memory may be used in place of a fuse.

Figure 28A:
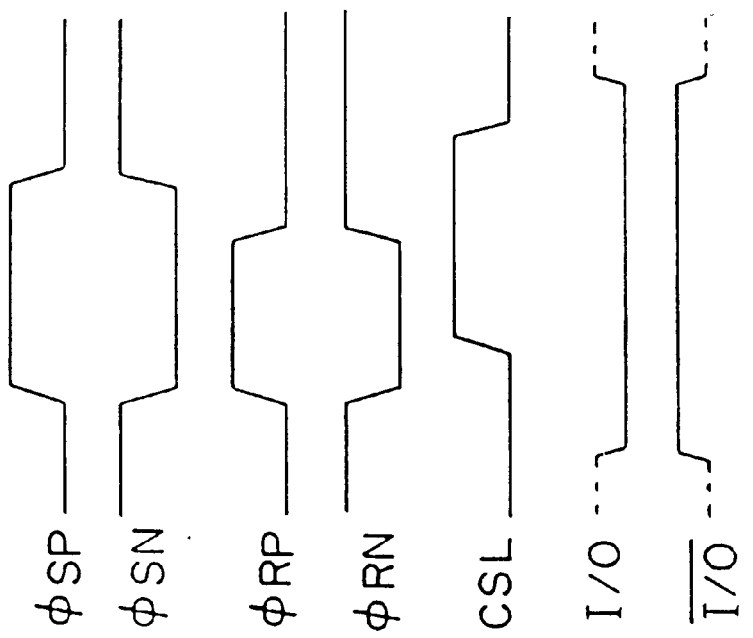
Figure 28B:
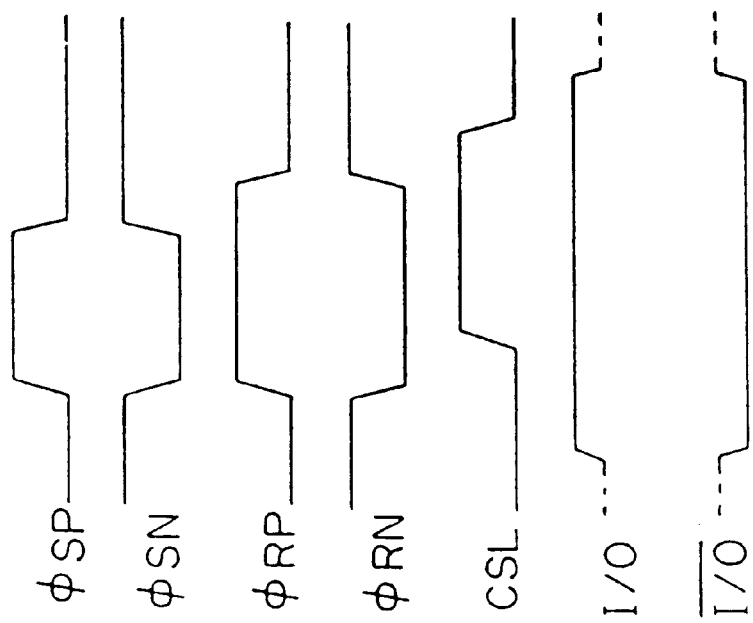

FIGS. 28(a) and 28(b) are timing charts explaining the operation of the third embodiment, wherein "0" or "1" program data is latched simultaneously or collectively to the data latch/sense amplifier circuits at all column addresses.

In FIG. 28(a), φF maintains to take "L", I/O takes "H", /I/O takes "L", φSP takes "L", and φSN takes "H". Thereafter, φRP takes "L", and φRN takes "H", thereby completing the latch operation for "1".

For the latch operation for "0", I/O takes "L" and /I/O takes "H" as shown in FIG. 28(a). After FF is inactivated, φRP takes "L" and φRN takes "H". Thereafter, φSP takes "L" and φSN takes "H".

FIG. 29 is a timing chart explaining the operation of the fourth embodiment, wherein "0" or "1" program data is latched to the data latch/sense amplifier circuits at all column addresses. φA and φB continue to take "L", I/O and /I/O take a potential dependent upon the data "0" or "1". φP takes "H" and φN takes "L", so that FF is inactivated. Thereafter, φE takes "H" to equalize. After the equalization, all column select signals CSL take "H", φP takes "L", and φN takes "H" to latch the data.

The term "all columns" used in the description of FIGS. 28(a) and 28(b) and FIG. 29 means all columns at the divided cell arrays and data latch and sense amplifier circuits selected, if they are provided in division. An open bit line system is used in FIGS. 14 and 15. Instead, a folded bit line system may also be used.

FIG. 30 shows a modification of the third embodiment, wherein one CMOS flip-flop is shared by adjacent two bit lines. The gates of the E type p-channel write detector MOS transistors T1 and T2 are connected to the ends of the bit lines on the opposite side of the flip-flops FF. As shown in FIG. 30, the fuses F1 and F2 of the write detector transistors T1, T1 and T2, T2, whose gates are connected to the bit lines selected by the same column select signal CSLi, can be shared. The fuses F1 and F2 may be inserted between the power supply Vcc and the sources of the write detector transistors T1 and T2 (refer to FIG. 31(a). In this case, two fuses are replaced by a single fuse F (refer to FIG. 31(b).

The third and fourth embodiments can enjoy the same advantages as the first and second embodiments, as well as the following advantages. Namely, in detecting the write verify read results, the write conditions can be checked without being influenced by a non-used column address or defective address. It is therefore possible to provide an EEPROM having a write detector circuit with least malfunction.

Next, the fifth embodiment of the present invention will be described.

FIG. 32 is a block diagram of a NAND cell type EEPROM according to the fifth embodiment. A bit line control circuit 2 is provided for the execution of data write, data read, data rewrite, and data verify read, to and from a memory cell array 1. The bit line control circuit 2 is connected to a data input/output buffer 6. An output of a column decoder 3 is supplied via the bit line control circuit 2 to the memory cell array 1. The column decoder 3 receives an address signal from an address buffer 4 and a redundant address signal from a column redundancy circuit 10. An address signal from the address buffer 4 is supplied to the column redundancy circuit 10. A row decoder 5 is provided for the control of control gates and select gates of the memory cell array 1. A substrate potential control circuit 7 is provided for the control of a p-type substrate or n-type substrate on which the memory cell array was formed.

A program completion detector circuit 8 detects data latched by the bit line control circuit 2, and outputs a write completion signal which is externally outputted from the data input/output buffer 6. A bit line charge circuit 9 is provided for charging the bit line to a predetermined voltage, irrespective of the address signal. The equivalent circuit of the memory cell array 2 is shown in FIGS. 2A and 2B.

FIG. 33 shows the detailed structure of the memory cell array 1, bit line control circuit 2, and bit line charge circuit 9. NAND cells NC shown in FIGS. 2A and 2B are arranged in a matrix shape. NCijr (i=0 to k,j =0 to n) constitutes a redundancy unit. Data latch/sense amplifiers R/W0 to R/Wm, R/W0r to R/Wkr are connected, via data transfer transistors QFN0 to QFnm, QFn0r to QFnkr of E type n-channel MOS transistors, to bit lines BL0 to BLm, BL0r to BLkr. Column select signals CSL0 to CSLm, CSL0r to CSLkr to be inputted to the data latch/sense amplifiers R/W, are outputs CSL0 to CSLm from the column decoder 4 and outputs (CSL0r to CSLkr) from the redundancy circuit 10. Of the bit lines BL0 to BLm, (k+1) bit lines can be replaced by bit lines BL0r to BLkr in the redundancy unit.

E type n-channel MOS transistors QRn0 to QRnm, QRn0r to QRnkr are reset-transistors for resetting the bit lines to the ground potential. E type n-channel MOS transistors QPn0 to QPnm, QPn0r to QPnkr are charge transistors for sending a bit line charge voltage VBL to the bit line when necessary.

Fuses F0 to Fm, F0r to Fkr disconnect the paths between the charge transistors and VBL. Fuses connected to non-used bit lines inclusive of defective bit lines are all blown. For example, assuming that the bit line BL2 is replaced by a redundant bit line BL0r, the fuse F2 is blown. If the other redundant bit lines BL1r to BLkr are not used, the fuses F1r to Fkr are all blown out.

FIG. 34 is a timing chart illustrating the data write operation. Prior to the write operation, all the data latch/sense amplifiers R/W are reset to "0" program data. Thereafter, the program data is transferred from the data line I/O and /I/O to R/W, and latched at R/W. While data is latched to all R/W, the bit lines, control gates, and select gates are pre-charged. After a bit reset signal φR takes "L", a bit line pre-charge signal φP and charge voltage VBL take the power supply voltage Vcc. Bit lines except the non-used bit lines are charged to Vcc. The control gates CG1 to CG8 and select gate SG1 of each NAND cell are charged to Vcc. During the write operation, the select gate SG2 is set to the ground potential. Thereafter, the bit pre-charge signal φP and charge voltage VBL are raised to the intermediate potential VM (about 10 V), and the bit line BL, control gates CG1 to CG8, and select gate SG1 are also raised to VM.

After the data latch operation, the pre-charge signal φP takes "L", and a data transfer signal φF takes Vcc and thereafter is raised to VM. With the latched program data, only the bit lines latched with "0" data are set to the ground potential. The selected control gate (in this example CG2) is raised to a high voltage Vpp (about 20 V). Non-used bit lines including defective bit lines remain at the ground potential because the corresponding R/W are reset to the "0" program data before the data latch operation. The threshold value of a memory cell connected to a bit line with its R/W being latched with "1", will not change but remains at the value when the erase operation was executed.

After the control gates CG1 to CG8 and select gate SG1 were reset to the ground potential, the data transfer signal φF is grounded, the reset signal φR takes "H", and the bit line is reset to the ground potential.

During the write operation, the intermediate potential VM will not be applied to non-used bit lines, because of the operation of resetting all R/W to the "0" program data and the operation of blowing a fuse by the bit line charge circuit, respectively executed before the data load operation.

FIG. 35 illustrates the read operation. The reset signal φR takes "L", and the pre-charge signal φP takes "H". Therefore, all bit lines except non-used bit lines are charged to VBL (typically Vcc). The selected control gate (in this example, CG2) is grounded, and the other control-gates CG1, CG3 to CG8 are set to "H" (typically Vcc). Since the threshold value of a memory cell with "0" data written is high (Vth>0 V), the bit line potential remains "H". Since the threshold value of a memory cell with "1" data written is low (Vth<0 V), the bit line potential thereof becomes "L". After the data in each memory cell is outputted to the bit line as the bit line voltage, the data transfer signal φF becomes "H", and the bit line voltage is sensed by the data latch/sense amplifier R/W. The potentials at circuit portions of memory cells are the same as shown in Table 2.

According to this embodiment, defective bits can be relieved by blowing fuses by the bit line charge circuit, providing the same advantages described with the third and fourth embodiments.

FIG. 36 shows the detailed structure of a memory cell array 1, bit line control circuit 2, and bit line charge circuit 9 of the sixth embodiment, the structure being similar to that shown in FIG. 33.

A data latch/sense amplifier R/Wi, R/Wjr (i=0 to m, j=0 to k) is provided to each pair of adjacent two bit lines BLai and BLbi, BLajr and BLbjr (i=0 to m, j=0 to k). For the bit line BLai, there are provided a data transfer signal φFa, reset signal φRa, and pre-charge signal φPa. For the bit line BLbi, there are provided φFb, φRb, and φPb. A bit line charge voltage source VBL is used in common by BLai and BLbi.

FIGS. 37 and 38 illustrate a write operation and a read operation, respectively. When BLai is selected, the operation for BLai is the same as the embodiment shown in FIG. 33. Non-used bit lines BLbi remain charged to the intermediate potential VM during the write operation, to thereby prevent an erroneous write to the memory cells connected to BLbi. BLbi remains grounded during the read operation to suppress coupling noises between bit lines. The potentials at circuit portions of memory cells are given by Table 5.

TABLE 5

| | | Write | | |
|---|---|---|---|---|
| | Erase | "0" | "1" | Read |
| Bit line BLai | Floating | 0 V | 10 V | 5 V |
| Bit line BLbi | | 10 V | 10 V | 0 V |
| Select gate SG1 | 0 V | 10 V | 10 V | 5 V |
| Control gate CG1 | 0 V | 10 V | 10 V | 5 V |
| Control gate CG2 | 0 V | 20 V | 20 V | 0 V |
| Control gate CG3 | 0 V | 10 V | 10 V | 5 V |
| Control gate CG4 | 0 V | 10 V | 10 V | 5 V |
| Control gate CG5 | 0 V | 10 V | 10 V | 5 V |
| Control gate CG6 | 0 V | 10 V | 10 V | 5 V |
| Control gate CG7 | 0 V | 10 V | 10 V | 5 V |
| Control gate CG8 | 0 V | 10 V | 10 V | 5 V |
| Select gate SG2 | 0 V | 0 V | 0 V | 5 |
| Source line | Floating | 0 V | 0 V | 0 |
| Substrate | 20 V | 0 V | 0 V | 0 |

FIG. 39 shows a modification of the embodiment shown in FIG. 33. In this modification, four types of data I/O lines I/O0 to I/O3 and four data latch/sense amplifiers R/W are provided for each common column select signal CSLi. If even one of the four bit lines to which the same CSLi is inputted has a leakage failure, all four bit lines are required to be relieved. For this reason, in this embodiment, one fuse is used for the four bit lines. Also in the embodiment shown in FIG. 36, a plurality of bit lines to which the same CSLi is inputted, may be provided with a single fuse as shown in FIG. 40.

FIG. 41 shows a modification of the embodiment shown in FIG. 36. The different point of the embodiment of FIG. 41 from the embodiment of FIG. 40 is that fuses are grouped into a fuse Fa for BLai and a fuse Fb or BLbi. In this case, the circuit area becomes inevitably large because of the provision of two fuses Fa and Fb. However, BLai and BLbi can be relieved independently from each other, improving the relief efficiency. This relief method will be described in detail with reference to FIGS. 42(a) and (b) and 43.

FIGS. 42(a) and 42(b) are schematic diagrams showing the embodiment shown in FIG. 36. If the relief is performed depending only upon a column select signal CSLi, both BLai and BLbi are required to be replaced as shown in FIG. 42(a). Similarly, for the embodiment shown in FIG. 40, both BLai0 to BLai3 and BLbi0 to BLbi3 are replaced. On the contrary, for the embodiment shown in FIG. 36, only BLai or BLbi can be replaced by the redundancy unit BLaji or BLbjr without any operation trouble, as shown in FIG. 42(b). In this case, the logical AND is used for the relief, between the column select signal CSLi and data transfer signal φFa (or φFb).

FIG. 43 is a schematic diagram of the embodiment shown in FIG. 41. Similar to the case shown in FIG. 42(b), only BLai0 to BLai3 or BLbi0 to BLbi3 can be replaced by BLajr0 to BLajr3 or BLbjr0 to BLbjr3. In this case, fuses are connected as shown in FIG. 41. As seen from FIGS. 42 and 43, the relief can be performed by providing the proper positional relation between BLa and BLb.

FIGS. 44(a) and 44(b) show embodiments in which one data latch/sense amplifier R/W is used in common by four bit lines. BLali and BLbli are arranged in juxtaposition.

BLa2i and BLb2i are arranged symmetrically with BLali and BLbli relative to R/W. Also in this case, the relief like shown in FIGS. 45(a) and (b) and 46 can be executed by providing the proper positional relation between BLa and BLn and providing a logical AND between CSLi, and φFal, φFa2, φFb1, φFb2.

Figure 45A:
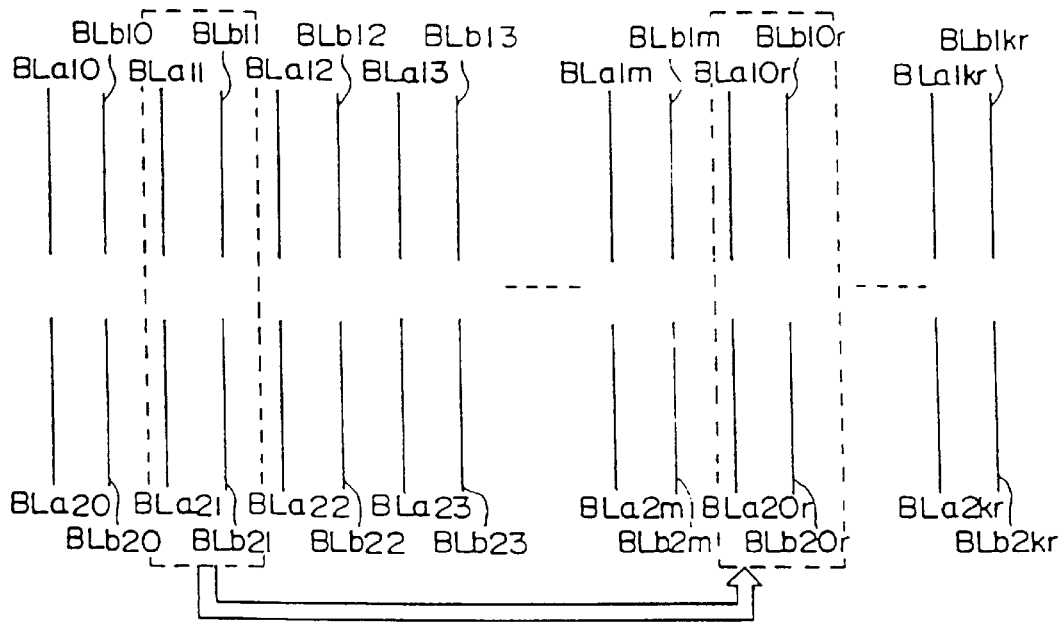
Figure 45B:
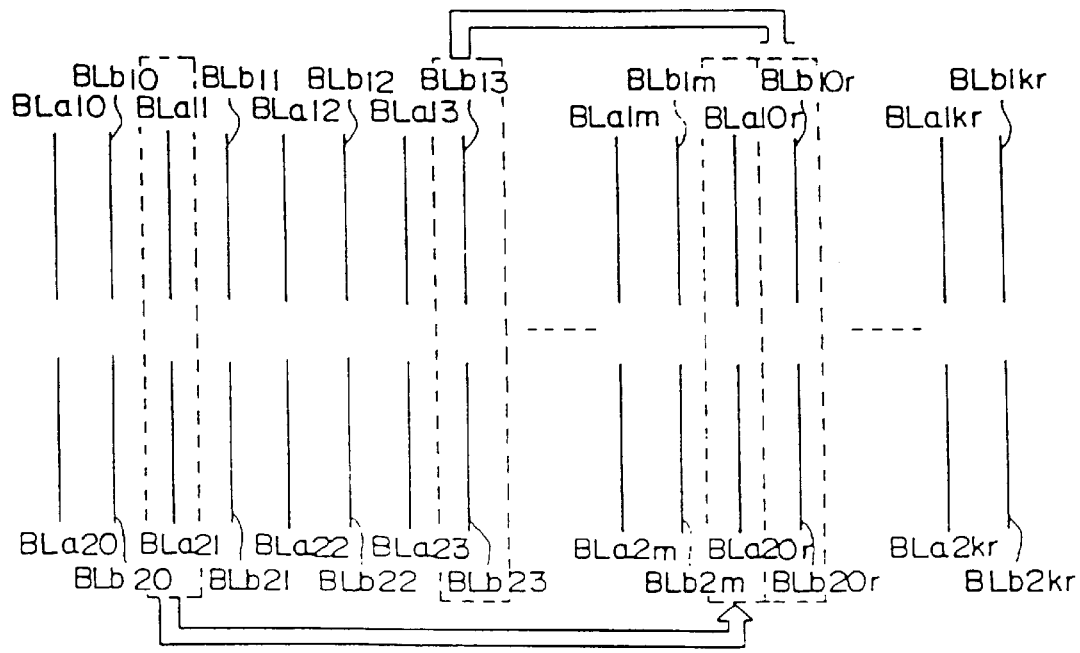
Figure 46B:
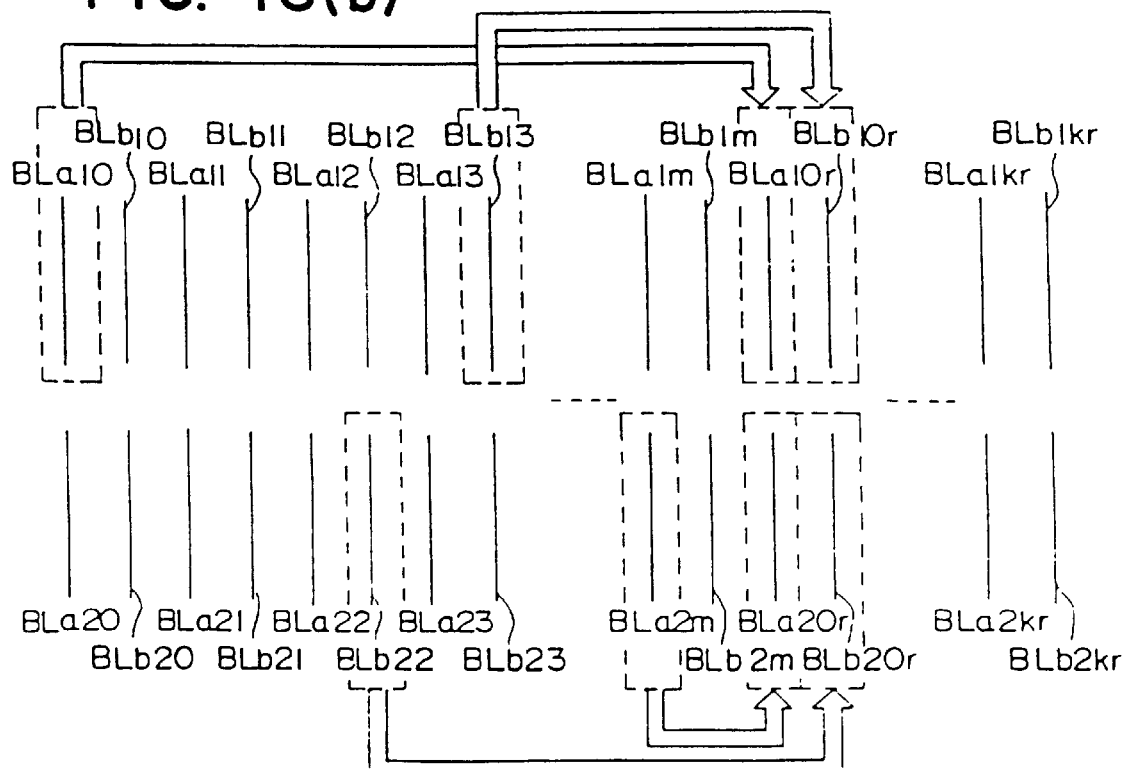

More specifically, in FIG. 45(a), four bit lines BLa1i, BLa2i, BLb1i, and BLb2i connected to the same R/W are replaced at the same time. In FIG. 45(b), two bit lines BLa1i and BLa2i, or two bit lines BLb2i and BLb2i are replaced in this unit. In FIG. 46(b), one bit line is replaced by a bit line in the redundance unit.

In the embodiments shown in FIGS. 39, 40 and 41, the pre-charge MOS transistor and reset MOS transistor may be used in common for bit lines connected to the same column select signal CSLi. When the bit line is pre-charged or reset, i.e., when φR or φP takes "H", φPR is set to "H". In this example, although φPR is additionally used, the number of reset and pre-charge MOS transistors can be reduced.

In the fifth and following embodiments, fuses for relieving defective bits are connected between the bit line charge circuit and charge voltage source. These embodiments may be used in combination of the third and fifth embodiments.

Various circuit structures intended to shorten a write verify time have been described in the first to sixth embodiments. Embodiments of the present invention regarding the erase verify operation will be described next.

FIG. 50 is a block diagram showing a non-volatile semiconductor memory device using a NAND type EEPROM according to the seventh embodiment of the present invention. A sense amplifier/latch circuit 2 is connected to a memory array 1 for the execution of data write, data read, and data write and erase verify. The memory cell array 1 is divided into a plurality of page blocks. This block is a minimum erase unit. The sense amplifier/latch circuit 2 is connected to a data input/output buffer 6. An address signal is inputted from an address buffer 3 to a column decoder 3. An output of the column decoder 3 is inputted to the sense amplifier/latch circuit 2. Connected to the memory cell array 1 is a row decoder 5 for controlling the control gates and select gates. Connected to the memory cell array 1 is a substrate potential control circuit 7 for the control of the potential at a p-type region (p-type substrate or p-type well) on which the memory cell array 1 was formed.

A verify completion detector circuit 8 detects data latched in the sense amplifier/latch circuit 2, and outputs a verify completion signal which externally outputted from the data input/output buffer 6.

FIG. 51 shows the connection relationship between the sense amplifier/latch circuit 2, memory cell array 1, and verify completion detector circuit 8. In the circuit shown in FIG. 51, there is provided a detector means (detector transistor Qn12) which is controlled by a first output from the sense amplifier/latch circuit FF. An E type n-channel MOS transistor is used as the detector transistor Qn12. This transistor Qn12 is provided to each sense amplifier/latch circuit FF connected to each bit line BLi. As shown in FIG. 51, each detector transistor Qn12 has its drain connected to the common sense line VDTCE.

The erase operation will first be described with reference to the flow chart shown in FIG. 52. When an erase command is entered, the erase verify cycle starts. If the erase state is detected, the erase operation is immediately terminated at this time (YES at step 101). If it is detected at step 101 that the data of any memory cell has not been erased yet, the erase operation is executed (step 102), and thereafter the verify operation starts (step 103). If a verify NG state is detected, a predetermined number of erase and verify operations are repeated (step 104).

The erase check operation will be described next.

(1) For the erase operation, a high voltage (e.g. 20 V) is applied to the p-type region (p-type substrate or p-type well) on which memory cells were formed. Vss is applied to the control gates. In this way, the threshold values of memory cells can be shifted to the negative direction.

(2) Next, data in a memory cell is read. Under the condition of "H" of φF, first φSP is set to "H", φSN i.s set to "L", φRP is set to "H", and φRN is set to "L", to thereby inactivate CMOS inverters. Thereafter, /φP is set to "L" to pre-charge the bit line. Next, the selected control gate is set to Vss, non-selected control gates are set to Vcc, and the selected select gate is set to Vcc, respectively for a predetermined time period. If the selected memory cell was erased and has a negative threshold value, a cell current will flow and the bit line is discharged to Vss.

(3) Next, φSP is set to "L" and φSN is set to "H", to detect the bit line potential. φRP is set to "L" and φRN is set to "H" to latch the data.

(4) Thereafter, a verify completion is checked using the detector transistor. As described previously, the sense line VDTCE is connected to the drains of the detector transistors of a plurality of sense amplifier/latch circuits. If all memory cells have a negative threshold value, the sense line VDTCE takes "H". In this case, the next page is checked. If even one of memory cells has a positive threshold value, VDTCE takes "L". In this case, the erase operation is repeated until VDTCE takes "H". The detected results are outputted externally via a data input/output pin or READY/BUSY pin.

In this embodiment, data is checked one page after another. All pages in one NAND block may be checked at the same time. In such a case, all control gates of the selected block are applied with Vss to execute a read operation. If one of memory cells has a positive threshold value, the bit line will not be discharged, and this can be detected in the manner described above.

The voltage applied to the control gate is not necessarily limited to Vss level, but a negative voltage may be applied to provide some margin. Furthermore, the control gate may be set to Vss and a positive voltage may be applied to the source, or source and p-type substrate or p-type well, to make an apparent negative voltage to the control gate. A fuse may be provided between the source of the detector transistor and Vss- Any operation trouble will not occur if the fuse is blown for a sense amplifier/latch circuit corresponding to a defective bit line or a non-used redundant bit line. In the manner described above, the erase state can be detected.

The above operations may be controlled systematically. In this case, the system has a management table storing information representing whether each block is in the erased state or not, for each NAND type EEPROM block. A host system or a controller for controlling a non-volatile memory device detects whether each NAND type EEPROM to be erased is in an erased state or not, by referring to the management table. If the reference result indicates a non-erase state, the erase operation is executed. If an erased state is indicated, the erase operation is not executed.

The erase check may be executed before the write operation. Namely, prior to the write operation, the area to be written may be checked whether it has already erased or not. In this case, the check operation may be executed in units of block or page.

In FIG. 51, the write verify operation is generally the same as a conventional case, and so the detailed description is omitted.

FIG. 51 illustrates the eighth embodiment of the present invention.

The fundamental structure is the same as that shown in FIG. 50. In the eighth embodiment, a cell array is divided into two blocks 1A and 1B, and a sense amplifier/latch circuit common to both the blocks is provided. FIG. 54 shows the structure of the sense amplifier/latch circuit. A flip-flop FF is constituted by E type n-channel MOS transistors Qn16 and Qn17 and E type p-channel MOS transistors Qp7 and Qp9. E type n-channel MOS transistors Qn14 and Qn15 are equalizing transistors. Transistors Qn27 and Qn28 are detector transistors.

An E type n-channel MOS transistor Qn18 and E type p-channel MOS transistor Qp8 are FF activating transistors. E type n-channel MOS transistors Qn19 and Qn20 are transistors for connecting two FF nodes Ni and N2 to bit lines of the cell array blocks 1A and 1B. Transistors Qn25 and Qn26 are pre-charge and reset transistors. Transistors Qn21 to Qn24 are transistors for connecting bit lines to a Vcc line.

The verify operation after the erase operation of the memory system constructed as above will be described.

The following description will be given on the assumption that the memory cell array 1A and bit line BLai are selected.

First, the bit line BLai is pre-charged to 3 V, and BLbi is pre-charged to 2 V (reference potential). Thereafter, pre-charge signals φPA and φPB are set to "L" to make the bit lines BLai and BLbi of a floating state. Next, the selected control gate is set to Vss, the non-selected control gates are set to Vcc, and the selected select gate is set to Vcc, respectively for a predetermined time period. After the CMOS flip-flop is reset by an equalizing signal, φA and φB are set to "H" to connect the nodes N1 and N2 to the bit lines BLai and BLbi, respectively. φP is set to "L" and ON is set to "H" to read data on the bit line BLai. The read data is latched. Thereafter, the read data is simultaneously or collectively detected by the detector transistor Qn27.

Next, it is assumed that the bit line BLbi of the memory cell array 1B is selected.

First, the bit line BLbi is pre-charged to 3 V, and BLai is pre-charged to 2 V (reference potential). Thereafter, the pre-charge signals φPA and φPB are set to "L" to make the bit lines BLai and BLbi of a floating state. Next, the selected control gate is set to Vss, the non-selected control gates are set to Vcc, and the selected select gate is set to Vcc, respectively for a predetermined time period. After the CMOS flip-flop is reset by an equalizing signal, AA and @B are set to "H" to connect the nodes N1 and N2 to the bit lines BLai and BLbi, respectively. φP is set to "L" and φN is set to "H" to read data on the bit line BLbi. The read data is latched. Thereafter, the read data is simultaneously or collectively detected by the detector transistor Qn27.

For the write verify operation of the memory cell array 1A, the transistor Qn28 is used as the detector transistor. For the write verify operation for the memory cell array 1B, the transistor Qn27 is used as the detector transistor. In this way, in accordance with a memory address and the erase or write mode, the following verify operation selects one of the detector transistors. The verify operation can thus be executed using one detector transistor.

FIG. 55 illustrate the ninth embodiment of the present invention. In the seventh embodiment shown in FIG. 51, detector transistors are connected to both the nodes of the sense amplifier/latch circuit. In the ninth embodiment, a p-type and n-type detector transistors are connected to one of the two nodes of the sense amplifier/latch circuit. During the write verify operation, the n-type detector transistor is used as in a conventional case. During the erase verify operation, the p-type detector transistor is used. After the erase operation, the read operation is executed. If there is a memory cell whose erase is insufficient, "H" is latched to the node on the bit line side of the sense amplifier/latch circuit, and "L" is latched to the node on the opposite side of the bit line. Therefore, the p-type detector transistor takes an ON stage, and so VDTCE takes "H" level. This level is detected, and the erase operation is again executed.

FIG. 56 shows the tenth embodiment of the present invention. In the eighth embodiment shown in FIG. 54, detector transistors are connected to both the nodes of the sense amplifier/latch circuit. In this embodiment, p-type and n-type detector transistors are connected to one of the two nodes of the sense amplifier/latch circuit. During the write verify operation for the memory cell array 1A, the n-type detector transistor Qn28 is used. During the erase verify operation for the memory cell array 1A, the p-type detector transistor Qp29 is used. During the write verify operation for the memory cell array 2A, the p-type detector transistor Qn29 is used. During the erase verify operation for the memory cell array 2A, the n-type detector transistor Qp28 is used.

The embodiments applying the present invention to the erase verify operation have been described above. The structures of these embodiments are obviously applicable to NOR type cells similar to the case of the abovedescribed write verify operation.

The following advantages can be obtained by applying the present invention to the erase verify operation. Namely, the erase verify operation can be speeded up without reading data to the external circuitry. Furthermore, if a cell array is divided into two blocks, one detector means can be used both for the erase verify operation of one memory cell array block and the write verify operation for the other memory cell array block, reducing the area of the simultaneous detector or collective verify circuit. Still further, since there is provided means for detecting whether the selected block is in an erased state or not prior to the erase operation, it is possible not to execute an unnecessary erase operation for the rewrite operation or other operations, speeding up the operation and improving the reliability.

Next, the eleventh embodiment will be described wherein one collective verify means or simultaneous detecting means can be used for both the erase verify and write verify operations.

The characteristic feature of this embodiment resides in the following points. There is provided a collective verify control circuit or simultaneous detecting circuit BBC for reading all 256 bytes at the same time and judging whether the program verify or erase verify is in an OK state or in an NG state. Furthermore, a data register circuit DR is structured such that it can perform a collective verify operation and that data is not rewritten for a program completed bit when the program data write is again executed because of a program verify NG state after the program verify operation. Still further, a re-program control circuit RPC is provided for controlling the data register circuit in the above-described manner.

The memory system using an EEPROM shown in FIG. 57 will be described generally.

An EEPROM shown in FIG. 57 has a structure of 256 bytes per one page and 8 bits per one byte. Memory cells are arranged in a matrix shape as a memory cell array MCA having m rows * 256 bytes. Namely, m word lines extend from a row decoder RD. In each byte, one NAND cell row unit RU is constituted by eight 8 NAND cell BC arranged in the row direction, each 8 NAND cell BC having eight memory cells connected in the column direction. (m/8) 8NAND cell BC are arranged in the column direction. In each row unit RU, the drain of each 8NAND cell BC is connected to a corresponding one of bit lines, and the source is connected in common to Vss.

In each unit, the control gates of eight memory cells disposed in the column direction and two select gates are connected to the row decoder RD via eight word lines WL and SDG and SGS.

Each bit line BL'OO is connected to the data register circuit DR for latching data to be read and written. The data register circuit DR outputs an amplified signal IO of a high or low potential on the bit line BL'OO, and its inverted signal NIO. These IO and NIO signals are supplied to common I/O bus lines I/OBUS via column gate transistors which are turned on and off by signals outputted from column decoders CDI and CDII. The signals IO and NIO are inputted from the common IO bus lines I/OBUS to a sense amplifier circuit S/A. An output signal d* of the sense amplifier circuit is inputted to an output buffer I/OBUF.

Connected to each bit line BL are a write pre-charge circuit WPC for raising the bit line to a high potential for the read operation, and a read pre-charge circuit RPC for pre-charging the bit line for the read operation. The write pre-charge circuit WPC is constructed of an n-channel type transistor TW1 whose drain is supplied with a signal BLCRL, gate is supplied with a signal BLCK, and source is connected to the bit line. The read pre-charge circuit RPC is constructed of a transistor TR1 one end of 49 which is connected to a power supply Vdd, whose gate is supplied with a signal PRE, and the other end of which is connected to the bit line, and another transistor TR2 one end of which is connected to the bit line, whose gate is supplied with a signal RST, and the other end of which is connected to Vss.

The data register circuit DR includes a latch circuit constructed of two inverters IV1 and IV2, and a transistor TT connected to the bit line, whose gate is supplied with the signal BLCD. The data register circuit DR further includes two transistors $T_{PV}$ and $T_{EV}$ connected to the output terminals of the two inverters IV1 and IV2. One end of the transistor $T_{PV}$ is supplied with the signal IO, and the gate is supplied with a signal PROVERI. One end of the transistor $T_{EV}$ is supplied with the signal NIO, and the gate is supplied with a signal ERAVERI. The other ends of the transistors $T_{PV}$ and $T_{EV}$ are connected to the gate of a transistor T14 one end of which is connected to Vss and the other end of which is connected to the collective verify control circuit BBC. The data register circuit DR also includes transistors T11 and T12. The transistor T11 is an n-type, one end being connected to the power supply BLCRL, the gate being inputted with the signal NIO, and the other end being connected to one end of the transistor T12. The gate of the transistor T12 is inputted with an output signal PV from a re-program control circuit RPCC. The other end of the transistor T12 is connected to the bit line BL'OO.

The collective verify control circuit BBC has a two-input NOR gate NOR1 to which the signals PROVERI and ERAVERI are inputted. An output signal of the NOR gate NOR1 is inputted to the gates of transistors $TP_1$, and $TN_1$.

One end of the transistor $TP_1$ is connected to the power supply Vcc, and the other end is connected to one end of the transistor $TN_1$. The other end of the transistor $TN_1$ is connected to Vss. The interconnection between transistors $TP_1$ and $TN_1$ is connected to the transistor T14 of each data register circuit DR and to the input side of an inverter IV3. An output signal PEOK of the inverter IV3 is outputted via an I/O buffer to an external circuit, as a judgement signal whether the verify operation is in an OK state or not.

The re-program control circuit RPCC has an inverter $IV_{RP}$ and flip-flop circuit $FF_{RP}$. The signal PROVERI is inputted to the inverter $IV_{RP}$. An output signal of the inverter $IV_{RP}$ and its inverted signal are inputted to two NOR gates of the flip-flop circuit $FF_{RP}$. An output signal PV of the flip-flop circuit $FF_{RP}$ is supplied as the control signal to the gate of the n-channel transistor T12 of the data register circuit DR.

Next, the operation of the EEPROM constructed as above will be described.

For the erase operation, a high voltage (about 20 V) raised by an erase voltage booster circuit SU6 is applied to the substrate (p-well) on which memory cells were formed. At the same time, under control of the row decoder RD, the word lines WL1 to WLm and select gates SDG and SGS are set to 0 V, to pull out electrons from the floating gates and perform the erase operation.

Next, the read operation will be described.

The row decoder RD selects a row unit RU having a memory cell to be selected, by applying "H" level to the select gates SDG and SGS of the row unit RU. The memory cell is then selected by applying 0 V to the word line WL. After this state, a predetermined pulse signal is supplied as the signal PRE to turn on the transistor TR1 and precharge the bit line BL to "H" level. If the memory cell was written with "0" data, the memory cell is off and no current will flow. Therefore, the bit line BL maintains "H" level which was latched by the data latch circuit DR. On the other hand, if the selected memory cell was written with "1" data, the memory cell is on. Therefore, the bit line BL takes "L" level which was latched by the data register DR. At this time, all data of 256 bytes connected to the selected (L-leveled) word line are latched by data register circuits DR connected to the bit lines. Thereafter, column addresses $A_C$ to be applied to the column address buffer CAB are sequentially changed from "00" to "FF" to sequentially turn on the column gate transistors CGT of the bytes 1 to 256. In this way, data of 256 bytes are sequentially read via the common IO buses.

Since the on-current of a memory cell is very small in the order of several $\mu$A because of the structure specific to a NAND cell, it takes about several $\mu$sec for the charge/discharge. However, after was once read and latched by the data register circuit DR, data can be outputted from the common IO bus and accessed at a high speed in the order of one hundred nsec.

Next, the write operation will be described.

FIG. 58 is a timing chart illustrating the write operation.

When a program command PC is entered, the program mode is initiated and the signal BLCD for controlling the transmission transistor TT of the data register circuit DR takes "L" level to turn off the transistor TT. At this time, the voltage booster SU starts operating so that the signals BLCRL and BLCU to be applied to the write pre-charge circuit WPC are gradually raised to about 10 V. At the same time, as the BLCRL rises, the potentials of the bit lines BL'00 of the memory cell array rise. The selected word line WL is set to a high potential of about 20 V, the gates of the select gate transistors on the source side of the NAND cells are set to 0 V, and the other gates are set to the intermediate level of about 10 V.

In this state, the column address $A_c$ is sequentially changed to input write data to the data register circuits DR. The write data inputted to the data register circuit DR is latched by this circuit DR. When the data of 256 bytes are latched by the data register circuits DR, the signal BLCU takes "L" level to turn off the write pre-charge circuit WPC. At this time, the signal BLCD raised to about 10 V turns on the transistor TT to connect the bit line BL'00 to the data register circuit DR. At this time, the power supply VBIT raised to about 10 V is supplied to the data register circuit DR. If "1" level was latched by the circuit DR, the high level of the bit line BL is maintained unchanged. If "0" level is latched by the circuit DR, the level of the pre-charged bit line BL is discharged to "L" level, so that electrons are injected to the floating gate. In this way, data of 256 bytes are written at the same time.

The program, program verify, re-program operations will be described with reference to the timing chart shown in FIG. 59.

The first program operation is the same as described with FIG. 58. Namely, when the program mode is initiated upon input of the program command PC, the control signal BLCD takes "L" level, so that the transmission transistor TT of the data register circuit DR turns off to disconnect the data register circuit DR from the bit line. The voltage booster circuits SU1 to SU6 then start operating, so that the signals BLCRL and BLCU applied to the write pre-charge circuit WPC gradually rise to about 10 V. As the signal BLCRL rises, the potentials of bit lines in the memory cell array MCA also rise high. At this time, the selected word line WL is set to a high potential of about 20 V, the gates (select lines SL2) of the select gate transistors $T_2$ of the NAND cells on the source side are set to 0 V, and the gates (select lines SL1) of the other transistors $T_1$ are set to the intermediate level of about 10 V.

In this state, the column address $A_C$ is sequentially changed to input eight write data of an n-th byte to eight data register circuits DR and latch the write data at these circuits DR. This operation is repeated 256 times to latch all write data of 256 bytes to all data register circuits DR. Thereafter, the signal BLCU takes "L" level to turn off the write pre-charge circuit WPC. At this time, the signal BLCD raised to about 10 V turns off the transistor TT to connect the bit line to the data register circuit DR. At this time, the power supply VBIT raised to about 10 V is supplied to the data register circuit DR. If "1" data was latched by the data register circuit DR, the bit line level is maintained at the high level. If "0" level was latched by the data register circuit DR, the pre-charged high level bit line is discharged to "L" level, so that electrons are injected into the floating gate of the selected memory cell, namely, "0" data is written. This write operation is carried out for 256 bytes at the same time. This write operation is the same as described with FIG. 58.

After the completion of the write operation, a verify command VC is entered to release the program mode. The signal BLCD becomes 0 V, BLCRL becomes 5 V, VBIT becomes 5 V, and the reset signal RST causes the bit line to discharge. In this embodiment, the latched data in the data register circuit DR is made not to be reset at this time. Namely, the write data remains latched in the data register circuit DR. In this state, the control signal PRE of "H" level is applied to the read pre-charge circuit RPC to pre-charge the bit line. Consider now "0" data was written. In the latch circuit of the data register circuit DR, the signal IO takes "1" level and its inverted signal takes "0" level. When the program verify mode is initiated, the transistor T12 of the data latch circuit DR turns on, whereas the transistor T11 is off because of "0" level of the gate signal. Therefore, the bit line will not be charged from this path.

After the "0" data write operation, there are two cases, including a write NG state and a write OK state. In the write OK state, the threshold value of the memory cell has shifted to the positive direction, so that the pre-charged potential is maintained unchanged. When the signal BLCD for controlling the transmission transistor TT takes "1" level, the data register circuit DR is connected to the bit line so that the potential of "0" level NIO is charged to "1" level by the bit line charged to the high potential. As a result, "0" level is inputted via the transmission transistor TT applied with the signal PROVERI to the gate of the transistor T14 to turn it off.

Next, consider the write NG stage. In this case, although "0" was written, the threshold voltage of the memory cell is in the negative direction. Therefore, the potential of the pre-charged bit line discharges and drops to "0" level. When the signal BLCD for controlling the transmission transistor TT takes "0" level, the data register circuit DR is connected to the bit line. In this case, however, the potential of NIO remains "0" level so that the gate of the transistor T14 is inputted with "1" level signal to turn the transistor T14 on.

Consider next "1" data was written.

When "1" data was written, in the latch circuit of the data register circuit, the signal IO takes "0" level and the inverted signal NIO takes "1" level.

When the verify operation is executed under this condition, the transistor T11 of the data register circuit DR turns on. Therefore, the bit line continues to be charged via the transistors T11 and T12 during the verify operation. The conductance gm of the read precharge transistor TR2 is set to a small value so that the bit line is discharged to "0" level by an on-current of the memory cell turned on when reading data. The conductances of the transistors T11 and T12 are on the other hand set to a large value so that the bit line is charged to "1" level during the verify operation after the "1" data write operation. Namely, the gate of the transistor T124 is inputted with a "0" level signal.

It is conceivable that the threshold value of a memory cell with "1" data written rises high because of a write error. Also in such a case, in the verify operation, a "0" level signal is inputted to the gate of the transistor T14. Therefore, this case cannot be discriminated from the above-described normal case. However, such a write error is tested at the delivery time of memory devices, and it can be neglected in practical use.

In the above manner, inputted to the gate of the transistor T14 of the data register circuit DR connected to each bit line is "0" or "1" level depending upon the data read by the verify operation. If even one bit in the program NG state is present, the input signal to the gate of the transistor T14 takes "1" level. As a result, the transistor T14 turns on and the signal PEOK takes "1" level indicating the verify NG state.

In such a case, a program command PCII is newly entered to execute a re-program operation. Different from the first program operation, in this re-program operation, the data of the bit in the program OK state of the latched data in the data register circuit DR has changed to "1" write data. Consequently, "0" data is written in only the bit in the program NG. Namely, a rewrite operation is no more executed for the bit in the program OK state, preventing a further rise of the threshold voltage. When all bits enter the program OK state after repeating the re-program operation, the gate signals of all transistors T14 take "0" level and the signal PEOK takes "0" level, completing the re-program operation.

By using the above-described method of the present invention, it is possible to simultaneously execute the verify operation without sequentially changing the column address. Therefore, the time required for the verify operation can be shortened, and hence the program operation time can be reduced. Furthermore, in the re-program operation for the bit in the verify NG state, the re-program operation is not effected for the bit in the verify OK state. Therefore, the distribution of threshold voltages can be narrowed, improving the read margin. FIG. 60 shows the distribution of threshold values Vth in the data write operation using the present invention. In the write operation after the erased state, a fast write memory cell FMZ provides a verify OK state, whereas a slow write cell SMC provides a verify NG state. In the re-program operation under this condition, data is not rewritten to the memory cell in the verify OK state, preventing a further threshold voltage rise. Namely, the distribution width VthDB of threshold voltages can be narrowed at the time when slow write cells SMC provide the verify OK state.

The foregoing description has been given basing upon the program operation. The erase operation as well as the read operation for judgment of an erase OK state can be executed simultaneously in the same manner as the program verify operation. Namely, in the erase verify operation, the signal NIO is inputted to the transistor T14. In the case of the erase OK state, the signal PEOK takes "0" level allowing the collective verify or simultaneous detecting operation.

FIG. 61 is a flow chart illustrating the operation in the erase mode. As seen from the flow chart of FIG. 61, in the erase mode, the erase operation itself is the same as a conventional case. However, the verify operation can be executed simultaneously, shortening the verify operation time.

I/O BUF shown in FIG. 57 is an output circuit the details of which are shown in FIG. 62.

FIG. 63 shows part of a conventional memory cell array having a plurality of memory cells arranged in a matrix shape of m rows * 256 bytes.

Bit lines are generally formed by an A1 film having a thickness of several thousands angstroms, at a pitch of several pm. Therefore, an interlayer capacitance is present between adjacent bit lines. In FIG. 63, an interlayer capacitance between bit lines BL1 and BL2 is represented by $C_{12}$, and an interlayer capacitance between bit lines BL2 and BL3 is represented by $C_{23}$.

The bit line is formed on a memory cell so that it also has a capacitance relative to the substrate. These capacitances are represented by $C_1$, $C_2$, and $C_3$. A memory cell is connected via a select transistor to the bit line. Therefore, a capacitance is also present at the junction of the select transistor. These capacitances are represented by $C_{1j}$, $C_{2j}$, and $C_{3j}$.

A 16 M NAND EEPROM having 8192 * 256 bytes for example has the following capacitances:

Capacitance between a bit line and the substrate $C_1 = C_2 = C_3 = 0.39$ pF;

Interlayer capacitance between bit lines $C_{12} = C_{23} = 0.14$ pF; and

Capacitance at a junction $= C_1 = C_2 = C_3 = 0.11$ pF.

As previously described, in reading data from a memory cell, the bit line is pre-charged to the power supply voltage Vcc to check whether the pre-charged potential discharges or not. Namely, for a "1" cell, the pre-charged potential is discharged froin the memory cell, and for a "0" cell, the memory cell remains off and so the pre-charged potential is retained. Consider now adjacent three bit lines. Assuming that the bit lines BL1 and BL3 are connected to "1" cells and only the bit line BL2 is connected to a "0" cell. When reading data, the bit line BL2 is not discharged but the bit lines BL1 and BL3 are discharged. Since there exist the capacitances described above, the bit line BL2 is influenced by the potential change. The potential $\nabla\Delta$ changed by such influence is given by:

$$\nabla\Delta = (2C_{12})/(C_2 + 2C_{12} + C_{2j}) * Vcc$$

$$= (2 * 0.14)/(0.39 + 2 * 0.14 + 0.11) * 5$$

$$= 1.79$$

A voltage drop of about 1.8 V is generated. This drop is present not only during the read operation but also during the program verify operation. In the program verify mode, there is a memory cell insufficiently written. The operation margin is therefore more severe in the case of the program verify mode.

This will be clarified in the following.

FIG. 64 is a timing chart illustrating the program verify operation.

When a program command PC (not shown) is entered, the program mode is initiated. At this time, the signal BLCD for controlling the transmission transistor TT of the data register circuit DR takes "L" to turn the transistor TT off. Then, the voltage booster circuit SU starts operating to gradually raising the signals BLCRL and BLCU applied to the write pre-charge circuit WPC (refer to FIG. 55) to about 10 V. As the BLCRL signal rises, the potentials of bit lines BL of the memory cells rise high. At this time, the selected WL is set to a high potential of about 20 V, the gates of the select gate transistors on the source side of the NAND cells are set to 0 V, and the other gates are set to the intermediate level of about 10 V.

In this state, the column address is sequentially changed to input write data to the data register circuits DR. The inputted write data is latched by the data register circuit DR. After the write data of 256 bytes are latched by the data register circuits DR, the signal BLCU becomes "L" to turn off the write pre-charge circuit WPC. The signal BLCD then rises to about 10 V to turn off the transistor TT and connect together the bit line BL and data register circuit DR. The power supply voltage VBIT applied to the data register circuit DR rises to about 10 V. If "1" was latched by the circuit DR, "H" on the bit line BL is maintained unchanged. If "0" was latched by the data register circuit DR, the level of the pre-charged bit line is discharged to "L" so electrons are injected into the floating gate. In the above manner, data is written for memory cells of 256 bytes.

After the write operation, a verify command VC (not shown) is inputted to release the program mode. The signal BLCD becomes 5 V, BLCRL becomes 0 V, and signal VBIT becomes 5 V. As a result, the bit line BL is discharged upon reception of the reset signal RST. At this time, the write data in the data register circuit DR is reset.

In this state, the transistor TR1 of the read precharge circuit RPC turns on upon reception of the control signal PRE to pre-charge the bit line. The data in each memory cell is read in the manner described above, and the write data is verified.

Specifically, at the timing when the discharge of the bit line becomes sufficient, the signals Pv and BLCD are set to "H" level so that "L" and "H" levels of the bit lines are transferred to the data register circuit DR to again latch the re-program data. If in a verify NG state, i.e., if "1" is read although "0" was written, the bit line takes "L" level. Therefore, "L" level is latched. In the rewrite operation, "0" is again written. On the contrary, if in a verLfy OK state, the bit line takes "H" level. When the signals Pv and BLCD take "H" level, "H" level on the bit line is transferred to the data latch circuit DR to invert the latch data from "0" data to "1" data. Namely, in the re-program operation, "1" is written so that the threshold value will not rise. The bit line with "1" written is discharged to "L" level during the verify operation. When the signal Pv becomes "H" level, the gate of the transistor T11 becomes "H" level, because "1" is latched by the data register circuit DR. Therefore, the bit line again takes "H" level via the transistors T11 and T12. When the signal BLCD becomes "H", "H" level on the bit line is again latched by the data register circuit DR. In this manner, the re-program operation is effected only for a bit with "0" written and in the verify NG state.

The above-described program verify operation has the following problems which will be described next.

FIG. 65 shows combinations of write data and verify data of three adjacent bit lines.

The uppermost diagram indicated by (1) in FIG. 65, shows the case wherein the bit lines BLi and BL3 are written "1" and bit line BL2 is written "0", the bit written with "0" being in a verify NG state. In this case, the pre-charged potentials on the three bit lines are discharged to "L" level in the verify operation. When the bit line discharges sufficiently, the signal Pv takes "H" level to set the re-program data. Specifically, the bit lines BL1 and BL3 with "1" written are charged to "H" level via the transistors T11 and T12 as described previously. In this state, there is a current path from Vcc to Vss via the transistors T11 and T12. Therefore, the conductances gm of the transistors T11 and T12 are set larger than that of a memory cell to reliably ensure "H" level.

The bit line BL2 with "0" written and in the verify NG state is also discharged to "L" level. Even if a signal CON takes "H" level, the bit line BL2 remains "L" level. There occurs a problem that the potential of the bit line with "1" written is again charged from "L" level to "H" level during the re-program data setting. Namely, as previously discussed, the level of the bit line BL2 is also raised (Tup) by the coupling between adjacent bit lines. For example, considering the drop of a threshold value of the transistor T11, the level is raised from 0 V to 4 V when the power supply voltage Vcc is 5 V. The level of the bit line BL2 changes therefore by:

$$\nabla A = 0.358 * 4 = 1.4 \ V.$$

The distribution of potential levels after the verify operation will become wide because of the distribution of threshold values of memory cells with "0" written. This is illustrated in FIG. 66. The level after the verify operation is discharged completely to 0 V in one case, and discharged to about 1 V in another case. In the latter case, the potential changes to 2.4 V because of the abovedescribed coupling, which level is over the sense level. In other words, a memory cell which should otherwise be detected as in the "0" write NG state, is erroneously detected as in the "0" write OK state, reducing the operation margin of a memory cell. Other combinations indicated by (2) to (8) in FIG. 65 will not provide a malfunction to be caused by the coupling.

The method of solving the above problem will be described next.

The operation of writing data in a memory cell after the program command is entered, is the same as that described with FIG. 64, and so the description thereof is omitted. The program verify operation is however different. In the program verify mode, the bit line is pre-charged upon reception of the signal PRE. After the pre-charge of the bit line, the verify read operation is executed and the signal Pv is set to "H" level. As a result, the bit line with "1" written is charged through the turned-on transistors T11 and T12. Therefore, "H" level is retained without being discharged to "L" level. After a predetermined time lapse, the signal BLCD is set to "H" level to transfer the potential level on the bit line to the data latch circuit DR, to execute the detection and latch operations. As described, the bit line with "1" written is always set to "H", and the bit line with "0" written and in the verify OK state also takes "H" level. The bit line in the verify NG is discharged. In this manner, the bit line with "1" written will not be discharged so that the above-described potential change from "L" level to "H" level will not occur during the rewrite data setting. It is therefore possible to detect data without the influence of the coupling and without an erroneous data detection. This is illustrated in FIG. 68. An improvement can be seen from the comparison between the uppermost diagrams indicated by (1) in FIGS. 68 and 65. This improvement can be seen also from the comparison between FIGS. 69 and 66. As described above, there is no rise of the bit line potential to be caused by the coupling, allowing correct data read.

FIGS. 70($a$), ($b$) and ($c$) show another example of the rewrite setting transistors T11 and T12. The diagram indicated by FIG. 70($a$) shows the transistors T11 and T12 described previously, and the diagram indicated by FIG. 70($b$) shows another example of the transistors T11 and T12. By using a transistor having a threshold voltage near 0 V as the transistor T11, it is possible to set "H" level on the bit line near to Vcc in the verify mode. It is more effective to apply a raised potential to the gate of the transistor T12. Namely, the potential drop (threshold drop) relative to the power supply voltage Vcc becomes small, providing a large margin in the read operation.

FIGS. 71 to 77 show circuits used for the above-described method, these circuits are general circuits and so the description thereof is omitted.

The influence of the coupling of bit lines can be neglected in the verify operation using the above method.

The gate of a memory cell with "0" written is raised by about 0.5 V to obtain a sufficient margin in the program verify operation, although this is not explicitly given in the above description.

As described above, for a memory cell with "1" written, current always flows through a memory cell via the turned-on transistors T11 and T12 during the verify operation.

The sources of memory cells are connected in common at the outside of the memory cell array, and a high potential of about 20 V is applied to the sources during the erase operation, and with the ground level during the program and read operations. Therefore, the sources are connected to a Vwell circuit. The wiring resistance of the source lines therefore exists. Assuming that current of about 10 $\mu$A flows through each cell during the verify operation and "1" is written for about one page, current of 256 * 8 * 10 $\mu$A=20 mA will flow always through memory cells of 256 bytes.

Assuming that the source line has a resistance in the order of 20$\Omega$, the voltage at the source line is raised by 0.4 V. On the contrary, if most of memory cells of one page is written with "0", current flowing always hardly exists. Therefore, the source potential rises scarcely and is set to the ground level. It therefore occurs a problem that the source potential during the program verify operation changes with the write data pattern.

During the read operation, there is no path flowing current always, and so the source level is almost the ground level. The operation margin of memory cells is therefore different for each write pattern of cell distribution. If most of memory cells of one page is written with "1", the source potential differs between the program verify and read operations. Therefore, a verify OK state may result in an NG state when actually reading the memory cell.

FIG. 78 shows the structure of a chip. The ground of a circuit for raising the gate of a memory cell by about 0.5 V during the program verify operation is connected to the Vss line of peripheral circuits. The source line of each memory cell is connected to the Vwell circuit. As a result, even if the source line of each memory cell is raised depending upon the write pattern, the source of the verify level setting circuit is not raised so that the potentials of the source lines become different. Considering the potential rise of the source, it is assumed that the verify level is set to 1.0 V for example. In the case where most of cells of one page is written with "0", the upper limit threshold level of the written memory cell is 1 V+2.5 V=3.5 V if the threshold voltage of the written memory cell is 2.5 V. On the other hand, in the case where most of cells of one page is written with "1", the memory cell gate becomes 0.5 V because the source potential is also raised by about 0.5 V. In this case, the upper limit threshold level is 0.5 V+2.5 V=3.0 V. This difference results in a variation of AC characteristics and reliability.

In order to solve this problem, the source of the verify setting circuit is connected via a transistor $T_A$ to the source of each memory cell. The gate of the transistor $T_A$ is applied with a signal PROVERI which takes "H" level during the program verify operation. In this way, the source of the verify setting circuit is set to the level of the source of each memory cell. Therefore, the source potential change of each memory cell can be reflected upon.

Namely, if the source is raised by 0.5 V, the output potential also rises by 0.5 V relative to the setting value. Accordingly, a constant voltage level is always applied between the source and gate of each memory cell. The same distribution can be obtained for any type of pattern, providing a high reliability.

FIG. 80 shows a verify level setting circuit, and FIG. 81 shows a Vwell circuit.

A modification of the eleventh embodiment (FIG. 55) will be described which can have the same advantages as the eleventh embodiment by using a different circuit arrangement. In FIG. 82 showing this modification, like elements to those used in the eleventh embodiment (FIG. 55) are represented by using identical reference numerals. FIG. 82 shows a memory cell array of one column and its peripheral circuits.

In this modification different from the eleventh embodiment, the data latch circuit DR is divided into two data latch circuits DR1 and DR2. The first data latch circuit DR1 has two inverters in a reversed parallel connection directly connected between IO and NIO. The second data latch circuit DR2 has two inverters connected via transistors $T_{31}$ and $T_{32}$ between IO and NIO. The transistors $T_{31}$, and $T_{32}$ are controlled by a signal SDIC. The outputs of the first and second data latch circuits DR1 and DR2 are supplied to an exclusive NOR gate XNOR which outputs "H" level when the logical levels of the two input signals are the same. An output of the exclusive NOR gate is supplied to IO via a transistor $T_{33}$ controlled by a signal VREAD. The inverted signal of an output of the gate XNOR is supplied to NIO via a transistor $T_{21}$, controlled by the signal VREAD. In FIG. 82, the transistors T11 and T12 shown in FIG. 55 are not necessary and omitted.

The read and erase operations of the memory system shown in FIG. 82 are the same as those of the eleventh embodiment, and so the description thereof is omitted.

The write operation will be described.

The program operation is the same as described previously. When a program command PC enters, the program mode is initiated. A column address and page address are externally inputted. At this time, the signal BLCD takes "L" and the transistor TT turns off. Then, the voltage booster circuit SU starts operating to gradually raise the signals BLCRL and BLCU inputted to the write pre-charge circuit WPC to about 10 V. As the signal BLCRL rises, the potentials of the bit lines of the memory cell array rise. The selected WL is set to a high potential of about 20 V, the gates of the select gate transistors of NAND cells are set to 0 V, and the other gates are set to the intermediate level of about 10 V.

In this state, the column address Ac is sequentially changed to input write data to the data register circuits DR. The write data inputted to the data register circuit DR is latched by the first latch circuit DR1. After the write data of 256 bytes are latched by the first data latch circuit DR1, the signal BLCU takes "L" level to turn off the write pre-charge circuit WPC. When the signal SDIC takes "H", the transistors $T_{31}$, and $T_{32}$ turn on to latch the write data in the second data latch circuit DR2. Then, the signal SDIC takes "L" to turn off the transistors $T_{31}$, and $T_{32}$. The signal SDIC may be set to "H" level at the same time when the write data is inputted, to allow the first and second latch circuits to execute the latch operations. During the above operations, the transistors $T_{21}$, and $T_{22}$ are off because the signal VREAD takes "L". At this time, the signal BLCD raised to about 10 V then turns on the transistor TT to connect the bit line to the data register circuit DR.

At this time, the power supply VBIT supplied to the data latch circuit DR is raised to about 10 V. If the first data latch circuit DR1 latched "1", "HI" of the bit line BL is retained. If "0" was latched by the first data latch circuit DR1, the pre-charged level of the bit line is discharged to "L" to inject electrons into the floating gate. In this way, data is written in memory cells of 256 bytes.

Next, as described previously, a verify command CF is entered after the completion of the program operation. The signal BLCK becomes 0 V, BLCRL becomes 5 V, and signal VBIT becomes 5 V. The bit line is discharged upon reception of the reset signal RST. The write data remains latched by the second latch circuit DR2 of the data register circuit DR. In this state, the control signal RPC of "H" is supplied to the read pre-charge circuit RPC to pre-charge the bit line.

Next, the signal BLCD becomes 5 V to latch the read data in the first latch circuit to compare it with the write data latched by the second latch circuit DR2. Next, the signal BLCD becomes 0 V to disconnect the data latch circuit from the memory cell. Then, the signal VREAD becomes 5 V to turn off the transistors $T_{21}$, and $T_{22}$, so that the comparison result is latched by the first latch circuit DR1. In this case, the conditions of write data "1" and verify data "0" encircled by a broken line in FIG. 83 are judged as an error. Namely, a verify NG signal is outputted even under the conditions of write data "1" and verify data "0" neglected by the eleventh embodiment.

The verify read operation is the same as the eleventh embodiment. Namely, when a verify read command CF is entered after a predetermined time lapse from the program operation, the verify output mode is initiated. /Re is sequentially changed from "H", to "L", to "H" and to "L" to sequentially increment the column address Ac, thereby outputting the contents of the latched data of 256 bytes (sequentially 256 times). With the circuit configuration shown in FIG. 82, the comparison results shown in FIG. 83 are outputted. Namely, for bits in the verify NG state, "1" data are outputted in parallel, and for bits in the verify OK state, "0" data are outputted in parallel.

In the foregoing description, each of the program, verify, and re-program operations starts when a command is entered. Instead, an internal automatic operation may be used to automatically execute the verify and reprogram operations after entering a program command and executing the program operation. Such an arrangement makes the memory system more affordable.

FIGS. 84 and 85 conceptually show the fundamental system configuration.

A program automatic command is decoded by a command register circuit CR. In response to an output of this circuit CR, a logical circuit LOG1 outputs a pulse signal AUTO which is inputted to a flip-flop FF1 to latch a program mode signal PRO in an "H" level state.

When the signal PRO takes "H" level, the program operation starts. After a predetermined time lapse, a logical circuit LOG2 outputs a program completion signal PROE to reset the flip-flop FF1 and comand register FF1. The program completion signal PROE is also applied to a flip-flop FF11 to enter the verify mode. A predetermined verify time is counted by a binary counter BC11.

In the verify operation which is executed in the manner described previously, it is checked whether the verify operation is in a verify OK state or not. If it is in a verify NG state, the count of a counter PNC counting the number of program operations is incremented by 1 to again execute the program operation. If it is in the verify OK state, it is judged the operation was correctly passed.

With the above-described configuration, the judgement between "PASS" and "FALL" can be made only by entering the automatic program command, making the memory system more affordable.

The above description has been given basing upon the program operation. Also the erase operation can be effected in quite the same manner.

Next, a combination of the verify read and automatic program operations will be described. If a verify NG state continues after the execution of the re-program operations a predetermined times, the page (256 bytes) in concern is considered as an error. The number of cell bits in the verify NG state can be known externally. This mode is called a verify read mode. The operations from the program to verify read modes will be described with reference to the timing chart shown in FIG. 86.

The program operation is the same as described previously. When a program command PC is entered, the program mode is initiated. A column address and page address are inputted externally. The signal BLCD for controlling the transmission transistor TT of the data register circuit DR takes "L" to turn off the transistor TT (refer to FIG. 55). The voltage booster circuit SU then starts operating to gradually raise the signals BLCRL and BLCU inputted to the write pre-charge circuit WPC to about 10 V. As the potential of the signal BLCRL rises, the potentials of the bit lines BL in the memory cell array rises. The selected WL is set to a high potential of about 20 V, the gates of the select gate transistors on the source side of the NAND cells are set to 0 V, and the other gates are set to the intermediate level of about 10 V.

In this state, the column address Ac is sequentially changed to input write data to the data register circuits DR. In FIG. 86, /WE operates as the latch signal for the input data. The write data inputted to the data register circuit DR is latched by the circuit DR. After the write data of 256 bytes are latched by the data register circuits DR, the signal BLCU takes "L" to turn off the write pre-charge circuit WPC. At this time, the signal BLCD raised to about 10 V turns on the transistor TT to connect together the bit line BL and data register circuit DR. At this time, the power supply VBIT supplied to the data register circuit DR is raised to about 10 V. If the circuit DR latched "1", "HI" on the bit line BL is retained. If "0" was latched by the data register circuit DR, the level of the pre-charged bit line discharges to "1" to inject electrons into the floating gate. In this manner, data of 256 bytes are written simultaneously.

When not a collective verify command VC but a verify read command CF is entered after a predetermined time lapse, the verify output mode is initiated. The column address Ac is sequentially incremented to output the contents of the latched data of 256 bytes (sequentially 256 times). For bits in the verify NG state, "1" is outputted in parallel, and for bits in the verify OK state, "0" is outputted in parallel.

With the configuration using the collective verify circuit, it is possible to output the detection result whether it is a verify NG state or not, to the external circuit of the chip. This output data is not the data actually written in the cell as in a conventional case, but it is a verify NG signal indicating whether the data rewrite is to be executed. Therefore, the number of write error cells can be counted without a need of an external comparator circuit. The total number of cells outputting "0" in the verify read mode is the total number of verify NG states in one page. Obviously, it is possible to identify a cell address in the verify NG state.

Next, an embodiment of a combination of the verify NG state detecting function and an error correct circuit (ECC) will be described.

An approach to relieve an error cell by adding redundant cells is generally used for improving the reliability of stored data. For example, 64 redundant bits are provided for a page of 256 bytes (2 K bits). By Hamming coding the data for a redundant bit by using a Hamming distance, it becomes possible to correct data error of 6 bits. Generally, if N redundant bits are provided for an M bit data train, it is possible to correct T bit errors on the condition that the following expression is satisfied:

$$\sum_{i=1}^{T} {}_{N+M}C_i + 1 \geq 2^T$$

A flow chart illustrating the operation of the embodiment having an ECC circuit is shown in FIG. 87.

When the program starts in the write operation, data of one page (256 bytes) are written. In addition to this data write, redundant data is written in 64 redundant cell bits of the EEC circuit. In the following verify operation, if in a verify OK state, it means that the write operation was completed without any abnormality, and so the write operation is terminated. If in a verify NG state, the count of a counter counting the number of re-program operations is checked. If the count is 3 or less, the re-program operation is executed. If the number of re-program operations exceeds the predetermined re-program set number (3 in this example) the verify read operation is executed. At this time, as described previously, the number of NG bits of one page is counted. Next, it is checked whether the count is sufficient for correcting a predetermined number of redundant bits (64 bits in this example). If sufficient, it is the write OK state and so the write operation is terminated. If the number of NG bits are so large not to be relieved by the redundant bits, then it is the write error.

With the above configuration, even if a write bit error occurs, no write error is issued so long as the number of write NG bits can be relieved by the ECC circuit. With such a configuration, the number of error bits as seen externally can be reduced greatly as compared with a conventional case. This configuration provides distinctive effects particularly for an EEPROM having a secular change.

With the above-described configuration using the ECC circuit, even if there is an NG bit, no write error is issued. In this context, it is possible to check whether the number of NG bits is within the relievable range of the ECC circuit and whether it is near the relieving limit. For example, if the number of NG bits reaches 80% of the relievable limit of the ECC circuit, an alarm may be issued. This method can be used as a means for judging the life time of a chip particularly a chip using an EEPROM having a secular change.

The verify operation can be executed collectively or simultaneously for all memory cells as described with the embodiments shown in FIGS. 55 and 6. Therefore, it does not take a long time for the write operation inclusive of the verify operation.

An embodiment using an ECC circuit has been described. This embodiment may be implemented on a onechip, or may be configured as a memory system having a plurality of EEPROM chips, with the same advantageous effects. The redundant codes are generated by the Hamming coding method in this embodiment. However, various other coding methods may be used, such as a Reed Solomon method, HV coding method, Fire coding method, and cyclic coding method.

In the foregoing description, an address is externally inputted. The following description is directed to an embodiment wherein an address pin and data input pin are used in common. ALE, NWP, CE, NWE, and RE represent external control signals. These signals are inputted from input pins to determine the operation mode of the chip. A control circuit outputs a signal representing whether the chip is accessible or not, via a Ready/Busy pin to the external circuit. An external signal CLE determines the command input mode. The external control signal ALE determines an address input mode. The external control signal CE is a chip select signal. The external control signal NWE functions as a clock signal for reading data in the command input mode, address input mode, and data input mode. The external control signal RE is a clock signal having an address increment function for reading the address following the address inputted when reading data, and an output buffer enable function.

FIG. 88 is a timing chart showing the operation during the external control mode for data write. In the command input mode, a serial data input command 80H is inputted. Then, the chip enters the address input mode for inputting a program start address. In the address input mode, the column address and page address are held in the address buffer at the third clock of the external control signal NWE to set each internal address signal to a predetermined logical level corresponding to the inputted address data. At this time, a ready signal is held at the Ready/Busy output terminal. After the address input operation, the signal SDIC changes from "L" to "H". Therefore, write data and its inverted data are transferred from the I/O input terminals to the common bus lines IOi/IOiB. Next, while the external control signal NWE takes "L" level, the column decoder output signals CSLN corresponding to the inputted column address becomes "H" level. In this manner, data is transferred to the data register.

As a result, the contents of data registers from address 0 to address N−1 are data "1" when initialized. The data inputted from the I/O terminals are latched by the data registers at address N to address N+j.

After the data input, an automatic program command 10H is entered in the command input mode to write data in memory cells of the chip.

Thereafter, the above-described operations including program, verify, and re-program operations are automatically executed.

During the write operation, a busy signal is outputted from the Ready/Busy output terminal. After a predetermined write time, a ready signal is automatically outputted. Whether the write mode has completed normally or not can be detected by inputting a flag read command 70H in the command input mode and reading the verify result (signal PEOK) from the I/O terminal.

FIG. 89 shows data input timing and external control signal waveforms for the data write to the above-described semiconductor memory without using the automatic program command. In the command input mode, a serial data input conunand 80H is entered. The chip then enters the address input mode to input a program start address. Similar to the read mode, in the address input mode, a column data output signal takes "H" level, the column data output signal corresponding to the column address inputted while the external control signal WE takes "L" level. At this time, the contents latched in the data register is written in the write data latch on the common bus line. In this manner, write data is sequentially latched. After the data latch, a program command 40H is entered to advance to the program mode.

Next, when a verify command is entered, a word line is selected in accordance with each internal address signal in the address buffer corresponding to the row address. After a predetermined delay time, data of memory cells of one page whose control gates are connected to the selected word line, are read via bit lines and latched by the data registers. Next, the signal NRE is changed from "H" to "L" to "H" to sequentially increment the column address, so that the contents of the data registers are sequentially read and outputted externally. It is therefore possible to judge what address and how many bits have errors.

FIG. 90 shows data input timing and external control signal waveforms for the write and verify operations. In the command input mode, a serial data input command 80H is entered. The chip then enters the address input mode for inputting a program start address. Similar to the read mode, in the address input mode, the column address and page address are held in the address buffer at the third clock of the external control signal WE to set each internal address signal to a predetermined logical level corresponding to the inputted address data. Thereafter, a column data output signal takes "H" level, the column data output signal corresponding to the column address inputted while the external control signal WE takes "L" level. At this time, the contents latched in the data register is written in the write data latch on the common bus line. In this manner, write data is sequentially latched. After the data latch, a program command 40H is entered to advance to the program mode. This data write continues until the next verify command is entered.

When a verify command (collective or simultaneous verify) is entered, the collective verify operation is executed in the manner described above. Similar to the manner described above, the column address is incremented by sequentially changing RE from "H" to "L" to "H" to sequentially read data and output it from the chip.

In this manner, "0" data is outputted from a bit in a write NG state, and "1" data is outputted from a bit in a write OK state. It is therefore possible to know the apparent number of error bits. FIG. 91 shows another example of the memory system shown in FIG. 90. In this system, after inputting the verify read command, a flag read command 70H is entered to check a program OK state, without changing RE to increment the column address. Also with such a system configuration, it is possible to discriminate between Fail and Pass.

As well known, data is written in a memory cell of a NOR type by injecting hot electrons to the floating gate. Therefore, a write current of about 1 to 2 mA is consumed per one memory cell for the data write. Therefore, a page write such as 256 bytes is impossible for a NOR type memory, although a NAND EEPROM is possible. However, NOR type memories are used because of its merits such as a high read speed.

A NOR type EEPROM can rewrite data on-board. Data is written in a memory cell by designating an address. The written data at the designated address is read and compared to check whether the data was correctly written.

In order to execute such operations on-board, CPU generates necessary signals for the data write and verify operations. There occurs a problem that CPU is occupied while generating such signals.

It is therefore general to release CPU from such operation by automatically executing the write and verify operations within the chip.

One example provides a circuit for latching write data, a circuit for latching the read data, and a circuit for comparing the read data (Japanese Patent Application No. 3-125399). In this example, there is a problem that the pattern area is relatively large, increasing the chip size.

In the example to be described below, not only a write operation but also an erase operation are possible with a relatively small pattern area.

In the embodiments described previously, memory cells of a NAND structure are used. In this embodiment, a collective verify method using memory cells of a NOR type of the two-layer structure will be described. An example of memory cells (EEPROM) of the two-layer structure is shown in FIGS. 92 to 94.

FIG. 91 is a plan view of a pattern, FIG. 93 is a cross sectional view taken along line B-B' of FIG. 92, and FIG. 94 is a cross sectional view taken along line C-C' of FIG. 92. In these figures, reference numeral 211 represents a floating gate (FG) made of a first layer polysilicon. Reference numeral 212 represents a control gate (CG) made of a second layer polysilicon. The control gate 212 is used as the word line of a memory cell.

Reference numeral 213 represents a p-type substrate. Reference numerals 214 and 215 represent a source (S) and drain (D) of an n$^+$-type diffusion layer formed on the substrate 214. Reference numeral represents a contact hole. Reference numeral 217 represents an aluminum layer (bit line BL) connected via the contact hole 217 to the drain 216. Reference numeral 218 represents a gate insulating film of the floating gate transistor, having a thickness of 100 angstroms. Reference numeral 219 represents an insulating film interposed between the floating gate 211 and control gate 212. The insulating film 219 has the three-layer structure, e.g., O—N—O (Oxide-Nitride-Oxide) structure, and has a thickness of about 200 angstroms in the unit of oxide film thickness. Reference numerals 220 and 221 represent a field insulating film and interlayer insulating film.

Next, the operation principle will be described.

For the erase operation, the source 214 is applied with an erase voltage 12 V, the drain 215 is set to the floating state, and the control gate 213 is applied with 0 V. In this state, a high voltage is applied between the floating gate 211 and source 214 via the thin gate insulating film 18. Electrons in the floating gate are emitted from the source by the Fowler-Nordheim tunneling effect, to erase data.

For the write operation, the drain 215 is applied with about 6 V, the source 214 is applied with 0 V, and the control gate 213 is applied with 12 V. Impact ionization occurs near the drain so that electrons are injected into the floating gate 211 to write data. For the read operation, the drain 215 is applied with 1 V, the source 214 is applied with 0 V, and the control gate 213 is applied with 5 V. The memory cell turns off/on depending upon whether electrons are in the floating gate or not, respectively showing data "o"/"1".

A semiconductor integrated circuit using such memory cells, for example, a flash type EEPROM of 4-bit structure, is configured as shown in FIG. 95.

In FIG. 95, a row address input signal $A_0$ to $A_i$ is amplified and shaped by a row address buffer 1, and inputted to a row decoder 2. A column address input signal $B_{i+1}$ to $B_j$ is amplified and shaped by a column address buffer 3, and inputted to a column decoder 4. The row decoder 2 selects one of a plurality of word lines WL. The column decoder 4 selectively turns on one gate 6A of the column select gate circuit 6 to select one bit line BL for each I/O, totaling in four bit lines. Therefore, four memory cells MC one per each I/O are selected from the memory cell array 5. Data in the selected memory cells are detected and amplified by the sense amplifiers 7 and outputted from the chip. Four data are outputted at the same time.

In FIG. 95, the memory cell array 5 is constructed of four memory cell array units (MCAU) 5A. For the simplicity of description, each unit 5A is assumed to include four word lines WL, four bit lines BL, sixteen memory cells MC, and four reference memory cells RMC. Four gates 6A are provided in each column select gate circuit 6 in correspondence with four bit lines BL. One of the gates 6A is turned on by the column decoder 4. The reference memory cell RMC is connected to the sense amplifier (SA) 7 by a reference bit line RBL having a reference gate RBT.

The four bit data write to the EEPROM constructed as above is executed in the following manner. Four data are read from four I/O pads (not shown) to I/O. The write circuit 10 sets the bit line BL potential in accordance with the read data. Namely, the write circuit 10 supplies a high potential for the write data "0" and a low potential for the write data "1", to the bit line selected by the input address signal. At this time, the word line WL selected by the input address signal is supplied with a high potential.

More specifically, in writing "0" data, the selected word line WL and the data write bit line are set to a high potential. As a result, hot electrons generated near the drain D of the memory cell MC are injected into the floating gate, shifting the threshold value of the memory cell to the positive direction, to store "0" data.

In writing "1" data, the bit line BL is set to a low potential. Electrons are not injected into the floating gate and the threshold value of the memory cell MC will not be shifted. In this way, "1" data is written.

In erasing data, the source of the memory cell is set to a high potential. Electrons injected in the floating gate are emitted out by the F-N (Fowler-Nordheim) tunneling effect.

FIG. 96 shows the details of part of the system shown in FIG. 95. Identical reference numerals represent the same circuits in FIGS. 95 and 96. FIG. 95 shows the details of circuits, particularly the sense amplifier (SA) 7 and comparator 9, as well as a circuit INCIR for supplying one reference signal to the comparator 9, and a collective verify circuit VECIR for receiving an output of the comparator 9.

As described previously, MC represents a memory cell of a floating gate type MOS transistor, RMC represents a reference memory cell (dummy cell) of a floating gate type MOS transistor, BL represents a bit line, RBL represents a reference bit line, and RBT represents a dummy bit line select transistor equivalent to one of the column select gate transistors 6A. This transistor RBT is supplied with a Vcc potential at its gate, and provided on the reference bit line RBL- BAS represents a bus to which a plurality of column select gate transistors 6A, 6A, . . . are connected. LD1 represents a first load circuit (bias circuit) connected to the bus BAS. LD2 represents a second load circuit (bias circuit) connected to the reference bit line RBL. The potential Vin at the bit line BL' on the output side of the first load circuit LD1 and a potential (reference potential) Vref at the reference bit line RBL' on the output side of the second load circuit LD2, are supplied to a data detector circuit 28 (constructed of a CMOS current mirror circuit for example).

In the sense amplifier (SA) 7, an activation control p-channel transistor P4 is connected between the power supply Vcc and the data detecting circuit 28. An inverted signal /CE*1 is applied to the gate of the transistor P4. When the transistor P4 turns off, the data detecting circuit 28 is disabled to reduce current consumption. Connected between an output terminal DSO of the data detecting circuit 28 and the ground is an nchannel transistor N7 whose gate is supplied with the inverted signal /CD*1.

In the sense amplifier 7, the reference potential Vref at the reference bit line RBL generated in accordance with the data in the reference memory cell RMC is compared with the potential Vin at the bit line BL generated in accordance with the data in the selected memory cell. The data in the selected memory cell is detected from this comparison result, and outputted via three inverters to the output buffer 8.

An output of the sense amplifier 7 is supplied also to one input terminal of the comparator 9. Supplied to the other input terminal of the comparator 9 is a signal (write data) applied to the I/O pad. In the comparator 9, these two input signals are compared, and the comparison result is supplied to the collective verify circuit VECIR also supplied to which are three-bit outputs VR1, VR2, and VR3 of the comparator 9. The collective verify circuit VECIR allows an output circuit Dout to output data, only when all outputs VR0, VR1, VR2, and VR3 indicate the write OK state. Outputting data from the output circuit Dout is not allowed in the other case, i.e., when even one of the outputs VR0 to VR3 indicates a write NG state.

FIGS. 97 and 98 show an output VR0 of the comparator 9 during the program verify and erase verify operations. A block (a) of FIG. 97 shows the case of "1" write. In the case of a program OK state, the sense amplifier output DSO becomes "1" so that the comparator output VR0 becomes "1" indicating the program OK state. A block (b) of FIG. 97 shows the case of "0" write. In the case of a "0" write NG state, the sense amplifier output DSO becomes "1" so that the comparator output VR0 becomes "0" indicating the program NG state. A block (c) of FIG. 97 shows the case of "0" write. In the case of a "0" write OK state, the sense amplifier output DSO becomes "0" so that the comparator output VR0 becomes "H" indicating the program OK state.

When all the comparator outputs VR0 to VR3 take "H (program OK)", the collective verify circuit outputs a signal PVFY of "H". As seen from FIG. 98, in the case of an erase OK/NG state, the sense amplifier output becomes "1/0" so that the comparator output VR0 becomes "1/0". When all the comparator outputs VR0 to VR3 take an erase OK state, the collective verify circuit outputs signal EVFY of "1". When even one of the comparator outputs VR0 to VR3 takes an erase NG state, the output EVFY takes "0".

Next, another embodiment will be described with reference to FIG. 99. This embodiment uses the collective verify circuit used with the memory cells shown in FIG. 6 of Japanese Patent Laid-Open Publication No. 3-250495. Similar circuits to those shown in FIG. 96 are represented by using identical reference numerals in FIG. 99.

The voltages applied to circuit portions of the memory system shown in FIG. 99 during the erase, write, and read operations are given by Table 6.

TABLE 6

|  | I/O PAD | BSL | BL | WL | Vss |
|---|---|---|---|---|---|
| Erase (electron injection) Write | — | 0 V | Floating | 20 V | 0 V |
| "0" write (pull out no electron | 0 V | 22 V | 0 V | 0 V | Floating |
| "1" write (pull out no electrons | 5 V | 22 V | 20 V | 0 V | Floating |
| Non-selected cell | — | 22 V | 0 V/20 V | 10 V | Floating |
| Read | — | 5 V | 1 V | 5 V | 0 V |

The program verify and erase verify operations of the memory system shown in FIG. 99 are the same as those described with FIG. 90, and so the description thereof is omitted.

Next, a memory system using a non-volatile semiconductor memory device having the above-described collective verify function will be described.

Generally a memory system is hierarchically structured to derive the maximum capability with the minimum cost. One of such a system is a cache system which uses a localized memory access. A computer using an ordinary cache system has a CPU, a high speed and small capacity SRAM, and a low speed and large capacity DRAM. In such a cache system, part of the main storage made of a DRAM having a relatively long access time is replaced in operation with an SRAM or the like having a relatively short access time, to thereby shorten an effective access time. Namely, if data is being stored in SRAM (in the case of cache hit) when accessing from CPU or the like, the data is read from SRAM accessible at high speed. If there is no cache hit (in the case of cache mishit), the data is read from the main storage such as DRAM. If the cache capacity and replacement scheme are properly set, the hit percentage becomes in excess of 95%, greatly speeding up the average access time.

The write and erase operations of the above-described NAND type EEPROM or the like can be executed in units of page (e.g., 2 K bits). The processing in units of page greatly speeds up the write and erase operations. Since such a memory system sacrifices a random access, a cache memory of RAM such as SRAM and DRAM becomes essential. Use of a cache memory with a non-volatile memory device such as a NAND type EEPROM reduces the number of data write operations, elongating the chip life.

A first embodiment of a memory system using a non-volatile semiconductor memory device will be described. FIG. 100 shows the system arrangement. This system has a ROM 121 and a control circuit 122. ROM 121 has a collective verify function. The control circuit 122 controls the data write to ROM 121, and has at least a built-in data register. In response to the collective verify signal outputted from ROM 121, the write control circuit 122 outputs the page data to be written next. The control circuit 122 may be constructed of a CPU, or of a plurality of chips having gate arrays and SRAM.

As described previously, a collective erase block of a NAND type EEPROM has generally several pages. With the cache memory system, data is written for each collective erase block. For example, in a NAND type EEPROM having above-described 8 NAND type memory cells, one collective erase block is constituted by 2 K bits (1 page) * 8=16 K bits (8 pages). Data is written in this block unit. Therefore, the write operation is always executed for 8 pages.

In the circuit shown in FIG. 100, the next page write operation is executed in accordance with a collective verify signal VFY outputted from ROM 121. After the first page data is latched, the write and DRAM becomes essential. Use of a cache memory with a nonvolatile memory device such as a NAND type EEPROM reduces the number of data write operations, elongating the chip life.

A first embodiment of a memory system using a nonvolatile semiconductor memory device will be described. FIG. 100 shows the system arrangement. This system has a ROM 121 and a control circuit 122. ROM 121 has a collective verify function. The control circuit 122 controls the data write to ROM 121, and has at least a built-in data register. In response to the collective verify signal outputted from ROM 121, the write control circuit 122 outputs the page data to be written next. The control circuit 122 may be constructed of a CPU, or of a plurality of chips having gate arrays and SRAM.

As described previously, a collective erase block of a NAND type EEPROM has generally several pages. With the cache memory system, data is written for each collective erase block. For example, in a NAND type EEPROM having above-described 8NAND type memory cells, one collective erase block is constituted by 2 K bits (1 page) * 8=16 K bits (8 pages). Data is written in this block unit. Therefore, the write operation is always executed for 8 pages.

In the circuit shown in FIG. 100, the next page write operation is executed in accordance with a collective verify signal VFY outputted from ROM 121. After the first page data is latched, the write and verify operations are repeated within ROM 121. After the first page data write is completed, a collective verify signal VFY for the first page is outputted. When the control circuit 122 detects the collective verify signal, the second page data is latched in ROM 121. Next, the write and verify operations for the second page data are repeated within ROM 121. After the second page data write is completed, a collective verify signal VFY for the second page is outputted. The similar operations are repeated for the third and following pages.

For example, in a NAND type EEPROM having above-described 8NAND type memory cells, the control circuit 122 operates to transfer data of 8 pages per one write operation, and for the second and following pages, page data is transferred each time the collective verify signal is detected. As described above, according to this embodiment, write page data transfer from the control circuit 122 to ROM 121 can be executed in response to the collective verify signal. Conventionally, a comparator and a large capacity register have been used as external circuits. This embodiment is not necessary to use such circuits, simplifying the structure of the control circuit 122 to a large extent.

The above embodiment uses one ROM 121 for the control circuit 122. A memory system having a plurality of ROMs each outputting a collective verify signal is also possible. An example of such a system is shown in FIG. 101. This system has the above-described collective verify function, and is constructed of ROMs 101 to 103, a RAM 104, and a control circuit 105. When the data write is completed, each ROM 101 to 103 outputs a collective verify signal. RAM 104 is used as a cache memory for an access from a CPU (not shown). The control circuit 105 controls the data transfer between RAM 104 and ROMs 101 to 103 via a data bus 106. ROMs 101 to 103 constitute a main storage having a capacity far greater than that of RAM 104 used as the cache memory. The memory mapping is preferably an ordinary 4-way mapping. Various other types of mapping such as a direct mapping, associative mapping and the like may also be used. The capacity of each block of the cache memory is set to the same capacity of the collective erase block.

Next, the description will be given for the case wherein the size of the collective erase block is 16 K and the mapping method is a 4-way mapping. SRAM has 64 K bits and four 16 K blocks. These blocks temporarily store copy data of the collective erase blocks of ROM. Assuming now that the data in the second to fifth collective erase blocks are accessed. In this case, the copy data of the data in the collective erase blocks are temporarily stored in four blocks of SRAM.

Assuming that the write and erase operations are executed for the third collective erase block under control of CPU, the copy data is already present (cache hit) in SRAM. Therefore, data is accessed from the high speed SRAM without accessing ROM.

Assuming that the write operation is executed for the sixth collective erase block under control of CPU, the copy data of the sixth collective erase block is not present (cache mishit) in SRAM. It is therefore necessary to transfer data read from ROM to SRAM. Prior to this, it is necessary to write back the data in one of the blocks of SRAM to ROM. For example, in order to write back the data in the second collective erase block from SRAM to ROM, all data in the collective erase block of ROM are erased, and thereafter the block data in SRAM is sequentially transferred and written in ROM. In this write-back operation, the collective verify signal can be used. In response to the erase verify signal (indicating the completion of the erase operation), first page data is transferred from SRAM. The second and following page data can be transferred upon detection of the collective verify signal for the preceding page, as described previously. Data transfer for 8 pages is necessary for the 8NAND type EEPROM. Next, all the data in the sixth collective erase block is copied to an empty block of SRAM, and the data at the designated address is outputted from SRAM to CPU.

Assuming that the write operation is executed for the seventh collective erase block under control of CPU, the copy data of the seventh collective erase block is not present (cache mishit) in SRAM- It is therefore necessary to execute the above-described write-back operation and read operation prior to the data write to SRAM. For example, in order to write back the data in the third collective erase block from SRAM to ROM, all data in the collective erase block of ROM are erased, and thereafter the block data in SRAM is sequentially transferred and written in ROM. In this write-back operation, the collective verify signal can be used. In response to the erase verify signal (indicating the completion of the erase operation), first page data is transferred from SRAM. The second and following page data can be transferred upon detection of the collective verify signal for the preceding page, as described previously. Data transfer for 8 pages is necessary for the 8NAND type EEPROM. Next, all the data in the seventh collective erase block is copied to an empty block of SRAM, and the write data from CPU is written in a corresponding area of SRAM.

As described above, a ROM capable of outputting a collective verify signal can readily configure a cache system with a SRAM or the like, by using the collective verify signal for the write-back of mishit data.

A third embodiment of a memory system having the collective verify function will be described. FIG. 102 shows the system arrangement. This system has ROMs 111 and 112 having the collective verify function and a control circuit for controlling the data write, the control circuit having at least a built-in write data register. The control circuit 113 may be constructed of a CPU, or of a plurality of chips having gate arrays and SRAM. ROMs 111 and 112 may be formed on one chip, or on a plurality of chips.

Consecutive page data are stored alternately in ROM 111 and ROM 112. For example, the page data for the first, third, fifth, . . . , and (2N−1)-th pages are stored in ROM 111, and the page data for the second, fourth, sixth, . . . , and (2N)-th pages are stored in ROM 112. As described earlier, the write mode operation includes an operation of transferring page data to the data latch within the chip, and the following write and verify operations. In this memory system, while the write data is transferred to ROM 111, data is written in ROM 112 and verified. In writing data of a plurality of pages, data is transferred alternately to ROM 111 and ROM 112.

Also with the system arrangement shown in FIG. 102, the collective verify signal outputted from ROM is used in controlling the write data transfer. First, the first page data is transferred to ROM ill, and thereafter, data is written in ROM 111 and verified. While the data is written in ROM 111 and verified, the control circuit 113 operates to transfer the second page data to ROM 112 to succeedingly execute the write and verify operations. When the data write of the first page data to ROM 111 is completed, a collective verify signal is outputted. In response to this collective verify signal, the control circuit 113 operates to transfer the third page data to ROM 111 to succeedingly execute the write and verify operations. The similar operations are executed for the fourth and following page data write.

According to the third embodiment, the control circuit can operate to transfer the write page data to ROMs 111 and 112 in response to the collective verify signal. With this embodiment different from a conventional memory system, it is not necessary to provide a comparator and large capacity register for the verify read as external circuits, simplifying the structure of the control circuit to a large extent. Since the data write is alternately executed, the write operation can be speeded up, with a tradeoff of a doubled size of the collective erase block.

According to the present invention, whether the data write and erase were properly executed for each of a plurality of memory cells, can be detected speedily, and the data write and erase can be executed speedily for all target memory cells. Furthermore, even if the write and erase operations are executed repetitively, the change of the threshold values of memory cells can be prevented from becoming too large.

What is claimed is:

1. A method for simultaneous changing of memory states of plural non-volatile semiconductor memory cells formed on a semiconductor layer, each memory cell having a first gate, a second gate, a third gate, a drain and a source, said first gate being formed on a first insulating film formed on said semiconductor layer and set to a floating state for storing electric charge, said second gate being formed on a second insulating film formed on said first gate and electrically coupled to said first gate, said third gate being formed on a third insulating film formed on said semiconductor layer and arranged adjacent to said first gate, each of said drain being connected to a first common line, each of said source being connected to a second common line, each of said third gate being controlled by a corresponding one of plural data latch circuits, the method comprising the steps of:

(a) setting data of a first logic level to given data latch circuits for applying a first level voltage to corresponding third gates;
   (b) setting data of a second logic level to remaining data latch circuits for applying a second level voltage to corresponding third gates;
   (c) connecting all of said second gates to a common potential for changing the memory states of the memory cells corresponding to said given data latch circuits.

2. The method of claim 1, wherein said common potential is higher than a power supply voltage.

3. The method of claim 1, wherein said first level voltage is higher than said second level voltage.

4. The method of claim 1, wherein said first common line is connected to a power supply voltage, and said second common line is grounded.

5. The method of claim 1, further comprising the step of: initializing all of data stored in said data latch circuits to said second logic level.

6. The method of claim 1, further comprising the step of: initializing all of data stored in said data latch circuits to said first logic level.

7. A non-volatile semiconductor memory device comprising:

a semiconductor layer;
   a plurality of memory cells formed on said semiconductor layer, each memory cell having a first gate, a second gate, a third gate, a drain and a source, said first gate being formed on a first insulating film formed on said semiconductor layer and set to a floating state for storing electric charge, said second gate being formed on a second insulating film formed on said first gate and electrically coupled to said first gate, said third gate being formed on a third insulating film formed on said semiconductor layer and arranged adjacent to said first gate;
   a first common line connected to each of said drain;
   a second common line connected to each of said source;
   a plurality of data latch circuits for storing data in the form of one of first and second logic levels which define voltages to be applied to respective ones of the third gates; and
   a data input buffer for setting data of said first logic level to given data latch circuits to apply a first level voltage to the third gates and for setting data of a second logic level to remaining data latch circuits to apply the second level voltage to the third gates;
   wherein all of said second gates are connected to a predetermined common potential for changing the memory states of the memory cells corresponding to said given data latch circuits.

8. The device of claim 7, wherein said predetermined common potential is higher than a power supply voltage.

9. The device of claim 7, wherein said first level voltage is higher than said second level voltage.

10. The device of claim 7, wherein said first common line is connected to a power supply voltage, and said second common line is grounded.

11. The device of claim 7, wherein all of data stored in said data latch circuits are initialized to said second logic level before setting of data done by said data input buffer.

12. The device of claim 7, wherein all of data stored in said data latch circuits are initialized to said first logic level before setting of data done by said data input buffer.

13. A method for simultaneous changing of memory states of plural non-volatile semiconductor memory cells formed on a semiconductor layer, each memory cell having a first gate, a second gate, a drain and a source, said first gate being formed on a first insulating film formed on said semiconductor layer and set to a floating state for storing electric charge, said second gate being formed on a second insulating film formed on said first gate and electrically coupled to said first gate, said second gate being extended on a third insulating film formed on said semiconductor layer, each of said drain being connected to a first common line, each of said source being connected to a second common line, each of said second gate being controlled by a corresponding one of plural data latch circuits, the method comprising the steps of:

(a) setting data of a first logic level to given data latch circuits for applying a first level voltage to corresponding second gates;

(b) setting data of a second logic level to remaining data latch circuits for applying a second level voltage to corresponding second gates;

(c) connecting said first common line to a power supply voltage; and (d) connecting said second common line to ground.

14. The method of claim 13, wherein said first level voltage is higher than said second level voltage.

15. The method of claim 14, wherein said first level voltage is higher than the power supply voltage.

16. The method of claim 13, further comprising the step of:

initializing all of data stored in said data latch circuits to said second logic level.

17. The method of claim 13, further comprising the step of:

initializing all of data stored in said data latch circuits to said first logic level.

18. A non-volatile semiconductor memory device comprising:

a semiconductor layer;

a plurality of memory cells formed on said semiconductor layer, each memory cell having a first gate, a second gate, a drain and a source, said first gate being formed on a first insulating film formed on said semiconductor layer and set to a floating state for storing electric charge, said second gate being formed on a second insulating film formed on said first gate and electrically coupled to said first gate, said second gate being extended on a third insulating film formed on said semiconductor layer;

a first common line connected to each of said drain;

a second common line connected to each of said source;

a plurality of data latch circuits for storing data in the form of one of first and second logic levels which define voltages to be caused to respective ones of the second gates; and a data input buffer for setting data of said first logic level to given data latch circuits to apply said first level voltage to the second gates and for setting data of a second logic level to remaining data latch circuits to apply said second level voltage to the third gates;

wherein said first common line is connected to a power supply voltage and said second common line is grounded for changing the memory states of the memory cells corresponding to said given data latch circuits.

19. The device of claim 18, wherein said first level voltage is higher than said second level voltage.

20. The device of claim 18, wherein said first level voltage is higher than said power supply voltage.

21. The device of claim 18, wherein all of data stored in said data latch circuits are initialized to said second logic level before setting of data done by said data input buffer.

22. The device of claim 18, wherein all of data stored in said data latch circuits are initialized to said first logic level before setting of data done by said data input buffer.

* * * * *